(12) United States Patent
Wach

(10) Patent No.: US 7,965,949 B1
(45) Date of Patent: Jun. 21, 2011

(54) ROBUSTLY STABILIZING LASER SYSTEMS

(75) Inventor: Michael L. Wach, Alpharetta, GA (US)

(73) Assignee: Cirrex Systems LLC, Alpharetta, GA (US)

( * ) Notice: Subject to any disclaimer, the term of this patent is extended or adjusted under 35 U.S.C. 154(b) by 0 days.

(21) Appl. No.: 12/456,203

(22) Filed: Jun. 12, 2009

Related U.S. Application Data

(63) Continuation of application No. 11/226,553, filed on Sep. 14, 2005, now Pat. No. 7,565,084.

(60) Provisional application No. 60/610,030, filed on Sep. 15, 2004.

(51) Int. Cl.
  *H04B 10/00* (2006.01)
  *H04B 10/04* (2006.01)
  *H04B 10/12* (2006.01)

(52) U.S. Cl. ........ 398/200; 398/201; 398/143; 398/147; 398/158; 398/183

(58) Field of Classification Search .............. 398/26, 398/33, 25, 44, 143–144, 147, 158, 159, 398/168–170, 183–185, 192–194, 199–201
See application file for complete search history.

(56) References Cited

U.S. PATENT DOCUMENTS

| | | | |
|---|---|---|---|
| 3,484,719 A | 12/1969 | Smith | 331/94.5 |
| 3,568,012 A | 3/1971 | Ernst et al. | 317/234 |
| 3,761,184 A | 9/1973 | McLaughlin, Jr. | 356/186 |
| 3,873,408 A | 3/1975 | Hensier | 161/165 |
| 4,225,782 A | 9/1980 | Kuppenheimer, Jr. et al. | 250/216 |
| 4,234,356 A | 11/1980 | Auston et al. | 148/1.5 |
| 4,358,851 A | 11/1982 | Scifres et al. | 372/97 |
| 4,374,942 A | 2/1983 | Takami et al. | 523/210 |
| 4,481,414 A | 11/1984 | Gasper | 250/226 |
| 4,529,943 A | 7/1985 | George et al. | 330/4.3 |
| 4,573,761 A | 3/1986 | McLachlan et al. | 350/96.24 |
| 4,574,574 A | 3/1986 | Knaak | 57/59 |
| 4,583,227 A | 4/1986 | Kirkby | 372/32 |
| 4,616,898 A | 10/1986 | Hicks, Jr. | 350/96.15 |
| 4,693,544 A | 9/1987 | Yamasaki et al. | 350/96.16 |
| 4,699,452 A | 10/1987 | Mollenauer et al. | 350/96.16 |
| 4,725,110 A | 2/1988 | Glenn et al. | 350/3.61 |

(Continued)

FOREIGN PATENT DOCUMENTS

EP  0 210 869  2/1987

(Continued)

OTHER PUBLICATIONS

"*A Continuous-Wave Raman Silicon Laser*," by Haisheng Rong, Richard Jones, Ansheng Liu, Oded Cohen, Dani Hak, Alexander Fang, and Mario Paniccia, *Nature* 3346, Mar. 2, 2005.

(Continued)

*Primary Examiner* — Dalzid Singh

(57) ABSTRACT

A robustly stabilized communication laser can output a multimode optical signal remaining aligned to a coordinate of a dense wavelength division multiplexing ("DWDM") grid while responding to a fluctuating condition or random event, such as, without limitation, exposure to a temperature fluctuation, stray light, or contamination. Responsive to the fluctuating condition, energy can transfer among individual modes in a plurality of aligned longitudinal modes. Modes shifting towards a state of misalignment with the DWDM coordinate can attenuate, while modes shifting towards a state of alignment can gain energy. Fabrication processes and systems and light management, such as beam steering, epoxy scaffolds, spectral adjustments, mode matching, thermal expansion control, alignment technology, etc. can facilitate nano-scale control of device parameters and can support low-cost fabrication.

18 Claims, 65 Drawing Sheets

U.S. PATENT DOCUMENTS

| | | | |
|---|---|---|---|
| 4,807,950 A | 2/1989 | Glenn et al. | 350/3.61 |
| 4,851,095 A | 7/1989 | Scobey et al. | 204/192.12 |
| 4,867,520 A | 9/1989 | Weidel | 350/96.16 |
| 4,899,347 A | 2/1990 | Kuchar et al. | 372/33 |
| 4,911,516 A | 3/1990 | Palfrey et al. | 350/96.19 |
| 4,947,223 A | 8/1990 | Biefeld et al. | 357/30 |
| 4,958,897 A | 9/1990 | Yanagawa et al. | 350/96.15 |
| 5,000,575 A | 3/1991 | Southwell et al. | 356/382 |
| 5,009,485 A | 4/1991 | Hall | 350/163 |
| 5,031,189 A | 7/1991 | Stuhler et al. | 372/92 |
| 5,043,991 A | 8/1991 | Bradley | 372/32 |
| 5,045,249 A | 9/1991 | Jin et al. | 264/24 |
| 5,056,099 A | 10/1991 | Bradley | 372/49 |
| 5,112,127 A | 5/1992 | Carrabba et al. | 356/301 |
| 5,166,756 A | 11/1992 | McGee et al. | 356/446 |
| 5,181,143 A | 1/1993 | Southwell | 359/586 |
| 5,218,473 A | 6/1993 | Seddon et al. | 359/589 |
| 5,235,659 A | 8/1993 | Atkins et al. | 385/124 |
| 5,237,630 A | 8/1993 | Hogg et al. | 385/12 |
| 5,238,738 A | 8/1993 | Miller | 428/333 |
| 5,274,655 A | 12/1993 | Shieh et al. | 372/45 |
| 5,278,687 A | 1/1994 | Jannson et al. | 359/125 |
| 5,283,014 A | 2/1994 | Oestreich et al. | 264/1.5 |
| 5,283,692 A | 2/1994 | Herbst | 359/580 |
| 5,288,992 A | 2/1994 | Fohl | 250/216 |
| 5,305,336 A | 4/1994 | Adar et al. | 372/18 |
| 5,323,404 A | 6/1994 | Grubb | 372/6 |
| 5,373,519 A | 12/1994 | Siono et al. | 372/43 |
| 5,377,045 A | 12/1994 | Wolfe et al. | 359/585 |
| 5,377,182 A | 12/1994 | Monacos | 370/16 |
| 5,426,657 A | 6/1995 | Vakhshoori | 372/45 |
| 5,432,638 A | 7/1995 | Rahmlow | 359/588 |
| 5,438,579 A | 8/1995 | Eda et al. | 372/34 |
| 5,450,431 A | 9/1995 | Glance et al. | |
| 5,475,531 A | 12/1995 | Rahmlow et al. | 359/586 |
| 5,488,511 A | 1/1996 | Rahmlow, Jr. | 359/586 |
| 5,510,215 A | 4/1996 | Prince et al. | 430/7 |
| 5,521,564 A | 5/1996 | Kaneko et al. | 333/175 |
| 5,521,733 A | 5/1996 | Akiyama et al. | 359/127 |
| 5,525,199 A | 6/1996 | Scobey | 204/192.26 |
| 5,563,734 A | 10/1996 | Wolfe et al. | 359/360 |
| 5,596,987 A | 1/1997 | Chance | 128/633 |
| 5,604,588 A | 2/1997 | Goedert | 356/318 |
| 5,612,824 A | 3/1997 | Si et al. | 359/652 |
| 5,614,726 A | 3/1997 | Kaye et al. | 250/574 |
| 5,616,401 A | 4/1997 | Kobayashi et al. | 428/212 |
| 5,677,920 A | 10/1997 | Waarts et al. | 372/6 |
| 5,680,495 A | 10/1997 | Bloom | 385/94 |
| 5,711,889 A | 1/1998 | Buchsbaum | 216/5 |
| 5,712,865 A | 1/1998 | Chow et al. | 372/96 |
| 5,721,802 A | 2/1998 | Francis et al. | 385/137 |
| 5,764,348 A | 6/1998 | Bloom | 356/73.1 |
| 5,764,840 A | 6/1998 | Wach | 385/123 |
| 5,774,278 A | 6/1998 | Kaplan | 359/723 |
| 5,778,014 A | 7/1998 | Islam | 372/6 |
| 5,805,751 A | 9/1998 | Kewitsch et al. | 385/43 |
| 5,805,757 A | 9/1998 | Bloom | 380/137 |
| 5,815,619 A | 9/1998 | Bloom | 385/78 |
| 5,818,986 A | 10/1998 | Asawa et al. | 385/24 |
| 5,828,489 A | 10/1998 | Johnson et al. | 359/487 |
| 5,835,661 A | 11/1998 | Tai et al. | 385/146 |
| 5,861,134 A | 1/1999 | Swanson | 423/335 |
| 5,864,397 A | 1/1999 | Vo-Dinh | 356/301 |
| 5,866,204 A | 2/1999 | Robbie et al. | 427/256 |
| 5,868,855 A | 2/1999 | Fukazawa et al. | 134/1.3 |
| 5,871,559 A | 2/1999 | Bloom | 65/501 |
| 5,872,655 A | 2/1999 | Seddon et al. | 359/588 |
| 5,878,178 A | 3/1999 | Wach | 385/55 |
| 5,901,261 A | 5/1999 | Wach | 385/38 |
| 5,903,585 A | 5/1999 | Dawson et al. | 372/45 |
| 5,909,304 A | 6/1999 | Chang | 359/308 |
| 5,911,017 A | 6/1999 | Wach et al. | 385/115 |
| 5,914,972 A | 6/1999 | Siala et al. | 372/33 |
| 5,917,623 A | 6/1999 | Yoshida | 359/124 |
| 5,917,975 A | 6/1999 | Bloom | 385/78 |
| 5,928,713 A | 7/1999 | Haaland et al. | 427/10 |
| 5,931,983 A | 8/1999 | Bloom | 65/378 |
| 5,948,134 A | 9/1999 | Bloom | 65/376 |
| 5,953,477 A | 9/1999 | Wach et al. | 385/115 |
| 5,970,749 A | 10/1999 | Bloom | 65/378 |
| 5,971,629 A | 10/1999 | Bloom | 385/94 |
| 5,974,207 A | 10/1999 | Aksyuk et al. | 385/24 |
| 5,991,070 A | 11/1999 | Zanoni et al. | 359/341 |
| 5,994,721 A | 11/1999 | Zhong et al. | 257/89 |
| 5,999,684 A | 12/1999 | Bloom | 385/137 |
| 6,000,858 A | 12/1999 | Bloom | 385/94 |
| 6,003,341 A | 12/1999 | Bloom | 65/484 |
| 6,009,115 A | 12/1999 | Ho | 372/92 |
| 6,010,756 A | 1/2000 | Gasworth | 427/576 |
| 6,018,965 A | 2/2000 | Bloom | 65/378 |
| 6,038,061 A | 3/2000 | Sugaya | 359/337 |
| 6,041,072 A | 3/2000 | Ventrudo et al. | |
| 6,043,936 A | 3/2000 | Large | 359/572 |
| 6,044,096 A | 3/2000 | Wolak et al. | 372/36 |
| 6,051,453 A | 4/2000 | Takemura | 438/166 |
| 6,074,101 A | 6/2000 | Bloom | 385/78 |
| 6,076,344 A | 6/2000 | Doujak | 57/9 |
| 6,083,341 A | 7/2000 | Wei et al. | 156/274.4 |
| 6,091,872 A | 7/2000 | Katoot | 385/116 |
| 6,101,210 A | 8/2000 | Bestwick et al. | |
| 6,108,074 A | 8/2000 | Bloom | 356/73.1 |
| 6,111,688 A | 8/2000 | Kobayashi et al. | 359/341 |
| 6,112,555 A | 9/2000 | Bloom | 65/378 |
| 6,121,068 A | 9/2000 | Ramdani et al. | 438/39 |
| 6,144,791 A | 11/2000 | Wach et al. | 385/123 |
| 6,169,830 B1 | 1/2001 | Kewitsch et al. | 385/37 |
| 6,174,424 B1 | 1/2001 | Wach et al. | 205/73 |
| 6,174,749 B1 | 1/2001 | Yuen et al. | 438/35 |
| 6,177,985 B1 | 1/2001 | Bloom | 356/73.1 |
| 6,178,188 B1 | 1/2001 | Jing et al. | 372/36 |
| 6,198,857 B1 | 3/2001 | Grasis et al. | 385/24 |
| 6,208,783 B1 | 3/2001 | Wach | 385/43 |
| 6,208,798 B1 | 3/2001 | Morozov et al. | 385/140 |
| 6,219,474 B1 | 4/2001 | Cai et al. | 385/24 |
| 6,221,509 B1 | 4/2001 | Hirano et al. | 428/620 |
| 6,222,970 B1 | 4/2001 | Wach et al. | 385/115 |
| 6,233,263 B1 | 5/2001 | Chang-Hasnain et al. | 372/32 |
| 6,236,782 B1 | 5/2001 | Kewitsch et al. | 385/43 |
| 6,237,370 B1 | 5/2001 | Bloom | 65/484 |
| 6,244,756 B1 | 6/2001 | Bloom | 385/94 |
| 6,249,365 B1 | 6/2001 | Mizrahi et al. | 359/130 |
| 6,256,148 B1 | 7/2001 | Gasworth | 359/586 |
| 6,269,208 B1 | 7/2001 | Bhatia et al. | 385/37 |
| 6,282,340 B1 | 8/2001 | Nasu et al. | 385/37 |
| 6,289,699 B1 | 9/2001 | Kewitsch et al. | 65/406 |
| 6,298,075 B1 | 10/2001 | Kitaoka et al. | 372/33 |
| 6,300,176 B1 | 10/2001 | Zhang et al. | 438/166 |
| 6,320,888 B1 | 11/2001 | Tanaka et al. | 372/32 |
| 6,341,138 B1 | 1/2002 | Peters et al. | 372/96 |
| 6,351,476 B2 | 2/2002 | Kner et al. | 372/20 |
| 6,354,109 B1 | 3/2002 | Boire et al. | 65/60.1 |
| 6,356,681 B1 | 3/2002 | Chen et al. | 385/37 |
| 6,366,726 B1 | 4/2002 | Wach et al. | 385/115 |
| 6,370,406 B1 | 4/2002 | Wach et al. | 600/310 |
| 6,376,923 B1 | 4/2002 | Sumita et al. | 257/791 |
| 6,392,801 B1 | 5/2002 | Southwell | 359/487 |
| 6,404,953 B1 | 6/2002 | Wach et al. | 385/31 |
| 6,408,125 B1 | 6/2002 | Akwani et al. | 385/142 |
| 6,413,380 B1 | 7/2002 | Pinarbasi | 204/192.11 |
| 6,415,082 B1 | 7/2002 | Wach | 385/39 |
| 6,416,234 B1 | 7/2002 | Wach et al. | 385/70 |
| 6,449,420 B1 | 9/2002 | Akwani | |
| 6,475,557 B1 | 11/2002 | Mori et al. | 427/162 |
| 6,483,635 B1 | 11/2002 | Wach | 359/344 |
| 6,487,349 B2 | 11/2002 | Wach et al. | 385/115 |
| 6,496,523 B1 | 12/2002 | Wach | 372/32 |
| 6,506,289 B2 | 1/2003 | Demaray | |
| 6,514,840 B2 | 2/2003 | Barrett et al. | 438/530 |
| 6,531,710 B1 | 3/2003 | Yu | 257/51 |
| 6,535,533 B2 | 3/2003 | Lorenzen et al. | 372/34 |
| 6,537,623 B2 | 3/2003 | Ouellet et al. | 427/579 |
| 6,542,660 B1 | 4/2003 | Medin et al. | 385/24 |
| 6,542,673 B1 | 4/2003 | Holter et al. | 385/52 |
| 6,548,370 B1 | 4/2003 | Kasahara et al. | 438/FOR. 419 |
| 6,577,658 B1 | 6/2003 | Lee et al. | 372/45 |
| 6,580,734 B1 | 6/2003 | Zimmermann | 372/29.02 |
| 6,580,935 B1 | 6/2003 | Wach et al. | 600/310 |

| | | |
|---|---|---|
| 6,601,411 B2 | 8/2003 | MacDougall et al. ............ 65/378 |
| 6,614,818 B1 | 9/2003 | Kmetec et al. .................. 372/19 |
| 6,621,957 B1 | 9/2003 | Sullivan et al. ................. 385/37 |
| 6,656,996 B2 | 12/2003 | Tsutsumi et al. .............. 524/492 |
| 6,664,307 B2 | 12/2003 | Arnold et al. .................... 522/71 |
| 6,673,858 B2 | 1/2004 | Takeichi et al. ............... 524/430 |
| 6,683,898 B2 | 1/2004 | Ostergaard et al. ............. 372/43 |
| 6,723,209 B2 | 4/2004 | Baldwin et al. .......... 204/192.12 |
| 6,724,797 B2 | 4/2004 | Daiber ............................ 372/92 |
| 6,760,520 B1 | 7/2004 | Medin et al. .................... 385/43 |
| 6,816,530 B2* | 11/2004 | Capasso et al. .............. 372/50.1 |
| 6,872,452 B2 | 3/2005 | Taninaka et al. .............. 428/432 |
| 6,888,667 B2 | 5/2005 | Nicolaescu ................... 359/332 |
| 6,961,183 B2 | 11/2005 | Wada et al. .................... 359/584 |
| 6,992,818 B2 | 1/2006 | Betin et al. |
| 7,027,677 B2 | 4/2006 | Li et al. ............................ 385/14 |
| 7,099,357 B2 | 8/2006 | Kim |
| 2002/0061163 A1 | 5/2002 | Bartur et al. |
| 2002/0071159 A1 | 6/2002 | Lange et al. .................. 359/152 |
| 2002/0181908 A1 | 12/2002 | Pedersen et al. .............. 385/123 |
| 2003/0021306 A1* | 1/2003 | Fernald et al. .................. 372/20 |
| 2003/0063636 A1 | 4/2003 | Sasaki ............................. 372/32 |
| 2003/0072890 A1 | 4/2003 | Miyazawa .................... 427/554 |
| 2003/0087121 A1 | 5/2003 | Domash et al. ................ 428/641 |
| 2003/0105191 A1 | 6/2003 | Arnold et al. .................. 523/466 |
| 2003/0161363 A1 | 8/2003 | Wolf et al. ...................... 372/34 |
| 2003/0169959 A1 | 9/2003 | Jacobowitz et al. ............ 385/16 |
| 2003/0219048 A1 | 11/2003 | Couch |
| 2003/0231666 A1* | 12/2003 | Daiber et al. .................... 372/34 |
| 2004/0062945 A1 | 4/2004 | Domash et al. ................ 428/641 |
| 2004/0129931 A1 | 7/2004 | Asryan et al. .................... 257/14 |
| 2004/0131102 A1 | 7/2004 | Jette et al. |
| 2004/0228564 A1 | 11/2004 | Gunn et al. |
| 2005/0053103 A1* | 3/2005 | Lo et al. .......................... 372/20 |
| 2005/0063044 A1 | 3/2005 | Michie et al. .................. 359/344 |
| 2006/0002443 A1 | 1/2006 | Farber et al. |
| 2008/0219304 A1 | 9/2008 | Kupershmidt et al. |

FOREIGN PATENT DOCUMENTS

| | | |
|---|---|---|
| EP | 0 611 097 A1 | 8/1994 |
| JP | 60217315 | 10/1985 |
| JP | 61282803 | 12/1986 |
| JP | 02034806 | 2/1990 |
| JP | 63060410 | 3/1998 |
| JP | 10-327128 | 12/1998 |
| WO | WO 97/06616 | 2/1997 |
| WO | WO 99/21316 | 4/1999 |
| WO | WO 02/27385 A2 | 4/2002 |
| WO | WO 02/47128 | 6/2002 |
| WO | WO 02/055974 | 7/2002 |
| WO | WO 02/071630 | 9/2002 |
| WO | WO 03/041232 | 5/2003 |

OTHER PUBLICATIONS

"An All-Silicon Raman Laser," by Haisheng Rong, Ansheng Liu, Richard Jones, Oded Cohen, Dani Hak, Remus Nicolaescu, Alexander Fang, and Mario Paniccia, Nature, vol. 433, Jan. 20, 2005.
"Silicon Shines On," by Jerome Faist, Nature vol. 433, Feb. 17, 2005.
"Continuous Silicon Laser, Intel researchers create the first continuous silicon laser based on the Raman effect using standard CMOS technology," by Sean Koehl, Victor Krutul, and Mario Paniccia, published by Intel Corporation as a white paper, 2005.
"Intel's Research in Silicon Photonics Could Bring High-speed Optical Communications to Silicon," by Mario Paniccia, Victor Krutul, and Sean Koehl, published by Intel Corporation as a white paper, Feb. 2004.
"Silicon Photonics," by Mike Salib, Ling Liao, Richard Jones, Mike Morse, Ansheng Liu, Dean Samara-Rubio, Drew Alduino, and Mario Paniccia, Intel Technology Journal, vol. 08, Issue 02, May 10, 2004.
"Introducing Intel's Advances in Silicon Photonics," by Mario Paniccia, Victor Krutul, Sean Koehl, published by Intel Corporation as a white paper, Feb. 2004.
"Intel Unveils Silicon Photonics Breakthrough: High-Speed Silicon Modulation," by Mario Paniccia, Victor Krutul, and Sean Koehl, Technology@Intel_Magazine, Feb./Mar. 2004.
"Silicon Oxynitride Layers for Applications in Optical Waveguides," by Feridun Ay, Master Degree Thesis, Bilkent University, Sep. 2000.

"Distributed Feedback-Distributed Bragg Reflector Coupled Cavity Laser with a Ti(Fe:)Er:LiNbO_3 Waveguide," by Bijoy K. Das, Raimund Ricken, Viktor Quiring, Hubertus Suche, and Wolfgang Sohler, Optics Letters vol. 29, No. 2, Jan. 15, 2004.
"An Uncooled External Cavity Diode Laser for Coarse-WDM Access Network Systems," Toshiwa Sato, Fumihiko Yamamoto, Khoji Tsuji, Hiroki Takesue, and Tsuneo Horiguchi, IEEE Photonics Tech. Letters, vol. 14, No. 7, Jul. 2002.
"Wavelength Stabilization and Spectrum Narrowing of High-Power Multimode Laser Diodes and Arrays by Use of Volume Bragg Gratings," B. Volodin, S. Dolgy, E. Melnik, E. Downs, J. Shaw, and V. Ban, Optics Letters, vol. 29, No. 16, Aug. 15, 2004.
Actively Mode-Locked GaInAsP Laser with Subpicosecond Output; Corzine; Applied Physics Letters; vol. 52, No. 5; Feb. 1988; pp. 348-350.
Adhesives Deliver Low Shrink, Low Stress Bond and Fast UV Cure; Rhodes; Dymax Corporation; Sep. 2000; 18 pages.
Active Materials for Integrated Optic Applications; Hayden; Schott Glass Technologies, Inc. and National Institute of Standards and Technology; Sep. 1999; pp. 186-196.
Alignment Tolerant Lasers and Silicon Waferboard Integration; Dagenais; University of Maryland, Department of Electrical Engineering and Laboratory for Physical Sciences; SPIE; 1997; 11 pages.
Arrays of Distributed-Bragg-Reflector Waveguide Lasers at 1536 nm in Yb/Er Codoped Phosphate Glass; Veasey; Applied Physics Letters; vol. 74, No. 6; Feb. 8, 1999; pp. 789-791.
Alignment-Insensitive Technique for Wideband Tuning of an Unmodified Semiconductor Laser; Bernacki; Optics Letters No. 9; Sep. 1988; pp. 725-727.
Axial-Mode Instability in Tunable External-Cavity Semiconductor Lasers; Zorabedian; IEEE Journal of Quantum Electronics; vol. 30, No. 7; Jul. 1994; pp. 1542-1552.
All-Fiber Zero-Insertion-Loss Add-Drop Filter for Wavelength-Division Multiplexing; Kewitsch; Optical Letters; vol. 23, No. 2; Jan. 15, 1998; pp. 106-108.
Asymmetric Twin-Waveguide 1.55-μm Wavelength Laser with a Distributed Bragg Reflector; Studenkov; IEEE Photonics Technology Letters; vol. 12, No. 5, May 2000; pp. 468-470.
All-Fiber Optical Add-Drop Multiplexer Based on a Selective Fused Coupler and a Single Fiber Bragg Grating; Ortega; Applied Optics; vol. 37, No. 33; Nov. 20, 1998; pp. 7712-7717.
$Al_2O_3$ Coating of ZnO Nanorods by Atomic Layer Deposition; Min; Journal of Crystal Growth 252; 2003; pp. 565-569.
Agilent Technologies' Singlemode Small Form Factor (SFF) Module Incorporates Micromachined Silicon, Automated Passive Alignment, and Non-Hermetic Packaging to Enable the Next Generation of Low-Cost Fiber Optics Transceivers; Owen; 49th Electronic Components and Technology Conference, San Diego, CA; Jun. 1-4, 1999; pp. 182-187.
Alignment Tolerant Structures for Ease of Optoelectronic Packaging; Dagenais; SPIE Conference on Testing, Packaging, and Reliability of Semiconductor Lasers IV; San Jose CA; SPIE vol. 3626; Jan. 1999; pp. 128-137.
Application of Planar Lightwave Circuit Platform to Hybrid Integrated Optical WDM Transmitter/Receiver Module; Yamada; Electronics Letter vol. 31, No. 16; Aug. 3, 1995; pp. 1366-1367.
Band-Edge Electroabsorption in Quantum Well Structures: The Quantum-Confined Stark Effect; Miller; Physical Review Letters (The American Physical Society) vol. 53, No. 22; Nov. 26, 1984; pp. 2173-2176.
Beam Express Demos Tunable 1550nm VCSEL; Compound Semiconductor.Net; Oct. 15, 2002; 2 pages.
Broad Area Laser; Eagleyard Photonics (Product Specification Sheet); Jun. 17, 2003; 1 page.
High-Performance 1.6 μm Single-Epitaxy Top-Emitting VCSEL;Yuen; Bandwidth 9; (Web-published article and accompanying web page of Bandwidth9); 2000; 3 pages.
Bragg Grating Manufacturing: Techniques and Practices; Baldwin; Systems Planning and Analysis, Inc.; Serial: 155-00; www.spa-inc.net; Apr. 14, 2004; 6 pages.
A Broadband Access Network Based on Optical Signal Processing: The Photonic Highway; Yamaguchi; IEEE 1990; pp. 1030-1037.

*CWDM Moves Towards Standardization*; Eighenbaum; Lightwave; May 2002; p. 32.
*Compact Mode Expanded Lasers Using Resonant Coupling Between a 1.55-µm InGaAsP Tapered Active Region and an Underlying Coupling Waveguide*; Saini; IEEE Photonics Technology Letters; vol. 10, No. 9; Sep. 1998; pp. 1-3.
*Continuously Tunable High Power Fiber Lasers with 11 nm Tunability*; Pan; Web-published White Paper of E-TEK Dynamics, Inc. 2000; 5 pages.
*Continuously Tunable High Power Miniature Fiber Laser Transmitters for High Speed DWDM Networks*; Pan; Web-published White Paper of E-TEK Dynamics, Inc. 2000; 3 pages.
*Calculation of $\Delta n^2$ and κ for an Acoustically Induced Distributed Bragg Reflector (ADBR)*; Irby; IEEE Journal of Quantum Electronics, vol. 34, No. 2, Feb. 1998; pp. 213-224.
*Characteristics of a Grating-External-Cavity Semiconductor Laser Containing Intracavity Prism Beam Expanders*; Zorabedian; Journal of Lightwave Technology, vol. 10, No. 3, Mar. 1992; pp. 330-335.
*Complex Needs Drive Optoelectronic Integration*; Dagenais; Optoelectronics World, Jul. 1998; pp. 157-160.
*A Coupled-Waveguide Grating Resonator Filter*; Huang; IEEE Photonics Technology Letters, vol. 4, No. 8; Aug. 1992; pp. 884-886.
*Computer-Generated Waveguide Holograms by Double-Ion Exchange Process in Glass*; Saarinen; Electronic Letters, vol. 28, 1992; pp. 876-878.
*Coupled-Mode Theory for Corrugated Optical Waveguides*; Hall; Optics Letters, vol. 15, No. 11; Jun. 1, 1990; pp. 619-621.
*Ceramic Substrate with Negative Thermal Expansion for Athermalization of Fiber Bragg Gratings*; Sakamoto; IEICE Trans Electron, vol. E83-C, No. 9; Sep. 2000; pp. 1441-1445.
*Polarization Mode Dispersion (PMD): What is the Statistical Method for Determining Link PMD and Why is it Important*; Whitman; White Paper of Corning Incorporated; 1999; 9 pages.
*Corning® Single-Mode Optical Fiber, SMF-28™ Fiber*, Product Information; Product Literature of Corning Incorporated; Jul. 2000; 4 pages.
*Choosing Ball or GRIN Lenses*; Clark; White Paper of Deposition Sciences, Inc.; 2002; 4 pages.
*Coarse Wavelength Division Multiplexing—A Low Cost Solution for Increasing Return Path Capacity*; Maycock; Paper of Maeco Communications Ltd and Gigabit Optics Corporation; Maycock; Jul. 10, 2002; 7 pages.
*Characterization of the Negative Thermal Expansion Material $Zr_{1-x}Hf_xW_2O_8$*; Rong; Rare Metals, vol. 22, No. 2, Jun. 2003; pp. 107-111.
*Computing at the Speed of Light (Seminar)*; Bezjak; Apr. 2005; 45 pages.
*CWDM, Technology, Standards, Economics & Applications*; 2002; 26 pages.
*Dynamics of Extended-Cavity Semiconductor Lasers*; Web publication; Ramunno; 1999/2001; 5 pages.
*Detuned Loading Effect and High-Speed Modulation of Fiber Grating Semiconductor Lasers*; Fan; IEEE Photonic Technology Letters; 1998; pp. 1784-1786.
*Dynamic Wavelength Tuning Characteristics of the 1.5-µm Three-Section DBR Lasers: Analysis and Experiment*; Teshima; IEEE Journal of Quantum Electronics, vol. 31, No. 8; Aug. 1995; pp. 1389-1400.
*Dynamic Responses of Widely Tunable Sampled Grating DBR Lasers*; Lee; IEEE Photonic Technology Letters, vol. 8, No. 12; Dec. 1996; pp. 1597-1599.
*Design, Fabrication, and Performance of Infrared and Visible Vertical-Cavity Surface-Emitting Lasers*; Chow; IEEE Journal of Quantum Electronics, vol. 33, No. 10; Oct. 1997; pp. 1810-1824.
*Demonstration of a Semiconductor External Cavity Laser Utilising a UV Written Grating in a Planar Silica Waveguide*; Maxwell; The Institute of Electrical Engineers; 1994.
*Distributed Feedback Resonators*; Haus; Large-Scale Structures in Acoustics and Electromagnetics: Proceedings of a Symposium—Commission on Physical Sciences, Mathematics, and Applications; 1996; pp. 50-71.

*Double-Pass EA Modulator Array Monolithically Integrated with Passive-Waveguide*; Yamada; IEICE Transactions in Electronics; vol. E81-C, No. 8; Aug. 1998; pp. 1245-1250.
*Development of the Wavelength Locker with the High Temperature-Stability*; Sakai; Technical Report Paper; 2002; pp. 20-27.
*Design of Sampled Grating DBR Lasers with Integrated Semiconductor Optical Amplifiers*; Mason; IEEE Photonics Technology Letters; vol. 12. No. 7; Jul. 2000; pp. 762-763.
*Demonstration of a Semiconductor External Cavity Laser Using a UV Written Grating in a Planar Silica Waveguide*; Maxwell; Electronic Letters; vol. 30, No. 18; Sep. 1, 1994; pp. 1486-1487.
*Digitally Tunable Diode Laser*; Web Publication; Gutin; InterScience Inc. 1999; 1 page.
*Double-Ion-Exchange Process in Glass for the Fabrication of Computer-Generated Waveguide Holograms*; Saarinen; Applied Optics; vol. 33, No. 16; Jun. 1, 1994; pp. 3353-3359.
*Dispersion-Free Fibre Bragg Grating*; Ibsen; Optical Society of America; 2000; pp. MC1-1 through MC1-3.
*Design of Grating-Assisted Waveguide Coupler with Weighted Coupling*; Winick; Journal of Lightwave Technology; vol. 9, No. 11; Nov. 1991; pp. 1481-1492.
*Dopant Diffusion During Optical Fibre Drawing*; Lyytikainen; Optics Express; vol. 12, No. 6; Mar. 22, 2004; pp. 972-977.
*Dielectric Multilayered Interference Filters Deposited on Polymide Films*; Oguchi; Electronics Letters; vol. 27, No. 9; Apr. 25, 1991; 3 pages.
*Detection Reflections*; Espinasse; SPIE's OEMagazine; Mar. 2004; pp. 24-26.
*Definitions of Parameters 2001, CyOptics White Paper WP-011101-B*; 2001; 4 pages.
*Design and Fabrication of Highly-Dense Optical Components for In-Service Fiber Testing and Monitoring in Subscriber Loops*; Oguchi; IEICE Trans. Electron.; vol. E80-C, No. 1; Jan. 1997; pp. 123-128.
*A Diode-Pumped Channel Waveguide Laser Fabricated in Nd:Phospate Glass*; Patel; Fourteenth Topical Meeting on Optical Society of America Advanced Solid-State Lasers; Jan. 29, 1999; 5 pages.
*Design and Qualification of Hermetically Packaged Lithium Niobate Optical Modulator*; Moyer; IEEE Transactions on Components, Packaging, and Manufacturing Technology—Part B; vol. 21, No. 2; May 1998; pp. 130-135.
*Design Methodology for Guided-Wave Photonic Devices*; Yip; Chapter 13, Handbook of Photonics; CRC Press; 1997; pp. 530-587.
*ONS 15454 MSTP DWDM Networking Primer*; Web-Posted Presentation; Oct. 2003; 87 pages.
*Extremely Low Room-Temperature Threshold Current Density Diode Lasers Using InAs Dots in $In_{0.15}G_{0.85}$ Quantum Well*; Liu; Electronics Letters; vol. 35, No. 14; Jul. 8, 1999; 2 pages.
*The Expanded Mode Laser—A Route to Low Cost Optoelectronics*; Robertson; IEICE Trans. Electron.; vol. E80-C, No. 1; Jan. 1997; pp. 17-23.
*Electric Field Dependence of Optical Absorption Near the Band Gap of Quantum-Well Structures*; Miller; Physical Review B; vol. 32, No. 2; Jul. 15, 1985; pp. 1043-1060.
*Extended Tuning Range in Sampled Grating DBR Lasers*; Jayaraman; IEEE Photonics Technology Letters; vol. 5, No. 5; May 1993; pp. 103-105.
*External-Cavity Diode Lasers for Ultra-Dense WDM Networks*; Sykes; Lightwave; Mar. 2001; pp. 130-134.
*Electroabsorption in GaAs / AlGaAs Coupled Quantum Well Waveguides*; Islam; Appl. Phys. Lett. vol. 50, No. 16; Apr. 20, 1987; pp. 1098-1100.
*Electric-Field Dependence of Linear Optical Properties in Quantum Well Structures*; Miller; IEEE Journal of Quantum Electronics; vol. QE-22, No. 9; Sep. 1986; pp. 1816-1830.
Press Release: *E20 Communications Announces Breakthrough in 1310 nm-1550 nm Long-Wavelength VCSEL Technology; Technology Introduced at IEEE LEOS Post-Deadline Paper; Capable of Supporting CWDM and DWDM Wavelengths at Lowest Possible Cost*; PR Newswire; Nov. 4, 2003; 2 pages.
*Edge Emitting Lasers*; Web Publication; Dec. 6, 2000; 9 pages.

*Experimental Optimization of Double Ion-Exchange in Glass for Computer-Generated Waveguide Holograms*; Saarinen; SPIE vol. 1794; Integrated Optical Circuits II; 1992; 8 pages.
*Effect of Fabrication Errors in Channel Waveguide Bragg Gratings*; Coppola; Applied Optics; vol. 38, No. 9; Mar. 20, 1999; pp. 1752-1757.
*Effect of Ion Assisted Deposition on Optical Scatter and Surface Microstructure of Thin Films*; Al-Jumaily; J. Vac. Sci. Technol.; vol. A3 No. 3; May/Jun. 1985; pp. 651-655.
*The Effect of Polymer Architecture on the Aqueous Base Development of Phot resists*; Barclay; Polymer Preprintes—America; vol. 40, No. 1; 1999; pp. 438-439.
*Enhanced Photosensitivity in Lightly Doped Standard Telecommunication Fibre Exposed to High Fluence ArF Excimer Laser Light*; Malo; Electronics Letters; vol. 31. No. 11; May 25, 1995; pp. 879-880.
*Effects of Random Phase and Amplitude Errors in Optical Fiber Bragg Gratings*; Feced; Journal of Lightwave Technology; vol. 18, No. 1; Jan. 2000; pp. 90-101.
*Enhanced UV Photosensitivity in Boron Codoped GermanoSilicate Fibres*; Williams; Electronics Letters vol. 29, No. 1; Jan. 7, 1993; pp. 45-47.
*Erbium: Ytterbium Planar Waveguide Laser in Ion-Exchanged Glass*; Winick; SPIE vol. 2996; 1997; pp. 121-134.
*Engineering Properties of High Refractive Index Optical Gels for Photonic Device Applications*; Stone; Proceedings of the SPIE; vol. 3937; Micro- and Nano-Photonic Materials and Devices; Jan. 27-28, 2000; 13 pages.
*Fiberoptic Tutorial*; Lee; Web Publication of Nanoptics; Sep. 9, 2000; 8 pages.
*Fields in Extended Cavity Lasers*; Clarke; IEEE Journal of Quantum Electronics; vol. 34. No. 5; May 1988; pp. 833-411.
*Fiber-Grating External-Cavity Laser Diode Module for 2.5 Gb/s Dense WDM Transmission*; Takagi; ECOC'98, Madrid, Spain; Sep. 1998; pp. 81-82.
*Fiber-Grating Semiconductor Laser Modules for Dense-WDM Systems*; Kato; IEICE Trans. Commun; vol. E82-B; No. 2; Feb. 1999; pp. 409-411.
*Fiber-Grating Based WDM Transmitters for OC-48 Applications*; Verdiell; SPIE vol. 3038; pp. 67-77.
*Fibre Bragg Grating Fabrication Using Fluoride Excimer Laser for Sensing and Communication Applications*; Sun; Lasers for Science Facility Programme—Physics, Central Laser Facility Annual Report 2001/2002; pp. 147-149.
*Fabrication and Characterization of Graded Refractive Index Silicon Oxynitride Thin Films*; Callard; J. Vac. Sci. Technol.; A vol. 15, No. 4; Jul./Aug. 1997; pp. 2088-2094.
*Filter-Embedded Design and Its Applications to Passive Components*; Yanagawa; Journal of Lightwave Technology; vol. 7, No. 11; Nov. 1989; pp. 1646-1653.
*Fabrication of Tapered, Strain-Gradient Chirped Fibre Bragg Gratings*; Putnam; Electronics Letters; Feb. 16, 1995; vol. 31, No. 4; pp. 309-310.
*Fabrication of Buried Corrugated Waveguides by Wafer Direct Bonding*; Pelissier; Journal of Lightwave Technology; vol. 18, No. 4; Apr. 2000; pp. 540-545.
*Fine-Tuned Profile Simulation of Holographically Exposed Photoresist Gratings*; Zanke; Optics Communications 154; Aug. 15, 1998; pp. 109-118.
*Fabrication of Ridge Waveguides: A New Solgel Route*; Fardad; Applied Optics; vol. 37, No. 12; Apr. 20, 1998; pp. 2429-2434.
*FlexFilter Tunable Grating Filter*; Product Sheet of Bragg Photonics, Inc.; Sep. 2001; 2 pages.
*Coolerless Coaxial FP Laser Diode*; Data Sheet of Fitel; Feb. 15, 2002; 3 pages.
*Fermionics Lasertech Inc. Product Data Sheet*; Feb. 2, 2000; 3 pages.
*Fiber Grating Spectra*; Erdogan; Journal of Lightwave Technology; vol. 15, No. 8; Aug. 1997; pp. 1277-1294.
*Fabrication of Diffractive Optics: Surface Reliefs and Artificial Dielectrics*; Arnone; Diffractive Optics and Optical Mircosystems; 1997; pp. 119-131.

*Fabrication of Bragg Gratings in Silicon-on-Insulator Waveguides*; Subramanian; M.S. Thesis, Dept. of Electrical and Computer Engineering, University of Alberta; Sep. 19, 2002; 131 pages.
*Flip-Chip Approach to EndFire Coupling Between Single-Mode Optical Fibres and Channel Waveguides*; Hsu; Electronics Letters; vol. 12; Jul. 5, 1976 pp. 404-405.
*Finite-Element Full-Vectorial Propagation Analysis for Three-Dimensional z-Varying Optical Waveguides*; Montanari; Journal of Lightwave Technology; vol. 16, No. 4; Apr. 1998; pp. 703-713.
*Fiber Vista: An FTTH or FTTC System Delivering Broadband Data and CATV Services*; Wilson; Bell Labs Technical Journal; Jan.-Mar. 1999; pp. 300-322.
*A Design Concept of Fiber-Optic Wavelength-Division-Multiplexing Subscriber Loop Systems*; Miki; vol. 73, 1980; pp. 41-45.
*Gain and Linewidth Enhancement Factor in InAs Quantum-Dot Laser Diodes*; Newell; IEEE Photonics Technology Letters; vol. 11, No. 12; Dec. 1999; pp. 1527-1529.
*Grating-Assisted Coupling of Light Between Semiconductor and Glass Waveguides*; Butler; Journal of Lightwave Technology; vol. 16, No. 6; Jun. 1998; pp. 1038-1048.
*Generation of Ultrashort Electrical Pulses Through Screening by Virtual Populations in Biased Quantum Wells*; Chemla; Physical Review Letters; vol. 59, No. 9; Aug. 31, 1987; pp. 1018-1021.
*Grating Formation in a Germanium Free Silicon Oxynitride Fibre*; Dianov; Electronics Letters; vol. 33, No. 3; Jan. 30, 1997; pp. 236-238.
*Grating Formation in BGG31 Glass by UV Exposure*; Provenzano; Electronics Letters; vol. 35, No. 16; Aug. 5, 1999; pp. 1332-1334.
*Gratings Photowritten in Ion-Exchanged Glass Channel Waveguides*; Geraghty; Electronics Letters; vol. 35, No. 7; Apr. 1, 1999; pp. 585-587.
*Grating-Assisted Codirectional Coupler Filter Using Electro-Optic and Passive Polymer Waveguides*; Ahn; Optics Communications; vol. 197; Oct. 1, 2001; pp. 289-293.
*High-Performance Filters for Dense Wavelength Division Multiplex Fiber Optic Communications*; Pan; Web-Published White Paper of E-Tek Dynamics; 1999; 6 pages.
*Glass Waveguides by Ion Exchange: A Review*; Findakly; Optical Engineering; vol. 24, No. 2; Mar./Apr. 1985; p. 244-250.
*High-Speed Modular Testing Overcomes Challenges of Chirp*; Dickerson; WDM Solutions; Dec. 2001; 5 pages.
*High Reliability Non-hermetic 1.3 μm InP-Based Uncooled Lasers*; Chand; SPIE vol. 2610; Jan. 1996; pp. 46-57.
*Hybrid Sol-Gel Materials for Integration of Optoelectronic Components*; Fardad; Journal of Lightwave Technology; vol. 19, No. 1; Jan. 2001; pp. 84-91.
*High Temperature Operation with Low-Loss Coupling to Fibre for Narrow-Beam 1.3 μm lasers with butt-jointed selective grown spotsize converter*; Tohmori; Electronic Letters; vol. 31, No. 21; Oct. 12, 1995; pp. 1838-1840.
*High Stability Laser Sources*; Pan; Web-Published White Paper of E-Tek Dynamics; 1999; 6 pages.
*Hybrid Integrated Silicon Optical Bench Planar Lightguide Circuits*; Gates; 1998 Electronic Components and Technology Conference; 1998; pp. 551-559.
*High-Power Near-Diffraction-Limited External Cavity Laser, Tunable from 1030 to 1085 nm*; Morgott; Electronics Letters; vol. 34, No. 6; Mar. 19, 1998; pp. 558-559.
*Hybrid Integrated External Cavity Laser Without Temperature Dependent Mode Hopping*; Tanaka; Electronics Letters; vol. 35, No. 2; Jan. 21, 1999; pp. 149-150.
*High-Frequency Bragg Gratings in a Photothermorefractive Glass*; Efimov; Optics Letters; vol. 25, No. 23; Dec. 1, 2000; pp. 1693-1695.
*High Power Near Diffraction Limited External Cavity Single-Angled Facet Tapered Lasers, Tunable from 1.505 to 1.565 μm and 0.795 to 0.855 μm with High Spectral Purity*; Cho; Presentation Summary; IEEE; 1999; pp. 348-349.
*High Efficiency Coupling for High Aspect Ratio Laser Diodes*; Oleskevich; SPIE vol. 2610; Jan. 1996; pp. 246-254.
*High-Efficiency Continuous Surface-Relief Gratings for Two-Dimensional Array Generation*; Ehbets; Optics Letters; vol. 17, No. 13; Jul. 1, 1992; pp. 908-910.

*Hybrid Integration Optimizes PLC Module Design*; Shine; WDM Solutions; Nov. 2001; pp. 51-54.
*High-Efficiency Bragg Gratings in Photothermorefractive Glass*; Efimov; Applied Optics; vol. 38, No. 4; Feb. 1, 1999; pp. 619-627.
*Ion Beam Bombardment Effects During Film Deposition*; Special Series on Irradiation Enhanced Adhesion; Rossnagel; Vacuum; vol. 38, No. 2; 1988; pp. 73-81.
*Ion-Based Methods for Optical Thin-Film Deposition*; Martin; 1986; Chapman and Hall Ltd.; pp. 1-25.
*Ion-Assisted Deposition of Optical Thin Films: Low Energy Vs High Energy Bombardment*; NcNeil; Applied Optics; vol. 23, No. 4; Feb. 15, 1984; pp. 552-559.
*Ion-Beam-Assisted Deposition and Synthesis*; Rossnagel; MRS Bulletin; Feb. 16/Mar. 16, 1987; pp. 40-49.
*Ion-Exchanged Waveguide Lasers in $Er^{3+}/Yb^{3+}$ Codoped Silicate Glass*; Peters; Applied Optics; Nov. 20, 1999; vol. 38, No. 33; pp. 6879-6886.
*Integrated Optic Laser Emitting at 906, 1057, and 1358 nm*; Malone; Electronics Letters; vol. 29, No. 8; Apr. 15, 1993; pp. 691-692.
*Integrated External Cavity Laser Composed of Spot-Size Converted LD and UV Written Grating in Silicia Waveguide on Si*; Tanaka; Electronics Letter; vol. 32, No. 13; Jun. 20, 1996; pp. 1202-1203.
*Infineon Accelerates 1310 nm VCSEL Production*; Web Publication of fibers.org; Jun. 9, 2003; 2 pages.
*Indium Phosphide Addresses 10-Gbits/s Metro Demand*; Volterra; Laser Focus World; Apr. 2002; 5 pages.
*Impact of Near-End Residual Reflectivity on the Spectral Performance of High-Power Pump Lasers*; Davis; IEEE Journal of Quantum Electronics; vol. 40, No. 4; Apr. 2004; pp. 354-363.
*Interference-Filter-Tuned, Alignment-Stabilized, Semiconductor External-Cavity Laser*; Zorabedian; Optics Letters; vol. 13, No. 10; Oct. 1988; pp. 826-828.
*Indium Phosphide-Based Optoelectronic Wavelength Conversion for High-Speed Optical Networks*; Hutchinson; Intel Technology Journal; vol. 8, Issue 2; May 10, 2005; pp. 161-171.
*Integrated-Optic Dispersion Compensator That Uses Chirped Gratings*; Brooks; Optics Letters; vol. 20, No. 4; Feb. 15, 1995; pp. 368-370.
*An Integrated PC-Based Characterization System for Optical Waveguides*; Singh; Rev. Sci. Instrum.; vol. 66, No. 3; Mar. 1995; pp. 2690-2694.
*Ion-Exchanged Waveguide Add/Drop Filter*; Geraghty; Electronics Letters; vol. 37, No. 13; Jun. 21, 2001; pp. 829-831.
*In Situ Laser Reflectometery Applied to the Growth of $Al_xGa_{1-x}$ As Bragg Reflectors by Metalorganic Chemical Vapour Deposition*; Electronics Letters; vol. 27, No. 2; Jan. 17, 1991; pp. 155-157.
*Ion-Beam Sputtering*; Itoh; Handbook of Thin Film Process Technology; IOP Publishing Ltd; 1995; pp. A3.3:1-A3.3:12.
*Interferometric Measurement of Refractive Index Change in Photosensitive Glass*; Dennis; Submitted Paper to Applied Optics Aug. 2000; 10 pages.
*In Situ Control of the Growth of GaAs/GaAlAs Structures in a Metalorganic Vapour Phase Epitaxy Reactor by Laser Reflectometry*; Azoulay; Journal of Crystal Growth; vol. 145; 1994; pp. 61-67.
*Ion Beam for Thin Films*; Sobie; Vacuum and ThinFilm; Apr. 1999; pp. 36-40.
*Indium Phosphide, What is Indium Phosphide*; Web Publication of CyOptics; 2001; 1 page.
*Insertion Loss Reduction Between Single-Mode Fibers and Diffused Channel Waveguides*; Albert; Applied Optics; vol. 27, No. 23; Dec. 1, 1988; pp. 4837-4843.
*Integrated Optical Components in Substrate Glasses*; Roβ; Glastech. Ber. 62 (1989) Nr. 8; pp. 285-297.
*Infineon's New Triplexer Delivers Both Digital Services and Analog Video in Fiber-to-the-X Applications*; Web Publication of Lightwave; Jun. 24, 2004; 2 pages.
*Intrinsic Bistability of Luminescence and Stimulated Emission in Yb- and Tm-Doped Glass*; Physical Review Letters; vol. 84, No. 9; Feb. 28, 2000; pp. 1898-1901.
*Ion-Exchanged Er/Yb Waveguide Laser at 1.5 μm Pumped by a Laser Diode*; Roman; Electron. Lett.; vol. 31, No. 16; 1995; pp. 1345-1346.

*Ion-Exchanged Tapered-Waveguide Laser in Neodymium-Doped BK7 Glass*; Hettrick; Optics Letters; vol. 25, No. 19; Oct. 1, 2000; pp. 1433-1435.
*Ion-Exchanged Glass Waveguides: A Review*; Ramaswamy; Journal of Lighwave Technology; vol. 6, No. 6; Jun. 1988; pp. 984-1001.
*Lasing Wavelength Changes Due to Degradation in Buried Heterostructure Distributed Bragg Reflector Lasers*; Mawatari; Journal of Lightwave Technology; vol. 17, No. 5; May 1999; pp. 918-923.
*Laser Arrays May Provide DWDM Measurement Tool*; Veasey; Laser Focus World; May 1999; 3 pages.
*Low-Cost Wavelength Stabilized Plug and Play Lasers for WDM Systems in Future Local Networks*; Helmers; Electronics Letters; vol. 37, No. 16; Aug. 2, 2001; pp. 1012-1014.
*Longitudinal Mode Competition in Chirped Grating Distributed Feedback Lasers*; Winick; IEEE Journal of Quantum Electronics; vol. 35, No. 10; Oct. 1999; pp. 1402-1411.
*Lens-Coupled Laser-Diode Module Integrated on Silicon Platform*; Nakagawa; Proceedings of SPIE; vol. 2610; 1996; pp. 59-64.
*Laser Frequency Stabilization by Means of Optical Self-Hetrodyne Beat-Frequency Control—A Tutorial*; Web Publication; Sep. 7, 2001; 12 pages.
*Loss in Low-Finesse Ti $LiNbO_3$ Optical Waveguide Resonator*; Regener; Applied Physics B 36; 1985; pp. 143-147.
*Laser-Induced Damage of Photo-Thermo-Refractive Glasses for Optical-Holographic-Element Writing*; Efimov; SPIE vol. 3578; Sep.-Oct. 1998; pp. 564-575.
*Loss Measurements in Thin-Film Optical Waveguides*; Weber; Applied Optics; vol. 12, No. 4; Apr. 1973; pp. 755-757.
*Laser Reflectometry In Situ Measurement of Lead Zirconate Titanate Film Growth*; Beaudoin; Applied Optics; vol. 36, No. 3; Jan. 20, 1997; pp. 655-657.
*Low Noise and Efficient Fibre Coupling Using a Multimode Fibre for Single Mode Applications*; Tice; 1992; 19 pages.
*Low-Loss Fiber-Matched Low-Temperature PECVD Waveguide With Small-Core Dimensions for Optical Communication Systems*; Hoffmann; IEEE Photonics Technology Letters; vol. 9, No. 9; Sep. 1997; pp. 1238-1240.
*Multichannel Wavelength Division Multiplexing with Photonic Crystals*; Sharkawy; Applied Optics; vol. 40, No. 14; May 10, 2001; pp. 2247.
*Mode Hopping Conrol and Lasing Wavelength Stabilization of Fiber Grating Lasers*; Hashizume; Furukawa Review; No. 20; pp. 7-10.
*Modification of Refractive Index in Silicon Oxynidride Films During Deposition*; Materials Letters; vol. 45; Aug. 2000; pp. 47-50.
*Multifrequency Laser with Reduced Intracavity Wave Mixing*; Doerr; IEEE Photonics Technology Letters; vol. 11, No. 6, Jun. 1999; pp. 635-637.
*Modeling Noise and Modulation Performance of Fiber Grating External Cavity Lasers*; Premaratne; IEEE Journal of Selected Topics in Quantum Eletonics; vol. 3, No. 2; Apr. 1997; pp. 290-303.
*Metalorganic Vapor-Phase Epitaxial Growth of Vertically Well-Aligned ZnO Nanorods*; Park; Applied Physics Letters; vol. 80, No. 22; Jun. 3, 2002; pp. 4232-4234.
*MMI Multiplexer for Dual-Channel Erbium-Doped Waveguide Amplifiers*; Bakhtazad; Optics Express; vol. 9, No. 4; Aug. 13, 2001; pp. 178-183.
*Measurement of the Modal Reflectivity of an Antireflection Coating on a Superluminescent Diode*; Kaminow; IEEE Journal of Quantum Electronics; vol. OE-19, No. 4; Apr. 1983; pp. 493-495.
*Mechanical Reliability of Metallized Optical Fiber for Hermetic Terminations*; Bubel; Journal of Lightwave Technology; vol. 7, No. 10; Oct. 1989; pp. 1488-1492.
*Method of Fixing an Optical Fibre in a Laser Package*; Shaw; 2001 Electronic Components and Technology Conference; IEEE; 6 pages.
*Manufacture of Photonics Components with a Deep UV Laser Source at 255 nm*; Booth; Proceedings ICALEO; Paper M203; Laser Institute of America; 2001; 9 pages.
*Measuring the Group Delay Characteristics of Narrow-Band Devices by the Modulation Phase Shift Method*; Hernday; Applications Engineering White Paper; 2002; pp. 2-10.
*Magnetic Manipulation: Complex Magnetic Field Processing Leads to a New Class of Composite Materials*; Singer; Sandia Lab News; vol. 55, No. 22; Oct. 31, 2003; 2 pages (1 and 4).

*Novel and Improved Methods of Writing Bragg Gratings with Phase Masks*; Othonos; IEEE Photonics Technology Letters; vol. 7, No. 10; Oct. 1995; pp. 1183-1185.
*NECSEL in the Network / The NECSEL Advantage*; Web Publication of Novalux; Dec. 5, 2000; 3 pages.
*Neodymium-Doped Glass Channel Waveguide Laser Containing an Integrated Distributed Bragg Reflector*; Roman; Applied Physics Letters; vol. 61, No. 23; Dec. 7, 1992; pp. 2744-2746.
*Novel Chirped Fiber Grating Utilizing a Thermally Diffused Taper-Core Fiber*; Okude; OFC 96 Technical Digest; pp. 88-89.
*Novel Add/Drop Filters for Wavelength-Division-Multiplexing Optical Fiber Systems Using a Bragg Grating Assisted Mismatched Coupler*; Dong; IEEE Photonics Technology Letters; vol. 8, No. 12, Dec. 1996; pp. 1656-1658.
*Novel Design Procedure of Broad-Band Multilayer Antirefelection Coatings for Optical and Optoelectronic Devices*; Lee; Journal of Lightwave Technology; vol. 16, No. 5; May 1998; pp. 884-891.
*New Fibre Technologies for Long-Haul High Data-Rate Networks*; Dowdell; NOC 1999; 8 pages.
*Numerical Analysis of Eigenmodes and Splice Losses of Thermally Diffused Expanded Core Fibers*; Ohtera; Journal of Lightwave Technology; vol. 17, No. 12; Dec. 1999; pp. 2675-2682.
*Output Power Changes in Laser Diodes Subject to Sub-Wavelength Variations in External Cavity Length: Theory and Experiment*; Jones; IEEE; CWF80; Sep. 2000; 1 page.
*Over-40-GHz Modulation Bandwidth of EAM-Integrated DFB Laser Modules*; Kawanishi; MJ3-1; Optical Society of America; 2000; 3 pages.
*An Optical Add-Drop Multiplexer With a Grating-Loaded Directional Coupler in Silicia Waveguides*; Ofusa; IEICE Trans. Commun.; vol. E82-B, No. 8; Aug. 1999; pp. 1248-1251.
*Optical Frequency Division Multiplexed Transmission System Unified for Broadcasting and Communication Utilizing a Set of Fabry-Perot Etalons*; Tateda; IEICE Trans. Commun.; vol. E84-B, No. 1; Jan. 2001; pp. 120-123.
*Optical Feedback Phenomena in Semiconductor Lasers*; Petermann; Semiconductor Laser Conference; Sep. 19, 1994 pp. 8-11.
*Optical Properties of Photosensitive Fiber Phase Gratings*; Mizrahi; Journal of Lightwave Technology; vol. 11, No. 10; Oct. 1993; pp. 1513-1517.
*Optical Fibers With Depressed Claddings for Suppression of Coupling into Cladding Modes in Fiber Bragg Gratings*; Dong; IEEE Photonics Technology Letters; vol. 9, No. 1; Jan. 1997; pp. 64-66.
*Optoelectronic Properties of Semiconductor Lasers But-Coupled to Optical Fibers*; Andrekson; IEEE Journal of Quantum Electronics; vol. 24, No. 10; Oct. 1988; pp. 2039-2045.
*Optical Coatings for Laser Facets Fabricated by Reactive Ion-Beam Sputter Deposition*; Lorch; Annual Report 2001; Optoelectronics Department, University of Ulm; 2001; pp. 1-6.
*Product Data Sheets—Semiconductor Optical Amplifiers, Taper Lensed Fibres, and FP Lasers*; Web Publications of Opto Speed SA; Sep. 3, 2000; 12 pages.
*Specifications High Speed 1550 nm Tapered Fabry Perot-Laser*; Opto Speed Product Sheets; Sep. 20, 2001; 9 pages.
*Opto Speed High Temperature 10 Gb/s FP-Laser 1310 nm*; Product Data Sheet; Jun. 2000; 1 page.
*Specifications High Speed 1550 nm Distributed Feedback Laser*; Opto Speed Product Sheets; Aug. 2000; 4 pages.
*Specifications High Speed 1550 nm Fabry Perot Laser*; Opto Speed Product Sheets; Aug. 2000; 3 pages.
*Specifications Reflective Semiconductor Optical Amplifier RSOA*; Opto Speed Product Sheets; Aug. 2000; 6 pages.
*Optical Coupling and Alignment Tolerances in Optoelectronic Array Interface Assemblies*; Sutherland; IEEE; 1995; pp. 577-583.
*Optical Waveguide Amplifier in Nd-Doped Glass Written With Near-IR Femtosecond Laser Pulses*; Sikorski; Electronics Letters; vol. 36, No. 3; Feb. 3, 2000; 2 pages.
*Optoelectronic Packages for Integrated Sealing of Optical Fibers*; Velsher; Apr. 12, 2001; 10 pages.
*Optical Surface Mount Technology*; Uchida; IEICE Trans. Electron.; vol. E80-C, No. 1, Jan. 1997; pp. 81-87.
*Photosensitive Glass for Phase Hologram Recording*; Glebov; Glass Science and Technology; 71C; 1998; pp. 85-90.

*Photowritten Gratings in Ion-Exchanged Glass Waveguides*; Roman; Optics Letters; vol. 18, No. 10; May 15, 1993; pp. 808-810.
*Photosensitization of Optical Fiber and Silica-on-Silicon/Silica Waveguides*; Bilodeau; Optics Letters; vol. 18, No. 12; Jun. 15, 1993; pp. 953-955.
*Packaging of Electrically Switchable Tunable Tapered Lasers*; Cho; Part of SPIE Conference on Testing, Packaging, and Reliability; SPIE vol. 3626; Jan. 1999; pp. 240-245.
*Passive Aligned Hybrid Integrated WDM Transceiver Module Using Planar Lightwave Circuit Platform*; Okano; IEICE Trans. Electron.; vol. E80-C, No. 1; Jan. 1997; pp. 112-116.
*PLC-Type Hybrid External Cavity Laser Integrated With Fron-Monitor Photodiode on Si Plafform*; Tanaka; Electronic Letters; vol. 37, No. 2; Jan. 18, 2001; pp. 95-96.
*Polymeric Tunable Optical Attenuator With an Optical Tap for WDM Transmission Network*; Lee; IEEE Photonics Technology Letters; vol. 11, No. 5; May 1999; pp. 590-592.
*Phase Response Measurement Technique for Waveguide Grating Filters*; Brooks; Applied Physics Letters; vol. 66, No. 17; Apr. 24, 1995; pp. 2168-2170.
*Postfabrication Wavelength Trimming of Fiber Bragg Gratings Written in $H_2$-Loaded Fibers*; Guan; IEEE Photonics Technology Letters; vol. 13, No. 6; Jun. 2001; pp. 591-593.
*Permanent Index Changes in Ge-$SiO_2$ Glasses by Excimer Laser Irradiation*; Nishii; Materials Science and Engineering; vol. B54; 1998; pp. 1-10.
*Polarization Independent Narrow Band Bragg Reflection Gratings Made With Silica-On-Silicon Waveguides*; Adar; Applied Physics Letters; vol. 60, No. 15; Apr. 13, 1992; pp. 1779-1781.
*Preliminary Results of a European Intercomparison of Group Delay Measurements of Fibre Bragg Gratings*; Wicks; Proceedings of OFMC '01 Conference; 2001; 4 pages.
*Polychromic Glasses—A New Material for Recording Volume Phase Holograms*; Glebov; Sov. Phys. Dokl.; vol. 35, No. 10; Oct. 1990; pp. 878-880.
*Photosensitive Glass Integrated Optical Devices*; Ainslie; Glass Integrated Optics and Optical Fiber Devices; Critical Reviews Vo. CR53; Sep. 1994; pp. 235-249.
*Polarisation-Independent Bragg Gratings in Ion-Exchanged Glass Channel Waveguides*; Geraghty; Electronics Letters; vol. 36, No. 6; Mar. 16, 2000; pp. 531-532.
*Polymer-Based Filters for DWDM Applications*; Eldada; OSA TOPS vol. 29 WDM Components; 1999; pp. 105-116.
*Polarisation Insensitive Arrayed-Waveguide Grating Multiplexers With Ion-Exchanged Waveguides in Glass*; Buchold; Electronic Letters Online No. 19961493; Oct. 9, 1996; 3 pages.
*A Polarization-Independent Distributed Bragg Reflector Based on Phase-Shifted Grating Structures*; Huang; Journal of Lightwave Technology; vol. 14, No. 13; Mar. 1996; pp. 469-473.
*A Polarization-Independent Grating Resonator*; Huang; IEEE Journal of Quantum Electronics; vol. 33, No. 5; May 1997; pp. 719-723.
*Plasma Enhanced Chemical Vapor Deposition Silicon Oxynitride Optimized for Application in Integrated Optics*; Worhoff; Sensors and Actuators; vol. 74, 1999; pp. 9-12.
*Packaging of Optical Fibre Bragg Gratings*; Psaila; 2001 Electronic Components and Technology Conference IEEE; 2001; 5 pages.
*Plasma Ion Assisted Deposition: Investigation of Film Stress*; Preprint of the Proceedings SPIE vol. 2776-23, presented in Glasgow May 1996; 5 pages.
*Photorefractive Effect in Annealed Proton-Exchanged $LiTaO_3$ Waveguides*; Fujiwara; IEEE Transactions on Automatic Control; vol. 5, No. 9; Sep. 1993; pp. 1062-1064.
*Polarization Insensitive Ion-Exchanged Arrayed-Waveguide Grating Multiplexers in Glass*; Buchold; Fiber and Integrated Optics; 1998; pp. 279-297.
*Planar Er:Yb Glass Ion Exchanged Waveguide Laser*; Vossler; Electronic Letters; Jul. 6, 1995; vol. 31, No. 14; pp. 1162-1163.
*Passive Optical Devices for Photonic Networks*; Hibino; IEICE Trans. Commun.; vol. E83-B; No. 10; Oct. 2000; pp. 2178-2190.
*Quadratic Electro-Optic Effect Dut to the Quantum-Confined Stark Effect in Quantum Wells*; Weiner; Applied Physics Letters; vol. 50, No. 13; Mar. 30, 1987; pp. 842-844.

*Quantum Confinement Observed in ZnO/ZnMgO Nanorod Heterostructures*; Park; Advanced Materials; vol. 15, No. 6; Mar. 17, 2003; pp. 526-529.
*Product Data Sheet of Quantum Photonics*; Mar. 3, 2000; 3 pages.
*Reduction of Waveguide Facet Reflection in Optical Hybrid Integrated Circuit Using Saw-Toothed Angled Facet*; Ogawa; IEEE Photonics Technology Letters; vol. 7, No. 1; Jan. 1995; pp. 44-46.
*Root-Locus Technique for Predicting the Stability of Laser Diodes with Optical Feedback*; Pierce; CWF81; Sep. 2000; Wednesday/227; 1 page.
*Relation Between Electroabsorption in Bulk Semiconductors and in Quantum Wells: The Quantum-Confined Franz-Keldysh Effect*; Miller; Physical Review B; vol. 33, No. 10; May 15, 1986; pp. 6976-6982.
*Room-Temperature Operation of InAs Quantum-Dash Lasers on InP (001)*; Wang; IEEE Photonics Technology Letters; vol. 13, No. 8; Aug. 2001; pp. 767-769.
*Reconstruction of Fiber Grating Refractive-Index Profiles From Complex Bragg Reflection Spectra*; Huang; Applied Optics; vol. 38, No. 21; Jul. 20, 1999; pp. 4494-4499.
*Rare-Earth-Doped Waveguide Lasers in Glass and $LiNbO_3$: A Review*; Winick; SPIE vol. 3280, Rare-Earth-Doped Devices II; Jan. 26-27, 1998; 16 pages.
*Spot-Size Converter Integrated Laser Diodes (SS-LDs)*; IEICE Trans. Electron.; vol. E80-C, No. 1; Jan. 1997; pp. 30-36.
*Spectral Characteristics for a Fiber Grating External Cavity Laser*; Cheng; Optical Quantum Electronics; vol. 32; 2000; pp. 339-348.
*Single-Mode Operation from an External Cavity Controlled Vertical-Cavity Surface-Emitting Laser*; Giudice; IEEE Photonics Technology Letters; vol. 11, No. 12; Dec. 1999; pp. 1545-1547.
*Single-Mode Operation of the External Cavity DBR Laser With Sol-Gel Waveguide Bragg Grating*; Beregovski; Optics Communications; vol. 164; 1999; pp. 57-61.
*Stability Analysis for Laser Diodes with Short External Cavities*; Schunk; IEEE Photonics Technology Letters; vol. 1, No. 3; Mar. 1989; pp. 49-51.
*Single-Longitudinal Mode Operation of a Semiconductor Laser Using a Metal Film Reflector Filter*; Dutta; IEEE Journal of Quantum Electronics; vol. QE-21, No. 6; Jun. 1985; pp. 559-562.
*Short-Cavity Distributed Bragg Reflector Laser With an Integrated Tapered Output Waveguide*; Chien; IEEE Photonics Technology Letters; vol. 3, No. 5; May 1991; pp. 418-420.
*Semiclassical Theory of the Many-Atom MicroLaser*; An; Journal of the Korean Physical Society; vol. 42, No. 4; Apr. 2003; pp. 1-13.
*Stability Regimes and High-Frequency Modulation of Laser Diodes With Short External Cavity*; Tager; IEEE Journal of Quantum Electronics; vol. 29, No. 12; Dec. 1993; pp. 2886-2890.
*Step-Wise Tunability of a DBR Laser With a Superimposed Fiber Grating External Cavity*; Adomat; Proceedings of OFC 2000; 2000; pp. TuL7-1 to TuL7-3.
*Simple Method to Evaluate Coupling Functions at Antireflection-Coated Diode Facets Facing Grating Reflectors of Long External Cavities*; Chen; IEEE Photonics Technology Letters; vol. 5, No. 10; Oct. 1993; pp. 1174-1176.
*Semiconductor Lasers for Coherent Optical Fiber Communications*; Koch; Journal of Lightwave Technology; vol. 8, No. 3; Mar. 1990; pp. 274-291.
*Shedding Light on Hybrid Optics: A Tutorial in Coupling*; Best; Optics and Photonics News; Feb. 1999; pp. 31-34.
*Strong Fiber Bragg Grating Fabrication by Hybrid 157- and 248-nm Laser Exposure*; Chen; IEEE Photonics Technology Letters; vol. 14, No. 2; Feb. 2002; pp. 170-172.
*Simple Measurement of Fiber Dispersion and of Chirp Parameter of Intensity Modulated Light Emitter*; Devaux; Journal of Lightwave Technology; vol. 11, No. 12; Dec. 1993; pp. 1937-1940.
*Sidelobe Suppression in Corrugated-Waveguide Filters*; Cross; Optics Letters; vol. 1, No. 1; Jul. 1977; pp. 43-45.
*A $SiCl_4$ Reactive Ion Etching and Laser Reflectometry Process for AlGaAs/GaAs HBT Fabrication*; Granier; Vacuum; vol. 47, No. 11; 1996; pp. 1347-1351.
*Sol-Gel Glass Waveguide and Grating on Silicon*; Najafi; Journal of Lightwave Technology; vol. 16, No. 9; Sep. 1998; pp. 1640-1646.
*Sputtering, the Versatile Coating Process*; Comello; R&D Magazine; May 1998; p. 71.
*A Study of the Growth Kinetics of II-VI Metalorganic Vapour Phase Epitaxy Using In Situ Laser Reflectometry*; Irvine; Journal of Crystal Growth; vol. 145; 1994; pp. 74-81.
*Silica-Based Planar Lightwave Circuits for WDM Systems*; Inoue; IEICE Trans. Electron.; vol. E80-C, No. 5; May 1997; pp. 609-618.
*Spot-Size-Converter Integrated Semiconductor Optical Amplifiers for Optical Switching Systems*; Tamanuki; IEICE Trans. Commun.; vol. E82-B, No. 2; Feb. 1999; pp. 431-438.
*Self-Alignment of Optical Fibers with Optical Quality End-Polished Silicon Rib Waveguides Using Wet Chemical Micromachining Techniques*; Rosa; IEEE Journal of Selected Topics in Quantum Electronics; vol. 5, No. 5; Sep./Oct. 1999; pp. 1249-1254.
*A Simple Laterally Tapered Waveguide for Low-Loss Coupling to Single-Mode Fibers*; Kasaya; IEEE Photonics Technology Letters; vol. 5, No. 3; Mar. 1993; pp. 345-347.
*Silica-On-Silicon Remains a Staple for Making Waveguides*; Caves; Laser Focus World; May 2001; pp. 219-223.
*SiON High-Refractive-Index Waveguide and Planar Lightwave Circuits*; Bona; IBM Journal of Research and Development; vol. 47, No. 2/3; Mar./May 2003; pp. 239-249.
*Silica-Based Single-Mode Waveguides on Silicon and Their Application to Guided-Wave Optical Interferometers*; Takato; Journal of Lightwave Technology; vol. 6, No. 6; Jun. 1988; pp. 1003-1010.
*Tapered Active Layer Laser Device Performance and Its Impact on Low Cost Optoelectronics*; Lealman; Lasers and Electro-Optics Society Annual Meeting 1995; $8^{th}$ Annual Meeting Conference Proceedings; vol. 1; IEEE; Oct. 31, 1995; pp. 11-12.
*Theory of the Threshold Current of a Semiconductor Quantum Dot Laser*; Asryan; 1999; pp. 52-59.
*Tuning Fidelity of Acoustooptically Controlled External-Cavity Semiconductor Lasers*; Zorabedian; Journal of Lightwave Technology; vol. 13, No. 1; Jan. 1995; pp. 62-66.
*Theory, Design, and Performance of Extended Tuning Range Semiconductor Lasers With Sampled Gratings*; Jayaraman; IEEE Journal of Quantum Electronics; vol. 29, No. 6; Jun. 1993; pp. 1824-1834.
*A Tunable Femtosecond Modelocked Semiconductor Laser for Applications in OTDM-Systems*; Ludwig; IEICE Trans. Electron.; vol. E81 C, No. 2; Feb. 1998; pp. 140-145.
*Tunable Grating Coupled Surface-Emitting Tapered Laser*; Luo; IEEE Photonics Technology Letters; vol. 11, No. 9; Sep. 1999; pp. 1102-1104.
*Tapered Amplifier, Product Data Sheet of Eagleyard Photonics*; Jun. 17, 2003; 1 page.
*Tunable Fiber Bragg Grating Filters*; Iocco; PhD Thesis No. 2006; Laurea in Ingegneria Meccanica, Universita degli Studi di Brescia, Italie; 1999; 138 pages.
*Tapered Polymer Single-Mode Waveguides for Mode Transformation*; Fan; Journal of Lightwave Technology; vol. 17., No. 3; Mar. 1999; pp. 466-474.
*3D Photonic Integrated Circuits for WDM Applications*; Shakouri; SPIE; San Jose, CA; Jan. 1999; 24 pages.
*2-D Mode Tapering Via Tapered Channel Waveguide Segmentation*; Weissman; Electronic Letters; vol. 28, No. 16; Jul. 30, 1992; pp. 1514-1516.
*Thermal Management Challenges, Small ONU Enclosures*; White Paper of Marconi; May 2000; 9 pages.
*UV-Induced Surface-Relief Gratings on LiNbO3 Channel Waveguides*; Wu; IEEE Journal of Quantum Electronics; vol. 35, No. 10; Oct. 1999; pp. 1369-1373.
*UV Written Bragg Gratings in Tapered Waveguides, a Response Shaping Approach*; Berendt; IEEE; 1997; pp. 359-360.
*Understanding Monomode Optical Fibers*; Snyder; Proceedings of the IEEE; vol. 69, No. 1; Jan. 1981; pp. 6-12.
*Use of Laser Reflectometry for End-Point Detection During the Etching of Magnetic Thin Films*; Khamsehpour; Journal Vac. Sci. Technol.; A vol. 14, No. 4; Jul./Aug. 1997; pp. 2069-2073.
*UV-Curable Adhesives and Sealants for Optical Devices, Product Data Sheets*; Web Publication of NTT Advanced Technology; Jul. 25, 2001; 6 pages.
*Vertical Cavity Lasers for Telecom Applications*; Margalit; Web Publication; IEEE; 1997; 9 pages.

*Volume Diffractive Elements in Photosensitive Inorganic Glass for Beam Combining*; Glebov; SSDLTR 2001; 2001; 4 pages.
*Visualization of Grit Interactions During the Ductile to Brittle Polishing Transition*; Mindek; Society of Manufacturing Engineering; 2001; pp. 1-8.
*Wavelength Stable Uncooled Fibre Grating Semiconductor Laser for Use in an All Optical WDM Access Network*; Campbell; Electronic Letters; vol. 32, No. 2; Jan. 18, 1996; 2 pages.
*Wavelength Accuracy and Output Power of Multiwavelength DFB Laser Arrays With Integrated Star Couplers and Optical Amplifiers*; Zah; IEEE Photonics Technology Letters; vol. 8, No. 7; Jul. 1996; pp. 864-866.
*Waveguide Grating Filters for Dispersion Compensation and Pulse Compression*; Roman; IEEE Journal of Quantum Electronics; vol. 29, No. 3; Mar. 1993; pp. 975-982.
*WaveSelector, Gratings for DWDM Applications*; Web Publication of Bragg Photonics; Sep. 2001; 2 pages.
*A Widely Tunable Fiber Bragg Grating With a Wavelength Tunability Over 40 nm*; Set; MC4-1; Optical Society of America; 2000; 3 pages (MC4-1 through MC4-3.
*Wavelength Tunable Optical Add and Drop Multiplexer Utilising Coupled Semiconductor Waveguides and a Striped Thin-Film Heater*; Horita; Electronics Letters; vol. 34, No. 23; Nov. 12, 1998; pp. 2240-2241.
*Widely Tunable Integrated Filter/Receiver With Apodized Grating-Assisted Codirectional Coupler*; Jan; SPIE Photonics West '98, Paper No. 3290-232, San Jose, CA; Jan. 24-30, 1998; pp. 24-27.
*Wafer Scale Photonic-Die Attachment*; Zhou; 1997 Electronic Components and Technology Conference; IEEE; 1997; pp. 763-767.
*A Wide-Band Local Access System Using Emerging-Technology Components*; Linnell; IEEE Journal on Selected Areas in Communications; vol. SAC-4, No. 4; Jul. 1986, pp. 612-618.
*Waveguide Fabrication in $Nd^{3+}$ and $Yb^{3+}$ Doped Phosphate Glasses*; Patel; OSA TOPS; vol. 19; 1998; pp. 446-449.
*Ytterbium-Doped Glass Waveguide Laser Fabricated by Ion Exchange*; Florea; Journal of Lightwave Technology; vol. 17, No. 9; Sep. 1999; pp. 1593-1601.
*Yb/Er-Codoped and Yb-Doped Waveguide Lasers in Phosphate Glass*; Veasey; Journal of Non-Crystalline Solids 263 & 264; 2000; pp. 369-381.
*ZnO: Growth, Doping, and Processing*; Norton; Materials Today; Jun. 2004; pp. 34-40.
*1.3 μm High Performance FS-BH Laser Diodes With Waveguide Lens for Optical Access Network*; Takemoto; ICICE Trans. Electron.; vol. E80-C; No. 1; Jan. 1997; pp. 24-28.
*10 Gbit/S Directly-Modulated, High Temperature-Stability, External Fibre Grating Laser for Dense WDM Networks*; Timefeev; IEEE; 1998; pp. 360-361.
*85° C. Investigation of Uncooled 10-Gb/s Directly Modulated InGaAsP RWG GC-DFB Lasers*; White; IEEE Photonics Technology Letters; vol. 13, No. 8; Aug. 2001; pp. 773-775.

*100 GHz-Spacing 8-Channel Light Source Integrated With Gratings and LDs on PLC Platform*; Tanaka; OFC 2002; 2002; pp. 76-77.
*10km Transmission Using an Uncooled Be-Doped Fabry-Perot Laser With More than 100-Degree Operation Temperature Range*; Csutak; Optical Society of America; 2000; 3 pages.
*10Gbit/s Directly Modulated, High Temperature-Stability External Fibre Grating Laser for Dense WDM Networks*; Timofeev; Electronics Letters; vol. 35, No. 20; Sep. 30, 1999; pp. 1737-1739.
*1310-nm VCSEL Diode*, Infineon; Product Announcement Web Publication of Photonics Spectra; Aug. 2003; 1 page.
*100% Reflectivity Bragg Reflectors Produced in Optical Fibres by Single Excimer Laser Pulses*; Archambault; Electronic Letters; vol. 29, No. 5; Mar. 4, 1993; pp. 452-455.
*III-V Membrane Structures for Tunable Fabry-Perot Filters and Sensor Applications*; Hartnagel; IEEE; 1999 pp. 49-56.
*10-Gb/s Transmission of 1.55-μm Direct Modulated Signal over 100 km of Negative Dispersion Fiber*; Tomkos; IEEE Photonics Technology Letters; vol. 13, No. 7; Jul. 2001; pp. 735-737.
*Automated Interference Lithography Systems for Generation of Sub-Micron Feature Size Patterns*; Hobbs; Proceedings of SPIE; vol. 3879; Aug. 1999; pp. 124-135.
*Arrayed-Waveguide Grating Multiplexer with Loop-Back Optical Paths and Its Applications*; Tachikawa; Journal of Lightwave Technology; vol. 14, No. 6; Jun. 1996; pp. 977-984.
*Coating Materials*; Friz; Springer Series in Optical Sciences; Optical Interference Coatings; vol. 88; 2003; pp. 105-130.
*Comparison of Some Fiber Optic Configurations for Measurement of Luminescence and Raman Scattering*; Myrick; Applied Optics; vol. 29, No. 9; Mar. 20, 1990; pp. 1333-1344.
*Comparative Study of Some Fiber-Optic Remote Raman Probe Designs. Part II: Tests of Single-Fiber, Lensed, and Flat- and Bevel-Tip Multi-Fiber Probes*; Cooney; Applied Spectroscopy; vol. 50, No. 7; 1996; pp. 849-860.
*Electrooptically Tunable Narrow-Linewidth InGaAsP-TI:LiNbO$_3$ Extended Cavity Laser*; Heisman; OFC/IOOC 1987; p. 149.
*High-Stability 1.5 μm External-Cavity Semiconductor Laser for Phase-Lock Applications*; Kahn; IEEE Photonics Technology Letters; Jul. 1989; pp. 159-161.
*Monolithic Enhancement or Compensation of Laser Temperature Characteristics*; Research Report; 2000; 4 pages.
*Sampling Probes Enhance Remote Chemical Analyses*; Nave; Laser Focus World; Dec. 1995; 5 pages.
*Toward Tunable Optical Filters*; Parmentier; O.S.A. 2001; 26 pages.
*Toward Tunable Thin-Film Filters for Wavelength Division Multiplexing Applications*; Parmentier; Applied Optics; vol. 41., No. 16; Jun. 1, 2002; pp. 3277-3284.
*Will Silicon Be the Photonic Material of the Third Millenium?*; Pavesi; Journal of Physics: Condensed Matter; vol. 15; 2003; pp. 1169-1196.

\* cited by examiner 171, 172, 173, ..., 17N – spectral representation of cavity stabilizer
101, 102, 103, ..., 10N – spectral representation of optical signals 191 Dense Wavelength Division Multiplexing ("DWDM") Grid Coordinate

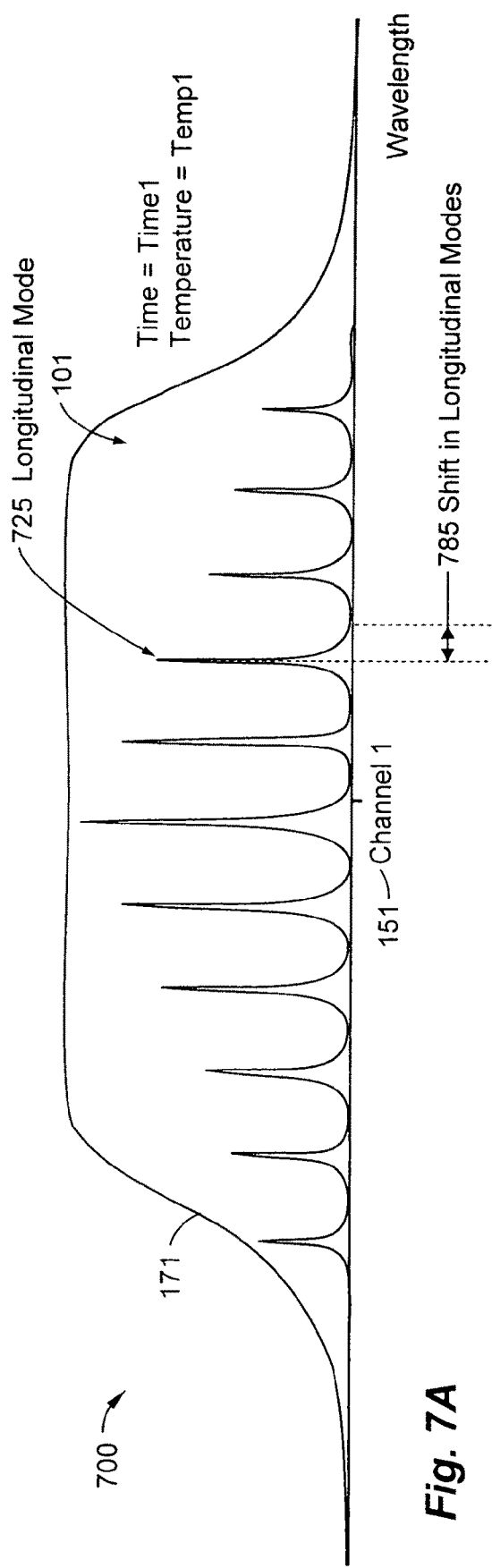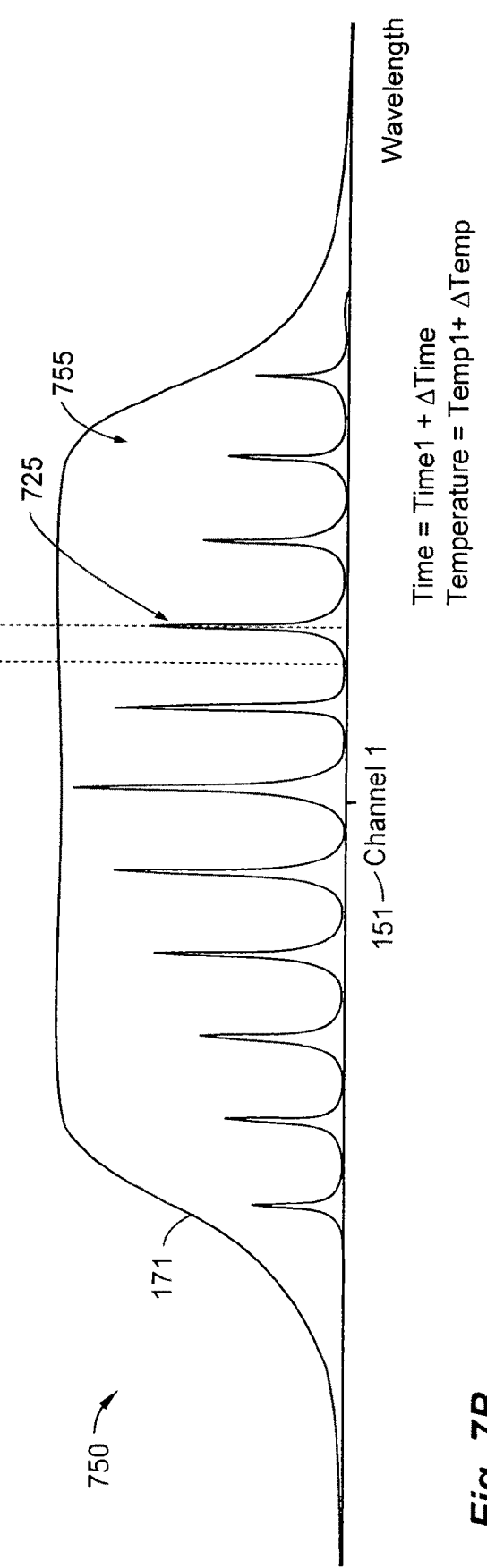

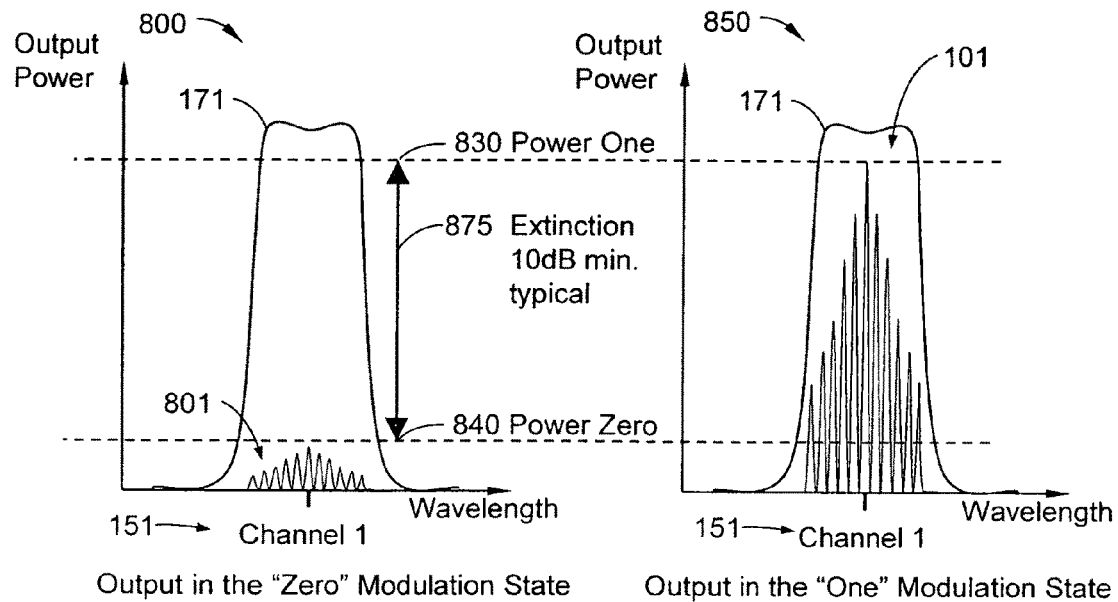
Fig. 8A Output in the "Zero" Modulation State
Fig. 8B Output in the "One" Modulation State
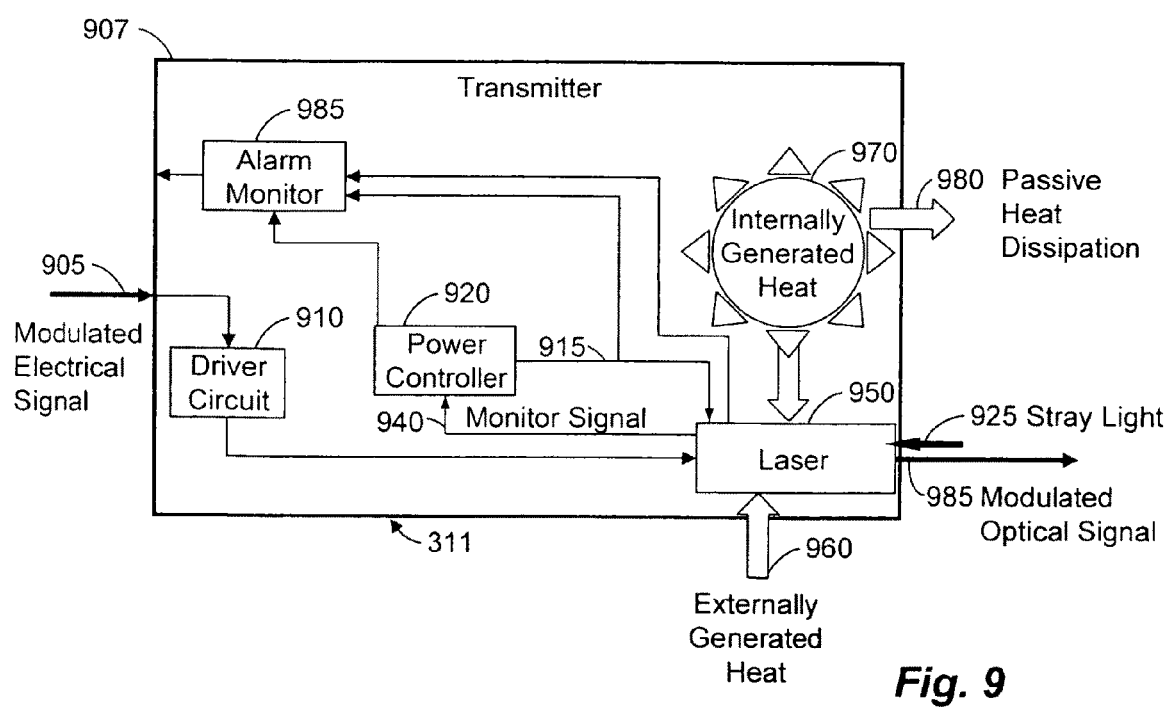
Fig. 9

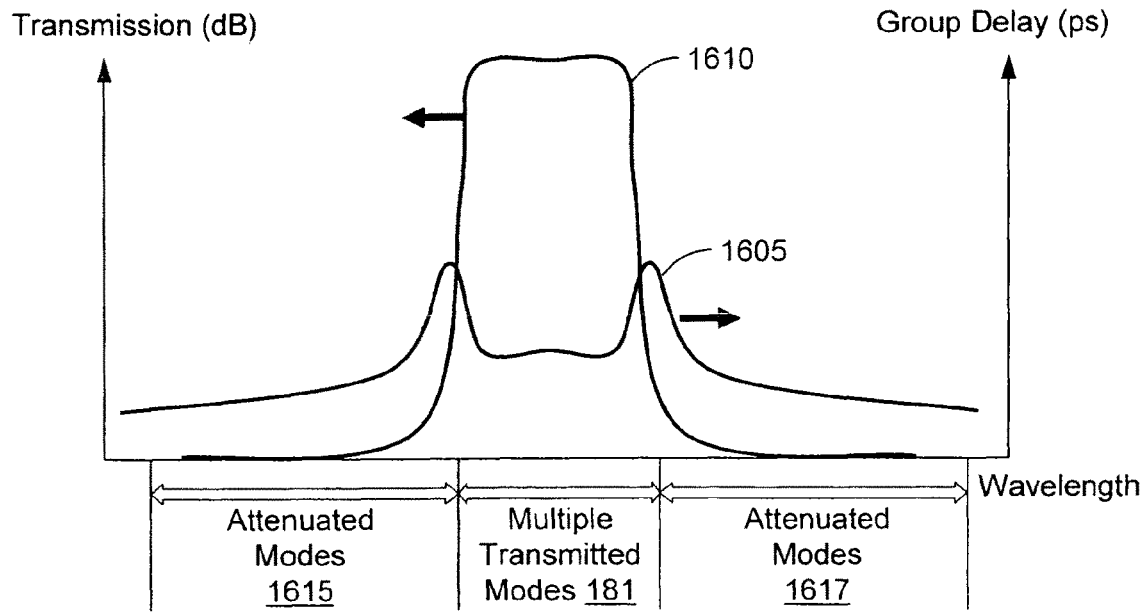
Fig. 16A  ↖ 1600 Exemplary spectral characteristics of cavity stabilizer
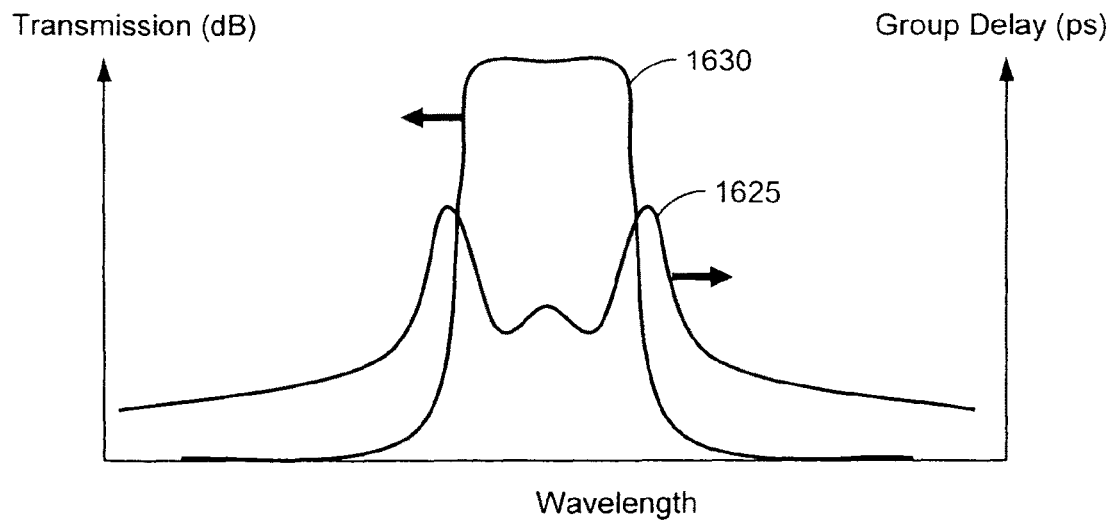
Fig. 16B  ↖ 1620 Exemplary spectral characteristics of cavity stabilizer

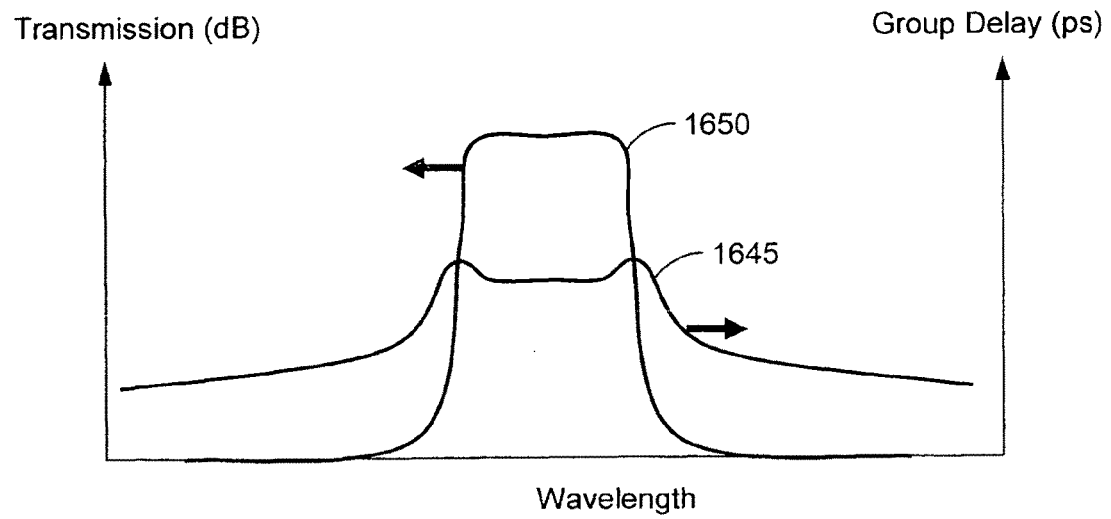
Fig. 16C ← 1640 Exemplary spectral characteristics of cavity stabilizer
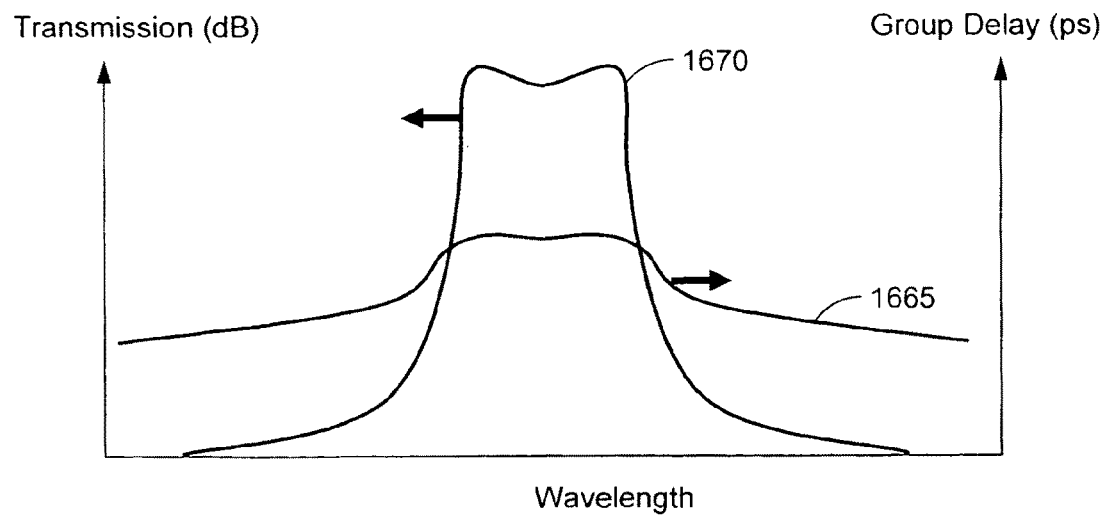
Fig. 16D ← 1660 Exemplary spectral characteristics of cavity stabilizer

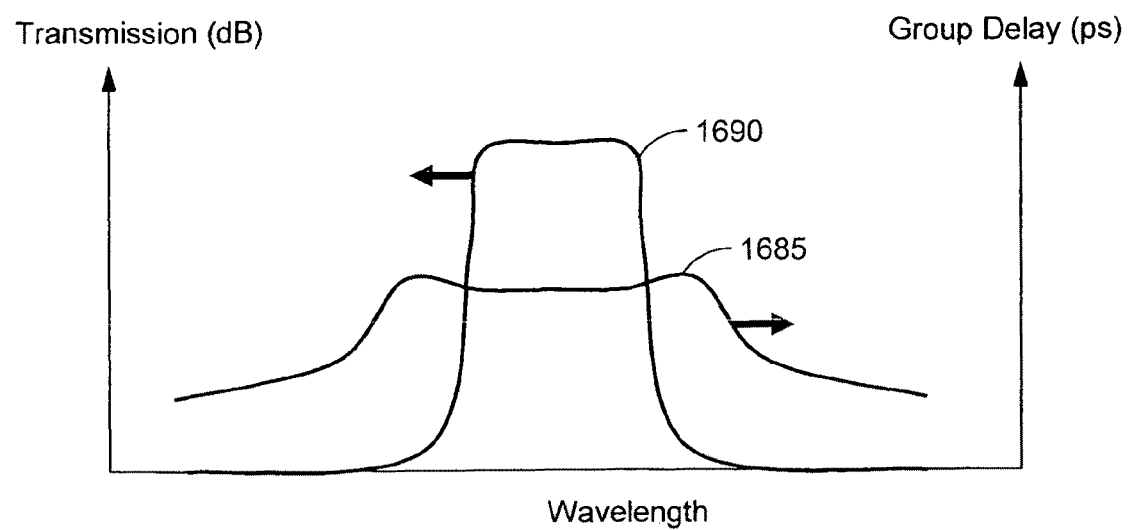
Fig. 16E   1680 Exemplary spectral characteristics of cavity stabilizer

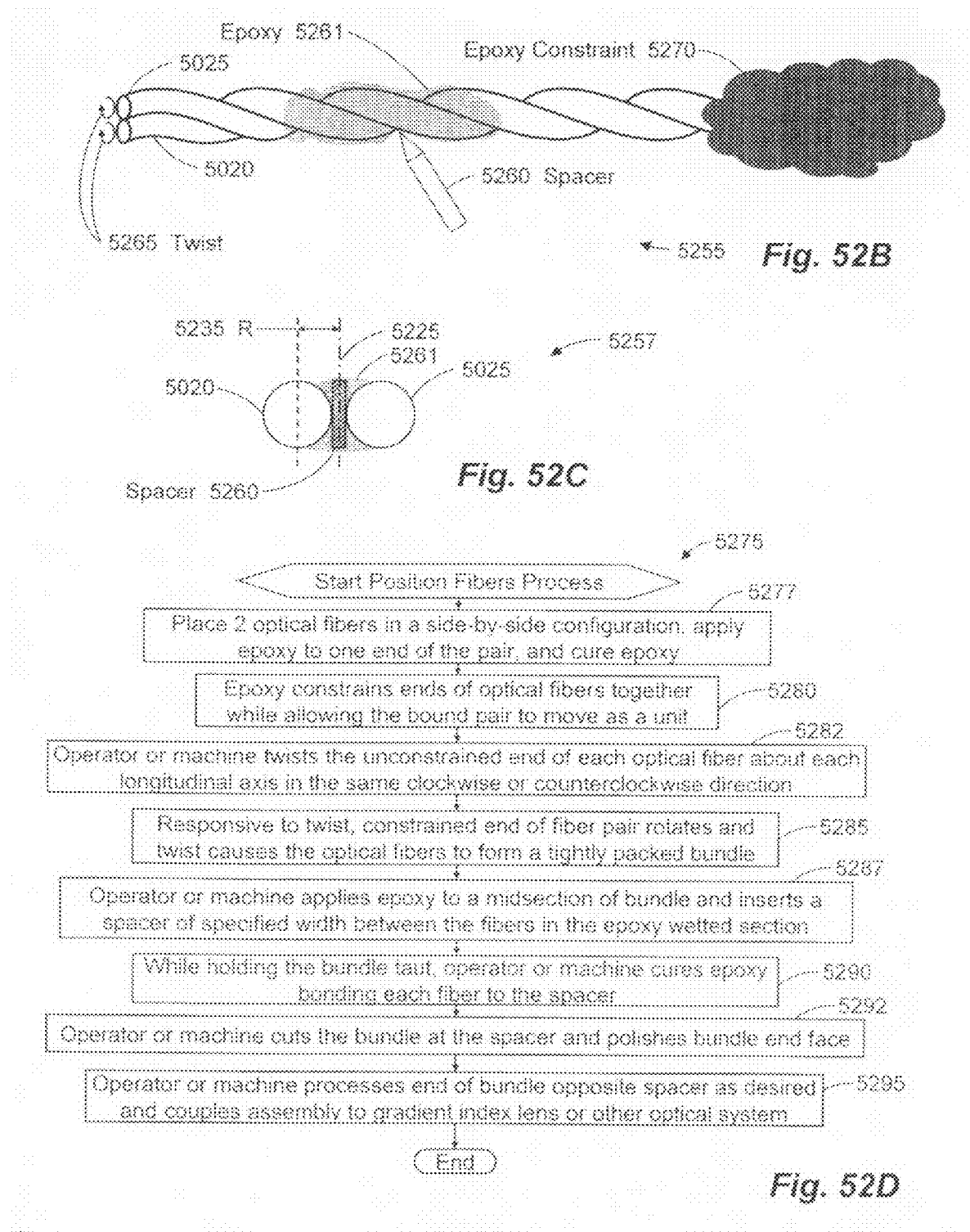

ROBUSTLY STABILIZING LASER SYSTEMS

CROSS REFERENCE TO RELATED APPLICATIONS

This application is a continuation of U.S. patent application Ser. No. 11/226,553, now U.S. Pat. No. 7,565,084, entitled "Robustly Stabilizing Laser Systems," filed on Sep. 14, 2005 in the name of Michael L. Wach, which claims the benefit of priority to U.S. Provisional Patent Application No. 60/610,030, entitled "Robustly Stabilizing Laser Systems," and filed Sep. 15, 2004. The entire contents of each of the above identified priority documents and specifically U.S. patent application Ser. No. 11/226,553 and U.S. Provisional Patent Application No. 60/610,030 are hereby incorporated herein by reference.

TECHNICAL FIELD

The present invention relates to optical devices that output light of defined wavelength and more specifically to robust stabilization of lasers that generate multimode light at defined wavelengths for optical communications.

BACKGROUND

A growing number of uses and applications for information continue to fuel an interest in increasing the amount of information that can be cost effectively transmitted among sites on an information network. In many situations, optical communication has emerged as a preferred technique for high-speed information transmission. Wavelength division multiplexing ("DWDM"), which involves transmitting multiple colored optical signals over a common communication path, offers the potential to significantly increase the bandwidth or information carrying capability of that communication path. DWDM technology generally increases the information carrying capability of the path in proportion to the number of colored signals that can coexist on that path, wherein each colored signal transmits in a wavelength channel. However, the general complexity and expense of most conventional DWDM technologies, places DWDM communication out of reach of many cost sensitive applications.

Most conventional DWDM systems use single mode laser sources that output highly monochromatic light signals. Those signals typically provide a single concentrated peak of photonic energy at a selected wavelength aligned to the DWDM channel and thereby exhibit high spectral purity. Conventional technologies for controlling such single mode lasers to maintain wavelength alignment with their respective DWDM channels often entails detrimental complications. For example, most conventional DWDM lasers need precise temperature regulation, hermetic packaging, and stray light isolation to operate within DWDM specifications and to maintain wavelength alignment to an assigned DWDM channel. Achieving a sufficient level of such temperature regulation, hermetic packaging, and stray light isolation using conventional technologies can entail manufacturing complexities, operational expenses, excessive power consumption, and bulky size. Such drawbacks often inhibit DWDM communication from applications that could benefit from greater bandwidth.

One conventional approach to providing more than one colored signal on a communication link is coarse wavelength division multiplexing ("CWDM"). Conventional CWDM lasers usually operate without active cooling and output a single mode of light. That single mode of light drifts in wavelength in response to temperature change until reaching a wavelength at which the mode hops. Thus, a conventional CWDM laser may output a single spectral peak of light that responds to temperature change by drifting from a lower end of a wavelength region towards a higher end of that region and then suddenly jumping back to the lower end. The wavelength span of the drifting and mode hopping is often more than 20 nanometers ("nm"), thereby undesirably limiting the number of CWDM channels that can coexist on a particular optical communication link. Further, in many circumstances, such mode hopping can be detrimental to communication integrity and can adversely impact bit error rate.

Another conventional approach to optical communication involves directly modulating free running Fabry Perot lasers. A conventional free running Fabry Perot laser typically generates multiple modes of light that are free to drift within the laser's gain profile. That is, the laser's gain medium has a capability to amplify light across a wavelength span, and the conventional laser's multimode output is generally free to shift and move about within that span. The breadth of that drift and gain profile usually limits the number of conventional Fabry Perot lasers that can concurrently transmit signals over a common communication link and thereby limits the link's accessible bandwidth. For example, some conventional communication networks have at one end of an optical fiber a free running Fabry Perot laser with a gain profile that is nominally centered at 1310 nm and, at the opposite end of the fiber, another free running Fabry Perot laser with a gain profile that is nominally centered at 1550 nm. The 1310 nm laser and the 1550 nm laser transmit signals in opposite directions, and each of those signals can drift within the gain profile of its respective laser.

Conventional technologies for manufacturing optical communication devices are also often undesirably inefficient, costly, or slow. Fabrication often involves expensive processes and systems for forming, processing, aligning, or attaching optical components. Complexity associated with conventional optical device fabrication can limit the extent to which optical networking can address cost sensitive applications.

To address these representative deficiencies in the art, what is needed is a capability for cost effective DWDM communication. The capability should provide optical signals that are robustly aligned to DWDM channels. Another need exists for confining a multimode optical signal to a specified wavelength range. Yet another need exists for cost effective fabrication of optical devices. Such capabilities would support enhancing an optical communication system's bandwidth and would server cost sensitive applications.

SUMMARY

The present invention supports increasing the information carrying capacity of a fiber optic network. In one aspect of the present invention, a plurality of optical signals can each convey distinct information over a common communication link. A light source at one end of the link can output a respective one of the signals for reception by a detector at the opposite end of the link. Each of the optical signals can have a specified color or a specified wavelength which distinguishes that optical signal from the other optical signals on the communication link. That is, an optical communication link between two devices, sites, points, or locations can have two or more color-based channels for transmitting colored optical signals between those devices, sites, points, or locations. The colored optical signal of each of the channels can comprise a plurality of peaks or quantities of photonic energy or discrete colors.

That is, each optical channel can carry light of a specified color, and the colored light of each channel can comprise discreet color variations, finer colors, a cluster of similar colors, light that spectrally exhibits a comb-like pattern, or multiple longitudinal modes of laser light. In response to a fluctuating condition, a random event occurrence, a stochastic stimulus, a nondeterministic input, or an unplanned perturbation, the light source can output light that remains spectrally aligned to its respective channel or maintains its specified color or wavelength. Such a fluctuating condition, random event occurrence, stochastic stimulus, nondeterministic input, or unplanned perturbation can comprise exposure to a temperature fluctuation, stray light, or environmental contamination, to name a few examples. The light source can be a lasing device stabilized to output a multimode optical signal at the specified color. Responsive to the fluctuating condition, random event occurrence, stochastic stimulus, nondeterministic input, or unplanned perturbation, energy can transfer between individual modes in the multimode optical signal. Modes shifting towards a state of misalignment with the channel can attenuate, while modes shifting towards a state of alignment can gain energy.

The discussion of optical communication presented in this summary is for illustrative purposes only. Various aspects of the present invention may be more clearly understood and appreciated from a review of the following detailed description of the disclosed embodiments and by reference to the drawings and claims.

Other aspects, systems, methods, features, advantages, and objects of the present invention will become apparent to one with skill in the art upon examination of the following drawings and detailed description. It is intended that all such aspects, systems, methods, features, advantages, and objects be included within this description, be within the scope of the present invention, and be protected by the accompanying claims.

BRIEF DESCRIPTION OF THE DRAWINGS

FIGS. 7A and 7B illustrate spectral plots of longitudinal modes of a robustly stabilized multimode laser responding to temperature fluctuation in the laser's lasing cavity in accordance with an exemplary embodiment of the present invention.

FIGS. 8A and 8B illustrate spectral plots of modulation states of a robustly stabilized multimode laser in accordance with an exemplary embodiment of the present invention.

FIG. 9 is a functional block diagram illustrating an optical transmitter that comprises a robustly stabilized multimode laser in accordance with an exemplary embodiment of the present invention.

FIGS. 16A-16E illustrate spectral characteristics of laser cavity stabilizers in accordance with exemplary embodiments of the present invention.

FIG. 52B illustrates a pair of optical fibers situated for establishing a defined separation between each of the optical fibers in accordance with an exemplary embodiment of the present invention.

FIG. 52C illustrates an end-on view of a pair of optical fibers having a defined separation between each of the optical fibers in accordance with an exemplary embodiment of the present invention.

FIG. 52D is a flow chart illustrating a process for fabricating an assembly that comprises two optical fibers with a defined separation or with essentially no separation in accordance with an exemplary embodiment of the present invention.

Figure 1A:
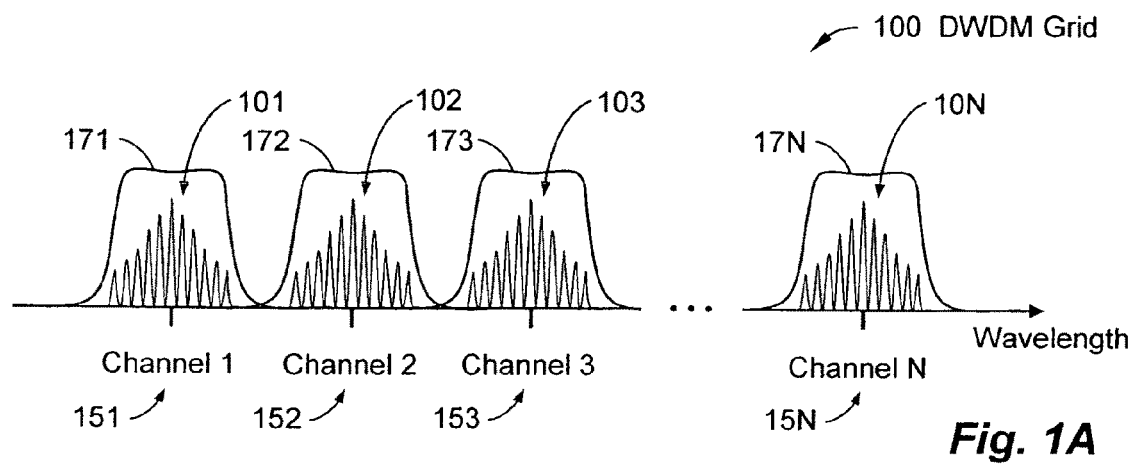
FIGS. 1A and 1B illustrate robustly stabilized multimode optical signals aligned to a wavelength division multiplexing grid in accordance with an exemplary embodiment of the present invention.

Many aspects of the present invention can be better understood with reference to the above drawings. The components in the drawings are not necessarily to scale, emphasis instead being placed upon clearly illustrating the principles of exemplary embodiments of the present invention. Moreover, in the drawings, reference numerals designate corresponding, but not necessarily identical, parts throughout the several views.

DETAILED DESCRIPTION OF EXEMPLARY EMBODIMENTS

The present invention generally relates to robustly stabilized laser systems including communication lasers that output multimode optical signals aligned to a coordinate of a DWDM grid. However, the present invention can benefit a variety of applications. The disclosed technologies, systems, and methods for making and using a robustly stabilized laser can be applied to or can benefit many other optical devices and a wide range of situations.

A robustly stabilized communication laser can output a multimode optical signal that remains aligned to a DWDM coordinate or channel despite fluctuating conditions such as random temperature fluctuations of the laser's laser cavity, stray light from an optical network back reflected into or otherwise entering the laser cavity, and material contamination. Responsive to a fluctuating condition, energy can transfer between individual modes in a plurality of output longitudinal modes that are aligned as a cluster to the DWDM channel. Modes shifting out of channel alignment can attenuate by transferring their energy to other modes. Un-energized modes shifting into alignment can gain energy from other modes. Transferring energy between modes in a controlled manner can maintain the energy of the mode cluster at a uniform level and provide robust stabilization.

Aligning the robustly stabilized optical signal to a spectral window of an optical fiber that has a dip or local minimum in chromatic dispersion and transmission attenuation can support data rates that facilitate upgrading synchronous optical network ("SONET") systems with DWDM. The bandwidth of a SONET-based access network can be increased by upgrading SONET nodes or access points with robustly stabilized multimode lasers. The outputs of robustly stabilized multimode lasers can be aligned to each coordinate or channel of a DWDM grid, thereby populating the grid with robustly stabilized optical signals.

Integrating a cavity stabilizer with a laser cavity can provide robust stabilization. Integrating a mode slicer with a laser cavity can slice one longitudinal laser cavity mode into multiple fine modes and can provide or support cavity stabilization.

The present invention can provide fabrication processes, systems, and technology that control optical and mechanical parameters of a robustly stabilized laser as well as other optical and non-optical devices.

Positioning an adjustable beam steering optical element in a coupling between two misaligned optical components can overcome or correct misalignment and enhance coupling efficiency.

Placing an optical component with two planar sides that are nearly parallel into a path of an optical beam can displace the beam according to the angle of incidence of the beam with respect to one of the surfaces. Rotating the optical component can provide adjustable beam displacement.

Dispensing epoxy into a through-hole or via of a substrate or other component can convey epoxy into a gap or interface between the substrate and an optical component positioned thereon to facilitate a precision bond.

Elongated particles that expand minimally or that contract in response to increased temperature can move in response to a magnetic field. Dispersed as a filling in an epoxy, these particles can form a scaffold upon an application of a magnetic field to the epoxy during epoxy curing. The scaffold can enhance dimensional stability and integrity of a bond. A system can deliver UV light and a magnetic field in a coordinated manner to the filled epoxy to cause assembly of the scaffold and epoxy cure. The system can comprise a bundle of optical fibers coupled to a UV light source such as a UV lamp or a UV laser. The distal end of the bundle can have a coil of wire that produces a magnetic field when electrical current flows through wire. A current source coupled to the wire can supply the electrical current.

Matching the field dimensions of a laser and an optical fiber that is coupled to the laser can enhance the coupling efficiency and heighten the transfer of light between the laser and the optical fiber. The transverse mode field of a mode-expanded laser can have a cross sectional dimension approximating the cross sectional dimension of an optical fiber that has a reduced core size. For example, the cross sections can be approximately 3-5 microns in diameter. This reduced-core optical fiber can be mated with an industry-standard single-mode optical fiber that has a larger core dimension optimized or designed for transmission, for example approximately 10 microns in diameter. Heating the end of the reduced-core optical fiber that is mated to the transmission optical fiber can form a core up-taper so the laser-end of this optical fiber is efficiently mated to the laser and the opposite, up-tapered end is efficiently mated to the transmission optical fiber. A grating in a reduced-core section of this tapered optical fiber can stabilize the laser.

A contoured region of an optical component, such as a tapered region of a cone-tipped optical fiber, can have a grating, such as a UV-written Brag grating. The grating can be written into the contoured region by submerging the component in a fluid having a refractive index matched to the component and then projecting UV laser light through the fluid and onto the component. Such a cone-tipped optical fiber can be mated to a laser to form an external cavity laser.

A distributed feedback laser can have a grating or similar feature that stabilizes the laser by controlling and allowing resonance of multiple longitudinal modes. A negative thermal expansion material attached to the laser can enhance the laser's wavelength stability by controlling the laser's dimensional change in response to temperature fluctuations.

A VCSEL can output a signal that is aligned to a coordinate of a DWDM grid with sufficient stability so that wavelength alignment is not interrupted by or remains acceptable in the face of temperature fluctuations of the VCSEL. The VCSEL can have a lasing cavity that extends beyond the VCSEL's gain medium. A section of the cavity can shorten in response to an increase in temperature to compensation for a gain medium that expands in response to the temperature increase. The overall or net optical length of the cavity can remain uniform, invariant, or essentially constant during a temperature fluctuation.

An optical filtering assembly can filter light output by a robustly stabilized multimode laser or other optical source. An optical fiber can receive light from the laser and deliver it to a gradient index lens or other lens that projects that light onto a band pass filter or other thin film or interference filter. The filter can transmit light in a span of wavelengths and reflect light outside of that wavelength span. A second optical fiber, adjacent the first optical fiber, can collect light reflected by the filter. A third optical fiber coupled to a condensing or receiving lens can collect light transmitted through the filter. The first and second optical fibers can be disposed in concentric alignment with the optical axis of the gradient index lens. That is, these two optical fibers can each be disposed an equidistance from and on opposite sides of the lens's optical axis. Adjusting the separation between the first and second optical fiber can create a corresponding adjustment in the angle of incidence of light on the filter. The adjustment in angle of incidence can, in turn, create a corresponding shift in the transmission and reflection characteristics of the filter assembly, for example shifting a pass band of a band pass filter to a shorter wavelength.

A spacer fixed between a pair of optical fibers can provide a defined or specified separation between the two optical fibers to provide a corresponding defined, specified, or predetermined shift in the spectral characteristics of the filter assembly when the pair is butted to the gradient index lens. One end of the pair of optical fibers can be bound together in a manner that allows the pair to move freely together as a unit. Twisting each optical fiber at the opposite, unbound end of the pair can cause the pair to become tightly packed, for example constrained around or embracing the spacer.

A gradient index lens can have a mechanical axis that is offset from its optical axis as a result of manufacturing tolerance. A mechanical feature having a mechanical axis essentially collinear with the optical axis, such as a taper, can be ground on the lens. This mechanical feature can facilitate automated manufacturing by providing alignment in an assembly so that the mechanical axis of the assembly is essentially collinear with its optical axis.

A material removal process can shorten an optical component, such as a planar light guide circuit that can be incorporated into a laser device, to impart the component with a desired length. A process based on photolithography can coat a patch of the optical component with a fluorescent material or other material readily detected by optical sensing. A polishing or lapping process can abrade, release, or otherwise remove material from the component until a sensor detects the coating in the removed material, for example by monitoring a lapping disk's surface for fluorescent particles. Detection of the coating can serve as a process endpoint to trigger terminating a stage of material removal.

Turning now to a discussion of terminology, an overview of some terms related to various embodiments of the present invention follows.

The term "ultraviolet" or "UV," as used herein, refers the region of the electromagnetic spectrum or light spectrum having a wavelength shorter than approximately 450 nm.

The term "mode hopping," as used herein, refers to a sudden shift of a laser diode output from one longitudinal mode to another longitudinal mode during single mode operation.

The terms "single mode optical fiber" and "single mode optical waveguide," as used herein, refer respectively to an optical fiber or waveguide in which only the lowest order bound mode, such as a pair of orthogonally polarized fields, can propagate in a sustained manner at a wavelength of interest. Crystal optical fibers, which strictly speaking can contain multiple modes, are considered single mode optical fibers as they carry a single mode over a propagation distance. While single mode optical fibers typically waveguide and transmit exactly one transverse mode at a specific wavelength, they may transmit many longitudinal modes, such as the modes output by a multimode longitudinal laser.

The term "dispersion shifted fiber" or "dispersion shifted optical fiber," as used herein, refers to a type of single-mode optical fiber often used in high-bit-rate, long-distance telecommunications systems. Silica-clad dispersion shifted optical fiber usually has a segmented core that lowers the slope of the dispersion curve at 1550 nm, the wavelength at which silica-based glasses typically reach their lowest attenuation. That is, dispersion shifted optical fiber may exhibit minimal or zero dispersion in a 1550 nm window of propagation that also provides minimal or controlled attenuation.

The term "dispersion" or "chromatic dispersion," as used herein, refers to a property of a material or an optical path to separate light transmitting there through into its constituent wavelength components or colors. In an optical fiber, dispersion reduces bandwidth or data carrying capacity as different wavelengths of light travel at different speeds through the optical fiber communication medium. An optical signal, such as an optical pulse, that is composed of multiple colors or wavelengths of light spreads during propagation according to the dispersion properties of the optical fiber and the wavelength spread of the signal. Measuring time delay of an optical pulse as a function of wavelength can yield a dispersion characterization of an optical fiber. The term "group delay," as used herein, refers to an optical property mathematically related to dispersion.

Pulses at various wavelengths may propagate at different speeds in an optical fiber and thus experience wavelength dependent propagation delay over a unit length of the optical fiber. Group delay of an optical fiber can be measured by determining the transit times of optical signals, having unique wavelengths, traveling a given distance in the fiber. Whereas dispersion is typically measured in picoseconds per nanometer ("ps/nm"), group delay is typically measured in the units of picoseconds ("ps"). Dispersion is usually characterized as the derivative or slope, with respect to nanometers or another expression of wavelength, of an optical fiber's group delay. That is, dispersion can be the change in group delay with respect to wavelength.

The term "interference," as used herein in the context of manipulating light by interference, refers to an additive or subtractive process whereby the amplitudes of two or more overlapping light waves are systematically attenuated and reinforced via interaction with one another. Interference can produce phase shifts, wavelength selective reflection, or broadband transmission, to name a few examples.

The term "interference filter," as used herein, refers to an optical filter that controls the spectral composition of transmitted or reflected photonic energy at least partially by the effects of interference. An interference filter can be made up of thin layers of metal or dielectric material, resulting in high transmission over one or more narrow spectral bands and high reflection outside such bands.

The term "Bragg grating," as used herein, refers to a filter that separates light into constituent colors in accordance with Bragg's law. A fiber Bragg grating is a Bragg grating imposed in an optical waveguide, typically an undulated or periodic refractive index that interacts with light transmitting in the waveguide. The optical waveguide can be an optical fiber, a planar lightguide circuit, or a laser gain medium, for example. That is, the waveguide exhibits a periodic fluctuation in the refractive index of the modal field of light guided in the waveguide, in the core, and/or in the surrounding cladding material.

The term "multimode laser" can refer to a laser that produces emission at two or more transverse or longitudinal modes. A multimode laser can be a laser that outputs multiple longitudinal modes or a laser that outputs multiple transverse modes. A laser that outputs multiple longitudinal modes of light outputs light having a pattern of multiple wavelengths or colors. The wavelength separation between each mode typically relates to the optical length of the laser's lasing cavity. A multimode laser that outputs multiple transverse modes of light may, or may not, output a single longitudinal mode of light. As used herein, the term "multimode laser" generally (according to context) refers to a laser that outputs multiple longitudinal modes of light or a plurality of peaks of photonic energy having distinct wavelengths.

The term "laser cavity" or "lasing cavity," as used herein, refers to a spatial region or volume that supports optical resonation in which resonating light undergoes lasing. A laser cavity is typically situated between or bounded by two reflectors, at least one of which is partially transparent to light incident thereon.

A laser cavity may support longitudinal cavity modes and transverse cavity modes. Longitudinal modes are typically associated with the length or axis of the lasing cavity, while transverse modes are typically associated with the width of the lasing cavity. The concepts of and distinctions between longitudinal modes and transverse modes are well known to those skilled in the art. The usage of the terms "longitudinal mode" and "transverse mode" provided herein is not intended to substantively depart from the generally accepted characterizations and usage of these terms by those skilled in the art.

A longitudinal mode is typically an optical waveguide mode with boundary conditions determined along the length of the optical cavity. One skilled in the art can gain an understanding or appreciation of longitudinal modes as related to the present invention from a review of the descriptions and various figures disclosed herein.

A transverse mode is a mode that generally has a field vector normal to the direction of propagation. In a transverse electric mode ("TE"), the electric field vector is generally normal to propagation, while in a transverse magnetic mode ("TM"), the magnetic field vector is normal to propagation. In the transverse electromagnetic mode ("TEM"), both the electric and magnetic field vectors are normal to the propagation direction. In diode lasers, transverse modes are usually spatial modes perpendicular to the active layer. $TEM_{00}$ designates the simplest or basic transverse mode of a laser, with a Gaussian energy distribution across the beam. The $TEM_{00}$ mode is the fundamental mode and corresponds to a smooth distribution of light across a laser's output beam. Transverse modes can arise from waves traveling off-axis along a lasing cavity and influence the spatial profile of a laser's output beam.

The term "multi-quantum well laser," as used herein, refers to a laser structure with a thin (typically about 10 nm thick) layer of bulk semiconductor material sandwiched between two barrier regions of higher bandgap material. That structure restricts the motion of electrons and holes and forces quantization of energies of motion, causing energy to occur at discrete energies.

The term "vertical cavity surface-emitting laser" or "VCSEL" as used herein refers to a laser that emits light essentially perpendicular to the plane of the wafer upon which the VCSEL grows during fabrication. VCSELs typically have a small cavity-length dimension as compared to edge emitting lasers, are efficient, and output light having a relatively large mode field or cross sectional diameter.

The term "distributed feedback laser" or "DFB laser," as used herein, refers to an injection laser that has a Bragg reflection grating or similar grating structure in or adjacent its active region in order to control longitudinal modes.

The gratings in most conventional DFB lasers suppress multiple longitudinal modes and enhance a single mode to facilitate single mode operation.

The term "injection laser diode," as used herein, refers to a laser employing a forward-biased semiconductor junction as its active medium. Stimulated emission of coherent light occurs at a positive-intrinsic-negative ("PIN") junction where electrons and holes are driven into or provided in the junction.

The term "quantum dot," as used herein, refers to a small semiconductor crystal or similar structure of suitable material containing a variable number of electrons that occupy well-defined, discrete quantum states. Because of their tiny size, quantum dots behave according to the rules of quantum physics, which describe the behavior of atoms and smaller particles, rather than the rules of classical physics, which describe the behavior of objects made of many atoms. Quantum dashes are slightly elongated quantum dots.

The term "quantum dot laser," as used herein, refers to a laser having quantum dots associated with the laser's active region to improve laser performance, typically enhancing gain and reducing adverse effects of increased temperature.

The term "wavelength division multiplexing" or "WDM," as used herein, refers to a system that supports or allows the transmission of more than one optical signal over a common transmission path by assigning each signal a different wavelength region or frequency for propagation. These wavelength regions for propagation or channels may be specified in terms of frequency or wavelength. For example, each of the channels in a WDM system may be aligned with a spectral grid, wherein each coordinate on the grid is separated by a frequency. Such frequency has a correspondence with wavelength and refers to the frequency of the light that transmits on the coordinate system. Thus, this frequency is distinct from a modulation frequency of an optical signal that may transmit information on a WDM system. CWDM and DWDM are forms of WDM.

The term "coarse wavelength-division multiplexing" or "CWDM," as used herein, refers to a WDM system having a 20 nm or greater spacing between adjacent channels. CWDM typically supports stacking eight or fewer channels in the 1550 nm region of optical fiber, the C-Band.

The term dense wavelength division multiplexing or "DWDM," as used herein, refers to a WDM system in which each channel is separated by a wavelength less than 20 nm from an adjacent channel. The coordinates of a DWDM grid can each be aligned with a communication channel, for example positioned in the center of a communication channel, with each coordinate spaced less than 20 nm from its adjacent channel. The coordinates of a DWDM grid can be uniformly spaced as measured in units of frequency or in units of wavelength. These wavelength spacings can be 100 gigahertz ("GHz") (0.8 nm), 200 GHz (1.6 nm), 400 GHz, 800 GHz, or 1600 GHz, to name a few examples.

The term "optical add drop multiplexing" or "OADM," as used herein, refers to a technique or device for adding and dropping select WDM channels from an optical communication system at a location on a communication path.

The term "L-band" as used herein, refers to a wavelength region between approximately 1565 nm and approximately 1625 nm used for carrying multiple WDM signals.

The term "C-band" as used herein, refers to a wavelength region between approximately 1530 nm and approximately 1565 nm used for carrying multiple WDM signals.

The term "S-band" as used herein, refers to a wavelength region between approximately 1485 nm and approximately 1530 nm used for carrying multiple WDM signals.

The term "time-division multiplexing," as used herein, refers to a signal transmission technique in which several low-speed channels are multiplexed into a high-speed channel for transmission. Each low-speed channel is allocated a specific position based on time. That is, each low-speed channel utilizes a dedicated slice of time in the high-speed channel.

The term "bandwidth," as used herein, refers to an information carrying capacity, such as a voice carrying capacity, a data carrying capacity, a carrying capacity for cable television signals, or a carrying capacity of an analog fiber optic link or a digital fiber optic link. Increasing a communication link's bandwidth enables the link to convey an increased level of digital or analog information.

Turning now to discuss each of the drawings presented in FIGS. 1A-68C, in which like numerals indicate like, but not necessarily identical, elements throughout the several views, an exemplary embodiment of the present invention will be described in detail. These figures include functional block diagrams, illustrations, plots, and process flow charts. Certain steps in the processes described below must naturally precede others for the present invention to function as described. However, the present invention is not limited to the order of the steps described if such order or sequence does not alter the functionality of the present invention. That is, it is recognized that some steps may be performed before or after other steps or in parallel with other steps without departing from the scope and spirit of the present invention.

The present invention can include multiple processes that can be implemented with computer or manual operation. The present invention can comprise one or more computer programs that embody certain functions described herein and illustrated in the examples, functional block diagrams, and appended flow charts. However, it should be apparent that there could be many different ways of implementing aspects of the present invention with computer programming, manual steps, non-computer-based machines, or in a combination of computer and manual implementation. The invention should not be construed as limited to any one set of computer program instructions. Further, a skilled programmer would be able to write such computer programs without difficulty based on the exemplary functional block diagrams, flow charts, and associated description in the application text, for example.

Therefore, disclosure of a particular set of program code instructions is not considered necessary for an adequate understanding of how to make and use the present invention. The inventive functionality of any programming aspects of the present invention will be explained in more detail in the following description in conjunction with the various figures illustrating functions, hardware, systems, applications, program flows, and processes.

Figure 1B:
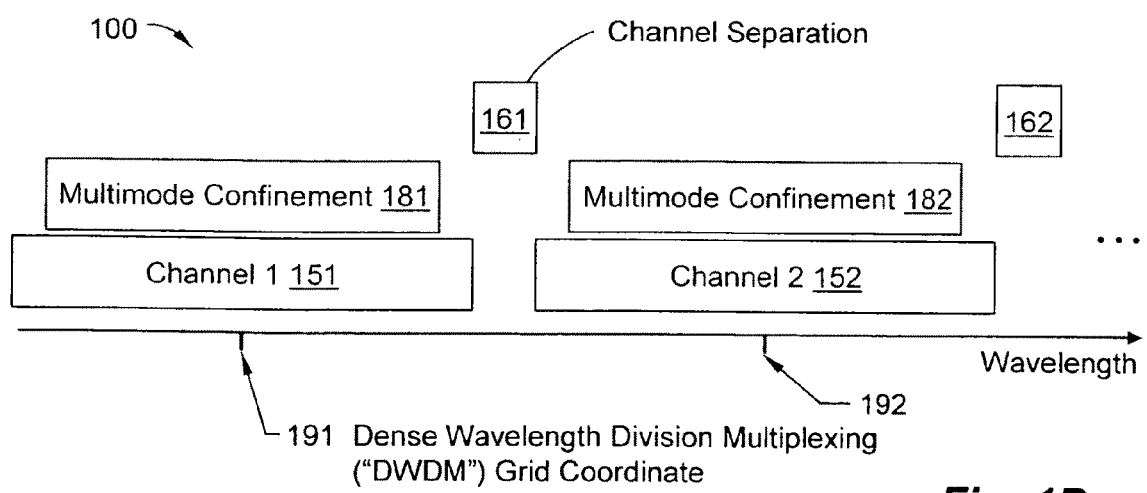

FIGS. 1A and 1B illustrate robustly stabilized multimode optical signals 101, 102, 103, 10N aligned to a DWDM grid 100 in accordance with an exemplary embodiment of the present invention. Referring now to FIG. 1A, the DWDM grid 100 is illustrated in association with a wavelength axis to illustrate the relative and respective wavelengths of each DWDM channel 151, 152, 153, 15N on the grid 100. While illustrated and discussed as a DWDM grid 100, each channel 151, 152, 153, 15N can be aligned to another grid or coordinate system, such as a CWDM grid or another WDM grid. Such a WDM, DWDM, or CWDM grid can support OADM.

In one exemplary embodiment of the present invention, the spacing between each of the channels 151, 152, 153, 15N is less than 20 nm. In one exemplary embodiment of the present invention, the spacing between each of the channels 151, 152, 153, 15N is less than approximately 15 nm. In one exemplary embodiment of the present invention, the spacing between each of the channels 151, 152, 153, 15N is less than approximately 10 nm. In one exemplary embodiment of the present invention, the spacing between each of the channels 151, 152, 153, 15N is approximately 100 GHz or approximately 0.8 nm. In one exemplary embodiment of the present invention, the spacing between each of the channels 151, 152, 153, 15N is approximately 200 GHz or approximately 1.6 nm. In one exemplary embodiment of the present invention, the spacing between each of the channels 151, 152, 153, 15N is approximately 400 GHz or approximately 3.2 nm. In one exemplary embodiment of the present invention, the spacing between each of the channels 151, 152, 153, 15N is approximately 800 GHz or approximately 6.4 nm. In one exemplary embodiment of the present invention, the spacing between each of the channels 151, 152, 153, 15N is approximately 1600 GHz or approximately 12.8 nm.

Each of the multimode optical signals 101, 102, 103, 10N comprises a plurality or cluster of peaks, with each peak in the cluster being a longitudinal mode. Each cluster can be viewed as a group, set, organized arrangement, or comb of photonic energies or light colors. The multimode optical signals 101, 102, 103, 10N propagate on a common single mode optical fiber (not shown in FIG. 1) and are modulated to carry or convey information along the optical fiber. Consequently, each of the signals 101, 102, 103, 10N functions as a "virtual" optical fiber increasing the bandwidth or data carrying capacity by a multiple of the number of the signals 101, 102, 103, 10N and typically carrying distinct digital or analog information.

Robustly stabilized multimode lasers (not shown in FIG. 1) output the multimode optical signals 101, 102, 103, 10N from various locations or sites of an optical network. Each robustly stabilize multimode laser can comprise a cavity stabilizer that provides robust stabilization and wavelength control. FIG. 1A illustrates exemplary spectral characteristics 171, 172, 173, 17N of the cavity stabilizers overlaid upon the DWDM grid 100 with the spectral characteristics 171, 172, 173, 17N of each cavity stabilizer matched to the output 101, 102, 103, 10N of its respective laser. While the spectral characteristics 171, 172, 173, 17N of the cavity stabilizers and the spectral characteristics of the optical signals 101, 102, 103, 10N are illustrated on a common wavelength axis, the amplitudes are not illustrated on a common amplitude scale. That is, FIG. 1 illustrates exemplary relative wavelength positioning of the cavity stabilizers, the respective optical signals 101, 102, 103, 10N, and the DWDM grid 100. However, this figure is not intended to illustrate quantitative amplitude or spectral intensity relationship between the optical signals 101, 102, 103, 10N and the cavity stabilizer spectral characteristics 171, 172, 173, 17N.

As an alternative to propagating the multimode optical signals 101, 102, 103, 10N on an optical fiber medium, these signals 101, 102, 103, 10N can propagate through other waveguided or unguided media. For example, the DWDM grid 100 and the aligned multimode optical signals 101, 102, 103, 10N can increase bandwidth on a free space optical communication link that transmits information between buildings, computer peripherals, relay stations, or other communication apparatus.

Each multimode optical signal 101, 102, 103, 10N is aligned to a respective channel 151, 152, 153, 15N of the grid 100. While illustrated in a configuration of being centered on the coordinates (labeled as 191 and 192 in FIG. 1B) of the channels 151, 152, 153, 15N, each of the optical signals 101, 102, 103, 10N can also be aligned in an offset or non-centered position with respect to the coordinates 191, 192 while maintaining or retaining alignment with the channels 151, 152, 153, 15N.

Turning now to FIG. 1B, this figure illustrates spectral allocation of the DWDM grid 100. DWDM channel one 151 and DWDM channel two 152 are respectively aligned to DWDM grid coordinate one 191 and DWDM grid coordinate two 192. A spectral region of channel separation 160 protects the channels 151, 152 from interfering with one another. That is, channel separation 161 between channel one 151 and channel two 152 offers a wavelength tolerance and a spectral region essentially void of optical signals. This channel separation 161 also provides a spectral region for filtering to support adding or dropping one or more optical signals 101, 102, 103, 10N from a transmission medium. A cavity stabilizer associated with the optical signal 101 propagating in channel one 151 confines the optical signal 101 to a multimode confinement spectral region 181. Likewise, a cavity stabilizer associated with the optical signal 102 propagating in channel two 152 confines the optical signal 102 to that channel's multimode confinement spectral region 182. In other words, the DWDM grid 100 can comprise wavelength ranges 151, 152 assigned to each respective coordinate 191, 192; wavelength ranges 181, 182 within each channel 151, 152 into which cavity stabilizers bound or limit multimode optical signals 101, 102; and wavelength ranges 161, 162 separating each channel 151, 152.

Figures 2A, 2B:
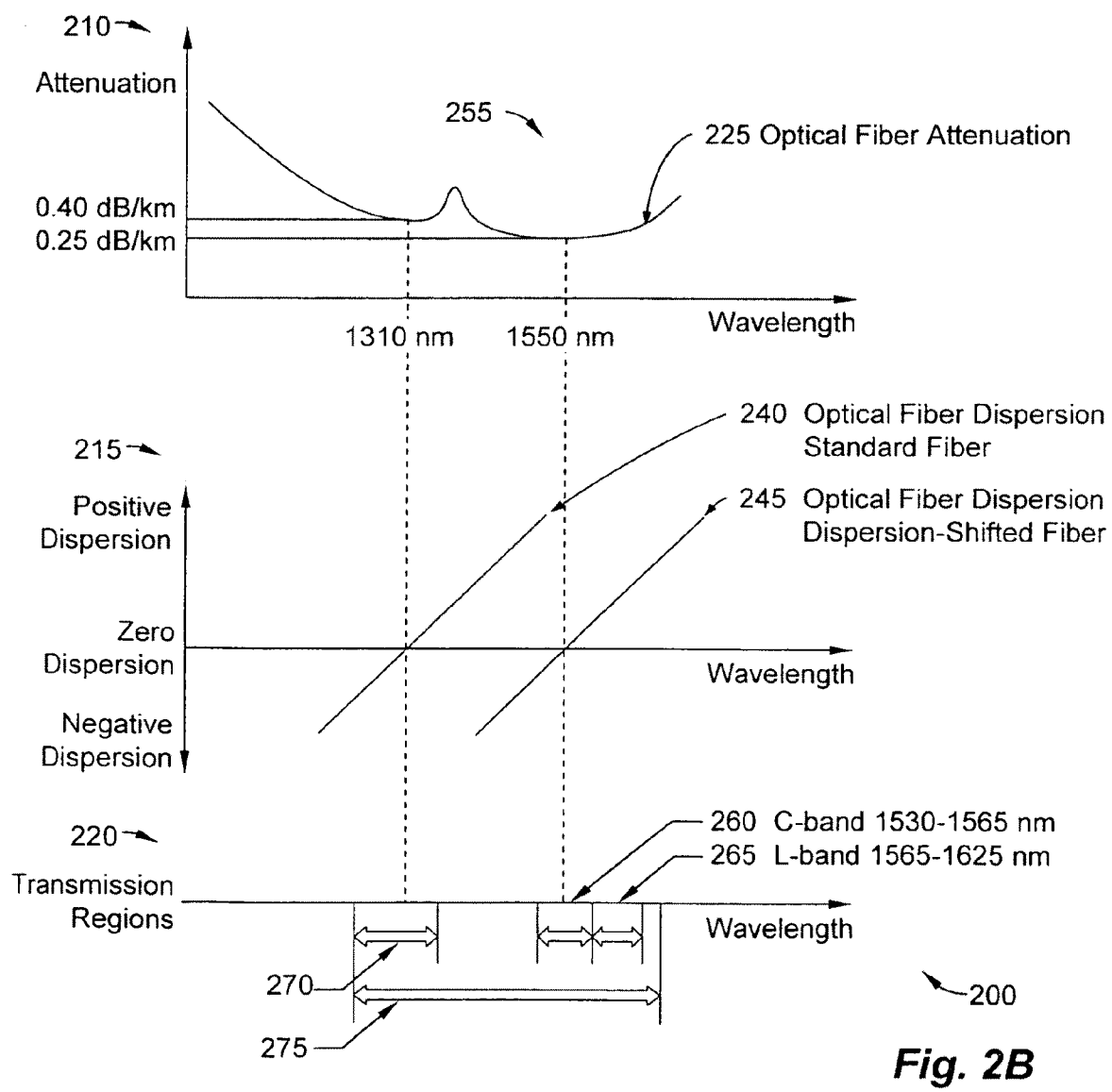
FIGS. 2A and 2B illustrate an optical fiber and plots of its chromatic dispersion and attenuation in accordance with an exemplary embodiment of the present invention.

Turning now to FIGS. 2A and 2B, these figures illustrate an optical fiber 201 and plots 200 of its chromatic dispersion 240, 245 and attenuation 225 in accordance with an exemplary embodiment of the present invention. The robustly stabilized multimode optical signals 101, 102, 103, 10N illustrated in FIG. 1 and discussed above propagate over the transmission optical fiber 201 transmitting information between two sites or among multiple sites, nodes, network locations, or terminals. These sites can comprise communication equipment on a local area network, a cable television network, or a telecommunication node, for example. While the illustrated transmission optical fiber 201 is a single mode optical fiber, the present invention can also support transmission of robustly stabilized optical signals 101, 102, 103, 10N in multimode optical fibers.

The transmission optical fiber 201 has two transmission windows 270, 255, one 270 in a 1310 nm range and one 255 in a 1550 nm range. Each transmission window exhibits a dip or a local minimum in attenuation 225. That is, optical fiber attenuation 225 increases at wavelengths above and below each window. This reduced attenuation facilitates transmitting robustly stabilized multimode optical signals 101, 102, 103, 10N extended distances with minimal or manageable attenuation. In the 1310 nm window 270, the optical fiber 201 attenuates transmitted optical signals approximately 0.40 decibels ("dB") per kilometer ("km"). In the 1550 nm window, the optical fiber provides approximately 0.25 dB per km of attenuation.

The transmission optical fiber 201 provides negative chromatic dispersion below 1310 nm and positive chromatic dispersion above 1310 nm. Thus, the transmission optical fiber 201 has essentially zero dispersion for at least some wavelength in the 1310 nm window.

Transmitting a robustly stabilized optical signal 101, 102, 103, 10N in the 1310 nm window 270 of the transmission optical fiber 201 provides reduced attenuation 225 and reduced dispersion 240. The reduced attenuation 225 facilitates lengthy transmission distances such as 10 km, 20 km, 30 km, 40 km, or 50 km that do not cause excessive amplitude reduction of optical signals 101, 102, 103, 10N and, for example, support transmission without signal amplification.

The reduced dispersion 240 facilitates transmitting robustly stabilized optical signals 101, 102, 103, 10N at high data rates without excessive bit-to-bit interference. Since each mode on a robustly stabilized optical signal 101, 102, 103, 10N has a different wavelength, each mode propagates on the transmission optical fiber 201 at a different speed, according to the chromatic dispersion 240. If dispersion is excessive (unlike the dispersion 240 in the 1310 nm window of the transmission optical fiber 201), a mode of a "zero-state" bit can delay or advance in a communication bit stream and bleed into a earlier or later "one-state" bit, thereby causing interference that can result in unwanted bit errors.

The effect of dispersion on communication can depend on bit rate. Increasing bit rate generally reduces the time between each pulse in a train or time sequences of optical pulses propagating on an optical fiber 201 and conveying information. Dispersion can spread each pulse in time causing time-based overlap between adjacent pulses in the train that can cause communication interference.

With managed or minimal dispersion, such as the dispersion 240 in the 1310 nm window of the transmission optical fiber 201, a robustly stabilized multimode optical signal 101, 102, 103, 10N can propagate with the timing of each bit remaining intact. That is, a robustly stabilized multimode optical signal's individual modes propagate in a coordinated or controlled manner along the optical fiber 201 without causing excessive dispersion-related bit errors.

Transmitting in a region of the optical fiber 201 exhibiting reduced attenuation and dispersion facilitates transmitting multimode optical signals 101, 102, 103, 10N at fast data rates, for example more that approximately one gigabit per second. A plurality of robustly stabilized multimode optical signals 101, 102, 103, 10N can be aligned to a DWDM grid 100 placed in a wavelength region of an optical fiber that provides minimal attenuation and chromatic dispersion.

Existing telecommunication networks, such as telephone access networks, were usually implemented with optical fiber that provides zero dispersion in the 1310 nm window of propagation, as described above. For example, Corning Incorporated of Corning N.Y. has, for some time, marketed a standard, telecommunication-grade single-mode optical fiber product under the product designation "SMF-28" with a window of favorable dispersion and attenuation in the range of 1310 nm. A DWDM grid 100 populated with robustly stabilized multimode optical signals 101, 102, 103, 10N can be overlaid on such "legacy" optical fiber to increase communication bandwidth. Such optical signals 101, 102, 103, 10N can each provide a data rate of 1.25 Gbps, 2.5 Gbps, or 10 Gbps.

As illustrated in FIG. 2B, dispersion shifted optical fiber, an alternative to standard optical fiber 201, can provide essentially zero dispersion 245 in the 1550 nm window of reduced propagation attenuation. A DWDM grid 100 populated with robustly stabilized multimode optical signals 101, 102, 103, 10N can be situated in either the C-band 260 or the L-band 265 or can span both the C-band 260 and the L-band 265. Further, such a DWDM grid 100 can span a range 275 extending from the lower end of the 1310 nm transmission window to the upper end of the 1550 nm transmission window. In one exemplary embodiment of the present invention an optical fiber provides favorable dispersion and attenuation characteristics across a range extending from below 1310 nm to above 1550 nm and supporting multimode DWDM.

Robustly stabilized multimode optical signals 101, 102, 103, 10N can also transmit over an optical fiber in a wavelength range having significant dispersion and/or attenuation. The transmission distance can be short enough so that the dispersion and attenuation are not problematic, for example in a backplane of a communication system. The signals 101, 102, 103, 10N can alternatively flow on a buss of a distributed computer system, for example timing or coordinating computing operations or transmitting information between computing elements in a microprocessor, mainframe, server, minicomputer, or Internet-based computing system. Also, dispersion compensation, such as a dispersion-compensating grating, a thin film dispersion compensator, or a lead-in optical fiber can offset the inherent dispersion on of an optical fiber that exhibits a significant level chromatic dispersion. By placing a negative dispersion component in series with a positive dispersion section of optical fiber, the negative and positive dispersion effects can offset or cancel one another.

Figure 3:
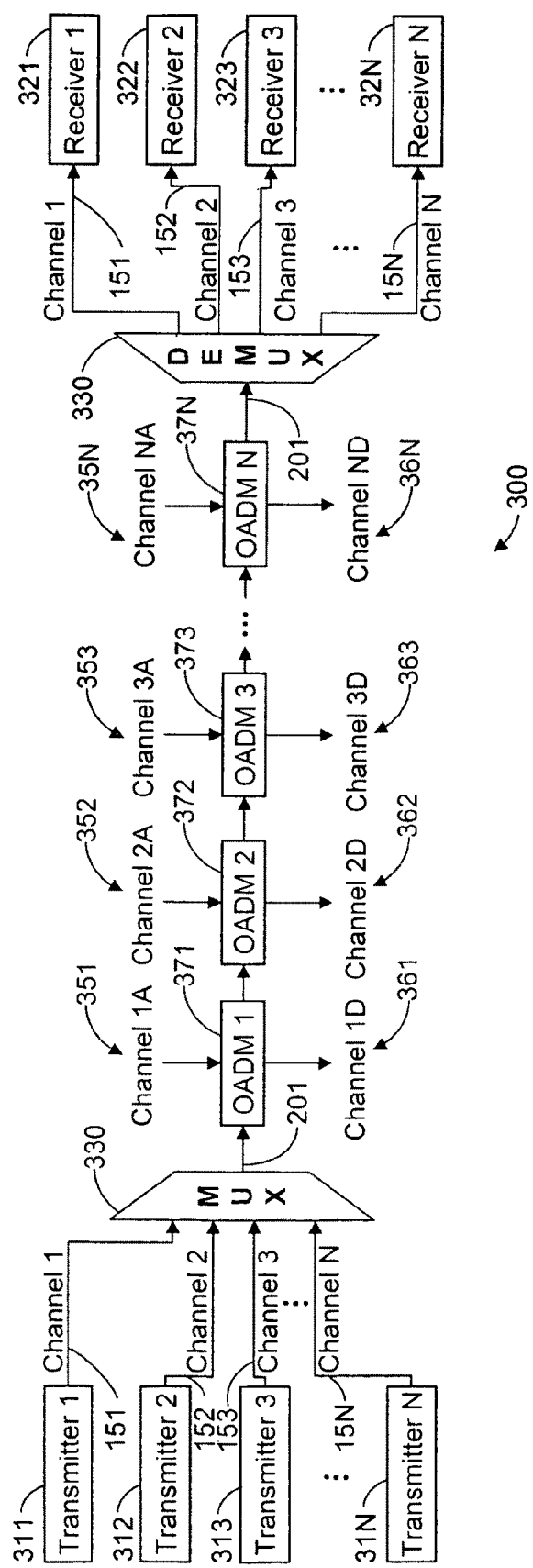
FIG. 3 is a functional block diagram illustrating a communication system using optical add drop multiplexing in conjunction with wavelength division multiplexing in accordance with an exemplary embodiment of the present invention.

Turning now to FIG. 3, this figure is a functional block diagram illustrating a communication system 300 using OADM in conjunction with wavelength division multiplexing in accordance with an exemplary embodiment of the present invention. The system 300 can be part of a local area network, an access network, a cable television network, or other communication system. A computer system can also comprise the system 300 so that computing devices send and receive information over the system 300. That is, a computer system can use the system 300 to provide internal or intra-system data exchange. The exemplary configuration of the system 300 provides a communication link spanning from a set of transmitters 311, 312, 313, 31N to a set of receivers 321, 322, 323, 32N, with taps, in the form of OADMs 101, 102, 103, 10N, that facilitate adding and dropping information at various locations along the span of the link in a computing or communication system or environment.

The transmitters 311, 312, 313, 31N each comprise a robustly stabilized multimode laser outputting a robustly stabilized multimode optical signal 101, 102, 103, 10N that is aligned to a coordinate 191, 192 of a DWDM grid 100, thus in combination populating the grid 100. The number of transmitters 311, 312, 313, 31N corresponds to the number of DWDM channels 151, 152, 153, 15N occupied with signals 101, 102, 103, 10N. For example if the DWDM grid 100 has forty channels 151, 152, 153, 15N, thirty of which are held in reserve or not used, the system 100 has ten operating transmitters 311, 312, 313, 31N.

Each transmitter 311, 312, 313, 31N is coupled to an optical fiber that leads to multiplexer 330 that places the channels 151, 152, 153, 15N and the respective robustly stabilized optical signals 101, 102, 103, 10N on a common transmission optical fiber 201. OADMs 371, 372, 373, 37N add and drop multimode DWDM optical signals 101, 102, 103, 10N from the transmission optical fiber 201. Each OADM 101, 102, 103, 10N can add or drop a single signal/channel 101, 102, 103, 10N/371, 372, 373, 37N or multiple adjacent channels 371, 372, 373, 37N and their respective signals 101, 102, 103, 10N. A communication device such as a router or another optical communication link can be connected to each OADM 101, 102, 103, 10N.

OADM one 371 can drop the signal 101 transmitting on the transmission optical fiber 201, as channel 1D 361, for reception at a residence, business, curb, or a communication device or computing element at another site. Channel 1A 351 can be coupled to a robustly stabilized multimode laser that delivers an optical signal 101 to OADM one 371 for insertion onto the transmission optical fiber 201 as channel one 151, replacing the data dropped into channel 1D 361.

A demultiplexer 330 splits out each of the DWDM channels 371, 372, 373, 37N and their respective optical signals 101, 102, 103, 10N for reception at respective receivers 321, 322, 323, 32N.

Figure 4A:
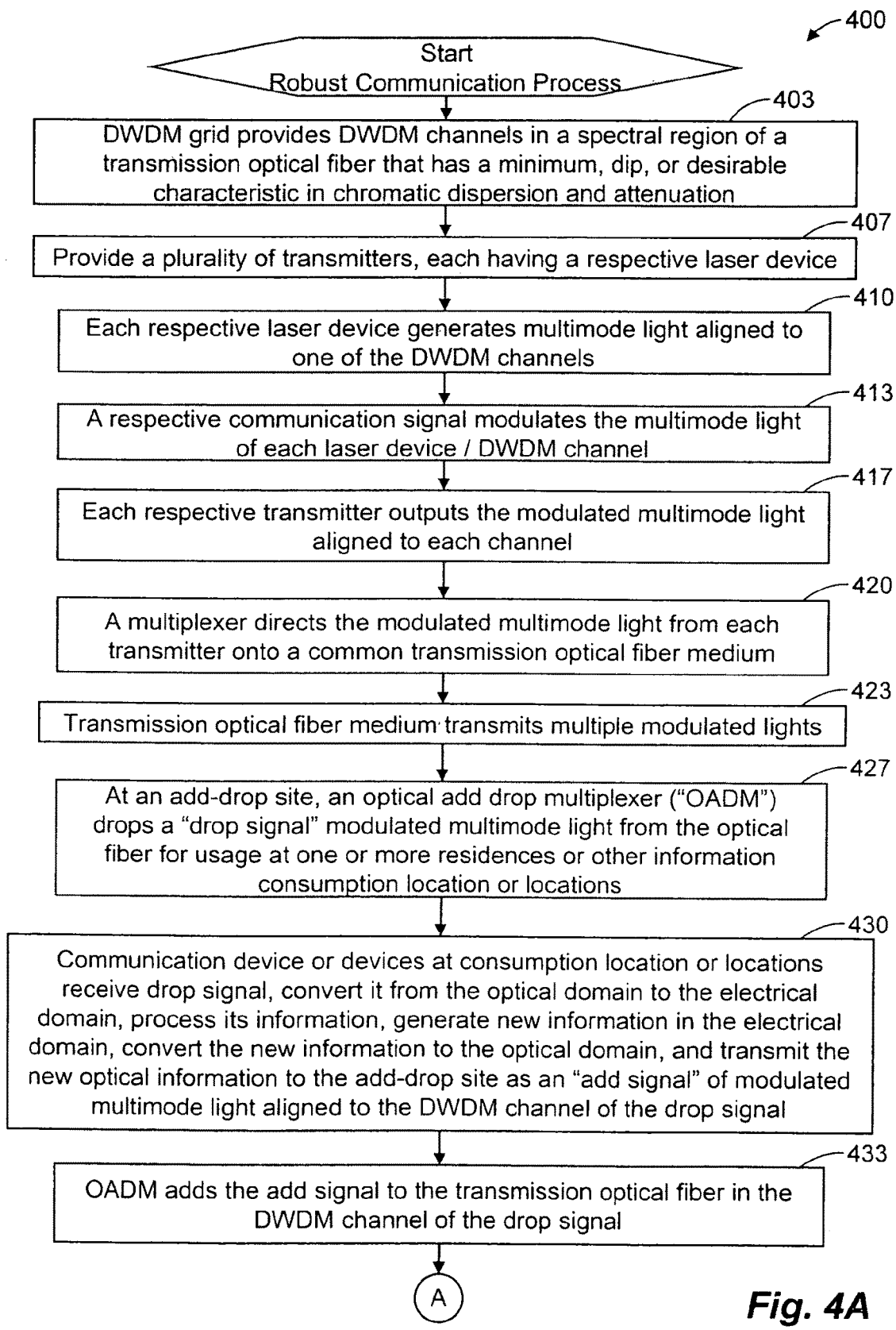
FIGS. 4A and 4B are a flow chart illustrating a process for optical communication using robustly stabilized optical signals in accordance with an exemplary embodiment of the present invention.
Figure 4B:
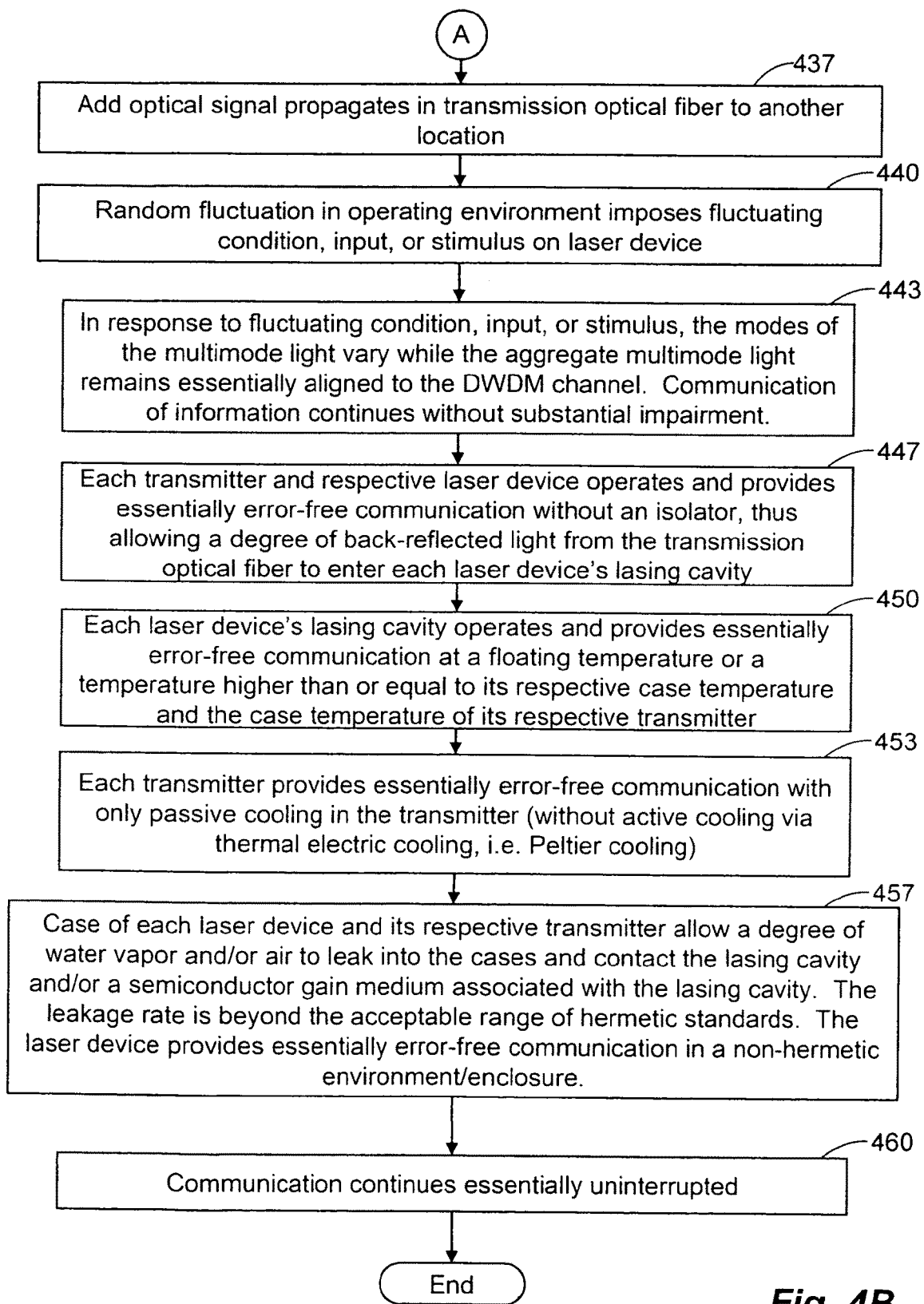

Turning now to FIGS. 4A and 4B, these figures are a flow chart illustrating a process 400, entitled Robust Communication, of an optical communication process using robustly stabilized optical signals 101, 102, 103, 10N in accordance with an exemplary embodiment of the present invention.

At Step 403, the first step in Process 400, a DWDM grid 100 provides DWDM channels 151, 152, 153, 15N in a spectral region or wavelength window of a transmission optical fiber 201 that has reduced chromatic dispersion and a reduced attenuation. That is, the optical fiber's chromatic dispersion and the attenuation each have a dip, a local minimum, an area of control, or a zero crossing in a wavelength range of propagation for the DWDM channels 151, 152, 153, 15N carrying robustly stabilized multimode optical signals 101, 102, 103, 10N.

At Step 407, a plurality of optical transmitters 311, 312, 313, 31N each comprise a respective robustly stabilized laser device that can output a robustly stabilized multimode optical signal 101, 102, 103, 10N. These transmitters 311, 312, 313, 31N are coupled to the transmission optical fiber 201 via respective launch optical fibers or fiber pigtails to facilitate launching robustly stabilized multimode optical signals 101, 102, 103, 10N onto this optical fiber 201.

At Step 410, each respective robustly stabilized multimode laser device generates multimode light spectrally aligned to one of the DWDM channels 151, 152, 153, 15N that can be centered on or offset to the respective grid coordinates 191, 192. At Step 413, a respective communication signal modulates the multimode light of each laser device for each DWDM channel 151, 152, 153, 15N. This modulating communication signal is typically an electrical data signal in digital format, but can also be an analog electrical signal, optical signal, or other signal that can cause optical modulation of the multimode light. The communication signal can be a modulated current injected into the gain medium or active region of a semiconductor diode laser, for example.

In an alternate exemplary embodiment of the present invention, the communication signal modulates the multimode light as an external modulator or an electro-absorption modulator. The external modulator can be a Mach-Zehnder modulator, for example. The external modulator or electro-absorption modulator may or may not be integrally attached, such as monolithically jointed, to the same substrate as the laser gain medium.

At Step 417, in correspondence to the modulation of the modulating electrical signal driving the laser, each optical transmitter 311, 312, 313, 31N outputs a robustly stabilized multimode optical signal 101, 102, 103, 10N carrying data. Thus, each transmitter 311, 312, 313, 31N can send distinct information, in the form of optical pulses, on the transmission optical fiber 201. The data rate of each transmitter 311, 312, 313, 31N typically exceeds approximately one gigabit per second. In one exemplary embodiment of the present invention, the output data rate is approximately ten gigabits per second.

At Step 420, the optical fiber pigtails couple the robustly stabilized multimode light 101, 102, 103, 10N from each optical transmitter 311, 312, 313, 31N into a multiplexer 330 that merges those DWDM signals 101, 102, 103, 10N onto the transmission optical fiber 201.

At Step 423, the transmission optical fiber 201 transmits the multimode DWDM signals a distance such as one, five, or fifty meters, but more typically at least five kilometers. At Step 427, an OADM 371, 372, 373, 37N, at an add-drop site, drops one of the robustly stabilized multimode optical signals 101, 102, 103, 10N, as a drop signal, into a drop channel 361, 362, 363, 36N. The voice, data, or other information carried by the drop signal may be consumed or processed at a residence, business, router, or other site.

At Step 430, a communication device at the drop site, or at a location coupled to the drop site via another optical communication link, receives the drop signal and generates a corresponding electrical signal. That communication device processes the conducted information in its electrical form for consumption. Such consumption can comprise storage in a service area network data base, viewing on a television, listening on a telephone receiver, or processing in a server, for example. As a result of such processing, new or revised information is generated. This information, carried as electrical signals, modulates a robustly stabilized multimode laser device at the add-drop site. A segment of optical fiber carries the robustly stabilized multimode optical signal output by this device, as an add channel 351, 352, 353, 35N, to the OADM 371, 372, 373, 37N.

At Step 433, the OADM 371, 372, 373, 37N launches the add signal into the transmission optical fiber 201 thereby replacing the dropped signal. At Step 437, illustrated on FIG. 4B, the add signal propagates in the transmission optical fiber 201 to another location, such as another OADM 371, 372, 373, 37N or a demultiplexer 330 that splits out all of the robustly stabilized optical signals on the transmission optical fiber 201.

At Step 440, a random fluctuation in an operating environment causes a fluctuating condition, input, or stimulus in at least one of the robustly stabilized multimode lasers in the communication system 300. The random fluctuation can be a random temperature change, typically greater than one degree Centigrade, in that laser's lasing cavity or gain medium.

For example, the robustly stabilized laser can be mounted in an air conditioned building or equipment enclosure in which the air conditioning provides temperature fluctuations of three to five degrees Centigrade. As the environmental temperature varies or swings, the temperature of the robustly stabilized multimode laser changes in a correspondingly erratic, random, or unplanned manner.

As another example, the robustly stabilized multimode laser can be mounted in an outside equipment enclosure that is void of air conditioning and subjected to seasonal temperature fluctuations as well as daily temperature fluctuations or cycles associated with sunlight patterns and daytime-nighttime hours. In correspondence to such random temperature fluctuations, the temperature of the laser's lasing cavity and associated gain medium can fluctuate on a Centigrade scale 5 degrees, 10 degrees, 20 degrees, 50 degrees, or 80 degrees or any range in between, for example.

As yet another example of a fluctuation condition, coherent or non-coherent light generated at a remote network location can back propagate towards the robustly stabilized laser device and couple into the laser cavity in an erratic or unplanned manner. For example, light from a robustly stabilized multimode laser can propagate to a remote location OADM 371, 372, 373, 37N on the transmission optical fiber 201, reflect off of an internal OADM component and back propagate to the same laser cavity from which it originated. Alternatively, light from one robustly stabilized multimode laser can couple into another robustly stabilized laser in an erratic or fluctuation pattern, for example in correspondence with the data signals of the laser generating the interference.

At Step 447, each transmitter 311, 312, 313, 31N and receiver 321, 322, 323, 32N operates and provides essentially error-free communication without an isolator in the transmitter's housing, thus allowing a degree of back-reflected light or other stray light to enter each robustly stabilized laser's lasing cavity. An isolator is a device that provides directionally selectively optical transmission. That is, light traveling in one direction transmits freely while light transmitting in the opposite direction is rejected, diverted, or attenuated. The robustly stabilized multimode laser can provide a bit error rate better than $10^{-12}$ (on average less than one received bit error for every 1,000,000,000,000 bits transmitted. The robustly stabilized multimode laser can provide this performance with at least 12 dB of return loss. In one exemplary embodiment of the present invention, the robustly stabilized multimode laser provides acceptable bit error rates in an environment of 14 dB of return loss. In one exemplary embodiment of the present invention, the robustly stabilized multimode laser provides acceptable bit error rates in an environment of 20 dB of return loss.

At Step 450, each lasing cavity of each robustly stabilized multimode laser operates and provides essentially error-free communication at a temperature higher than or equal to its respective case temperature. In one exemplary embodiment of the present invention, the gain medium of a robustly stabilized multimode laser floats and/or operates at a temperature that is above the temperature of its mount, housing, or enclosure or a nearby environment.

At Step 453, the robustly stabilized multimode laser can provide essentially error-free communication without active cooling, such as thermal electric cooling or Peltier cooling. The temperature of one or more components in the laser's lasing cavity can be approximately equal to or higher than the temperature of the case that encloses the laser. If the laser is encased in multiple or nested cases, the laser cavity or laser gain medium can be higher than each of these cases, or at least the innermost case.

At Step 457, the case of each robustly stabilized laser device and its respective transmitter 311, 312, 313, 31N allows a degree of water vapor and/or air to leak into the case and to contact the lasing cavity or a semiconductor gain medium of this cavity. More specifically, environmental contamination can enter the case and touch a surface or interface of the cavity upon which laser light is incident. The robustly stabilized multimode laser device can provide essentially error free communication in this state of contamination. The contamination rate or rate of case leakage can exceed hermetic standards. That is, the case can be sealed, for example with slightly permeable epoxy, without sealing it to a level that meets hermetic standards as generally accepted for electronic or optical packaging.

Operating a robustly stabilized laser without hermetic packaging and with a floating temperature or with a temperature that is equal to or greater than the surrounding environment, rather than with cooling provided by a thermoelectric cooler, can avoid moisture condensation on the laser's internal components.

At Step 460, communication on the optical communication system 300 continues essentially uninterrupted or otherwise providing acceptable communication performance despite fluctuations imposed on the laser's lasing cavity. Following Step 460, Process 400 ends.

A DWDM optical communication system 300 based on robustly stabilized multimode lasers can meet or exceed the communication, performance, and device standards, as currently published, for one or more of: the Telecommunications Industry Association ("TIA,"); the International Telecommunication Union ("ITU,"); Telecordia; synchronous digital hierarchy ("SDH;") SONET; and the Institute of Electrical and Electronic Engineering ("IEEE") during one or more of the steps of Process 400. That is, in addition to or in concert with performing the steps of Process 400, the present invention can conform to the TIA, ITU, SDH, SONET, or IEEE specifications for laser communication devices and optical communications based on laser communications devices.

TIA standards and specifications are available from the TIA in Arlington, Va. as well as from the organization's website at www.tiaonline.org. ITU standards and specifications are available from the ITU in Geneva, Switzerland as well as from the organization's website at www.itu.int. Telecordia standards and specifications are available from Telecordia Technologies, Inc. of Morristown, N.J. as well as from the company's website at www.telecom-info.telcordia.com. SONET standards and specifications are published by the American National Standards Institute ("ANSI") of Washington D.C. and are available through the organization's website at www.ansi.org. SDH is a standard published by and is available from the ITU. IEEE standards are available from the IEEE of Piscataway, N.Y. or through the organization's website at www.ieee.org.

Turning now to FIGS. 5A-5E, these figures illustrate plots 510, 520, 530, 540, 545 of responses of robustly stabilized multimode optical signals 101, 560, 565, 570, 575 to temperature fluctuations of a lasing cavity in accordance with an exemplary embodiment of the present invention. In other words, these plots 510, 520, 530, 540, 550 illustrate outputs 101, 560, 565, 570, 575 of a robustly stabilized multimode laser in response to an exemplary temperature fluctuation of the laser's lasing cavity.

Figure 5A:
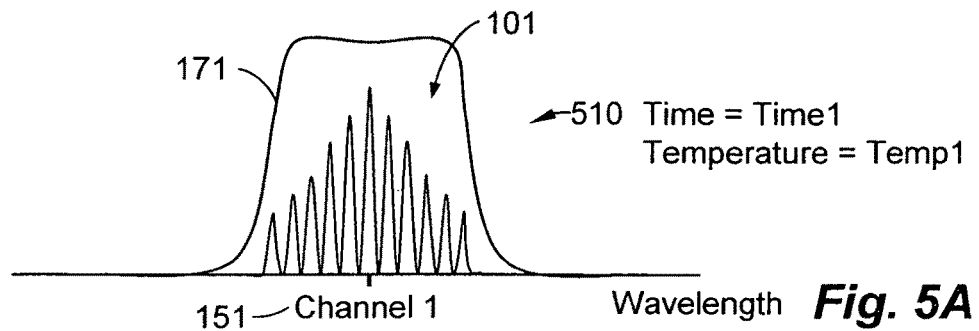
FIGS. 5A-5E illustrate plots of responses of robustly stabilized optical signals to temperature fluctuations of a lasing cavity in accordance with an exemplary embodiment of the present invention.

FIG. 5A illustrates a spectral plot 510 of an exemplary output 101 of a robustly stabilized multimode laser at time Time1 with the laser cavity at Temp1. A plot 101 of intensity of the output modes is superimposed on a plot 171 of the laser's cavity stabilizer, with each of these two plots 101, 171 having a distinct intensity scale. At that time and under those conditions, the laser output 101 comprises a cluster of longitudinal modes collectively aligned to DWDM channel one 151, wherein the energy of the optical signal 101 is centered on the channel 151. Temp1 can be a temperature in the range of −40° C. to 40° C.

Figure 5B:
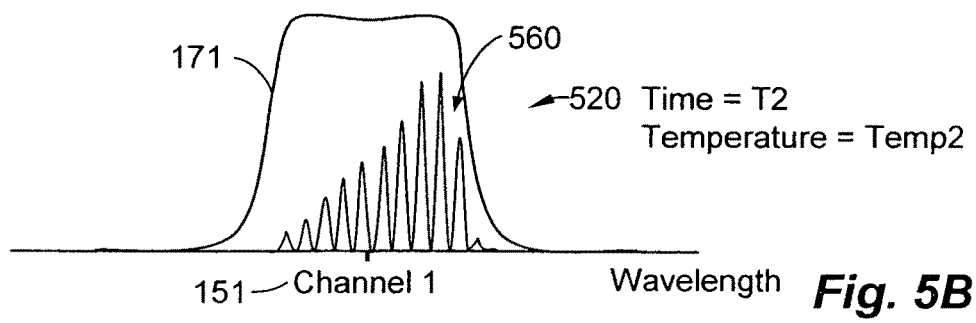

FIG. 5B illustrates a spectral plot 520 of an exemplary output 560 of the robustly stabilized multimode laser at a time T2 with the laser cavity at a temperature Temp2, also in the range −40° C. to 40° C., but distinct from Temp1. Temp2 can differ from Temp1 by 0.5° C., 5° C., or 10° C., for example. Time T2 can be one second, one minute, one hour, or one month later than time Time1, for example. In response to the temperature fluctuation, the energy distribution among the individual modes in the cluster 560 of modes has changed. Under control of the cavity stabilizer, the cluster remains aligned to the DWDM channel 151 as the cavity and its output 560 respond to the fluctuating temperature condition.

Figure 5C:
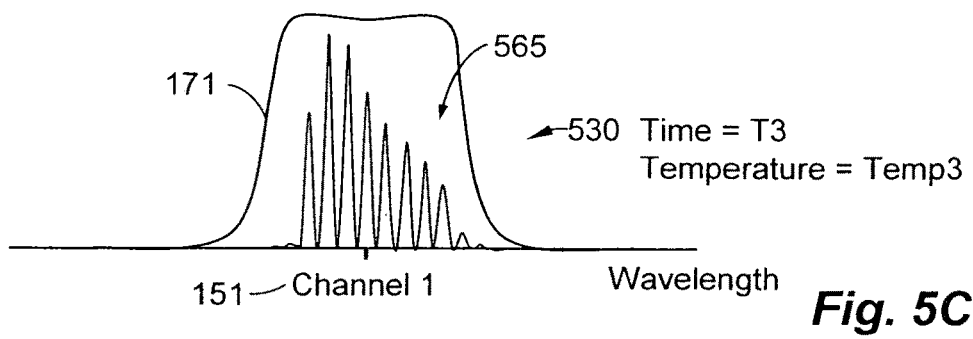

FIG. 5C illustrates a spectral plot 520 of an exemplary output 565 of the robustly stabilized multimode laser at an arbitrary time T3 with the laser cavity at an arbitrary temperature Temp3, also in the range −40° C. to 40° C., but distinct from Temp1 and Temp2. The pattern of energy distribution of the longitudinal modes of the output 565 responds to the temperature fluctuation while the aggregate mode energy remains aligned to the DWDM channel 151.

Figure 5D:
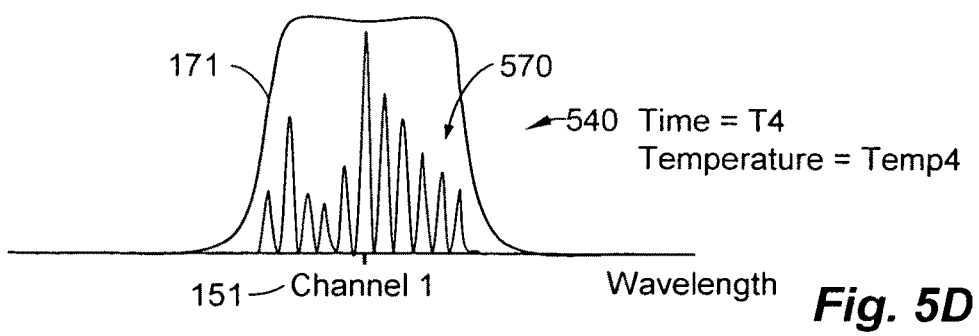

FIG. 5D illustrates another exemplary spectral plot 540 of the robustly stabilized multimode laser's output 570 at an arbitrary time T4 with the laser cavity at an arbitrary temperature Temp4. The time difference between time T3 and time T4 can be less than one millisecond, for example.

Figure 5E:
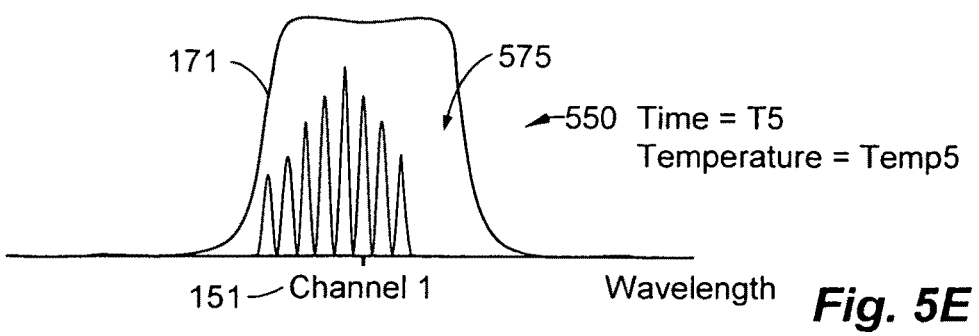

FIG. 5E illustrates a plot 550 of yet another exemplary response the robustly stabilized multimode laser's output 575 to a temperature fluctuation or a new temperature with respect to the temperatures of FIGS. 5A-5D. Time T5 and temperature Temp5 represent an arbitrary time and temperature respectively. At these conditions, the output's cluster of modes has shifted to the lower-wavelength, or blue, side of the channel 151 but nevertheless remains aligned to the channel 151 without significant detrimental bleed into an adjacent DWDM channel.

Figure 6:
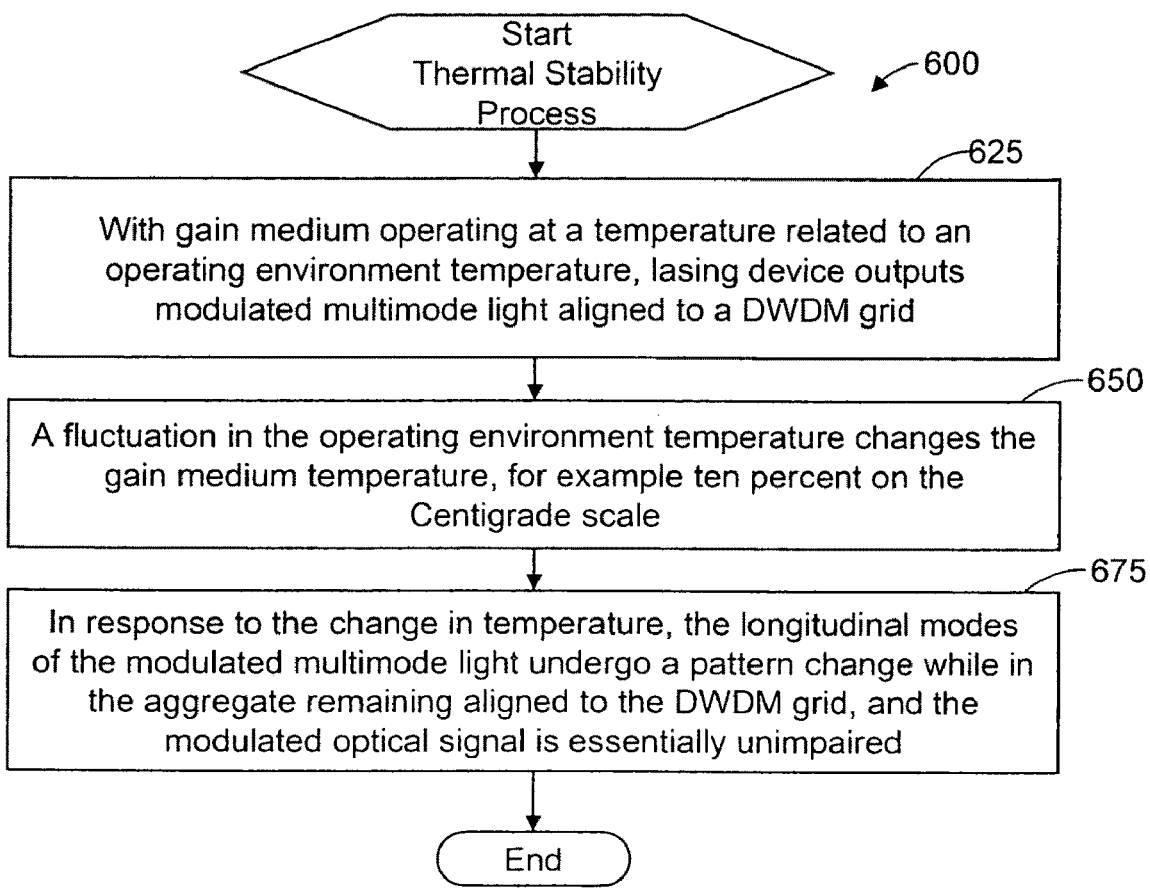
FIG. 6 is a flow chart illustrating a process for operating a robustly stabilized laser in accordance with an exemplary embodiment of the present invention.

Turning now to FIG. 6, this figure is a flow chart illustrating a process 600, entitled Thermal Stability, of a robustly stabilized laser's operation in accordance with an exemplary embodiment of the present invention.

At Step 625, the first step in Process 600, the gain medium of a robustly stabilized multimode laser has a temperature that is related to the temperature of the laser's broader operating environment. Thus, the temperature of the gain medium, or of the laser cavity as a whole, is dependent upon an atmospheric temperature or a temperature of a telecommunications cabinet, for example. The robustly stabilized multimode laser outputs an optical signal 101 comprising modulated multimode light that is aligned to a DWDM grid coordinate 191 or is in a DWDM channel 151.

At Step 650, a fluctuation in the operating environment temperature causes or results in a corresponding temperature fluctuation to the gain medium's temperature, for example 10% on a Centigrade scale or 10° C. The temperature fluctuation can also be a fraction of a degree or a larger temperature change such as 20° C.

At Step 675, in response to the temperature change of the gain medium, the longitudinal modes of the modulated multimode light undergo a pattern change. The pattern change can be a redistribution of the energy in each mode within the DWDM channel 151. The aggregate cluster of modes of the modulated multimode light remains aligned to the DWDM grid coordinate 191 and remains confined within the DWDM channel 151 during the temperature fluctuation and following the temperature fluctuation. The modulation of the optical signal 101 remains essentially unimpaired by the temperature fluctuation. Thus, optical communication continues essentially uninterrupted or remains within acceptable operational parameters or specifications. Following Step 675, Process 600 ends.

Turning now to FIGS. 7A and 7B, these figures illustrate spectral plots 700, 750 of longitudinal modes 725 of a robustly stabilized multimode laser responding to temperature fluctuations in the laser's lasing cavity in accordance with an exemplary embodiment of the present invention. In one exemplary embodiment, FIGS. 7A and 7B illustrate exemplary instances of the responses shown in FIGS. 5A-5 and 6, discussed above, in further detail.

FIG. 7A illustrates a spectral plot 700 of an exemplary optical signal 101 output by a robustly stabilized multimode laser aligned to a DWDM channel 151. The signal 101 comprises a cluster 101 of longitudinal modes 725 at an arbitrary time Time1 and an arbitrary temperature Temp1. Temp1 can be a temperature in the range of −40° C. to 40° C. This optical output plot 700 illustrates relative intensities and wavelengths or colors of each longitudinal mode 725 in the cluster 101. FIG. 1 further illustrates exemplary spectral transmission characteristics 171 of a cavity stabilizer on a common wavelength scale but on a distinct intensity scale.

The wavelength position of a mode 725 within the DWDM channel 151 is a function of the temperature of the laser's lasing cavity as an integrated unit, or of its various elements such as its gain medium. More specifically, the laser and its output 101 provide the illustrated wavelength position of longitudinal mode 725 at temperature Temp1.

FIG. 7B illustrates an exemplary spectral plot 750 of this laser's output 755 at a time Time1 plus Δtime (deltatime) and a temperature Temp1 plus ΔTemp (deltatemperature). In other words, this figure illustrates an exemplary net response of a robustly stabilized multimode laser to a temperature fluctuation of its lasing cavity. The fluctuation can be a small temperature change such as a fraction of a Centigrade degree, such as a tenth, a hundredth, or a thousandth of a degree, for example. The pattern or comb of the cluster of longitudinal modes 725 shifts towards the red (higher wavelength) in response to the temperature "delta" fluctuation. Responsive to the temperature fluctuation, longitudinal mode 725 shifts by a wavelength 785. The time delta between the plot 700 of FIG. 7A and the plot 750 of FIG. 7B is generally arbitrary but can be a faction of a second or a several hours, for example.

Turning now to FIGS. 8A and 8B, these figures illustrate spectral plots 800, 850 of modulation states of a robustly stabilized multimode laser in accordance with an exemplary embodiment of the present invention. A modulating current injected into the laser's semiconductor gain medium or active region modulates the optical signal 801, 101.

The plot 800 of FIG. 8A illustrates the laser's optical output 801 in the "zero" state. This state is representative of transmission of a zero bit in a digital data stream. The robustly stabilized multimode laser continues lasing in this state and thus does not "breaking the lasing threshold." In other words, the modulated current retains a bias level of current that maintains the laser in a lasing state during the zero state.

In the "one" state, the output of the laser is more intense than it is in the zero state. That is, the cluster of optical modes 101 carries a higher level of energy or power in the one state than in the zero state. The difference between the intensity 840 in the zero state and the intensity 830 in the one state is typically at least 10 dB, thus providing a 10 dB "extinction ratio." Stated another way, the intensity of the optical signal 101 in the one state is at least ten fold the intensity of the optical signal 801 in the zero state. In one exemplary embodiment of the present invention, the extinction ratio is in the range of 8 dB to 15 dB. In one exemplary embodiment of the present invention, the extinction ratio is in the range of 10 dB to 20 dB.

While the respective energy levels 830, 840 of the one signal 101 and the zero signal 801 are respectively illustrated as being aligned with each signal's most intense mode, those skilled in the art appreciate that this illustrated alignment is provided for explanatory purposes. The actual intensity, energy, or power of these signal clusters 101, 801 can be defined by the composite cluster of modes rather than the peak power in any single mode.

The power in an optical signal 101 can be characterized in terms of peak power in the one state or average power, as measured in a pulse train of ones and zeroes. In one exemplary embodiment of the present invention, the average power in an optical signal that the robustly stabilized multimode laser outputs is more than approximately 10 milliwatts. The average power can be in a range of three to 25 milliwatts, for example. In one exemplary embodiment of the present invention, the average power is greater than approximately 15 milliwatts. The average power can also be approximately 5 milliwatts or 1-3 milliwatts, depending on the transmission distances, and power budget of the application, for example.

In an alternative embodiment of the present invention, the robustly stabilized multimode optical signal 101 modulates in an analog manner rather than digitally. That is, the signal 101 varies gradually rather than abruptly between a peak power 830 and a minimum power 801. Analog modulation can convey analog information such as television signals.

Turning now to FIG. 9, this figure is a functional block diagram illustrating an optical transmitter 311 that comprises a robustly stabilized multimode laser 950 in accordance with an exemplary embodiment of the present invention. This transmitter 311 can be one of the exemplary optical transmitters 311, 312, 313, 31N in the optical communication system 300 illustrated in FIG. 3 and discussed above.

A modulated electrical signal 905 enters the transmitter's case 907, which is illustrated in FIG. 9 as a functional or schematic element rather than in its physical form, for reception by a driver circuit 910. The physical element corresponding to this functional element 907 can be a case, a housing, an enclosure, a mount, or a similar structure. The driver circuit 910 generates an electrical signal form suited to apply to the robustly stabilized multimode laser 950. The driver circuit 910 can dress or refine the electrical signal 905, for example addressing jitter or increasing rise time. The output of the driver circuit 910 is typically a modulated current but can also comprise a voltage.

The robustly stabilized multimode laser 950 outputs a monitor signal 940 that provides an indication of the optical power in the modulated optical signal 985, which is a robustly stabilized multimode optical signal 101, as described above. A power controller 920 receives the monitor signal 940 as feedback and generates a power control signal 915, which can be a bias current, for delivery to the laser 950.

The modulated electrical signal 905 sets the modulation pattern of the modulated optical signal 985, while the power controller 920 sets the power level. An alarm monitor 985 identifies power failures and provides an indication, in the form of an alarm or status signal, when the power level of the robustly stabilized multimode optical signal 985 falls below a threshold value.

The laser 950, power controller 920, and drive circuit 910 generates heat 970 within the enclosure 907. A portion 980 of this heat passively dissipates, while other heat remains trapped, retained, or resident within the enclosure 907. Heat sinks, fins, or passive thermal pathways can support passive heat dissipation. The transmitter layout can comprise mounts and materials engineered to efficiently conduct heat away from the heat generating sources 910, 920, 950 and towards the outside of the case 907. For example, a diamond heat spreader can transfer heat away from the laser's lasing cavity to prevent runaway heat accumulation. In one embodiment, the transmitter 311 or the laser 950 can comprise passive cooling A fan (not shown) or other device that promotes airflow can be mounted external to the transmitter 311, for example in the enclosure of a rack or similar chassis that holds multiple transmitters in the form of line cards.

Externally generated heat 960 from other transmitters 312, 313, 31N or other communication devices or heat generators can also enter the transmitter housing 907. The externally generated heat 960 can further come from natural sources, such as sunlight and ambient temperature.

In one exemplary embodiment of the present invention, neither the laser 950 nor the transmitter 311 has internal active cooling. In one exemplary embodiment of the present invention, neither the laser 950 nor the transmitter 311 has internal fans or other devices that generate forced airflow within the confines of the transmitter's enclosure 907. Nevertheless, the transmitter 311 can be mounted in an air conditioned enclosure or an enclosure having forced air flow.

Based on the illustrated thermal configuration, the laser's lasing cavity typically operates at a temperature that is higher than or essentially equal to temperature of the enclosure's housing 907 and the laser's case (not shown). Heat generated in the laser's gain medium causes this relatively high temperature in the laser's lasing cavity. That is, a level of thermal energy accumulates in the laser's lasing cavity, resulting in an increased temperature relative to the laser's housing or the transmitter's housing 907. Responsive to temperature fluctuations in an operating environment, associated for example with sunlight cycles or varying heat generated by various electrical devices, the temperature of the lasing cavity can likewise fluctuate. Thus, the laser 950 can function acceptably with a floating cavity temperature. In instances of rapidly increasing temperature incursions of the operating environment, the temperature of the lasing cavity may briefly, intermittently, or sometimes be lower the temperature of the operating environment.

In one alternated exemplary embodiment (not shown in FIG. 9) of the present invention, a temperature controller (not shown) controls the temperature of the laser's lasing cavity so that temperature remains at a defined temperature setting that is higher that the operating environment temperature. Thus, the lasing cavity temperature is elevated and does not significantly vary in response to fluctuating temperature in an operating environment.

Figure 10:
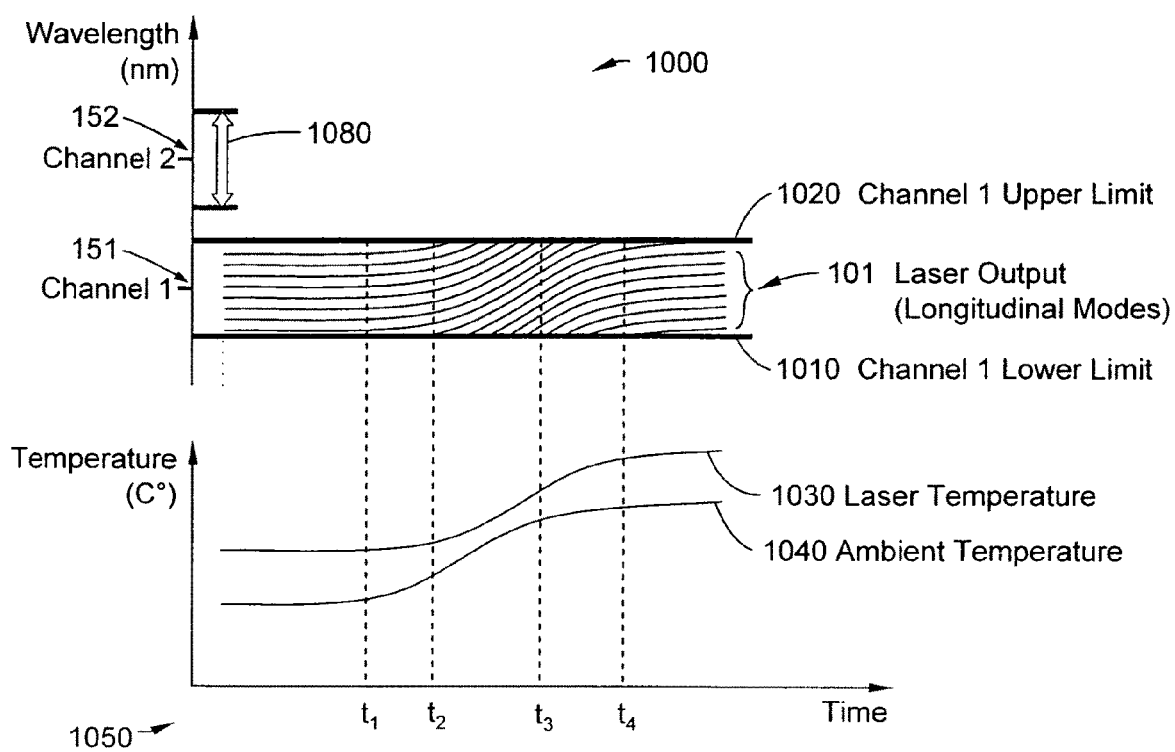
FIG. 10 illustrates a time-based plot of a robustly stabilized multimode laser responding to temperature fluctuation of the laser's lasing cavity in accordance with an exemplary embodiment of the present invention.

Turning now to FIG. 10, this figure illustrates a time-based plot 1000 of a robustly stabilized multimode laser 950 responding to a temperature fluctuation 1030 of the laser's lasing cavity in accordance with an exemplary embodiment of the present invention. Specifically, FIG. 10 illustrates a temperature plot 1050 of temperature fluctuations 1030, 1040 and a spectral plot 1000 of the laser's optical output 101, with these two plots 1000, 1050 presented on a common time scale. The laser temperature can be floating.

The ambient temperature 1040, for example the temperature of an operating environment, is essentially uniform prior to time $t_1$. Between time $t_1$ and time $t_3$, the ambient temperature 1040 increases monotonically then levels out or stabilizes after time $t_3$. The change in ambient temperature 1040 comprises a random fluctuation that can be caused by a change in weather or an increased thermal load in an equipment room associated with electrical equipment usage, for example. The elapsed time between time $t_1$ and time $t_3$ is arbitrary but can be in the range of ten seconds to twenty minutes, for example.

The temperature 1030 of the lasing cavity of the robustly stabilized multimode laser 950 responds to the ambient temperature fluctuation 1040 and likewise fluctuates. The lasing cavity temperature 1030 is essentially uniform and constant before time $t_1$ and has a higher temperature than the ambient temperature 1040 during this time frame. This higher temperature can be a result of heat generated by the laser 950 and/or associated electronics, such as drive circuitry.

Between time $t_1$ and time $t_2$, the lasing cavity temperature 1030 remains essentially uniform due to a time lag between the ambient temperature fluctuation and the lasing cavity's responsive temperature increase. Transferring heat between the ambient environment and the lasing cavity has a time delay associated thermal propagation through the laser's case, physical mounting structures, and thermal pathways, for example.

At time $t_2$, the temperature 1030 of the lasing cavity begins to increase in response to the ambient temperature fluctuation 1040. At this time, the heat of the ambient temperature fluctuation reaches the lasing cavity via thermal conduction. Between time $t_2$ and time $t_4$, the temperature 1030 of the lasing cavity increases in a fluctuating manner in correspondence to the fluctuation of the ambient temperature 1040. Following time $t_4$ the lasing cavity temperature 1030 levels off or stabilizes to an essentially uniform value.

The plot 1000 of the optical output 101 of the robustly stabilized multimode laser 950 illustrates the laser's response to the temperature fluctuation of the lasing cavity 1030, which is driven by the temperature fluctuation of the ambient temperature 1040.

The laser's output 1010 remains aligned to DWDM channel one 151 before, during, and after the lasing cavity temperature fluctuation 1030. More specifically, during the time frame illustrated in the plots 1000, 1050, the laser output 1010 remains essentially at or below the upper wavelength limit 1020 of channel one 151 and at or above the channel's lower wavelength 1010. DWDM channel two 152 has a wavelength band 1080 corresponding to, but displaced from, channel one 151 for carrying optical signals (not shown on FIG. 10). Because of wavelength control afforded by robust laser stabilization, little or no energy (or a minimal or insignificant level of energy) transfers between channel one 151 and channel two 152 due to displaced modal energy.

The energy of the optical signal 151 is distributed within the wavelength bounds of channel one 151, with an energy peak at the wavelength of each longitudinal mode in the optical signal 151. Each of the horizontally oriented lines in channel one 151 illustrates a longitudinal mode or energy peak of the robustly stabilized multimode laser's optical output signal 101. The total energy in the optical signal 101 is distributed among these modes with each mode having a relative intensity within channel one 151. This relative intensity is not illustrated in FIG. 10 but can follow one of the intensity patterns illustrated in FIGS. 5A-5E, for example. That is, FIG. 10 illustrates the relative wavelength positions of each longitudinal mode in cluster of modes, aligned to a DWDM channel 151, in response to a random temperature fluctuation.

Before time $t_2$, each mode in the output signal 101 has an essentially uniform wavelength or a wavelength that varies minimally over time. Between time $t_2$ and time $t_4$, the wavelength of each longitudinal mode shifts, in a coordinated manner, to a higher wavelength in response to the increased temperature 1030 of the lasing cavity that occurs during essentially the same timeframe. Those shifts can be controlled changes, movements, or variations that comprise responses to laser temperature change 1030.

Modes shifting out of channel one 151, above the channel's upper wavelength limit 1020, loose energy and attenuate. That is, modes moving towards a state of misalignment with channel one 151 become less intense. While modes of the channel-one optical signal 101 can have a wavelength position within the wavelength region 1080 of channel two 152, such modes have a negligible level of energy or essentially no energy and thus do not cause significant interference with the optical signal (not shown in FIG. 10) of channel two 152. As a channel-one mode shifts to the upper channel limit 1020, its energy transfers to another channel-one mode, either a mode already in channel one 151 or a mode that is shifting into channel one 151. Thus, as individual modes shift out of and into channel one 151, the composite energy is the optical signal 101 remains stable and essentially uniform and retains alignment with channel one 151.

Between time $t_2$ and time $t_4$, for each mode shifting out of channel one 151 to the upper wavelength boundary 1020, a new mode shifts into channel one 151, moving from a lower wavelength through channel one's lower wavelength limit 1010. Each mode shifting into channel one 151 can become energized, either receiving energy transferred from a mode moving past the upper channel limit 1020 or from another mode in the channel 151. After time $t_4$, shifting of the longitudinal modes tapers off, and each longitudinal mode of the laser output 101 exhibits an essentially uniform or level wavelength in correspondence with the uniformity of the lasing cavity temperature 1030 during this time frame.

Turning now to FIGS. 11A-11D, these figures illustrate spectral plots 101, 1120, 1130, 1140 of responses of a robustly stabilized multimode laser 950 to temperature fluctuations in accordance with an exemplary embodiment of the present invention. The temperature fluctuations can be or comprise one or more random disturbance, perturbation, or stimulus events. The four illustrated plots 101, 1120, 1130, 1140 are vertically stacked to show a common alignment of the wavelength of channel one 151 in each plot 101, 1120, 1130, 1140.

Figure 11A:
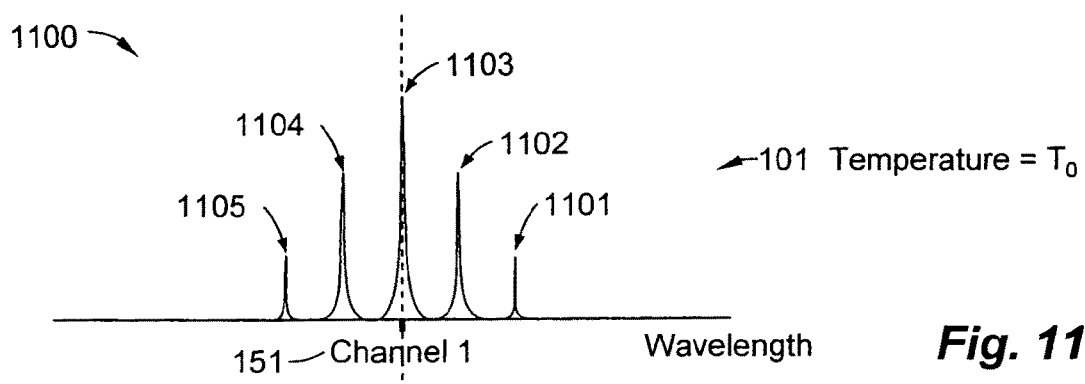
FIGS. 11A-11D illustrate spectral plots of responses of a robustly stabilized multimode laser to temperature fluctuations in accordance with an exemplary embodiment of the present invention.

The plot 101 of FIG. 11A illustrates an exemplary robustly stabilized multimode optical signal 985 having five longitudinal modes 1101, 1102, 1103, 1104, 1105, which is an exemplary number of modes. In other exemplary embodiments of the present invention, the output signal can comprise two, three, five, eight, ten, twelve, fifteen, twenty, or more modes, to name a few possibilities. The modes 1101, 1102, 1103, 1104, 1105 are aligned as a cluster to DWDM channel one 151. The peaks of the modes 1101, 1102, 1103, 1104, 1105 form a comb pattern with the frequency distance between each peak related to the optical length of the lasing cavity and further can be related to an energy separation. That is, the wavelength distance between each peak, measured in frequency units, can be related to an energy quantity.

Figure 11B:
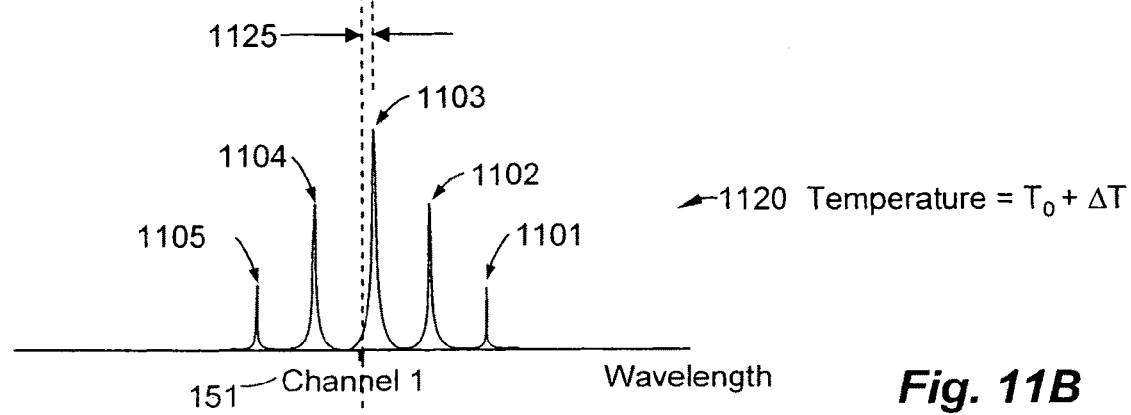

The temperature of the laser's lasing cavity is $T_0$, an arbitrary temperature coupled to the laser's operating environment that can be in a range between approximately −40° C. and 65° C., for example. The plot 1120 of FIG. 11B illustrates an exemplary response of the laser 950, in terms of its output, to a random increase in temperature of $\Delta T$ (deltaT). This temperature fluctuation can be a fraction of a Centigrade degree, several degrees Centigrade, or more than ten degrees Centigrade.

The modes 1101, 1102, 1103, 1104, 1105 shift in unison or in a coordinated manner in wavelength, in response to the temperature fluctuation. The cluster of modes can be described as a "comb" with each mode 1101, 1102, 1103, 1104, 1105 or peak forming a comb "tooth." Mode 1103 shifts a wavelength amount 1125 that is a function of the temperature change as well as other factors such as the absolute temperature $T_0$ and the configuration and materials of the laser's lasing cavity. The modes 1103, 1102, 1101 on the right-hand side of channel one 151 are shifting towards misalignment with the DWDM grid 100, while the modes 1105, 1104 on the left-hand side of channel one 151 are shifting towards alignment with the grid 100.

The pattern of optical energy in the modes 1101, 1102, 1103, 1104, 1105, has also redistributed in response to the temperature fluctuation. That is, the intensities of each mode changes somewhat in response to $\Delta T$ (deltaT).

Figure 11C:
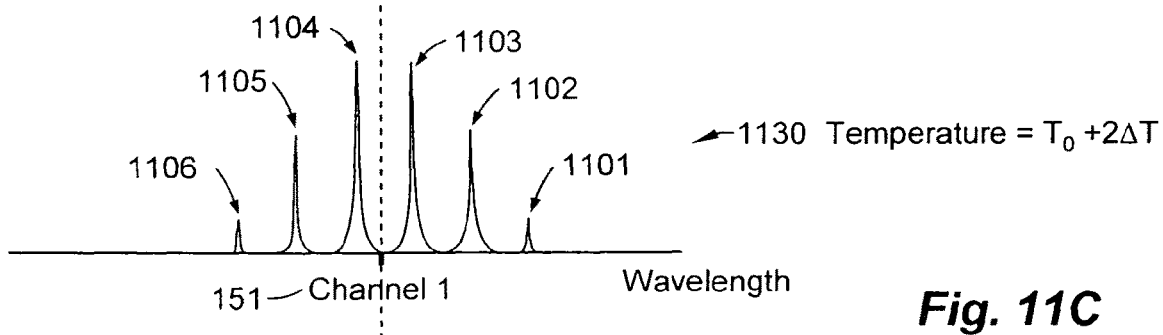

The plot 1130 of FIG. 11C illustrates an exemplary response of the laser 980, in terms of its output, to an increase in temperature of $2\Delta T$ (two times deltaT). That is, the change in temperature has doubled from the time snapshot of FIG. 11B to the time snapshot of FIG. 11C. The comb has shifted further towards the right-hand or higher-wavelength (red) side of the plot 1130.

Mode 1101 has shifted towards the upper wavelength channel boundary 1020 (shown on FIG. 10 but not on FIGS. 11A-11D). In response to approaching this boundary or moving out of alignment with channel one 151, the energy in mode 1101 transfers to one or more of the other modes 1102, 1103, 1104, 1105, 1106. The aggregate or total energy in or power of the mode cluster remains essentially uniform. That is, the intensity of the peak 1101 associated with mode 1101 reduces while the intensity of other peaks 1102, 1103, 1104, 1105, 1106 increases a corresponding amount. A "new" mode 1106 is shifting into alignment with channel one 151 and is gaining energy from one of the other modes 1105, 1104, 1103, 1102, 1101. Mode 1106 was in an un-energized state in the respective time frames of plot 101 and plot 1120 of respective FIGS. 11A and 11B and thus is not illustrated in those figures.

Mode 1103 also undergoes a reduction in intensity in response to moving towards misalignment with channel one 151, although this mode 1103 retains channel alignment at plot 1130 of FIG. 11C. Intensity can transfer from mode 1103 to mode 1104, for example.

Those skilled in the art understand that the discussion of transfer of energy, power, or intensity from one mode to another with respect to FIGS. 11A-D describes the dynamics of the robustly stabilized multimode laser 950 with emphasis on an intuitive explanation. Since the plots 101, 1120, 1130, 1140 graph spectral characteristics of light that is output by the laser 950 and that is external to the lasing cavity, quantities of energy in this light does not transfer directly between modes 1101, 1102, 1103, 1104, 1105, 1106 in a strict sense. Rather, the lasing cavity responds in a manner that exhibits a reduction of intensity in one mode and a corresponding increase in intensity in another mode, discussed and intuitively characterized in terms of an energy "transfer." The energy in each mode 1101, 1102, 1103, 1104, 1105, 1106 comes from a power supply, such as a driver circuit 910. Energy transferring from one mode 1101, 1102, 1103, 1104, 1105, 1106 to another can be one mode 1101, 1102, 1103, 1104, 1105, 1106 receiving a diminishing level of energy from the power supply while another mode 1101, 1102, 1103, 1104, 1105, 1106 receives an increasing level of energy from the power supply.

Figure 11D:
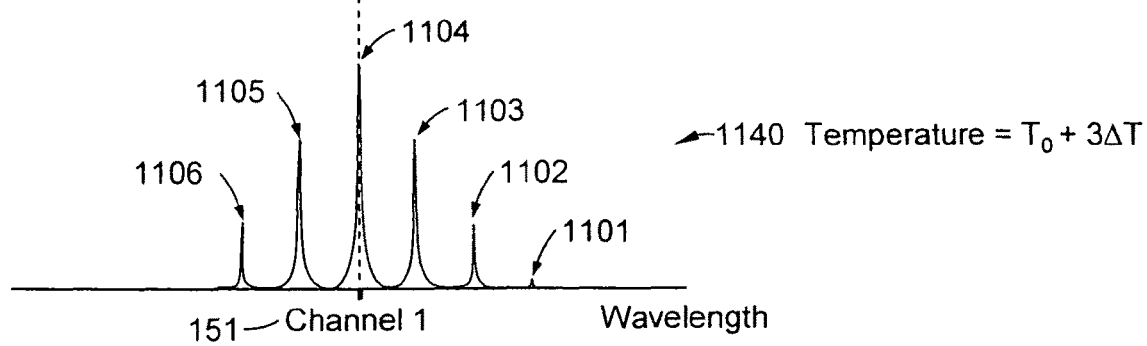

The plot 1140 of FIG. 11D illustrates an exemplary response of the laser 950, in terms of its output, to an increase in temperature of $3\Delta T$ (three times deltaT). That is, the change in temperature has increased three-fold from its initial value of $T_0$ between the time frames of plots 1120, 1130, and 1140. The comb has shifted further towards the right-hand or higher-wavelength (red) side of the plot 1130 of FIG. 10. This net temperature change of the lasing cavity has caused a full cycle of change to the mode comb. In other words, the cluster of modes has shifted a sufficient wavelength to move mode 1104 into the wavelength position held by mode 1103 at temperature $T_0$, as illustrated in FIG. 11A.

Under control of the cavity stabilizer, mode 1101 has shifted into a state of misalignment with channel one 151 and has attenuated to a level that does not cause or produce significant crosstalk in a spectrally adjacent channel. Mode 1106 has shifted into alignment with channel one 151 and, in response, has gained intensity.

The mode comb can shift further in response to additional temperature increase or more intense temperature fluctuation. For example, mode 1102 can loose intensity in response to shifting to the right and out of alignment with channel one 151, while a new or un-energized mode (not illustrated) can gain intensity as it moves into alignment with channel one 151.

Figure 12:
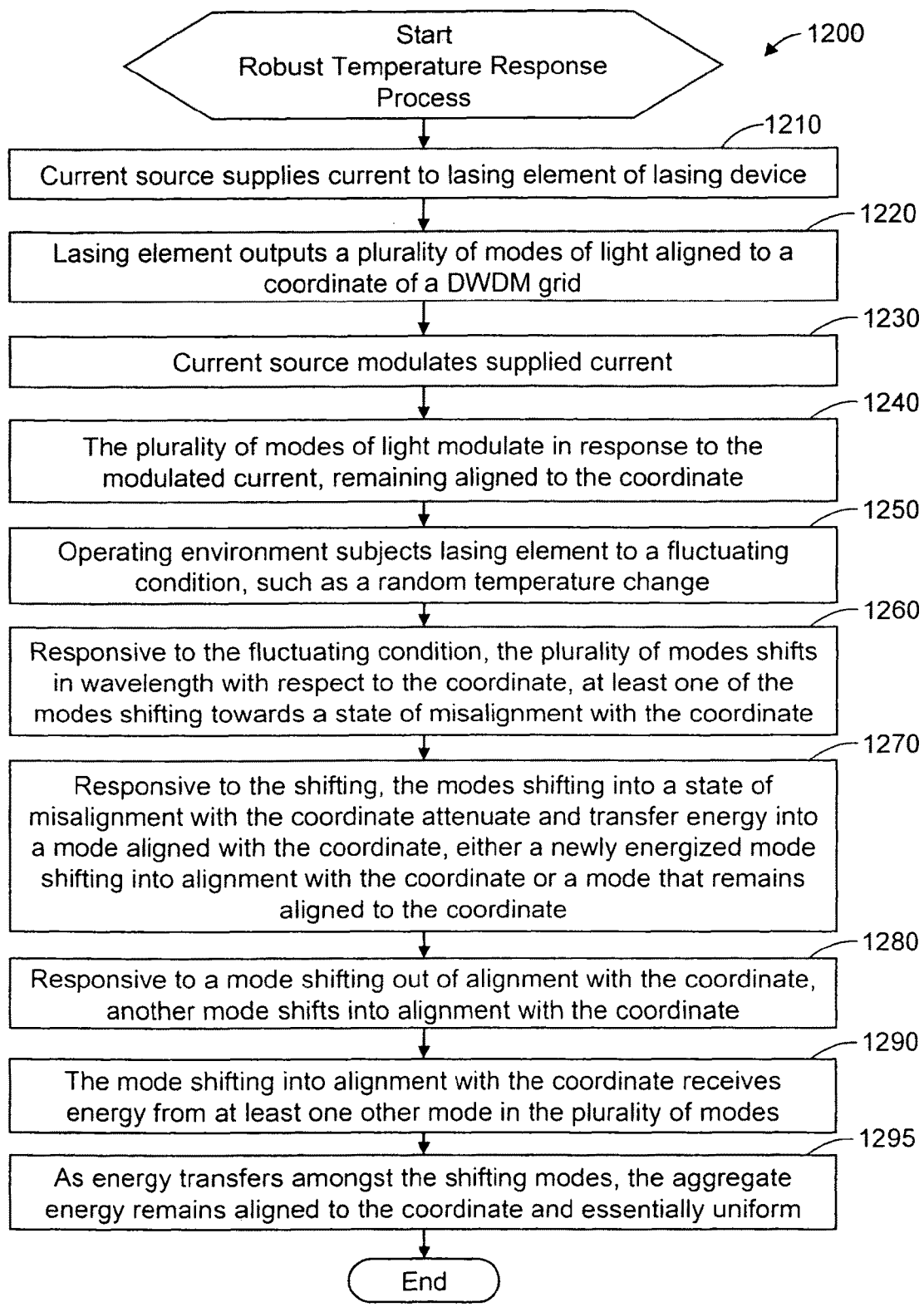
FIG. 12 is a flow chart illustrating a process of a robustly stabilized multimode laser responding to temperature fluctuation in accordance with an exemplary embodiment of the present invention.

Turning now to FIG. 12, this figure is a flow chart illustrating a process 1200, entitled Robust Temperature Response, of a robustly stabilized multimode laser 950 responding to a temperature fluctuation in accordance with an exemplary embodiment of the present invention.

At Step 1210, the first step in Process 1200, a current source 910 supplies current to a lasing element of a lasing device. The lasing element can be a semiconductor lasing die, gain chip, or a lasing cavity, for example, in a robustly stabilized multimode laser 950. The lasing element comprises a gain medium or an active region that amplifies resonant light in response to the current. In an alternate exemplary embodiment of the present invention, an electrical source supplies voltage to the lasing device.

At Step 1220, the lasing element outputs two or more longitudinal modes of light that are aligned to a DWDM channel 151 or a DWDM grid coordinate 191 associated with a DWDM channel 151. At Step 1230, the current source 910 modulates the current in correspondence to a modulated electrical signal 905 that carries data or other information.

At Step 1240, the modes output by the lasing element modulate in response to the modulated current, typically with an extinction ratio exceeding ten. During modulation, the cluster or comb of modes remain aligned to the optical channel 151.

At Step 1250, the operating environment of the robustly stabilized multimode laser 950 exhibits a fluctuating condition and subjects the lasing element to a corresponding fluctuating condition or a random interfering event, for example a random temperature fluctuation of the laser cavity. The laser element can have a floating temperature.

At Step 1260, the comb or cluster of modes shifts in wavelength or frequency in relation to the DWDM channel 151 in response to the fluctuating condition. At least one of the modes in the cluster shifts towards a state of misalignment with the DWDM channel 151 or its associated grid coordinate 191.

At Step 1270, the mode shifting out of alignment attenuates and looses energy or is suppressed, while a mode shifting towards an increased level of alignment becomes more intense or becomes amplified. Energy can transfer in a controlled manner from the attenuating mode to an amplifying mode shifting into alignment or to another mode in the cluster of modes.

At Step 1280, in response to the mode shifting out of alignment, another mode shifts into alignment with the coordinate or channel. This new mode can come from the comb shifting either to a lower wavelength, towards the blue, or to a higher wavelength, towards the red. Prior to shifting into alignment, this mode, in its unaligned state, is not energized or contains a level of energy that is sufficiently low to avoid interference with signals occupying an adjacent DWDM channel.

At Step 1290, the mode that is shifting into alignment gains energy, typically from another mode of the cluster. That is, as that mode intensifies, the aggregate or overall energy in the cluster remains essentially uniform with some modes gaining energy and other modes loosing energy. As energy transfers or redistributes among modes, at Step 1295, the aggregate energy of the mode cluster remains aligned with the DWDM coordinate 191 and channel 151. That is, the intensities of the teeth in the comb may vary while the total energy or center of energy mass remains essentially aligned to the coordinate 191. Communication continues essentially uninterrupted or with an acceptable rate of bit errors. Following Step 1295, Process 1200 ends.

Figure 13:
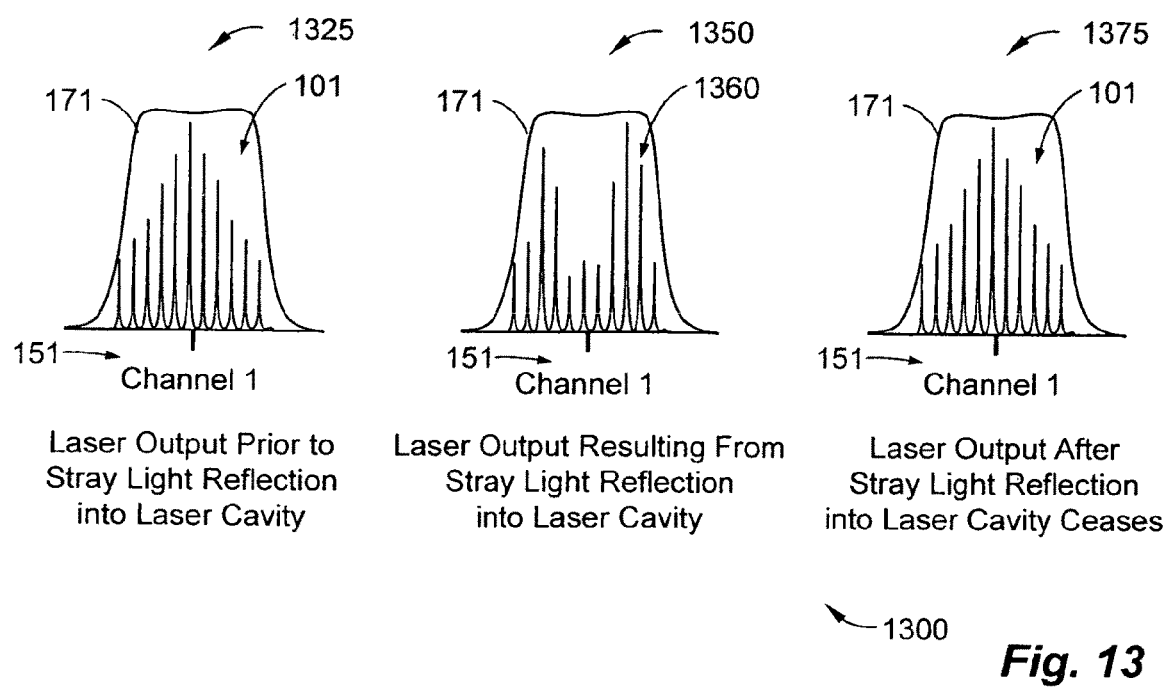
FIG. 13 illustrates spectral plots of a robustly stabilized multimode laser responding to stray light reflection into the laser's lasing cavity in accordance with an exemplary embodiment of the present invention.

Turning now to FIG. 13, this figure illustrates spectral plots 1325, 1350, 1375 of a robustly stabilized multimode laser 950 responding to stray light reflection 925 into the laser's lasing cavity in accordance with an exemplary embodiment of the present invention.

These plots 1325, 1350, 1375 together illustrate an exemplary time sequence 1300 of the laser's dynamic response. The total elapsed time is arbitrary, but can be a fraction of a millisecond, several seconds, or multiple minutes, for example. Stray light reflecting into the laser cavity can be an example of a random fluctuating condition for which the robustly stabilized multimode laser 950 can provide a stable response. That is, light inadvertently entering a lasing cavity can be a random event or stimulus.

At plot 1325, the robustly stabilized multimode laser 950 outputs an optical signal 101, comprising a cluster of longitudinal modes, that is aligned to channel one 151 or its associated grid coordinate 191. The plot 1325 includes an overlay 171 of exemplary or illustrative spectral characteristics of a cavity stabilizer that confines the modal energy to a plurality of aligned longitudinal modes. That is, modes aligned to a DWDM channel 151 can receive energy while modes out of alignment can loose energy.

The relative intensities of the modes exemplifies a stable and uniform state of laser operation wherein the laser 950 is not subject to a randomly fluctuating condition. While illustrated in clean, bell-shaped distribution of modes, the optical signal 101 can be distributed in a random pattern of modal intensities within the channel 151. The modal intensities can fluctuate in response to digital or analog modulation, to small random perturbations, or to the dynamics of the lasing cavity, any of which can comprise a random stimulus. In other words, even prior to being subjected to a stray light reflection or other large fluctuating condition, the output 101 of the robustly stabilized multimode laser 950 can fluctuate or change in a manner that does not significantly disturb channel alignment or communication integrity.

At plot 1350, the laser output signal 1360 responds to a random stray light reflection 925 into the lasing cavity. The stray light reflection, which can originate at a remote location on a fiber optic network, perturbs the lasing cavity. Via the cavity stabilizer and the cavity design (discussed in more detail below), the lasing cavity redistributes energy into each of the modes of the multimode optical signal 1360 while maintaining the modes within the confines of channel one 151. The intensities of each mode vary in a random manner but the aggregate intensity of the optical signal 151 remains aligned to the channel 151.

The spectral or wavelength position of each individual mode in the optical signal 151 can remain essentially uniform or can vary. Such variation can be slight, for example the comb can shift less than a full cycle so that one mode does not shift or move into the position of an adjacent mode. Alternatively, the comb can shift a sufficient wavelength so that one mode does move into a wavelength position previously held by another mode. During the response illustrated in plot 1350, communication continues essentially uninterrupted and unimpaired, for example complying with telecommunications standards or specifications.

Micro fluctuations in the optical signal 151 can absorb the impact of a randomly fluctuation condition to provide a systemically stable response without communication interference. In other words, the dynamic response of the robustly stabilized multimode laser 950 can distribute the effect of a random perturbation to a plurality of modes in a manner that maintains DWDM channel integrity and avoids interrupting optical communication.

The redistribution or rearrangement of modal energy in response to stray light, as illustrated in plot 1350, is an example of a robustly stabilized multimode laser 950 responding to a fluctuation condition in a manner that maintains systemic stability. The laser 950 can respond in a similar manner to other fluctuating conditions, such as temperature fluctuations, vibration, electromagnetic noise, noise or variation in the modulated current that drives the laser 950, or variation in the electrical supply, for example. Such redistribution of modal intensity can accompany wavelength shifts of laser output as illustrated in FIGS. 11A-11D. That is, the exemplary responses of FIG. 13 can occur contemporaneously with the responses illustrated in FIGS. 11A-11D.

At plot 1375, the stray light reflection into the lasing cavity has subsided, and the lasing cavity has returned to essentially the same state of operation that existed prior to the stray light perturbation.

Figure 14:
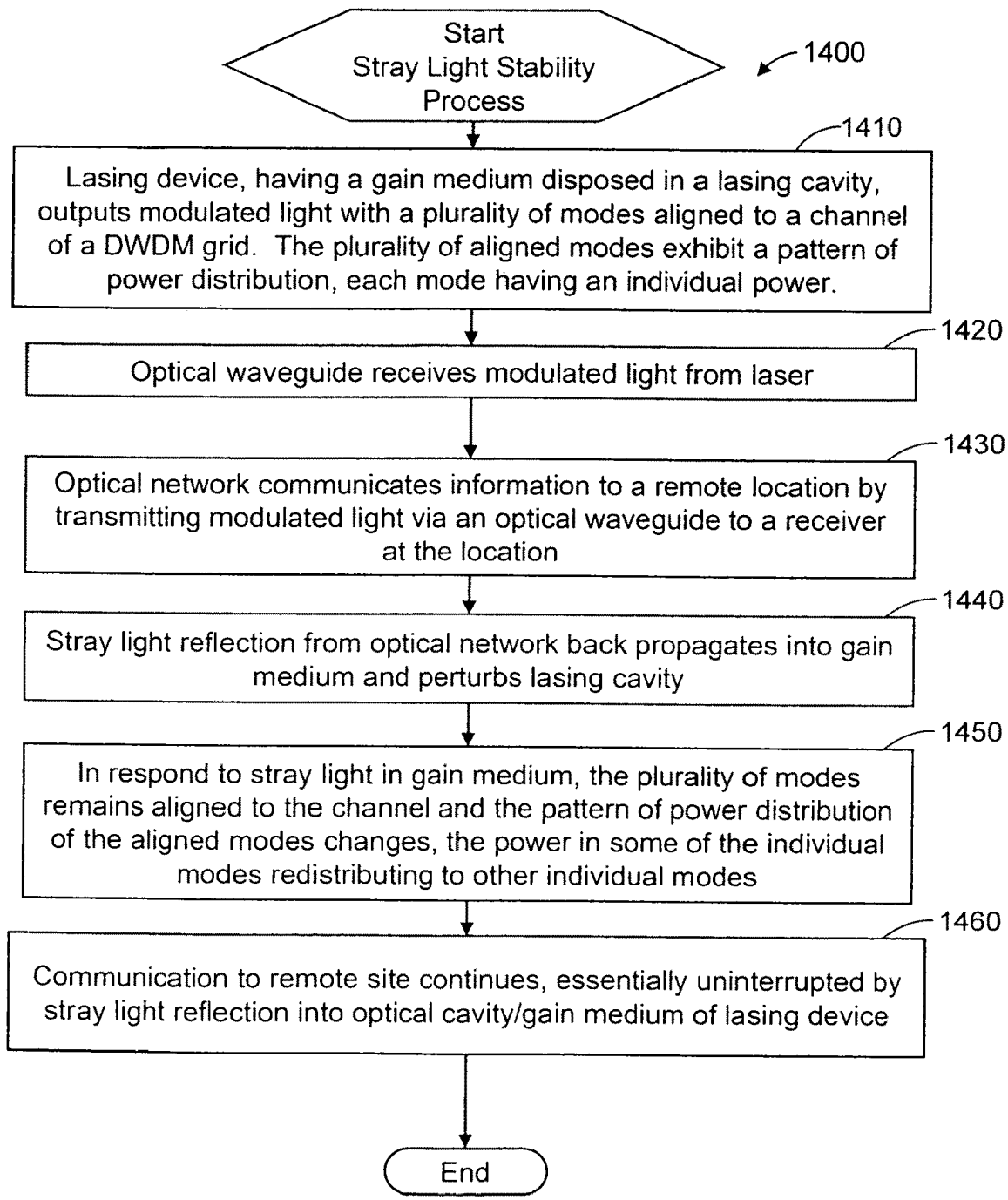
FIG. 14 is a flow chart illustrating a process of a robustly stabilized multimode laser responding to stray light reflection into the laser's lasing cavity in accordance with an exemplary embodiment of the present invention.

Turning now to FIG. 14, this figure is a flow chart illustrating a process 1400, entitled Stray Light Stability, of a robustly stabilized multimode laser 950 responding to stray light reflection 925 into the laser's lasing cavity in accordance with an exemplary embodiment of the present invention.

At Step 1410, the first step in Process 1400, a lasing device 950 that has a gain medium or active region disposed in a lasing cavity outputs modulated light 101. The modulated light 101 has a plurality of modes that are aligned to a channel 151 or coordinate 191 of a DWDM grid 100. This plurality or set of aligned modes exhibits a pattern of power distribution or relative intensity, wherein each mode has an individual power or intensity.

At Step 1420, an optical waveguide, such as a transmission optical fiber 201, receives the modulated light 101 from the lasing device 950. At Step 1430, an optical network, such as the optical network 300 illustrated in FIG. 3, transmits the modulated light 101 to a remote location via an optical waveguide, such as the fiber 201. This light transmission communicates information to the remote site according to the modulation pattern of the light 101. An optical receiver, such as receiver one 321 illustrated in FIG. 3, receives the modulated light 101 and generates a corresponding electrical signal.

At Step 1440, a stray light reflection 925 from the optical network 300 back propagates into the gain medium of the lasing device 950 and perturbs the dynamic state or operation of the lasing cavity. The stray light 925 can be a reflection of the modulated light 101 cast back reflected into the lasing cavity, light from another source, or another form of energy affecting the laser cavity.

At Step 1450, the plurality of modes maintains wavelength alignment with the DWDM channel 151 in response to the perturbation of the lasing cavity by the stray light reflection 925. The power or intensity of some of the individual modes redistributes to other individual modes.

At Step 1460, optical communication of information between the lasing device 950 and the remote site continues essentially without interruption or excessive impairment. The redistribution of power or photonic energy associated with the perturbation among the individual modes of the modulated light 101 can avoid excessive bit errors in data communication. Following Step 1460, Process 1400 ends.

Figure 15:
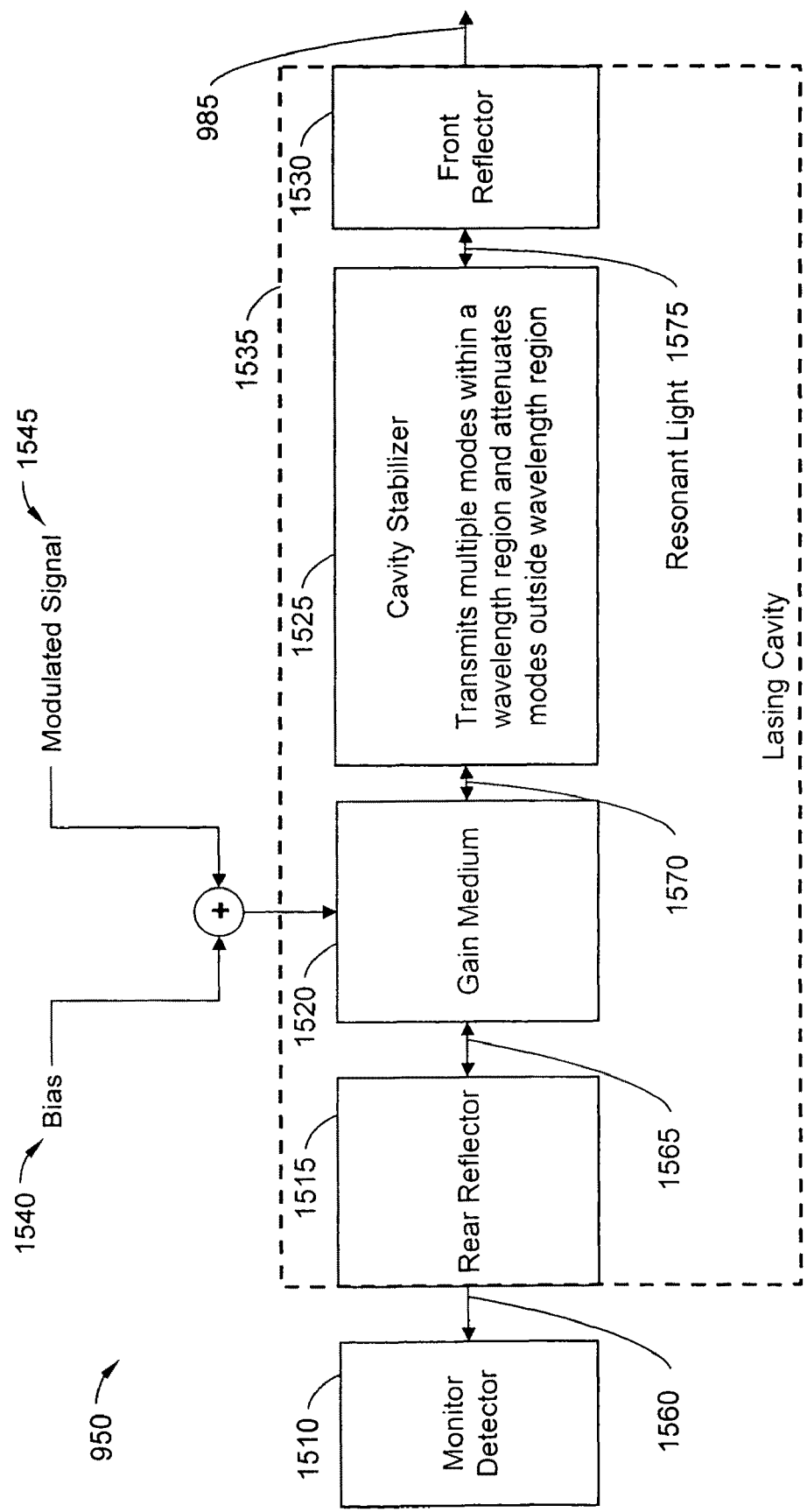
FIG. 15 is a functional block diagram illustrating a robustly stabilized multimode laser in accordance with an exemplary embodiment of the present invention.

Turning now to FIG. 15, this figure is a functional block diagram illustrating a robustly stabilized multimode laser 950 in accordance with an exemplary embodiment of the present invention. The robustly stabilized multimode laser 950 has a lasing cavity 1535 that comprises a rear reflector 1515, a gain medium 1520, a cavity stabilizer 1525, and a front reflector 1530. Light 1565, 1570, 1575 resonates between the front and rear reflectors 1515, 1530 and interacts with the gain medium 1520 and the cavity stabilizer 1525.

The front reflector 1530 transmits a portion 985 of the light 1575 resonating within the lasing cavity 1535 that is incident thereon and reflects another portion back into the lasing cavity 1535. The transmitted light 985 comprises a modulated optical signal 101 that is aligned to a DWDM grid coordinate 191 and/or a DWDM optical channel 151. This optical signal 101 can be coupled into an optical waveguide for transmission of information to a remote location.

In an exemplary embodiment, the front reflector 1530 can transmit approximately 70 percent of the incident resonant light 1575 while reflecting approximately 30 percent of this light 1575. The front reflector 1530 can comprise an optical thin film (not shown in FIG. 15) that provides controlled levels of transmission and reflection. The controlled level of transmission can be in a range of 40 to 80 percent, while the controlled level of reflection can be in a range of 20 to 60 percent, for example.

In one exemplary embodiment of the present invention, the front reflector 1530 transmits approximately 85 percent of incident resonant light 1575 while providing approximately 15 percent internal reflection or reflection in the opposite direction to the incident light. In one exemplary embodiment of the present invention, the front reflector 1530 transmits approximately 90 percent of incident resonant light 1575 while providing approximately 10 percent internal reflection. In one exemplary embodiment of the present invention, the front reflector 1530 transmits approximately 80 percent of incident resonant light 1575 while providing approximately 20 percent internal reflection. In one exemplary embodiment of the present invention, the front reflector 1530 transmits approximately 75 percent of incident resonant light 1575 while providing approximately 25 percent internal reflection. In one exemplary embodiment of the present invention, the front reflector 1530 transmits approximately 70 percent of incident resonant light 1575 while providing approximately 30 percent internal reflection. In one exemplary embodiment of the present invention, the front reflector 1530 transmits approximately 60 percent of incident resonant light 1575 while providing approximately 40 percent internal reflection. In one exemplary embodiment of the present invention, the front reflector 1530 transmits approximately 65 percent of incident resonant light 1575 while providing approximately 35 percent internal reflection.

The rear reflector 1515 transmits a portion 156 of the light 1565 resonating within the lasing cavity 1535 that is incident thereon and reflects another portion back into the lasing cavity 1535 towards the front reflector 1530. The transmitted light 1560 propagates to a monitor detector 1510 that receives this light 1560 and generates a corresponding electrical signal. The electrical signal from the monitor detector 1510 provides a measurement of the intensity of the optical signal 985 that is output by the front reflector 1530 and that carries information to a remote site. Thus, the monitor detector 1510 can provide an indication of the operational state of the laser 950 for general status and as a power monitor signal 940 for power control as illustrated in FIG. 9 and discussed above.

The rear reflector 1515 can transmit approximately 3 percent of the incident resonant light 1565 while reflecting approximately 97 percent of this light 1565. The rear reflector 1515 can comprise an optical thin film (not shown in FIG. 15) that provides controlled levels of transmission and reflection. The controlled level of transmission can be in a range of approximately 1 to 20 percent, while the controlled level of reflection can be in a range of 99 to 80 percent, for example.

In one exemplary embodiment of the present invention, the rear reflector 1515 transmits approximately 10 percent of incident resonant light 1565 while providing approximately 90 percent internal reflection. In one exemplary embodiment of the present invention, the rear reflector 1515 transmits approximately 5 percent of incident resonant light 1565 while providing approximately 95 percent internal reflection. In one exemplary embodiment of the present invention, the rear reflector 1515 transmits approximately 15 percent of incident resonant light 1565 while providing approximately 85 percent internal reflection. In one exemplary embodiment of the present invention, the rear reflector 1515 transmits approximately 20 percent of incident resonant light 1565 while providing approximately 80 percent internal reflection.

The reflectivities of the front and rear reflectors 1515, 1530 along with the optical length of the lasing cavity 1535 can influence the average time that an optical pulse is resident in the lasing cavity 1535. Too much resident time in the lasing cavity 1535 can impair high-speed modulation. For example, if the lasing cavity 1535 is too long and reflectivities of the front reflector 1530 and the rear reflector 1515 are too high, modulation speed can be limited to 1.5 gigabits per second or lower. In one exemplary embodiment of the present invention, a lasing cavity of approximately one to two millimeters can support data rates in a range of approximately 2.5 gigabits per second to approximately 12.5 gigabits per second. The gain medium 1520 can be a semiconductor laser die or gain chip, having an active region, with a length of approximately 350 to 450 microns, for example.

The gain medium 1520 can amplify light guided there through so that transmitted resonant light stimulates emission of additional resonant light. In one exemplary embodiment of the present invention, the gain medium 1520 comprises an edge emitting semiconductor laser die having a length in a range of approximately 200 microns to approximately 400 microns or alternatively approximately 400 microns to approximately 800 microns. A lasing cavity 1535 having a gain medium 1520 with a long length can have front and rear reflectors 1515, 1530 of lower reflectivity than the reflectors 1515, 1530 of a lasing cavity 1535 having a short gain media 1520. That is, lasing cavities 1535 can be configured with a tradeoff between gain medium length and reflectivity of the cavity mirror 1515, 1530 to achieve a sufficiently short resident cavity time to support optical pulses that facilitate acceptable modulation speed and signal quality for a given application.

The gain medium 1520 can be a quantum dot or a quantum dash laser die that provides amplification and optical gain over a relatively broad range of operating temperatures. In one exemplary embodiment of the present invention, the gain medium 1520 comprises a multiple quantum well lasing element. The gain medium 1520 can comprise an injection laser diode. The gain medium 1520 can also comprise a buried ridge laser, a ridge waveguide, or a buried hetero-structure laser. The gain medium 1520 can comprise indium gallium arsenide ("InGaAs"), GaAs, indium phosphide ("InP"), InP/InGaAsP, InGaAsN, silicon, or other material that can lase or provide optical amplification known to those skilled in the art. The gain medium 1520 typically has a capability or potential for light amplification spanning multiple channels 151, 152, 153, 15N, a dip 255, 270 in fiber attenuation 225, or the full DWDM grid 100.

An electrical supply, comprising a modulated electrical signal 1545 and a bias electrical signal 1540 supplies electrical power to the gain medium 1520. The modulated electrical signal 1545 imposes information on the optical output 985 of the lasing cavity 1535. The bias electrical signal 1540 has a sufficient level to avoid the modulation from causing the laser 950 to break the lasing threshold or stop lasing during a pulse train. The bias electrical signal 1540 can control the average level of power in the optical output 985. The modulated electrical signal 1545 driving the laser gain medium 1520 can be a current output by a driver circuit 910 as illustrated in FIG. 9 and discussed above. A power controller 920, likewise as illustrated in FIG. 9 and discussed above, can output the bias electrical signal 1540.

As an alternative to energizing the gain medium 1520 with electricity, a gain medium 1520 can be optically pumped. For example, another laser (not shown in FIG. 15) or an optical source can feed photonic energy into a gain medium 1520 that comprises silicon. A drain or electrical device can remove excess electrons or charge from such a silicon-based gain medium to enhance its light-generation efficiency. In this configuration, the gain medium 1520 can output light via the Raman effect or via stimulated Raman scattering. In one exemplary embodiment, the silicon photonic device comprises two overlapping lasing cavities. A first lasing cavity, energized via electricity, provides pumping or excitation light of a first wavelength to a second lasing cavity. In response to the excitation light from the first cavity, the second lasing cavity outputs response light, of a second wavelength, upon which information can be encoded. The first cavity and the second cavity can use a common element as a front cavity mirror and distinct mirrors for their respective rear cavity mirrors. The common front cavity mirror can manipulate light via interference or diffraction and can comprise one or more gratings or interference filters. The front cavity mirror can have a band of high reflectivity for the first wavelength and a band of lesser reflectivity for the second wavelength. For example, a thin film interference filter can reflect 95%, 98%, or 99%, or more, or in a range thereof, or essentially all, of the excitation light and can transmit 8% to 35% of the response light.

In one exemplary embodiment of the present invention, a silicon photonic device comprises the cavity stabilizer 1525. That is, the methods, steps, devices, systems, and teachings disclosed herein can be applied to a silicon photonic device to provide a silicon photonic device that is robustly stabilized. Such a robustly stabilized silicon photonic device can output light signals which remain aligned to a DWDM channel 151 in the face of random perturbation. A robustly stabilized silicon photonic device can comprise: a lasing device that comprises silicon; a silicon optical amplifier ("SiOA"); a silicon-based modulator; an attenuator comprising silicon; a silicon-based detector; a silicon-based emitter; and/or an optically-pumped silicon amplifying device, to name a few examples. In other words, the system 950 can comprise or be a silicon photonic device.

The eight documents listed immediately below disclose exemplary silicon photonic devices. Those disclosed devices can be adapted to comprise a cavity stabilization system, such as the cavity stabilizer 1525, with optical properties established in accordance with the technology, methods, processes, teachings, or other disclosure presented herein. That is, according to an exemplary embodiment of the present invention, the dynamic response or stability of the systems disclosed in the below eight documents can be enhanced to yield robust stabilization. Further, robust stabilization technology can be added to or integrated with the devices disclosed in those documents. The disclosures of the following eight documents are hereby incorporated by reference:

1) "*A Continuous-Wave Raman Silicon Laser*," by Haisheng Rong, Richard Jones, Ansheng Liu, Oded Cohen, Dani Hak, Alexander Fang, and Mario Paniccia, *Nature* 3346, Mar. 2, 2005. Available at www.nature.com/nature and at www.intel.com.

2) "*An All-Silicon Raman Laser*," by Haisheng Rong, Ansheng Liu, Richard Jones, Oded Cohen, Dani Hak, Remus Nicolaescu, Alexander Fang, and Mario Paniccia, *Nature*, Volume 433, Jan. 20, 2005. Available at www.nature.com/nature and at www.intel.com.

3) "*Silicon Shines On*," by Jerome Faist, *Nature* Volume 433, Feb. 17, 2005. Available at www.nature.com/nature and at www.intel.com.

4) "*Continuous Silicon Laser, Intel researchers create the first continuous silicon laser based on the Raman effect using standard CMOS technology*," by Sean Koehl, Victor Krutul, and Mario Paniccia, published by Intel Corporation as a white paper, 2005. Available at www.intel.com.

5) "*Intel's Research in Silicon Photonics Could Bring High-speed Optical Communications to Silicon*," by Mario Paniccia, Victor Krutul, and Sean Koehl, published by Intel Corporation as a white paper, February 2004. Available at www.intel.com.

6) "*Silicon Photonics*," by Mike Salib, Ling Liao, Richard Jones, Mike Morse, Ansheng Liu, Dean Samara-Rubio, Drew Alduino, and Mario Paniccia, *Intel Technology Journal*, Volume 08, Issue 02, May 10, 2004. Available at www.intel.com (http://developer.intel.com/technology/itj/index.html).

7) "*Introducing Intel's Advances in Silicon Photonics*," by Mario Paniccia, Victor Krutul, Sean Koehl, published by Intel Corporation as a white paper, February 2004. Available at www.intel.com.

8) "*Intel Unveils Silicon Photonics Breakthrough: High-Speed Silicon Modulation*," by Mario Paniccia, Victor Krutul, and Sean Koehl, *Technology@Intel Magazine*, February/March 2004. Available at www.intel.com.

Referring now to FIG. 15, the cavity stabilizer 1525 can limit the number and wavelength of longitudinal modes in the optical output 985 to match the DWDM specifications of an optical communications network, such as the network 300 illustrated in FIG. 3. The cavity stabilizer 1525 can transmit a plurality of modes within a wavelength region 181 associated with a DWDM coordinate 191 and reject or attenuate modes outside this wavelength region 181. The cavity stabilizer 1525 can energize modes within a predetermined wavelength region 181 associated with a DWDM grid 100 while suppressing energy in modes outside this region 181.

The cavity stabilizer 1525 can comprise one or more thin films integrated with the front reflector 1530, the gain medium 1520, or the rear reflector 1515. Such thin films can provide wavelength selectivity via optical interference. A cavity stabilizer 1525 based on thin film technology can have spectral transmission and reflection characteristics that reduced temperature sensitivity as compared to the temperature sensitivity of the length of the optical cavity 1535. In response to a temperature fluctuation, the length of the optical cavity 1535 can change as a function of the thermal expansions and contractions of the cavity's materials and the associated mounting structures. A comb or cluster of longitudinal modes in the cavity's optical output 985 can shift in response to such a change in cavity length. The comb can also stretch or compress somewhat in response to a temperature-driven change in cavity length. As the mode comb exhibits such a temperature-driven response, the cavity stabilizer's characteristics can remain essentially constant.

The cavity stabilizer 1525, with spectral characteristics that vary minimally to temperature change, can maintain uniform wavelength regions of transmission and reflection in an environment of temperature fluctuations. Thus, the cavity stabilizer 1525 can transmit modes within a defined, essentially temperature invariant wavelength region 181 associated with a DWDM grid coordinate 191 while rejecting or deflecting modes outside this region 181. Transmitted modes resonant within the lasing cavity 1535 while rejected modes do not resonant. That is, the cavity stabilizer 1525 can define a wavelength region 181 of robustly stabilized lasing, within the gain medium's amplification or gain profile, that is sufficiently constant with temperature to facilitate or support DWDM. Selecting an appropriate length of the lasing cavity 1535, appropriate reflectivities of the front and rear reflectors 1530, 1515, and a dynamic response speed of the gain medium 1520 can facilitate operating a robustly stabilized multimode laser 950 at data rates exceeding a one gigabit per second data rate for DWDM in an environment of fluctuating or randomly changing temperatures.

The cavity stabilizer 1525 can comprise a mode attenuation device for suppressing or energizing modes selected according to wavelength and a group delay device. The group delay device can provide selected group delay, for example of each mode controlled by the mode attenuator or each mode that the mode attenuator facilitates energizing. The cavity stabilizer 1525 can comprise a mode attenuator device and a group delay device that are integrated together into a unitary or monolithic arrangement.

Turning now to FIGS. 16A-16E, these figures illustrate spectral characteristics of laser cavity stabilizers 1525 in accordance with exemplary embodiments of the present invention. The plots 1600, 1620, 1640, 1660, 1680 of these figures each illustrate exemplary transmission characteristics 1610, 1630, 1650, 1670, 1690 and group delay characteristics 1605, 1625, 1645, 1665, 1685 on a common wavelength scale. That is, each of these figures illustrates wavelength-dependent optical properties of an exemplary laser cavity stabilizer 1525.

FIG. 16A illustrates a wavelength region 181 in which a laser cavity stabilizer 1525 provides a high level of transmission and thus transmits the modes of a robustly stabilized multimode optical signal 101 that are in alignment with a DWDM channel 151 or coordinate 191. Transmitting such aligned modes provides mode control and facilitates selective mode resonance and thus amplification in the lasing cavity 1535.

In addition to a spectral range 181 that transmits modes with little or no impediment, the laser cavity stabilizer 1525 has two wavelength regions 1615, 1617 that provide lower or suppressed levels of transmission. The laser cavity stabilizer 1525 impedes, suppresses, or blocks resonance of modes having wavelengths in these regions 1615, 1617 of suppressed transmission. Thus, modes that are out of alignment or that are moving towards a state of misalignment with the DWDM channel 151 or coordinate 191 do not gain a substantial level of energy.

In correlation with the wavelength range 181 of relatively unencumbered transmission and the wavelength ranges 1615, 1617 of suppressed transmission, a laser cavity stabilizer 1525 can control a laser cavity 1636 so that the laser 950 outputs a cluster or comb of modes having designated spectral characteristics.

The group delay 1605 of the cavity stabilizer 1525 can represent the relative time that would elapse as light of a designated wavelength passes through the cavity stabilizer 1525. The shape of the group delay curve 1605 indicates that the cavity stabilizer 1525 delays certain wavelengths of light propagating in the laser cavity 1535 more that other wavelengths. Thus, the cavity stabilizer 1525 transmits or attenuates each mode of the optical cavity 1535 according to the transmission characteristics 1610 and delays each mode's propagation according to group delay characteristics 1605.

The cavity stabilizer 1535 can comprise a feedback control system for the laser cavity 1535. A laser cavity 1535 can lase when light incident on one of its cavity mirrors 1530, 1560 feeds back into the cavity 1535 and oscillates or resonates between these mirrors 1530, 1560. The cavity stabilizer 1535 can control dynamic response characteristics of the laser cavity 1535 to provide wavelength control suited for DWDM and robust multimode stability.

The cavity stabilizer's group delay 1605 or the related parameter dispersion can have an effect on the pattern of modes in the optical signal 101 output by the robustly stabilized multimode laser 950. Depending on various parameters, the laser cavity 1535 can either exhibit single mode or multimode operation based on group delay properties 1605 of the cavity 1535. Even if the cavity stabilizer's wavelength region 181 of high transmission has sufficient width to support multiple modes, the group delay characteristics 1605 can dictate whether the lasing cavity 1535 operates in a single-mode or a multimode regime. Group delay properties can further affect the degree of stabilization that the cavity stabilizer imparts to the cavity 1535.

In some instances, a laser having transmission and gain characteristics that could support multimode operation can move into a state of single mode operation with the single mode orienting towards the sloping edge of a cavity stabilizer's transmission curve. That is, a laser intended to operate in a multimode state can instead operate in a single mode state, wherein the single mode has a wavelength at the edge of a cavity stabilizer's spectral transmission window. The wavelength position of the single mode can be influenced by the group delay of the cavity 1535 (and cavity length as will be discussed below in reference to FIGS. 20A-20C). Adapting the group delay of the cavity stabilizer can enhance the stability of such single mode operation. That is, single mode stability can depend on group delay properties.

Adapting the group delay or providing a specified, level of group delay can facilitate operating the laser cavity 1535 in a robustly stabilized multimode state rather than a single mode state. Certain group delay curves can provide enhanced multimode stability as compared with other group delay curves for a specific set of cavity parameters. Such cavity parameters can comprise modulation speed, gain, reflectivity of cavity mirrors 1510, 1530, cavity length, gain medium length, optical loss in the optical path of the cavity 1535, coupling loss between various optical elements in the cavity 1535, and dynamic response of the gain medium 1520, for example.

A selected group delay characteristic, such as the group delay profile 1610 illustrated in FIG. 16A, that supports robustly stabilized multimode operation can be related to time constants, rate equations, or response speed of a laser cavity 1535 or the gain medium 1520 of the laser cavity 1535. While group delay for a selected gain medium 1520 or semiconductor gain chip can be established or specified empirically, simulation of cavity dynamics can help define spectral properties of a cavity stabilizer 1525 that can provide robust stabilization. Such simulation can be carried out with mathematics based on manual calculations or with software simulation. Suppliers of software that can be useful for modeling and simulating laser cavity dynamics include: LSD-CAN GmbH of Munich, Germany; Crosslight Software, Inc. of Vancouver, Canada; CFD Research Corporation of Huntsville, Ala.; and Silvaco of Santa Clara, Calif.

A designer of a robustly stabilized multimode laser system can input various design parameters into such simulation or modeling software. Design parameters can comprise, for example, dynamic and steady state properties of the gain medium 1520, modulation speed, rise time, extinction ratio, known rate equation definitions, cavity length, reflectivity of cavity mirrors 1515, 1530, and power constraints. The designer can use simulation tools to refine cavity parameters, specifically group delay, to enhance robust stability in either a single mode or a multimode operating regime.

In the exemplary embodiment of FIG. 16A, the group delay curve 1605 exhibits a relatively flat region between two peaks. The peaks have similar wavelengths to the upper and lower bounds of the transmission region 181 of the cavity stabilizer's transmission characteristics 1610. A multimode optical signal 101 output by a cavity 1535 having a cavity stabilizer 1525 with spectral properties illustrated by FIG. 16A can exhibit robust stabilization and be aligned to the channel 151 or coordinate 191 of a DWDM grid 100.

FIG. 16B illustrates exemplary transmission characteristics 1630 and exemplary group delay characteristics 1625 of a cavity stabilizer 1525 that can support robustly stabilized multimode operation of a laser 950 in accordance with an exemplary embodiment of the present invention. In comparison with the exemplary embodiment of FIG. 16A, the group delay 1625 of FIG. 16B is flatter in the region of multimode confinement (not labeled in FIG. 16B) associated with the pass band of the cavity stabilizer's transmission characteristics 1630.

FIG. 16C illustrates exemplary transmission characteristics 1650 and exemplary group delay characteristics 1645 of a cavity stabilizer 1525 that can support robustly stabilized multimode operation of a laser 950 in accordance with an exemplary embodiment of the present invention. Group delay 1645 is elevated in the cavity stabilizer's region of multimode confinement (not labeled in FIG. 16C) but has a flat region aligned to the pass band of the cavity stabilizer's transmission characteristics 1650.

FIG. 16D illustrates exemplary transmission characteristics 1670 and exemplary group delay characteristics 1665 of a cavity stabilizer 1525 that can support robustly stabilized multimode operation of a laser 950 in accordance with an exemplary embodiment of the present invention. In comparison to the plots of FIGS. 16A and 16B, group delay 1665 is smoother.

FIG. 16E illustrates exemplary transmission characteristics 1690 and exemplary group delay characteristics 1685 of a cavity stabilizer 1525 that can support robustly stabilized multimode operation of a laser 950 in accordance with an exemplary embodiment of the present invention. Group delay 1685 is essentially uniform or constant throughout the cavity stabilizer's region of multimode confinement (not labeled in FIG. 16E) and the associated transmission characteristics 1690 of the cavity stabilizer 1525. The pass band of the cavity stabilizer's transmission characteristics 1690 helps select or define the modes that can become energized via cavity resonance. The group delay characteristics 1685 helps select or define the stability aspects of these resonant modes. The flatness or uniform aspects of the group delay 1685 in the spectral region of the transmission pass band can provide similar cavity residence time and similar dynamic behavior for each energized mode in a multimode DWDM optical signal 101.

Figure 17A:
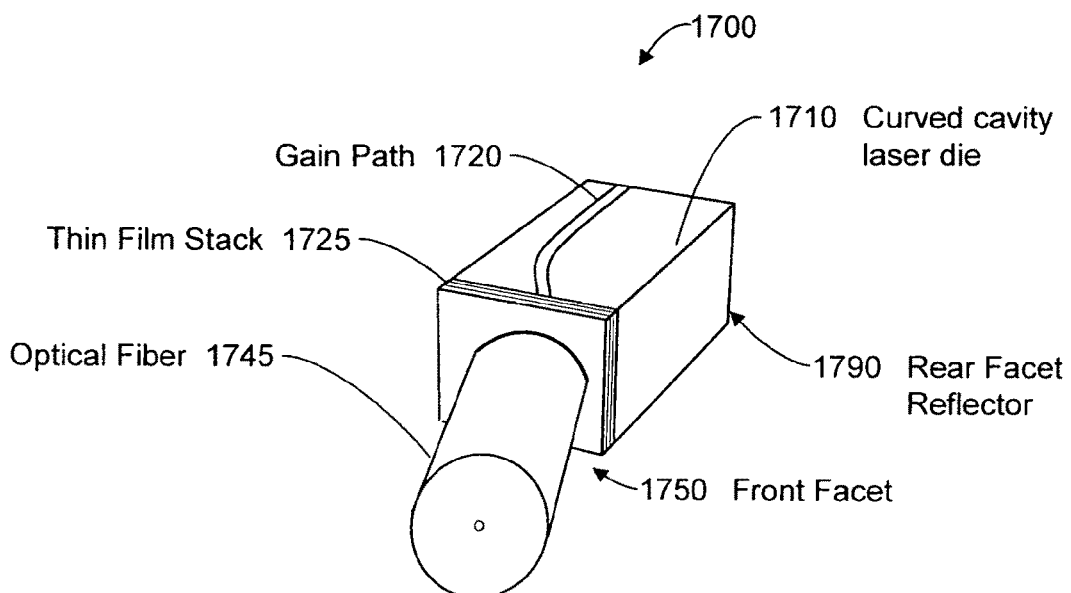
FIG. 17A illustrates a perspective view of a robustly stabilized multimode laser that comprises a curved cavity laser die in accordance with an exemplary embodiment of the present invention.

Turning now to FIG. 17A, this figure illustrates a perspective view of a robustly stabilized multimode laser 1700 that comprises a curved cavity laser die 1710 or gain chip in accordance with an exemplary embodiment of the present invention.

The geometry of the curved gain path 1720 of the laser die 1710 provides a rear facet reflector 1790 that serves as the rear reflector of the laser's lasing cavity. That geometry also provides a front facet interface 1750, through which light transits to couple into the optical fiber 1745. The front facet interface 1750 is angled or oblique with respect to the gain path 1720. That is, the rear facet reflector 1790 is essentially perpendicular with respect to the gain path 1720, while the front facet 1750 is neither perpendicular nor parallel with respect to the gain path 1720. The angled font facet 1750 deflects incident light that is reflected by the facet 1750 away from the gain path 1720, which is in the laser's lasing cavity. Such deflected light avoids resonance in the laser's lasing cavity. That is, the curvature of the gain path 1720 avoids setting up a standing optical wave between the front and rear ends 1750, 1790 of the gain chip or die 1710.

A stack 1725 of thin film layers is attached to the front facet 1750 and can be deposited directly on the front facet 1750. The stack 1725 can comprise oxide layers of alternating, high-low refractive indices that can be tantalum pentaoxide and silicon dioxide, for example. The stack 1725 can further comprise spacer layers that provide one or more cavities within the stack. The layers of the stack 1725 can have a packing density that approaches 100 percent.

The stack 1725 of thin film layers interacts with incident light via an interference effect that occurs at or in the stack 1725 to provide wavelength selective transmission and reflection. The interference effect further generates a group delay profile that varies as a function of wavelength. The stack of thin film layers 1725 comprises a cavity stabilizer that facilitates robustly stabilized multimode operation. The plots 1600, 1620, 1640, 1660, 1680 of FIGS. 16A-16E can exemplify group delay and transmission characteristics of the thin film stack 1725. These spectral properties can be stable with respect to temperature variation. For example, the spectral properties can vary less than approximately one percent over the operating temperature of the laser 1700. In one exemplary embodiment of the present invention, the spectral properties vary less than approximately 0.5 percent over the rated operating temperature of the laser's lasing cavity. Other exemplary embodiments may each provide less than approximately 0.05 percent, 0.1 percent, 2 percent, and 5 percent variation as a function of temperature. Changes in the physical and optical properties of each alternating layer, with respect to temperature, can offset one another to provide a net variation that is uniform or essentially constant as a function of temperature. The stack 1725 can comprise a dielectric interference filter of the band pass type.

Various software tools are available to support designing a stack of optical thin films to provide specific transmission and group delay characteristics, for example the characteristics illustrated in FIGS. 16A-E and discussed above. Such software can provide a multi-cavity stack of oxide thin films that cause interference of light incident thereon and provide wavelength selective transmission and wavelength selective group delay. Software Spectra Inc. of Portland, Oreg. offers a commercial product under the name TFCalc that can be useful for designing, simulating, or modeling cavity stabilizers 1525 based on thin film interference.

The Thin Film Center Inc. of Tucson, Ariz. provides products and services that can be useful in modeling and designing a cavity stabilizer based on a system of thin films. The company's design and analysis package, marketed under the product name "The Complete Macleod" can be a useful tool.

The software products of Software Spectra Inc, the Thin Film Center, and other suppliers of analytical tools for optical coatings, can also support developing thin film cavity stabilizers. Such software can assist a designer configuring thin film layers to provide a specified group delay. Another useful coating design and analysis tool is the software product known under the trade name FILMSTAR, available from FTG Software Associates of Princeton, N.J.

The present invention can comprise multiple optical thin film layers, such as a stack of film layers 1725 that a cavity stabilizer comprises. The layer can individually interact with light associated with a robustly stabilized multimode laser 1700, wherein the light interactions from each individual layer are, collectively, additive or subtractive upon one another. One or more such layers can embody certain functions described herein and illustrated in the examples, functional block diagrams, illustrations, and appended flow charts. However, it should be apparent that there could be many different ways of implementing aspects of the present invention using optical films, grating, or other light management implements, and the invention should not be construed as limited to any one optical thin film configuration. Further, a skilled optical engineer would be able to create such thin films without difficulty based on the exemplary functional block diagrams, flow charts, and associated description in the application text, for example.

Therefore, disclosure of a particular design, specifying each layer thickness for example, of a stack of optical thin film layers is not considered necessary for an adequate understanding of how to make and use the present invention. The inventive functionality of any multilayer aspects of the present invention will be explained in more detail in the following description in conjunction with the remaining figures illustrating the functions, devices, applications, and processes.

Figure 17B:
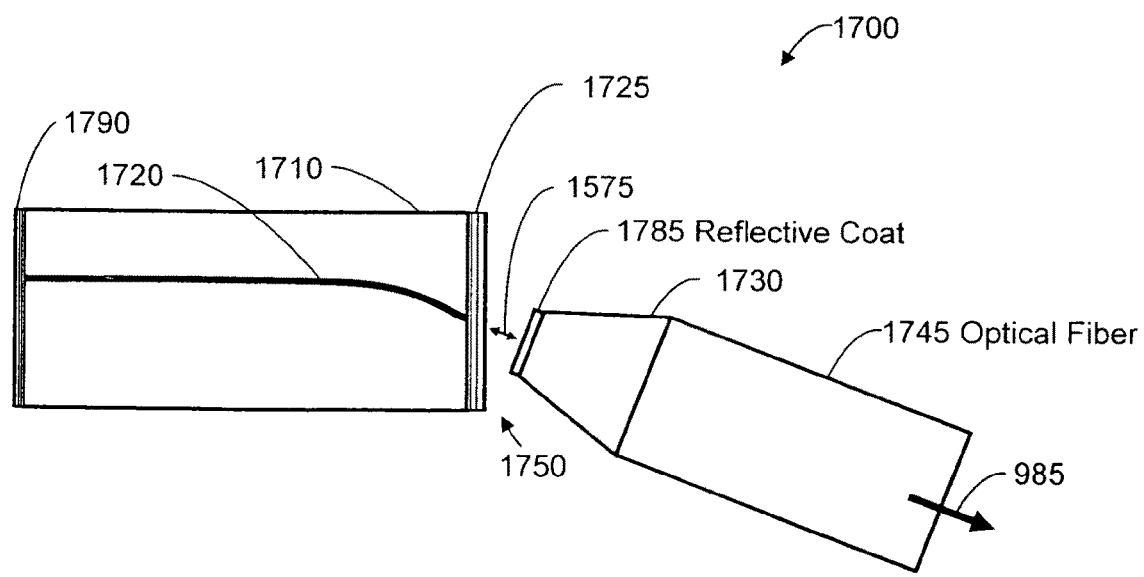
FIG. 17B illustrates an overhead view of a robustly stabilized multimode laser that comprises a curved cavity laser die in accordance with an exemplary embodiment of the present invention.

Turning now to FIG. 17B, this figure illustrates an overhead view of a robustly stabilized multimode laser 1700 that comprises a curved cavity laser die 1710 in accordance with an exemplary embodiment of the present invention. The overhead view can illustrate the same laser system 1700 illustrated in FIG. 17A and discussed above. The optical fiber 1745 comprises a tapered tip 1730 with a thin film coating 1785 facing the laser die 1710. This coating 1785 comprises the front reflector 1530 of the laser's lasing cavity, in correlation to functional blocks of FIG. 15, which are discussed above. Likewise, the rear facet reflector 1790 can be based on a thin film coating. The reflectivity of each of the rear facet reflector 1790 and the front facet reflector 1785 can be defined according to corresponding thin film layer configuration parameters such as layer thickness and refractive index.

The reflective coat 1785 on the end face of the optical fiber 1745 is oriented such that light incident thereon, from within the cavity, bounces back into the cavity along essentially the same path of incidence. That is, this reflector 1785 can be essentially perpendicular to the path of resonant light 1575 within the lasing cavity.

Cavity modes that are aligned to the DWDM channel 151 or coordinate 191 transmit through the pass or transmission band 181 of the thin film based cavity stabilizer 1725. Transmitting through the thin film stack 1727 and bouncing back and forth between the front and rear reflectors 1785, 1790, these modes comprise resonant light 1575 of the cavity. Modes having wavelengths in spectral regions 1615, 1617 above or below the transmission band 181 are reflected by the thin film stack 1725. Since the thin film stack 1725 is disposed at an angle relative to the light path in the cavity, reflected light is diverted or deflected away from the light path, thus avoiding lasing resonance in the cavity. Thus, modes that are out of alignment with respect to the DWDM channel 151 or coordinate 191 are attenuated or precluded from gaining energy in an amplifying manner.

Since the front reflector 1785 of the lasing cavity typically has less than 100% reflectivity (and typically has lower reflectivity than the rear cavity reflector 1790), part of the resonant light 1595 transmits though the front cavity reflector 1785. This transmitted light couples into the optical fiber 1745 as an optical signal 101 comprising a plurality of modes capability with the DWDM grid 100. The resulting waveguided light 985 propagates in the optical fiber 1745 to conduct information, modulated thereon, between optical communication devices, computing elements, or sites.

Figure 18:
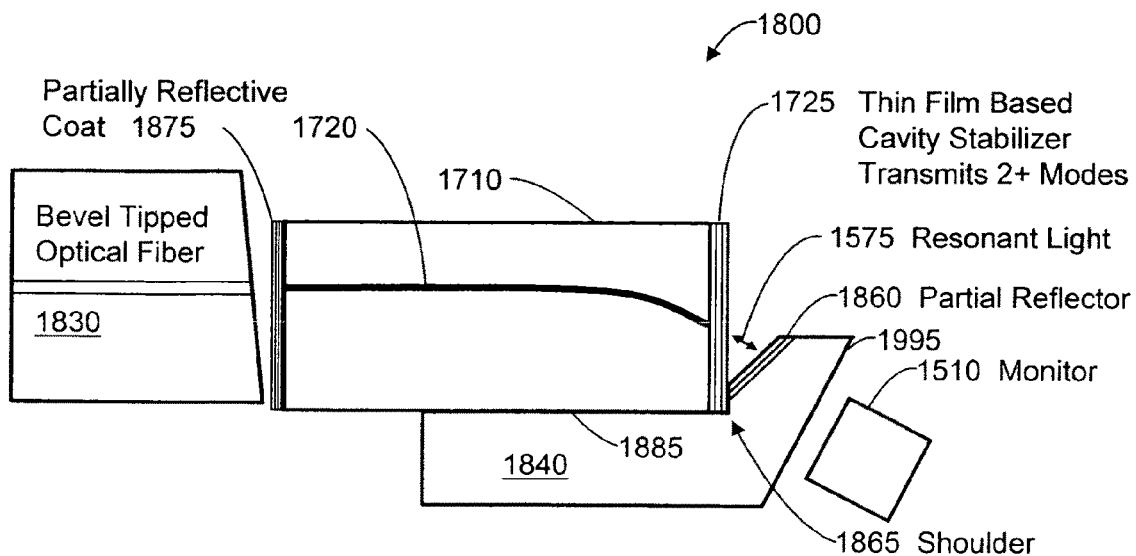
FIG. 18 illustrates a robustly stabilized multimode laser that comprises a curved cavity laser die in accordance with an exemplary embodiment of the present invention.

Turning now to FIG. 18, this figure illustrates a robustly stabilized multimode laser 1800 that comprises a curved cavity laser die 1710 in accordance with an exemplary embodiment of the present invention. The laser's lasing cavity spans from a partially reflective coat 1875 on one end of the laser die 1710 to a partial reflector 1860 mounted on a member or structure 1840. These coats 1875, 1860 typically comprise oxide thin films providing controlled levels of reflectivity, but can also be reflective coatings of metal, such as gold, or regions of varied chemistry in a semiconductor material or a silicon composition.

The mount 1840 for the partial reflector 1860 at the rear of the lasing cavity facilitates alignment between the partial reflector 1860 and the curved light path 1720 of the laser die 1710. The reflector mount 1840 comprises a shoulder 1865 that seats the rear facet of the laser die and a surface 1885 into which the laser die 1710 mates. This mount 1840 can provide passive alignment of the components of the laser cavity. That is, placing the laser die 1710 into the mated surfaces of the mount 1840 can provide inherent alignment of the partial reflector 1860 without dynamically adjusting the partial reflector 1860 while the laser die 1710 is powered up. Thus, the laser 1800 can be assembled passively or without using an optical signal from the laser 1800 as a basis for positional feedback.

A portion of the resonant light 1575 of the laser cavity transmits though the partial reflector 1860 for reception by a power monitor 1510. The power monitor 1510 provides an indication of the intensity of the light coupled from the laser die 1710 into the bevel tipped optical fiber 1830.

The bevel on the optical fiber 1830 deflects end face reflections away from the lasing cavity. While the robustly stabilized multimode laser 1800 can provide a minimal level of susceptibility to stay light back reflections into the cavity, the beveled end face provides a degree of insurance. Also, the response of the laser 1800 to a back reflection is sometimes related to the distance between reflective surface and the cavity. Due to coherence effects, closer reflective surfaces, such as the beveled end face, may generate a more significant cavity response than more distant reflective surfaces. For similar reasons, the surface 1995 of the mount 1840 between the rear cavity reflector 1860 and the monitor 1510 is configured to minimize the return of light incident on this surface 1995 back into the cavity. This surface can be obliquely angled with respect to incident light or treated with an antireflective ("AR") coating.

The laser 1800 comprises a thin film-based cavity stabilizer 1725 that controls the steady state and dynamic responses of the laser cavity. Via this cavity stabilizer 1725, the laser cavity outputs at least two, and typically a cluster of, robustly stabilized longitudinal modes suited for DWDM optical communication.

Figure 19A:
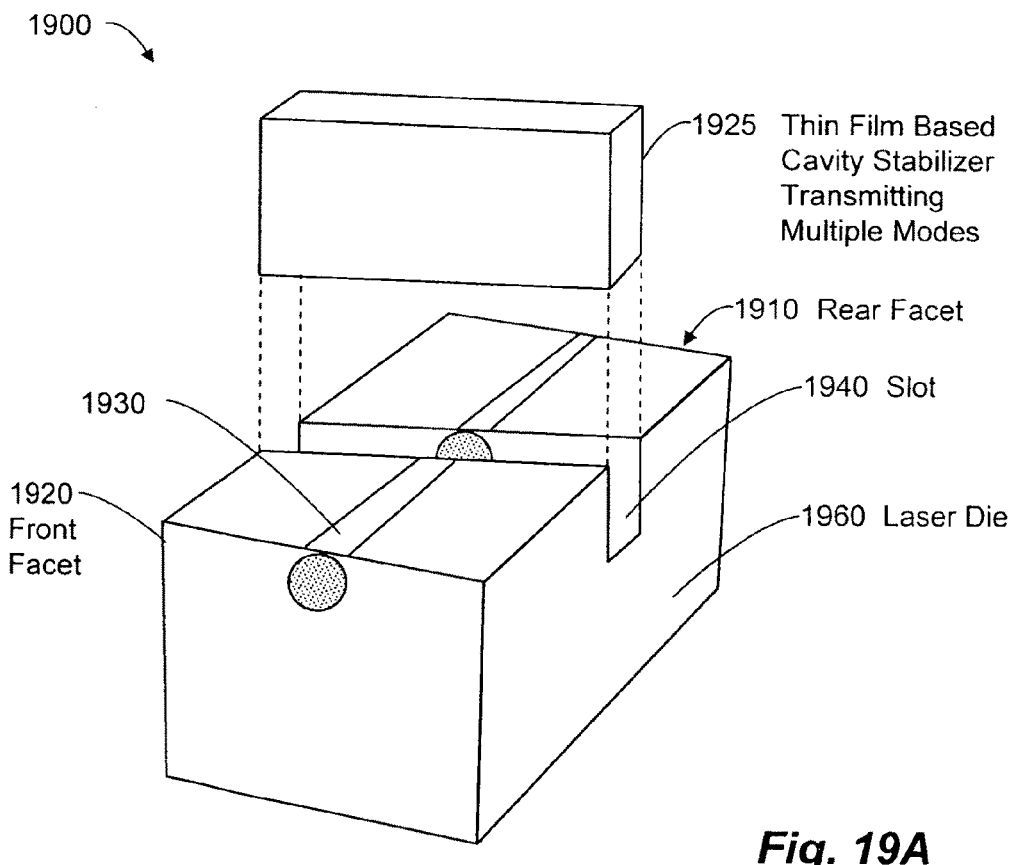
FIG. 19A illustrates a perspective assembly view of a robustly stabilized multimode laser in accordance with an exemplary embodiment of the present invention.
Figure 19B:
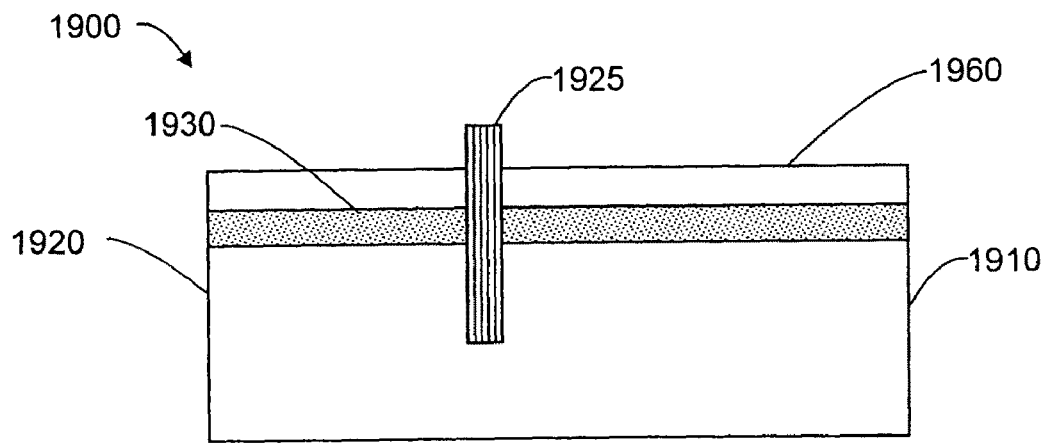
FIGS. 19B and 19C respectively illustrate a side and an overhead view of a robustly stabilized multimode laser in accordance with an exemplary embodiment of the present invention.
Figure 19C:
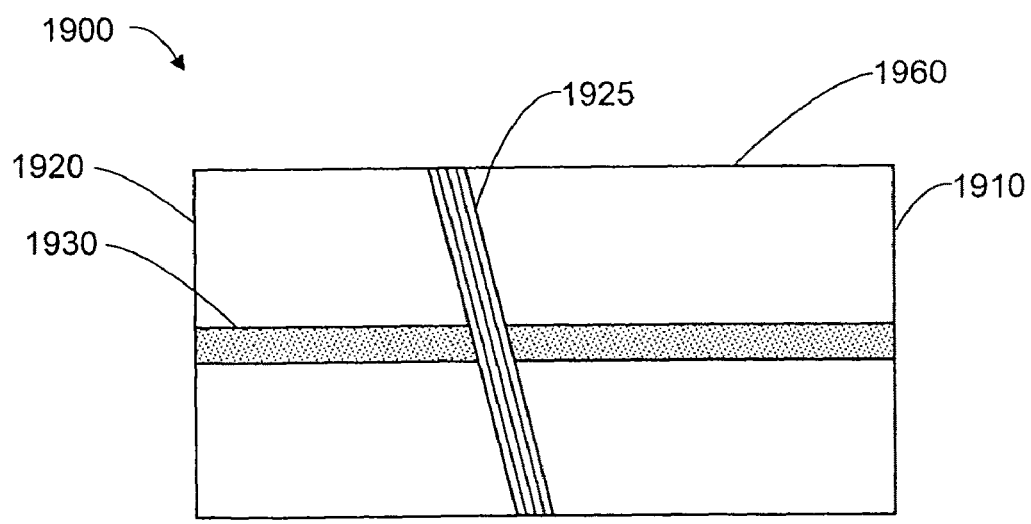

Turning now to FIGS. 19A-19C, these figures illustrate a robustly stabilized multimode laser 1900 in accordance with an exemplary embodiment of the present invention. FIG. 19A illustrates a perspective assembly view of the robustly stabilized multimode laser 1900 in accordance with an exemplary embodiment of the present invention. FIGS. 19B and 19C respectively illustrate side and overhead views of the robustly stabilized multimode laser 1900 in accordance with an exemplary embodiment of the present invention.

The laser die 1960 has a slot 1940 that receives a thin film based cavity stabilizer 1925, which transmits a plurality of longitudinal modes that are aligned to a DWDM grid coordinate 191 or channel 151. The slot 1940 can be formed in the laser die 1960 by etching, for example with an inductively coupled plasma etching process. The slot 1940 is oriented at an oblique or non-perpendicular angle with respect to the gain path 1930 in the die 1960.

The laser die 1960 can be a Fabry-Perot laser chip, or other laser die or gain chip, that is capable of outputting a high-speed digital signal without the slot 1940 and the cavity stabilizer 1925. The robustly stabilized multimode laser 1900 can comprise a high-speed Fabry-Perot laser that has been modified with the slot 1940 and the insertion of the cavity stabilizer 1925. For example, the unmodified laser die can be rated for digital communication at 1.5 gigabits per second or 10 gigabits per second with a multimode output that floats in wavelength without alignment to a DWDM grid 100. With the addition of the cavity stabilizer 1925, the resulting multimode laser can provide data transmission at 2.5 or 10 gigabits per second with multimode optical characteristics suited for DWDM.

Light can resonant in the laser die 1860 between the front facet 1920 and the rear facet 1910, through the cavity stabilizer 1925. The front and rear facets 1910, 1920, which comprise cavity reflectors, can be each be treated with a thin film to control reflectivity to selected levels.

In one embodiment, epoxy (not shown) in the slot 1940 can hold the cavity stabilizer 1925 in place. The epoxy can also provide an optical mate between the laser die's material and the cavity stabilizer's material. Optically mating the stabilizer 1925 with the laser die 1960 can minimize the amount of light lost at the interfaces between the die 1960 and the stabilizer 1925. The stabilizer 1925 can comprise a stack of thin films deposited on a thin substrate of indium gallium arsenide or other material having a refractive index that is similar to the laser die's refractive index. The epoxy can also have a similar refractive index. The thin film layers of the stabilizer 1925 can suppress reflection within a pass band via an interference effect.

In one embodiment, the slot 1940 is treated with an antireflective coating. Treating the surfaces of the slot 1940 through which resonant light passes can minimize reflection from these surfaces. The stabilizer 1925 can be captive in or embraced by the slot 1940 without epoxy in the light path. An interference fit, epoxy that is outside the light path, or a mechanical fastener (not shown) can hold or fasten the stabilizer 1925 in position.

An antireflective coating can be applied to the surfaces of the slot 1940 via low-pressure chemical vapor deposition. The antireflective coating can be created by chemically reacting a precursor gas at the surfaces of the slot 1940. The slotted laser die 1960 can be placed in an evacuated chamber and heated to approximately 500° C. A chemical vapor, typically in a range of 0.1 to 5.0 Torr of pressure, can be added to the heated chamber. The elevated temperature can induce a chemical reaction in the precursor gas that causes deposition on all exposed surfaces in the chamber. Repeating this process with selected gases and process conditions can produce a multilayer film with defined transmission and group delay properties. In one embodiment of the present invention, this process, or a similar process, can deposit cavity stabilization layers directly on the slot surfaces. That is, the process can either provide antireflective characteristics that facilitate inserting the cavity stabilizer 1925 into the slot as a discrete element or integrating the cavity stabilizer onto the laser die as a unitary structure. Depositions Sciences, Inc. of Santa Rosa, Calif. offers coating services and supplies coating equipment that can be compatible with the above described process.

Figure 20A:
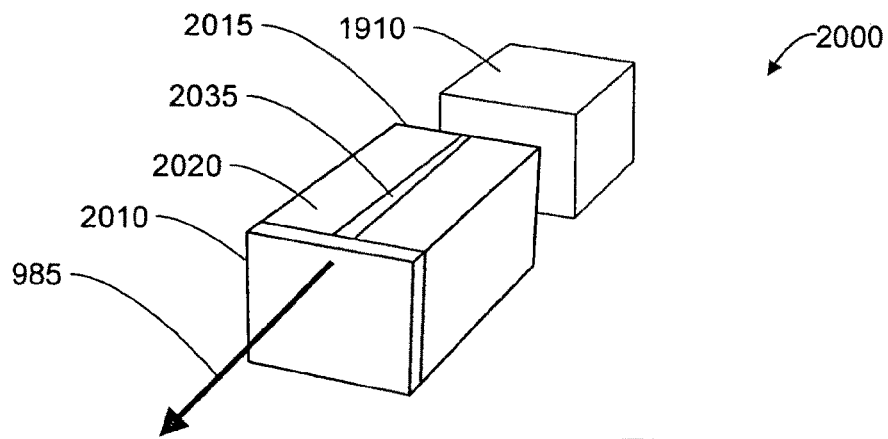
FIGS. 20A and 20B respectively illustrate perspective and cross section views of a robustly stabilized multimode laser in accordance with an exemplary embodiment of the present invention.
Figure 20B:
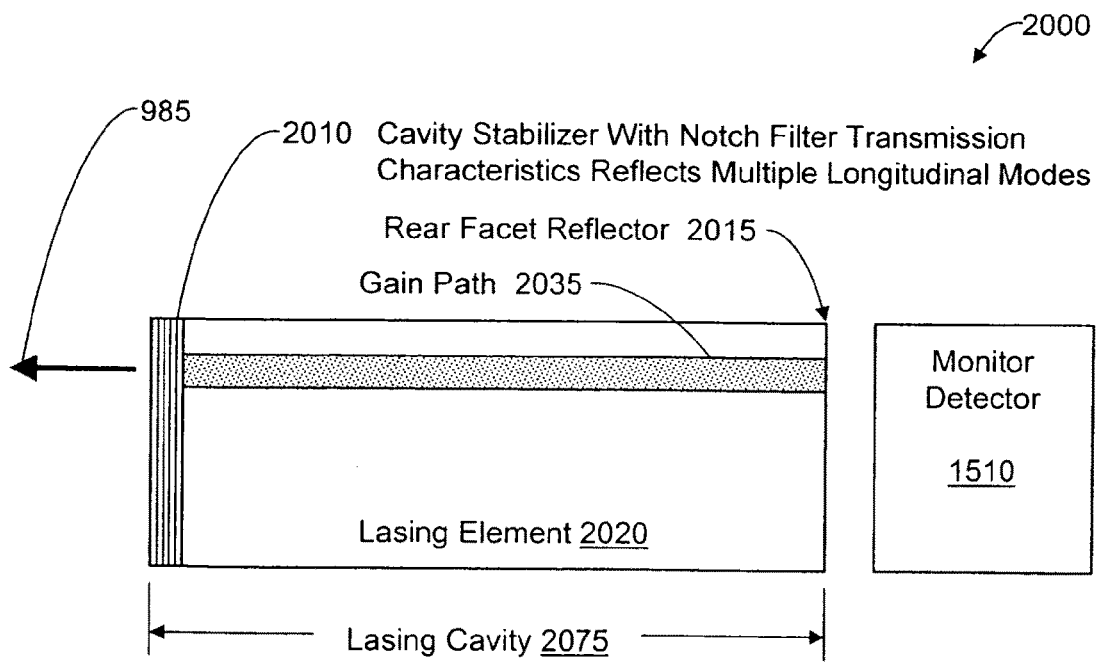

Turning now to FIGS. 20 A-D, FIGS. 20A and 20B respectively illustrate perspective and cross section views of a robustly stabilized multimode laser 2000 in accordance with an exemplary embodiment of the present invention. The laser's lasing cavity 2075 spans between a front facet reflector 2010 and a rear facet reflector 2015. A monitor detector 1510 receives a sample of light output through the rear facet reflector 2015 for operational monitoring. The front facet reflector 2010 comprises a thin-film-based cavity stabilizer 2010 that is disposed on the facet of the lasing element 2020, which can be a gain chip or lasing die.

The cavity stabilizer 2010 can be a multi-cavity stack of thin films that are deposited directly on the facet of the lasing element 2020 in a deposition chamber. In one exemplary embodiment, the thin film stack can be operable to waveguide light passing through or handled by the stack. Alternatively, the stack can manage light incident thereon without an integral waveguide (as illustrated in FIG. 20B). That is, the stabilizer 2010 can comprise thin film layers that manage incident light with or without waveguiding that incident light as it passes through the layers. In other words, the stabilizer 2010 can confine light in a dimension perpendicular to the direction of light propagation while that light is undergoing optical-interference-based processing.

An exemplary embodiment of a stabilizer comprising an integral waveguide will now be discussed. In one exemplary embodiment, the cavity stabilizer's thin film layers are processed to provide a waveguide structure having a longitudinal axis or axis of propagation that passes through the planes of the layers. An exemplary process for forming the structure can comprise placing the lasing element 2020, which can be a semiconductor gain chip, in a deposition chamber and depositing layers of oxide material thereon, wherein adjacent layers have differing refractive indices. That is, a deposition chamber can deposit a plurality of high-low refractive index layers onto a lasing element 2020 that has a waveguided gain path 2035.

Photolithography can apply a mask over the face of the stabilizer layers with the mask aligned to or over the gain path

2035. That is, a mask having a geometry that is similar to the cross sectional geometry of the gain path 2035 can be placed on the outer surface of the thin-film stack, over the gain path 2035.

The lasing element 2020 with the mask applied thereon can be placed in a material-removal chamber such as an inductively coupled plasma ("ICP") system. The mask shadows an area of the stack thereby blocking removal of the thin film material that is under that mask during the ICP process. Thus, the ICP system removes a region of the thin films that is not under the mask and leaves another region, under the mask, intact. That is, ICP removal results in a thin-film stack having a cross sectional dimension that matches the cross section of the gain path 2035. The match can be an optical or modal match or a physical geometric match.

The refractive indices of the layers can be selected to provide an average refractive index that matches the refractive of the gain path 2035. That is, the section of waveguide that comprises a stack of thin films can have similar refractive index, mode field diameter, numerical aperture, or light confining characteristics to the section of waveguide 2035 that comprises active gain material. Thus, a waveguide system providing wavelength selective transmission or amplification via optical interference can comprise a first section of amplifying waveguide 2035 coupled to a second section of waveguide (not shown in FIG. 20B) that comprises a stack of thin films, wherein light transmits between the two sections, through at least two of the films in the stack, or across an interface between two adjacent stack layers.

The stack of thin film layers that confines light can have a solid material disposed circumferentially there around that provides a cladding. That is, the cavity stabilizer can comprise a core of thin films surrounded by a cladding of lower refractive index than the layers. The cladding can provide a mode field match between the waveguide of the thin film stack and the waveguide of the gain path 2035. The cladding can comprise inorganic material or an organic material such as a polymer. The cladding can be applied via a deposition process, for example. In one exemplary embodiment, a photolithographic process provides a second mask that defines the areas of the face of the stabilizer 2010 that are to receive the cladding in the deposition process. That is, the cladding can be selectively deposited so that it contacts or embraces the side walls of the thin-film stack. In one exemplary embodiment, the cladding is applied by dispensing a liquid or gel that polymerizes or an epoxy around the core stack. Curing the epoxy or polymerizing the liquid provides a solid, fixed, or permanent cladding material surrounding the sidewalls of the core stack.

Accordingly, the stabilizer 2010 can receive light from a waveguide, propagate the received light along a path that crosses a plurality of thin film layers, confine the received light to a defined cross section compatible with the waveguide, and process the received light via interference. Those skilled in the art will appreciate that confining light that is undergoing thin-film interference to a waveguide can be used for a wide variety of applications and circumstances in addition to for laser stabilization. That is, in various exemplary embodiments, the waveguide stack is operable to provide a measured level of dispersion, group delay, spectral selective transmission, filtering, or other optical effect.

Whether the stabilizer 2010 comprises a waveguide or manages light without an integral waveguide, the cavity stabilizer 2010 has a wavelength region of reflectivity 2080 between two wavelength regions 2082, 2085 of high transmission. The spectral region 2080 of high reflectivity can alternatively be described as a dip or notch in transmission.

The region 2080 of high reflectivity is aligned to a DWDM grid coordinate 191 or channel 151. Modes within the spectral region 2080 of high reflectivity reflect off of the cavity stabilizer 2010 to the rear facet reflector 2015 for amplification and lasing in the gain path 2035. The cavity stabilizer 2010 transmits a portion of these amplified modes 2072 as output light 985 suited for optical communication. The cavity stabilizer 2010 does not reflect the modes outside of this spectral region of high reflectivity to a level that stimulates lasing. Thus, these out-of-band modes, which lack DWDM channel alignment, attenuate or exist in a state of minimal or essentially no energy.

Figure 20C:
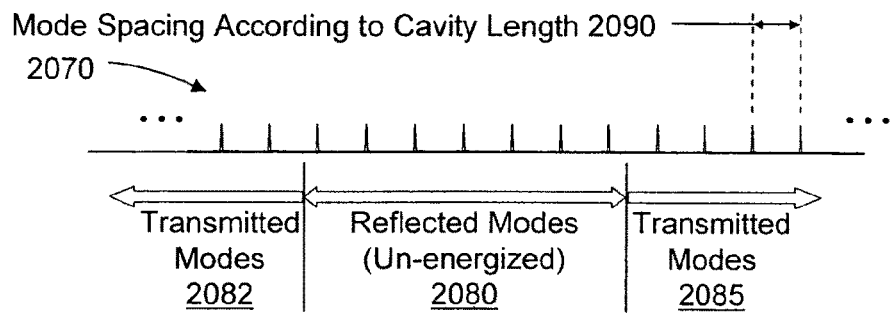
FIG. 20C illustrates a spectral plot of longitudinal modes of a robustly stabilized multimode laser with the longitudinal modes in an essentially un-energized state in accordance with an exemplary embodiment of the present invention.

Referring now to FIG. 20C, this figure illustrates a spectral plot 2025 of longitudinal modes 2070 of robustly stabilized multimode laser 2000 with the longitudinal modes 2070 in an essentially un-energized state in accordance with an exemplary embodiment of the present invention. The optical length of the lasing cavity 2070 and the lasing wavelength can define the spacing 2090 between the modes 2070 or establish a series of wavelength locations. A change in temperature of the laser cavity 2075 can cause a corresponding change in the physical length of the lasing cavity 2075 based on the thermal expansion coefficient of the lasing element 2020. The modes 2070 can shift in correspondence to the length change. The modes 2070 can also compress or expand, or "accordion" according to thermal effects.

The illustrated, essentially un-energized state of the modes 2070 can result from supplying the lasing element 2020 with a level of bias current 1540 that generates light but is insufficient to initiate lasing. That is, the plot 2025 of FIG. 20C can illustrate a non-operational state, such as a laboratory test, of the robustly stabilized multimode laser 2000. The plot can also illustrate the condition of ramping the bias current 1540 to the lasing element 2020 in preparation for entering a lasing state and subsequently modulating the laser's output.

Figure 20D:
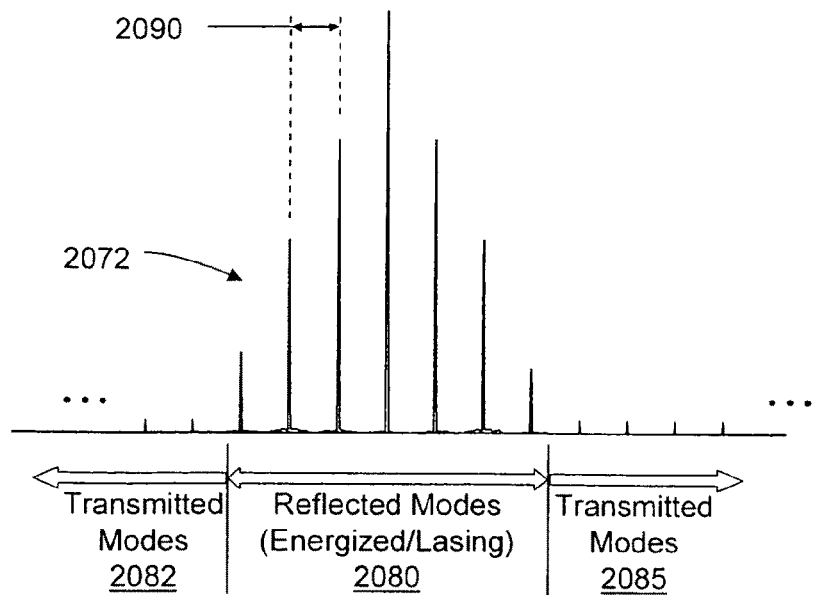
FIG. 20D illustrates a spectral plot of longitudinal modes output by a robustly stabilized multimode laser with certain longitudinal modes in an energized and lasing state in accordance with an exemplary embodiment of the present invention.

Referring now to FIG. 20D, this figure illustrates a spectral plot 2075 of longitudinal modes 2090 output by a robustly stabilized multimode laser 2000 with the longitudinal modes 2075 in an energized and lasing state in accordance with an exemplary embodiment of the present invention. The level of the bias current 1540 can be adequate to sustain lasing during current oscillations associated with information modulation.

The longitudinal modes 2072 within the wavelength region of increased reflectivity 2080 lase and thus intensify as illustrated in the exemplary plot 2075. The wavelength spacing 2090' between energized modes can be similar to the wavelength spacing 2090 between un-energized modes 2090. Spacing variation can result from temperature changes associated with heat generated in the lasing cavity 2075 via the increased level of supply current and the lasing effect.

Figure 21:
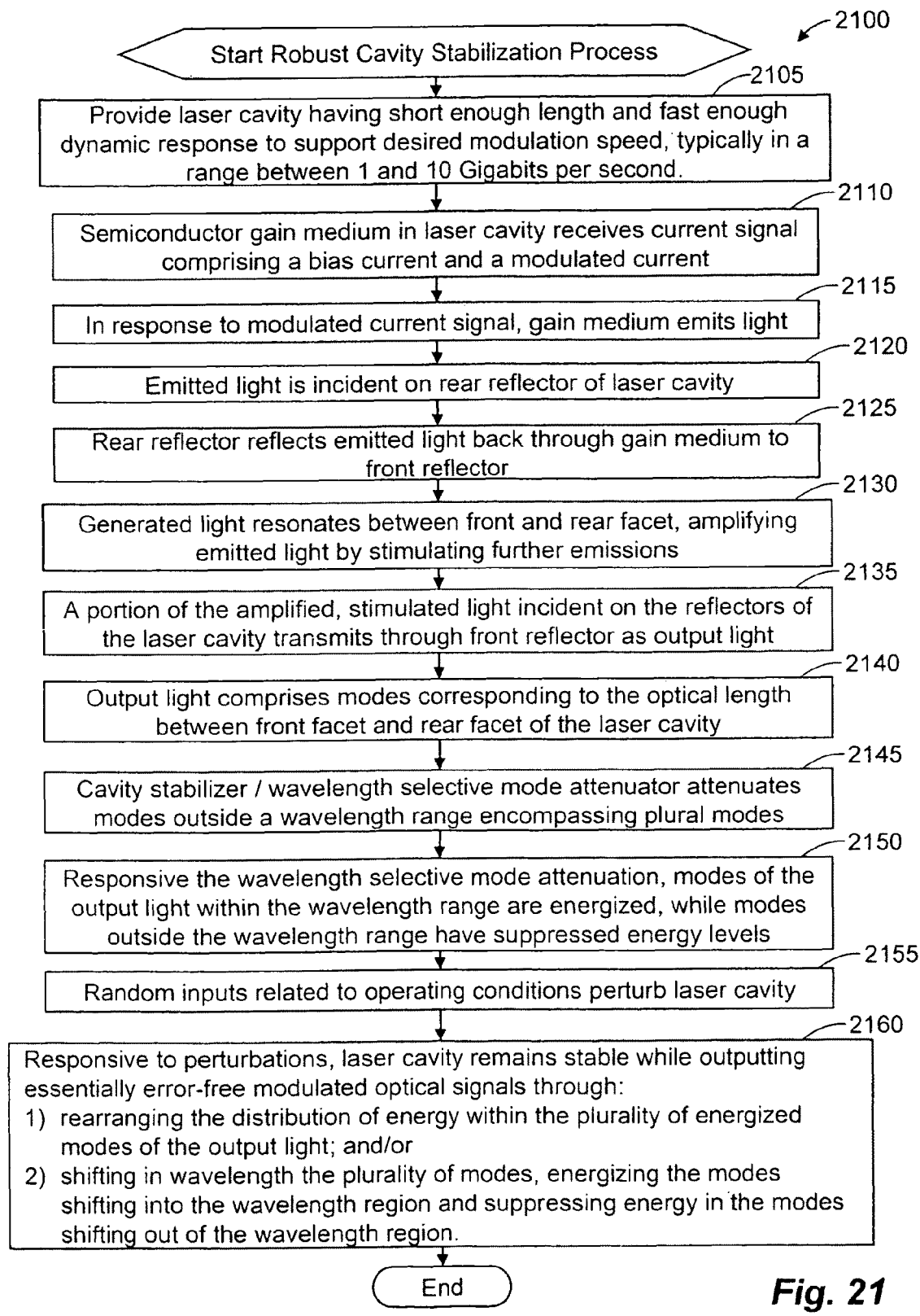
FIG. 21 is a flow chart illustrating a process for robust stabilization of a multimode laser cavity in accordance with an exemplary embodiment of the present invention.

Turning now to FIG. 21, this figure is a flow chart illustrating a process 2100, entitled Robust Cavity Stabilization Process, for robust cavity stabilization of a multimode laser 2020 in accordance with an exemplary embodiment of the present invention. Process 2100 will be discussed with exemplary reference to FIGS. 20A-20D, which are discussed above.

At Step 2105, the first step in Process 2100, a laser cavity 2075 has a sufficiently short length and a sufficiently fast dynamic response to support a desired speed of modulation or a desired level of data transmission. The data rate can be in an approximate range of 1 to 10 gigabits per second. The date rate can also be faster, for example approximately 12.5 gigabits per second or 15 gigabits per second.

At Step 2110, a semiconductor gain chip 2020 in the lasing cavity 2075 receives a current signal that comprises a bias current 1540, and a modulated current 1545. At Step 2115, the gain medium 2035 emits or generates light along a gain path

2035. At Step 2120, the light that the gain medium 2035 generates is incident on the rear reflector 2015 of the lasing cavity 2075. The rear reflector 2015 reflects most of the incident light back though the gain path 2035 of the lasing cavity 2075 at Step 2125.

At Step 2130, the generated light oscillates back-and-forth between the front and rear reflectors 2010, 2015 in a resonant or standing-wave manner. Resonance stimulates additional light emissions in the gain path 2035, thereby providing amplification.

At Step 2135, a fraction 985 of the amplified and stimulated light provided in the gain path 2035 transmits through the front reflector 2010 as output light 985. At Step 2140, the output light 985 comprises longitudinal modes 2090' corresponding to the optical length of the lasing cavity 2075.

At Step 2145, the cavity stabilizer 2010, which can also be a wavelength selective mode attenuator, attenuates modes in wavelength ranges 2082, 2085 outside of a wavelength range 2080 of desired mode alignment. The wavelength range 2080 of desired mode alignment can support a plurality of cavity modes 2090'.

At Step 2150, two or more modes 2090', such as a cluster, comb, group, set, or pod of modes, within the intended wavelength region 2080, gain energy in response to the cavity stabilizer's control. Modes in the peripheral wavelength ranges 2082, 2085 exhibit suppressed levels of energy.

At Step 2155, random inputs or events perturb the lasing cavity 2075. Such random inputs can be associated with uncontrolled operating conditions of the laser's operating environment. Random inputs or events can comprise temperature fluctuations, stray light, electrical signal noise, signal variation, etc.

At Step 2160, the laser cavity 2075 remains stable in response to the perturbations. The laser cavity 2075 outputs light 985 that comprises essentially error-free modulated optical signals. That is, the bit error rate of an optical communication link that is based on the laser 2000 meets applicable communication specifications (as referenced to various standards organizations described herein or to distinct network engineering specifications).

Robust multimode stabilization of the lasing cavity 2075 can result from or be linked to rearranging the distribution of energy among three or more modes in a cluster of modes 2072 aligned to a DWDM grid coordinate 191 or channel 151. This stabilization can also result from shifting the cluster of modes 2072 in wavelength and, in coordination, energizing modes shifting into the wavelength region 2080 and suppressing energy in modes shifting out of the wavelength region 2080.

Following Step 2160, Process 2100 ends.

Figure 22:
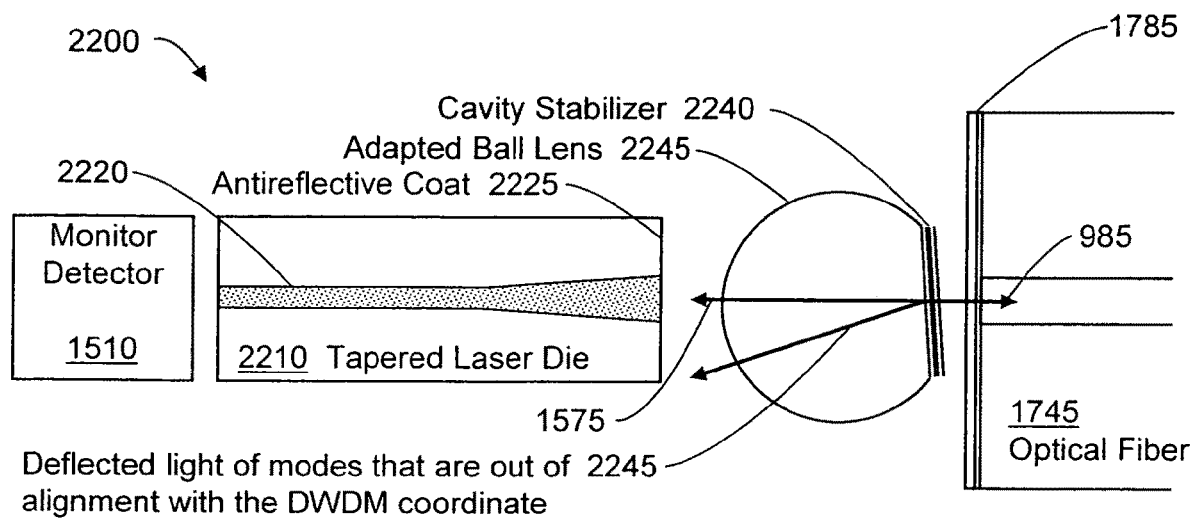
FIG. 22 illustrates an external cavity laser comprising an adjustable beam steering element in the laser's lasing cavity in accordance with an exemplary embodiment of the present invention.

Turning now to FIG. 22, this figure illustrates an external cavity laser 2200 with an adjustable beam steering element 2245 in the laser's lasing cavity in accordance with an exemplary embodiment of the present invention. The illustrated laser 2200 can be a robustly stabilized multimode laser or another laser, for example.

The laser die 2210 or gain chip has a gain path 2220 that is tapered. The mode field of the light guided in the gain path 2220 varies from in dimension along the gain path 2220. At the end of the laser die 2210 that faces the monitor detector 1510, the mode field has a larger diameter than the mode field at the opposite end of the laser die 2210. The light expansion along the longitudinal axis of the gain path 2220 is gradual and essentially adiabatic or lossless. The taper lessens the divergence of the light output by the gain chip towards the optical fiber 1745 in comparison to a laser die that is not tapered.

The cavity stabilizer 2240 is attached to an adapted ball lens 2245. The cavity stabilizer 2240 can comprise a stack of optical thin films that provide a selected level of wavelength-selective group delay and transmission. The stack can be attached to a flattened surface of the adapted ball lens 2245 via deposition or other attachment process, such as bonding.

Light output by the tapered laser die 2210 passes through the curved surface of the adapted ball lens 2245 and is incident upon the cavity stabilizer 2240. Light within a transmission band of the cavity stabilizer 2240 transmits through the cavity stabilizer 2240 and is incident upon a reflective coating 1785 on the optical fiber 1745. As a front reflector of the lasing cavity, this reflective film 1785 passes a portion 985 of the light into the optical fiber 1745 for waveguide transmission, for example as a robustly stabilized multimode optical signal for DWDM. The reflective film 1785 reflects another portion 1575 of the incident light back into the gain medium 2220 for simulated emission. The cavity stabilizer 2240 deflects modes that are out of alignment with the DWDM channel 151 or coordinate 191 at an angle that avoids resonance. Because the diverted modes are not fed back into the gain medium 2220, these modes exhibit a minimal or residual level of energy that can be 100 to 100,000 fold less than the energy in the aligned modes that support DWDM communication, for example.

The angle of the cavity stabilizer 2240 with respect to the axis of the incident light can be adjusted by rotating or pivoting the adapted ball lens 2245 to which it is attached. Pivoting the ball lens 2245 can adjust the angle of deflection of the light 2245 that is cast outside of the cavity.

Figure 23A:
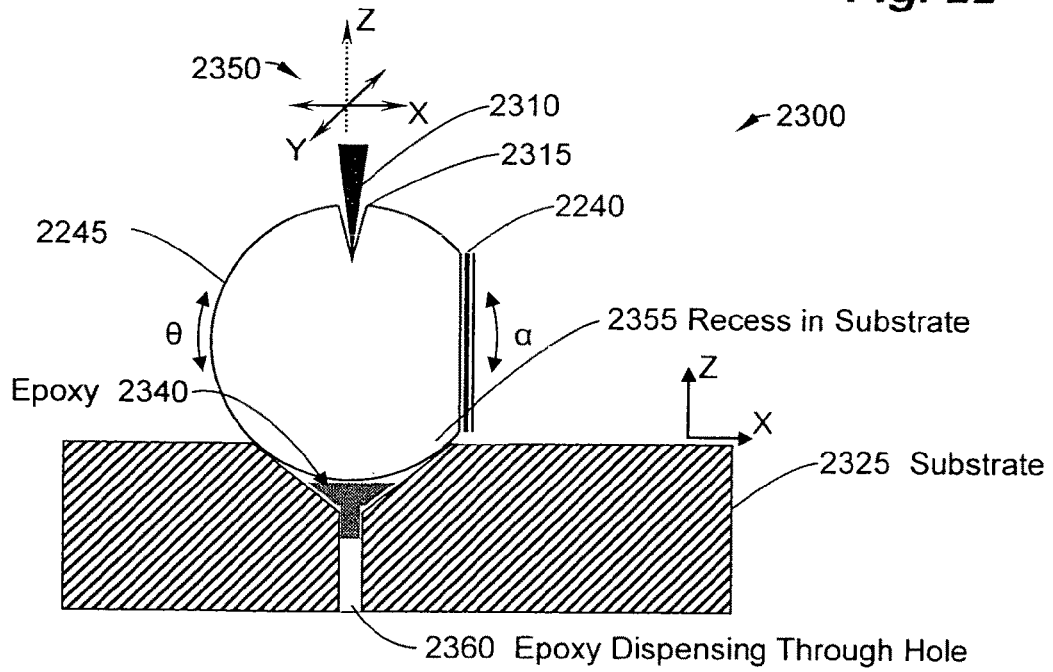
FIGS. 23A and 23B illustrate a cross section view of a beam steering optical element that can be pivoted to angularly displace an optical beam and bonded to a substrate with epoxy dispensed in a through-hole in accordance with an exemplary embodiment of the present invention.
Figure 23B:
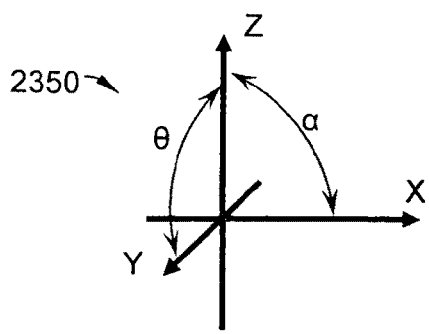

Turning now to FIGS. 23A and 23B, these figures illustrate a cross section view of a beam steering optical element 2245 that can be pivoted to angularly displace an optical beam and bonded to a substrate 2345 with epoxy 2340 dispensed in a through-hole 2360 in accordance with an exemplary embodiment of the present invention. The illustrated system 2300 can be used as a component of a robustly stabilized multimode laser, for example supporting the configuration illustrated in FIG. 22 and discussed above. The system 2300 and its underlying technologies are not limited to usage for robustly stabilized multimode lasers or other lasers. Rather, beam steering, bonding, and epoxy dispensing, as discussed herein in, can be utilized in a variety of optical systems and applications.

The substrate 2325 comprises a recess 2355, which can be a socket, cavity, indentation, slot, indentation, depression, or hollow, that receives the adapted ball lens 2245. The fit between the ball lens 2245 and the recess 2355 can be a mated fit or a fit that provides a limited degree of contact between the ball lens 2245 and the substrate 2325. The recess 2355 can be etched in a substrate 2325 that comprises crystalline material, such as silicon, along a natural crystal plane, for example.

The adapted ball lens 2245 can pivot, revolve, turn, or rotate in the recess 2355 in two angular dimensions. A blind hole 2315 or similar recess in the adapted ball lens 2245 receives an adapted pointed implement or stylus 2310. A positioning system (not shown) moves the stylus 2310 in an x-dimension and a y-dimension as illustrated by the exemplary coordinate system 2350.

Linear motion of the stylus 2310 along the y-axis rotates the adapted ball lens in the θ (theta) dimension, as illustrated in the exemplary coordinate system 2350. Linear motion of the stylus 2310 along the x-axis rotates the adapted ball lens in the α (alpha) dimension, as illustrated in the exemplary coordinate system 2350. Rotating the adapted ball lens in the α (alpha) dimension can steer a beam of light transmitting through the adapted ball lens 2245 or that is otherwise under control of the beam steering system 2300.

A cavity stabilizer 2240 or other light manipulation device can be attached to the adapted ball lens 2245. The beam steering system 2300 can be used to couple light into an optical fiber or other waveguide. Rotating the adapted ball lens 2245 can steer light incident thereon to enhance transmission into a waveguide. A laser, or other semiconductor light source, and a waveguide can be attached to the substrate 2325 via passive alignment. The beam steering system 2300, integrated between the laser and the waveguide, can compensate for assembly misalignment to direct light output by the laser into the waveguide.

A through hole 2360 in the substrate 2325 facilitates dispensing epoxy 2340 into the recess. The epoxy 2340 can be dispensed after establishing the beam steering position of the adapted ball lens 2245. The epoxy 2340 can be cured with UV light, heat, or a metered combination of light and heat.

Figure 24A:
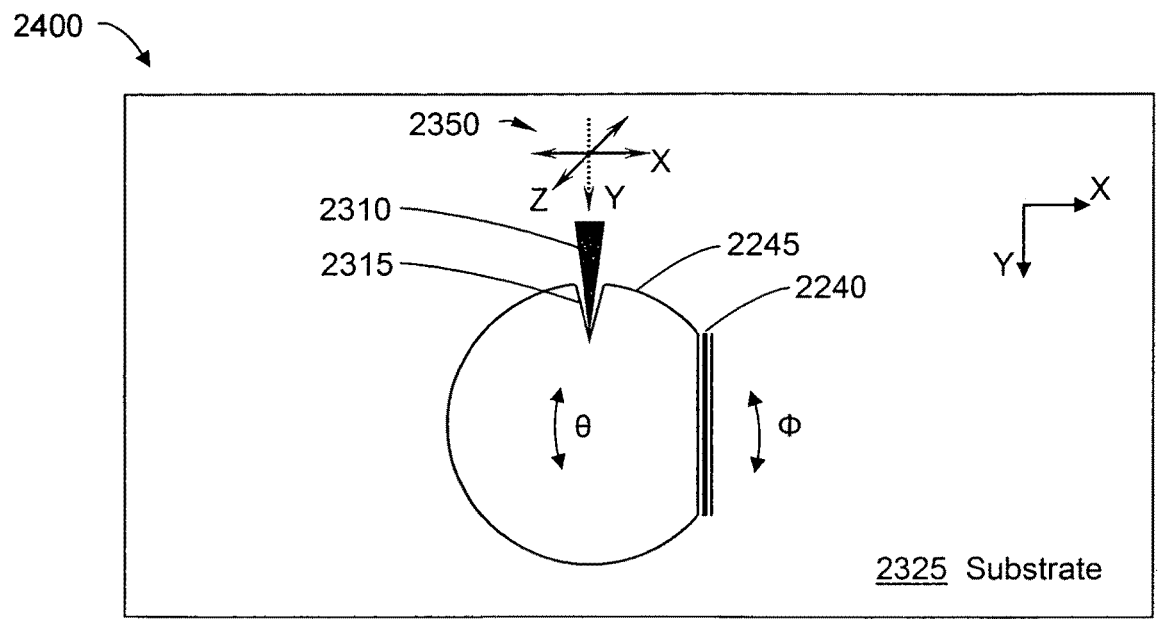
FIGS. 24A and 24B illustrate an overhead view of a beam steering optical element that can be pivoted to angularly displace an optical beam and bonded to a substrate with epoxy dispensed in a through hole in accordance with an exemplary embodiment of the present invention.
Figure 24B:
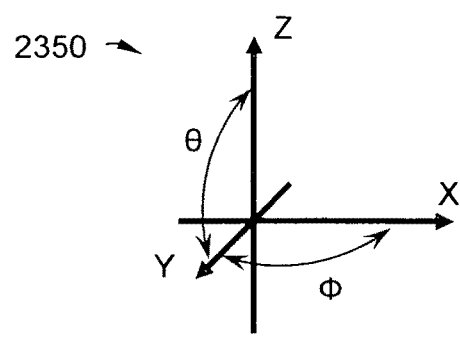

Turning now to FIGS. 24A and 24B, these figures illustrate an overhead view of a beam steering optical element 2245 that can be pivoted to angularly displace an optical beam and bonded to a substrate 2345 with epoxy dispensed in a through hole in accordance with an exemplary embodiment of the present invention. The system 2400 provides angular adjustment in the $\phi$ (phi) dimension as illustrated in coordinate system 2350'. Thus, the illustrated system 2400 can provide a dimensional that augments the dimensional control offered by the system 2300 illustrated in FIGS. 23A and 23B, as discussed above. Furthermore, a single beam steering optical element can be adapted to accommodate the angular beam steering illustrated in FIGS. 23A-B and FIGS. 24A-B, thereby providing beam steering in at least two dimensions.

Moving the stylus 2310, which resides in a hole or recess 2315 of the adapted ball lens 2245, along the x-axis rotates the adapted ball lens 2245 in the $\phi$ (phi) angular dimension as illustrated in the exemplary coordinate system 2350'. Rotating the adapted ball lens 2245 in this $\phi$ (phi) angular dimension provides corresponding adjustment to a beam of light (not shown in FIGS. 24A-B). Moving the stylus 2310 along the z-axis rotates the adapted ball lens 2245 in the $\theta$ (theta) dimension as illustrated in the exemplary coordinate system 2350'.

Figure 25A:
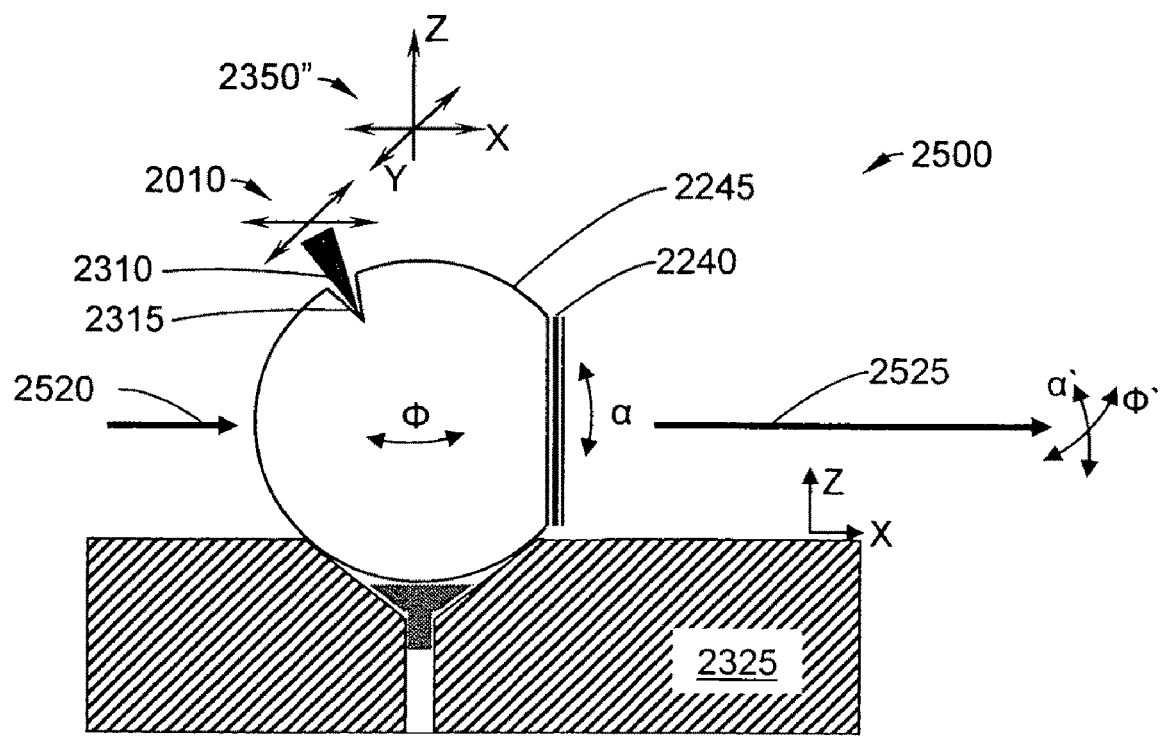
FIGS. 25A and 25B illustrate a cross section view of a beam steering optical element and an adjustment system that can pivot the optical element to provide angular adjustments to an optical beam in two angular dimensions in accordance with an exemplary embodiment of the present invention.
Figure 25B:
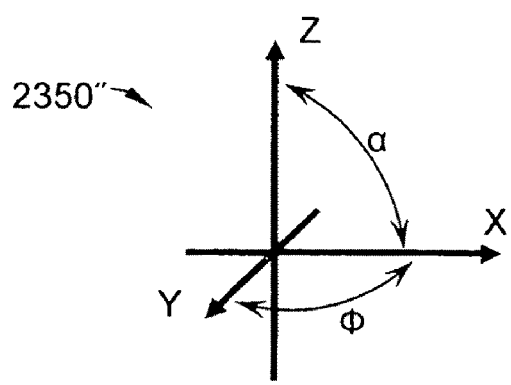

Turning to FIGS. 25A-B, these figures illustrate a cross section view of a beam steering optical element 2245 and an adjustment system 2500 that can pivot the optical element 2245 to provide angular adjustments to an optical beam 2525 in two angular dimensions in accordance with an exemplary embodiment of the present invention.

The adapted ball lens 2245 comprises an embodiment of a beam steering optical element that can adjust a beam 2525 in two orthogonal angular dimensions, $\alpha'$ (alpha prime) and $\phi'$ (phi prime). The geometry of a recess 2315 in the adapted ball lens 2245 facilitates moving the stylus 2010 in a plane to generate corresponding rotation of the adapted ball lens 2245. That is, the position of the recess 2315 on the spherical surface of the ball lens 2245 is selected so that stylus movements can provide two-angular-dimension control. Rotation of the adapted ball lens 2245 provides, in turn, corresponding multidimensional beam steering of a beam of light 2520 incident upon the ball lens 2245. Thus, motion of the stylus 2010 in the plane translates into steering the output beam 2525 in the $\alpha'$ (alpha prime) and $\phi'$ (phi prime) dimensions via geometric coordinate mapping. The movement 2010 of the stylus can be linear in the x-y plane as illustrated in the exemplary coordinate system 2350'' or can follow a nonlinear path in this plane. Nonlinear motion can provide decoupled steering of the output beam 2525 so that a stylus movement 2010 can provide beam steering in one angular dimension while maintaining essentially constant beam alignment in the other angular dimension. That is, the stylus 2010 can be moved in a coordinated manner that provides beam steering in one angular dimension without substantially varying beam angle in an another dimension.

Figure 25C:
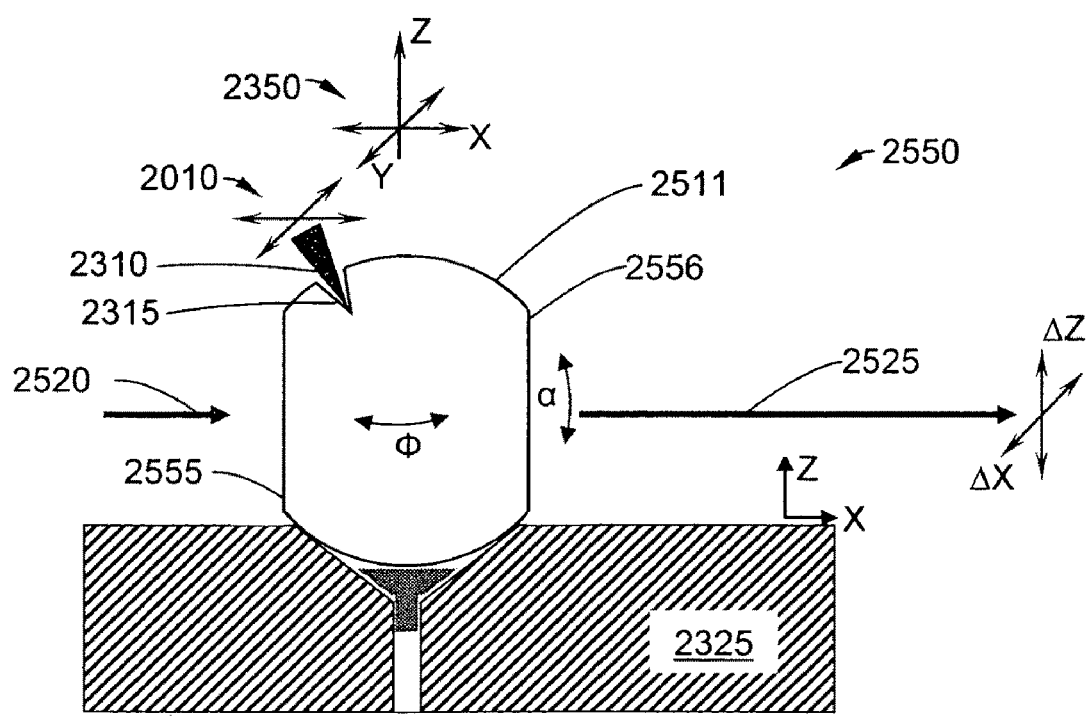
FIGS. 25C and 25D illustrate a cross section view of a beam steering system that can provide translational displacement of an optical beam with minimal change to the beam's angular heading in accordance with an exemplary embodiment of the present invention.
Figure 25D:
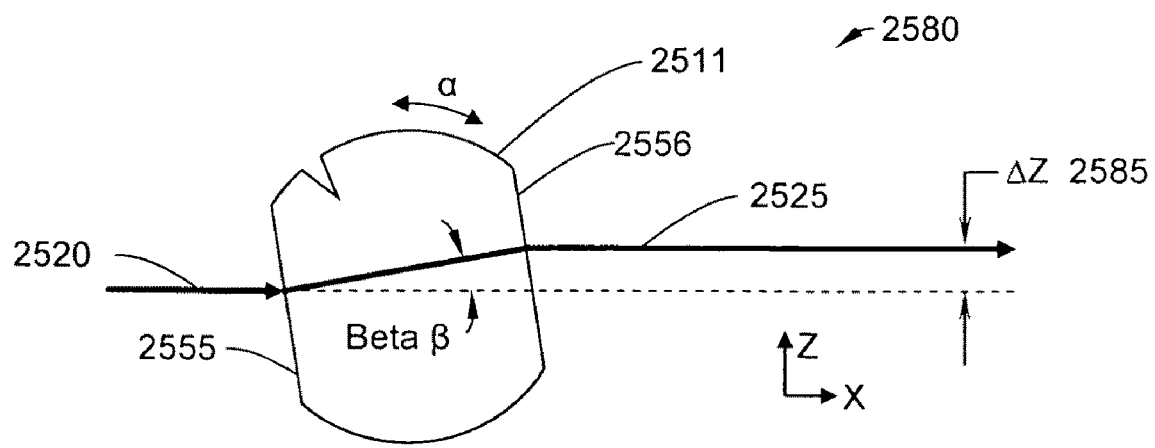

Turning now to FIGS. 25C and 25D, these figures illustrate a cross section view of a beam steering system 2250 that can provide translational displacement of an optical beam 2520 with minimal change to the beam's angular heading in accordance with an exemplary embodiment of the present invention.

The beam steering element 2511 comprises two opposing surfaces 2555, 2556 through which light 2520 passes. The surfaces 2555, 2556 can be essentially planar. To avoid setting up a standing pattern of light waves reflecting between those surfaces 2555, 2556, the surfaces 2555, 2556 can be treated with an antireflective coating. The surfaces 2555, 2556 can also be slightly angled with respect to one another so that these surfaces 2555, 2556 are not exactly parallel. The surfaces 2555, 2556 can be angled approximately 0.5°, 1°, 5°, 7°, 10°, 15° or a range between any of these values, for example. A specific angle can be selected according to dispersion parameters associated with the material of the adapted ball lens 2511 and the level of collimation of the incident light 2520. In one exemplary embodiment of the present invention, each of the surfaces 2555, 2556 comprise a moth-eye pattern or other pattern that suppresses reflection.

The illustrated beam steering element 2511 comprises an adapted ball lens 2245 having two opposing surfaces flattened via selective material removal such as lapping, grinding, polishing, etc. The adapted ball lens 2511 pivots in the recessed substrate 2325 via motion 2010 of a stylus 2310 that is disposed in an indentation 2315 of the adapted ball lens 2511. Pivoting the adapted ball lens 2511 adjusts the angle of incidence of a light beam 2520 that is incident on the first surface 2555 of the adapted ball lens 2511. Since the incident light transmits through the adapted ball lens 2511 to the opposite surface 2556, angular adjustment likewise varies the angle of incidence on the second surface 2556.

The incoming beam of light 2520 undergoes an angular dependent level of refraction at the interface of the first surface 2555. The level of refraction and thus the angle propagation $\beta$ (beta) within the medium of the adapted ball lens 2511, which can comprise silicon dioxide, glass, or silicon, for example. The beam of light 2520 diverges from its original propagation heading as it propagates within the adapted ball lens 2511. As the beam of light 2520 exits the adapted ball lens 2511, it is incident upon the second surface 2556. Refraction at the second surface 2556 steers the beam of output light 2525 to essentially negate the propagation angle $\beta$ (beta), thereby providing propagation on a heading that is essentially equal to the heading of the incoming beam of light 2520. As compared to the incoming beam of light 2520, the output beam of light 2525 is displaced a distance $\Delta Z$ (delta Z) 2585 but has a similar heading.

Thus, adjusting the angular orientation of the adapted ball lens 2511 provides a selected level of displacement of light 2520 while essentially maintaining or preserving the direction of the light 2520. Control of stylus motion 2010 can provide static or dynamic control of the light beam's position or displacement. That is, a motion control system (not shown) can sweep, oscillate, or rapidly move to displace the light beam 2520 or can be fixed to provide a selected static level of beam displacement 2585.

Stylus movements that provide rotation of the adapted ball lens 2511 in the $\alpha$ (alpha) dimension can provide beam displacement 2585 or translation in the z dimension, as illustrated by the exemplary coordinate system 2350. Stylus movements that provide rotation of the adapted ball lens 2511 in the φ (phi) dimension can provide beam displacement or translation in the x dimension.

An exemplary embodiment of a robustly stabilized multimode laser can comprise a beam displacement system similar to the exemplary system 2550 illustrated in FIGS. 25C and D. A beam displacement system 2550 that transmits light through a beam steering element 2245 while maintaining beam direction can also be useful in numerous optical applications. For example, an optical communication cross connect, dynamically addressable OADM, or optical assembly mount can comprise a beam displacement system 2550.

Figure 26:
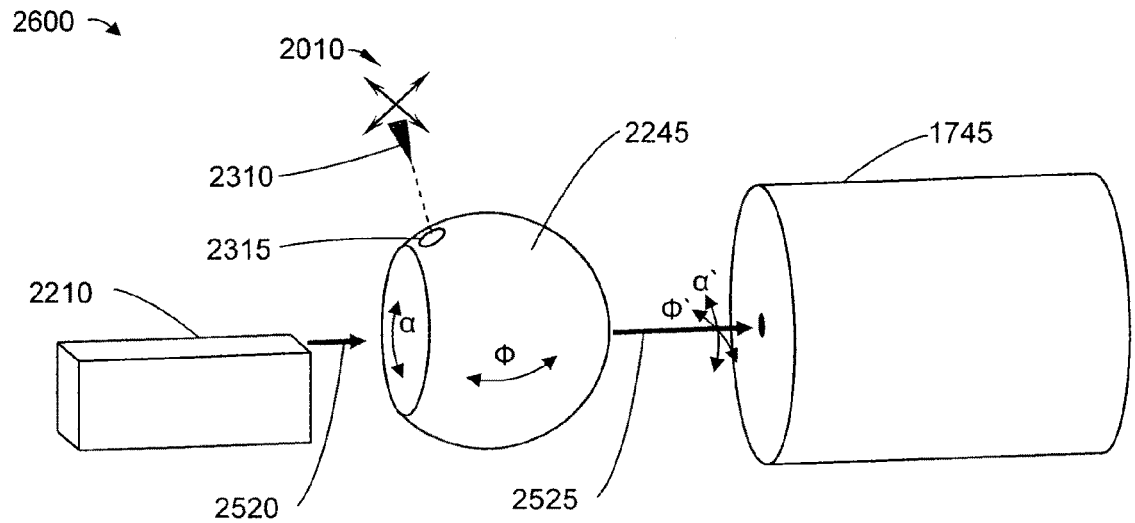
FIG. 26 illustrates an optical system that comprises a beam steering optical element providing optical alignment for coupling a laser to an optical fiber in accordance with an exemplary embodiment of the present invention.

Turning now to FIG. 26, this figure illustrates an optical system 2600 that comprises a beam steering optical element 2245 providing optical alignment for coupling a laser 2210 to an optical fiber 1745 in accordance with an exemplary embodiment of the present invention. The system 2600 can be an element in another system such as a communication transmitter, a fiber-coupled laser transmitter, a laser-based welding system, or an instrumentation system, for example.

The laser 2210, which typically comprises a semiconductor material, outputs a beam of light 2520. The laser 2210 can be a robustly stabilized multimode laser, a lasing element in a robustly stabilized multimode laser, or another laser, for example. This beam is incident on a planar first surface of the beam steering optical element 2245. Pivoting the beam steering optical element 2245 via motion 2010 of an effector, such as a stylus 2310 or another member, steers the output beam 2525 for reception by the optical fiber 1745. The resulting optical alignment achieves high coupling efficiency. The laser 2210, the beam steering optical element 2245, and the optical fiber 1745 can each be placed on and attached to a substrate (not shown in FIG. 26) via cost-effective passive alignment. Following alignment and attachment of the fiber 1745 and the laser 2210, the beam steering optical element 2245 can be pivoted and permanently fixed in a selected orientation, to compensate for any misalignment associated with the passive assembly of the laser 2210 and the optical fiber 1745. That is, an assembly process can permanently fix the laser 2210 and the optical fiber 1745 into respectively misaligned positions, and the beam steering optical element 2245 can correct, remove, or compensate for such misalignment.

Figure 27:
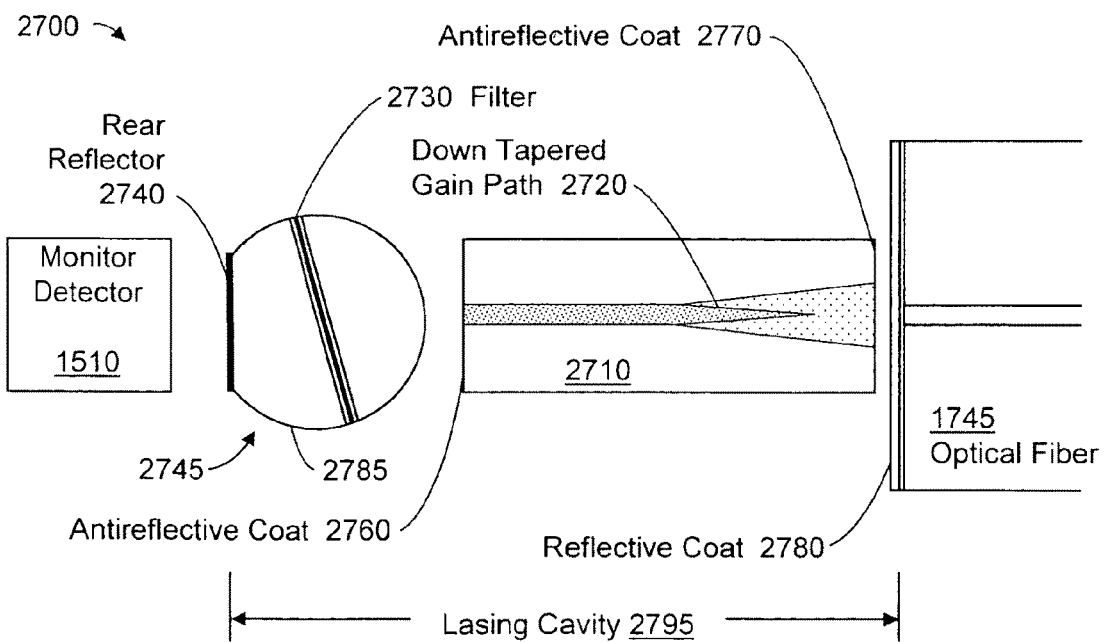
FIG. 27 illustrates a laser comprising an adjustable cavity stabilization element disposed in the laser's lasing cavity in accordance with an exemplary embodiment of the present invention.

Turning now to FIG. 27, this figure illustrates a laser 2700 with an adjustable cavity stabilization element 2745 disposed in the laser's lasing cavity 2795 in accordance with an exemplary embodiment of the present invention. The laser 2700 can be a robustly stabilized multimode laser or another laser, such as a single mode laser.

The adjustable cavity stabilization element 2745 comprises a cavity stabilizer based on a dielectric thin film filter 2730 sandwiched between two halves of an adapted ball lens 2785. The thin film filter 2730 can have a transmission window and a corresponding group delay that provides robustly stable DWDM optical communication. The cavity stabilization element 2745 is disposed in a mount (not shown) that facilitates pivoting or rotating for alignment of a rear reflector 2740 with respect to the light emitted from the coated back facet 2760 of the laser die 2710 or gain chip. The antireflective coating 2760 on the back facet suppresses superfluous reflections within the lasing cavity 2795, which can interfere with stable operation of the laser 2700. The adjustable cavity stabilization element 2745 can be adjusted in a manner similar to the adjustments of the beam steering elements illustrated in FIGS. 22-26 and discussed above, for example.

The laser die 2710 comprises a mode expansion path 2720 based on a down tapered waveguide. Light propagating in the waveguide path 2720 towards the optical fiber 1745 expands gradually as the down taper relaxes the modal confinement. That is, the pointed aspect of the down tapered gain path 2720 allows the guided light to increase in diameter to facilitate efficient coupling to the optical fiber 1745. The front facet of the laser die 2710 has an antireflective coat 2770 that suppresses reflection in a similar manner as the rear facet antireflective coat 2760.

The optical fiber 1745 has a reflective coat 2780 on the end face that functions as the front cavity reflector. The lasing cavity spans from the reflective coat 2780 on the optical fiber 1745 to the rear reflector 2745 on the cavity stabilization element 2745. The monitor detector 1510 receives a small but representative sample of light from the laser 2700 for feedback control of the laser's output power and can also be used for operational diagnostics.

Figure 28A:
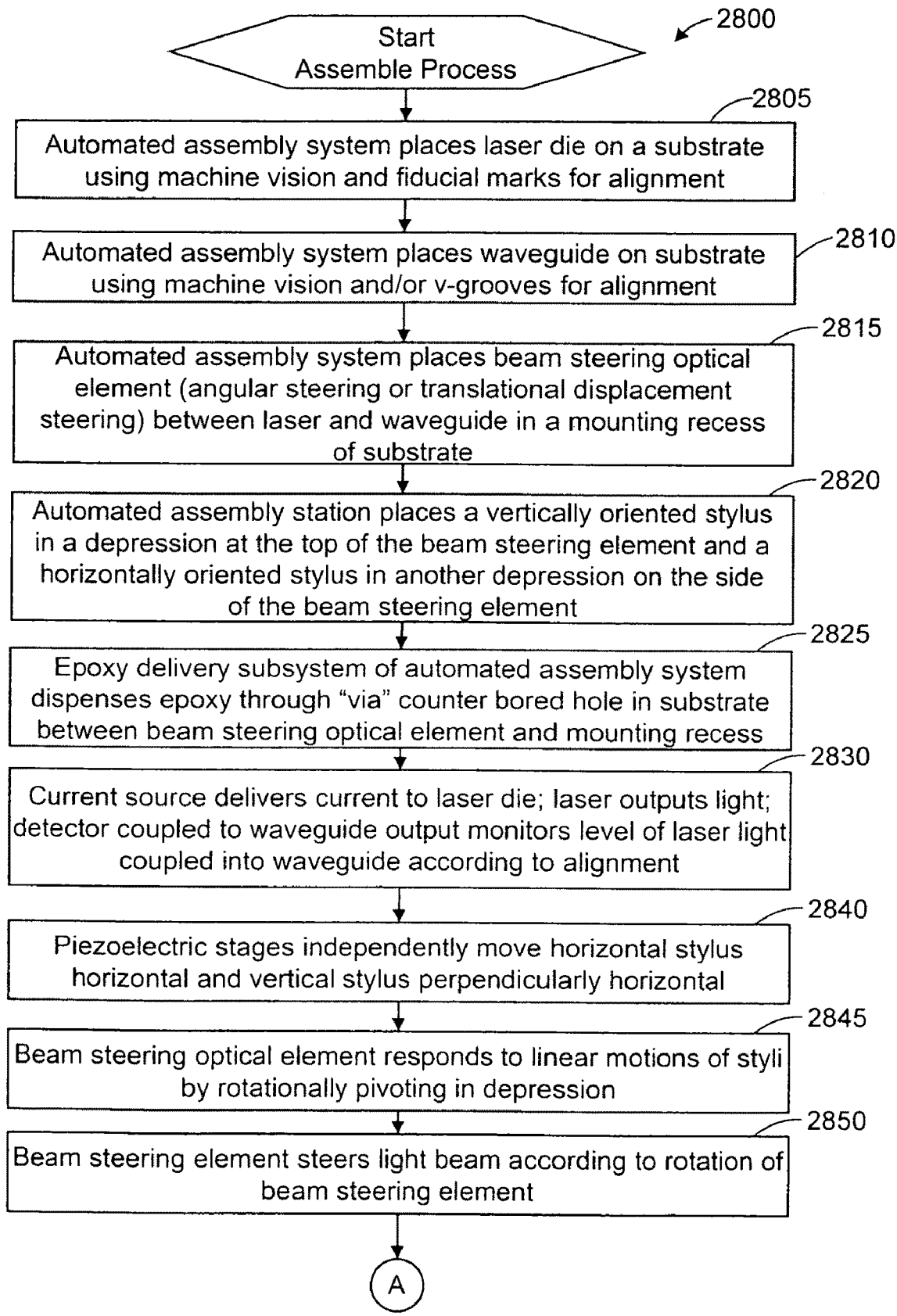
FIGS. 28A and 28B are a flow chart illustrating a process for assembling optical systems in accordance with an exemplary embodiment of the present invention.
Figure 28B:
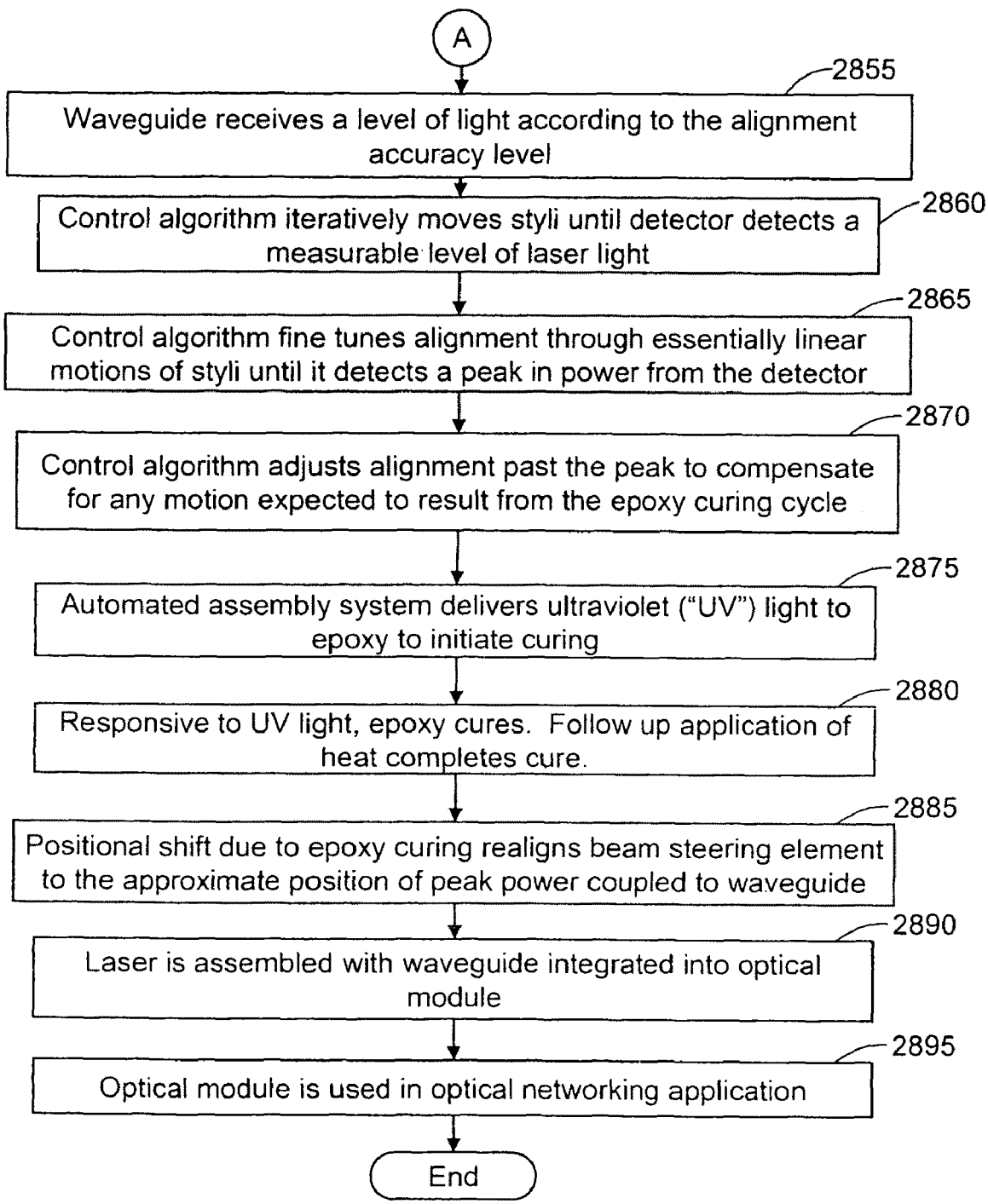

Turning now to FIGS. 28A-B, these figures are a flow chart illustrating a process 2800, entitled Assemble, for assembling optical systems in accordance with an exemplary embodiment of the present invention. Process 2800 will be discussed with exemplary reference to various elements in FIGS. 23A, 23B, 24A, 24B, and 26.

At Step 2805, the first step in Process 2800, an automated assembly system places a laser element 2210, laser die, gain chip, DFB laser, silicon-based Raman laser, or other light emitter on a substrate 2325 using machine vision and fiducial marks for alignment. For example, a digital camera-based system uses a defined mark on the substrate 2325 to position the laser element 2210 on the substrate 2323 for attachment. The spatial position of the laser element 2210 can be permanently fixed at this step.

At Step 2810, the automated assembly system places a waveguide 1745 on the substrate 2323 using machine vision for alignment. Alternatively, or in conjunction with machine vision, the assembly system can set the waveguide 1745 in a v-groove of the substrate 2323 or other physical alignment feature. The waveguide 1745 can be an optical fiber 1745 or a planar light guide circuit, for example. The spatial position of the waveguide 1745 can be permanently fixed at this step.

At Step 2815, the automated assembly system places a beam steering optical element 2245 between the laser element 2210 and the waveguide 1745. The beam steering element 2245 can provide angular steering in one angular dimension or two angular dimensions. The beam steering element 2245 can also provide displacement steering in one or two translational dimensions. That is, one or more beam steering elements 2245 can provide angular and linear offset control over a beam of light as exemplarily depicted in FIG. 23A-B, 24A-B, or 25A-D. The beam steering element 2245 can be placed in a mounting recess 2355 of the substrate 2325.

At Step 2820, the automated assembly station places a vertically oriented stylus 2310 in a depression 2315 at the top of the beam steering optical element 2245 as depicted in FIGS. 23A-B. The automated assembly station also places a horizontally oriented stylus 2310 in a depression 2315 on the side of the beam steering optical element 2245 as depicted in FIGS. 24A-B.

At Step 2825, an epoxy delivery subsystem of the automated assembly station dispenses epoxy 2340 in the recess 2355. The epoxy 2340 enters the recess 2340 by way of the through hole 2360 or via. The through hole facilitates dispensing the epoxy 2340 without disturbing the alignment of the beam steering optical element 2245. Further, the epoxy 2355 retains its position in the recess 2355 thereby avoiding entry into any optical path.

At Step 2830, a current source delivers current to the lasing element 2210. In response, the lasing element 2210 outputs light. A detector coupled to the output end of the waveguide 1745 monitors the level or amount of laser light coupled into optical waveguide 1745. The level of laser light corresponds to alignment between the lasing element 2210 and the optical waveguide 1745, taking into account the beam steering element 2245.

At Step 2840, piezoelectric stages independently move the horizontally and vertically disposed styli 2310. At Step 2845, the beam steering optical element 2245 responds to the linear motions of the styli 2310 and rotationally pivots in the recess 2355 or depression. At Step 2850, the beam steering optical element 2245 steers the light beam 2520 output by the lasing element according to the controlled rotation of the beam steering optical element 2245, as provided by horizontal and vertical linear positioning stages, which can be piezoelectric.

At Step 2855, which is illustrated in FIG. 28B, the waveguide 1745 receives a level of light 2525 output by the beam steering optical element 2245 according to a level of alignment accuracy. This initial level of alignment can be a function of the positional accuracy of passive placement of the lasing element 2210 and the optical waveguide 1745 and an initial or arbitrary alignment of the beam steering optical element 2245.

At Step 2860, a control algorithm or process, typically implanted in software and executed on the automated assembly station, iteratively moves each of the styli 2310 until the detector senses a measurable level of laser light 2525. At Step 2865, the control program, which can be or comprise a proportional plus integral plus derivate controller, senses a peak of optical power that is representative of adequate or optimal alignment.

At Step 2870, the control algorithm adjusts the alignment slightly away from the peak power to compensate for any motion of the beam steering optical element 2245 expected to occur during curing of the epoxy 2340.

At Step 2875, the automated assembly station delivers metered UV light, heat, or a combination of UV light and heat to the epoxy 2340. This initial energy stimulates or initiates curing of the epoxy 2340 to provide permanent bond. The epoxy 2340 cures at Step 2880. A follow-up thermal cycle completes curing of the epoxy 2340.

At Step 2885, the curing process of the epoxy 2340 causes a slight shift in the beam steering optical element 2245. This slight shift resets the beam steering optical element 2245 to the approximate position of providing peak coupling power into the optical waveguide 1745. That is, curing-related positional shift is taken up or offset by the positional offset implemented at Step 2870.

At Step 2890, the lasing element 2210 is assembled with the optical waveguide 1745 into an optical module. That is, an optical module can comprise the assembled lasing system 2600 that incorporates the beam steering optical element 2245.

At Step 2895, the optical module is deployed and operated in an optical networking application, such as DWDM optical network or other communication system, or a computing system. Process 2800 ends following Step 2895.

Figure 29A:
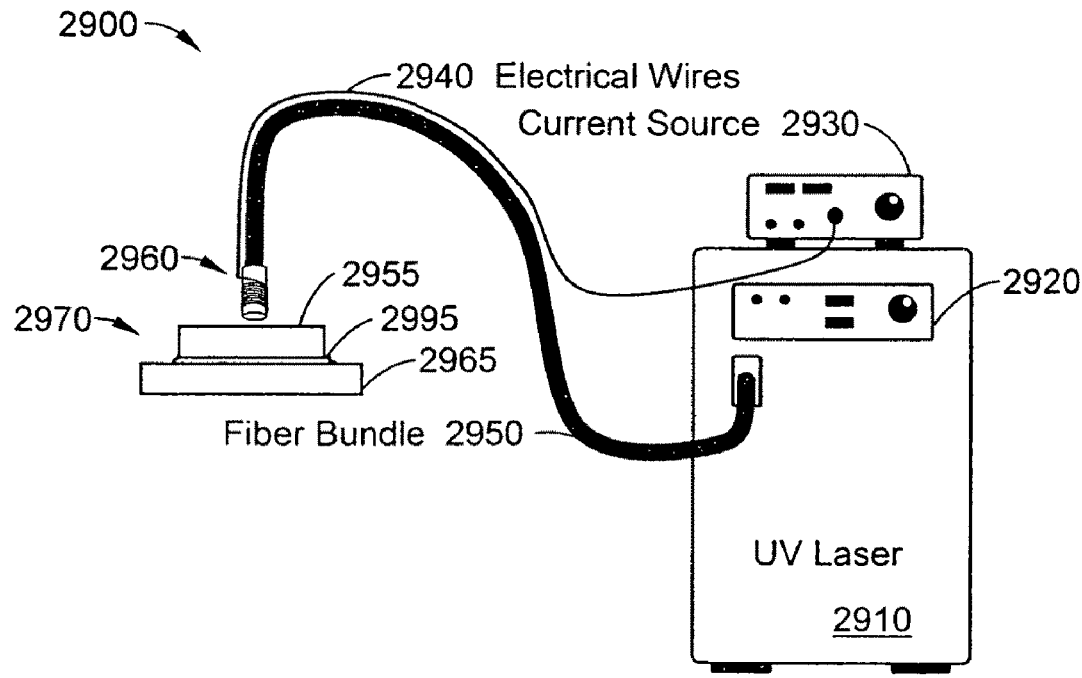
FIGS. 29A and 29B illustrate a system for delivering ultraviolet ("UV") light and a magnetic field in accordance with an exemplary embodiment of the present invention.

Turning now to FIGS. 29A and B, these figures illustrate a system 2900 for delivering ultraviolet UV 2990 and a magnetic field 2960 in accordance with an exemplary embodiment of the present invention. This system 2900 can be used to initiate or control photo-initiated chemical reactions. For example, the emitted UV light 2990 can trigger curing of the epoxy 2340 that bonds a beam steering implement 2245 to a substrate 2325 as illustrated in FIGS. 23A-25D as discussed above. The emitted magnetic field 2960 can align magnetically responsive particles in a matrix, such as a filled epoxy, to form an ordered or non-homogeneous structure. Such a structure can comprise a scaffold, truss, or other supporting structure in an epoxy or other polymerizing composition.

The system 2900 comprises a UV laser 2910 with a set of controls 2920 that can be automatically adjusted via computer-controlled feedback or via manual intervention. In an automatically adjusted arrangement, a spectroscopic analysis can provide a real-time analysis of the stage of epoxy curing.

The UV laser 2910 delivers the UV light 2990 through a fiber optic bundle 2950 to an assembly 2970. This assembly 2970 comprises a substrate 2965, an optical component 2955 that is transparent to UV light 2990, and epoxy 2995 disposed in the bond line.

The system 2900 also comprises a current source 2930 that delivers current to a coil 2975 through an electrical wire 2940. The current source 2930 can be automatically controlled through a computer-based feedback control system (not shown), comprising spectroscopic or other sensors that detect curing parameters of the epoxy 2995. The coil 2975 outputs a magnetic field 2980 with a strength that is related to the magnitude of the current supplied by the current source 2930.

Thus, the system 2900 comprises a flexible implement with a distal end 2960 that provides a light field 2990 and a magnetic field 2980 of selected properties, such as geometry and field strength. The delivered magnetic field 2980 and light field 2900 can control the epoxy's transition from a soft, fluid, monomer-based, or unordered composition into a firm, polymerized, solid, hardened, cured, or ordered composition with desirable physical and chemical properties such as thermal expansion characteristics.

In one exemplary embodiment of the present invention, a frequency doubled copper vapor laser supplies light 2990 of approximately 255 nm for dosing the epoxy 2995. The average power can be between 50 and 500 mW, with a repetition rate of approximately 6 kHz, pulse energy of less than approximately 0.05 mJ and a coherence length of approximately 40 millimeters ("mm"). The dose time can be set to a time between one second and 45 seconds, delivered in stages. The output light 2990 can be expanded or broadened, thereby controlling the flux density of delivered light 2990. Oxford Lasers Inc, of Littleton Mass. provides lasers in the company's FBG600 product line that can be suitable. A copper vapor laser can also emit approximately 100 mW of 255 nm light 2990, 200 mW of 271 nm light 2990, or 250 mw of 289 nm light 2990.

In one exemplary embodiment of the present invention, a UV lamp supplies the UV light 2990 through the fiber bundle 2950. The UV lamp can output up to 40 watts per square centimeter of light 2990 having a wavelength from 280 nm to 450 nm. Alternatively a UV lamp can output approximately 7 watts per square centimeter of light 290 at approximately 365 nm. Dymax Corporation of Torrington, Conn. supplies such lamps.

In one exemplary embodiment of the present invention, a xenon lamp supplies the UV light 2990. The xenon source can supply approximately 1000 watts per square centimeter of peak power or 100 watts per square centimeter of average power per pulse. In one exemplary embodiment of the present invention, the light intensity is increased by concentrating the light energy beam via lenses and/or waveguides until a desirable beam of UV light 2990 is achieved. That is, an appropriate level of light intensity to achieve an interaction between the light beam 2990 and the epoxy can result from varying the light intensity until acceptable results are achieved. Xenon Corporation of Woburn Mass. supplies xenon lamps.

In one exemplary embodiment of the present invention, a deuterium light source supplies the beam of light 2990 to the epoxy 2995 or other composition to control is transformation from an unordered to a structurally ordered arrangement. Such a source can output light 2990 between approximately 175 nm and 400 nm, providing approximately 10 to 400 watts of light 2990. The beam can be condensed or expanded according to the desired adjustment. Oriel Instruments of Stratford Connecticut supplies suitable deuterium lamp products, such as the company's product sold as Model 66135 High Power Deuterium Source.

In one exemplary embodiment of the present invention, a tunable UV laser outputs the light 2990 to the composition 2995 in a range between approximately 200 nm and 400 nm. The wavelength of the UV light 2990 is selected according to the desired material interactions. Tuning the laser to a specific wavelength facilitates dosing the epoxy 2995 to provide defined chemical or physical properties. SpectraPhysics of Mountain View, Calif. supplies tunable UV lasers.

In one exemplary embodiment of the present invention, the system 2900 can deliver light 2990 and a magnetic field 2980 to biological material, for example to assemble a scaffold that supports human or other tissue. While the system 2900 is discussed with regard to the exemplary application of bonding optical components, various aspects of that system 2900 or the system 2900 itself have numerous uses outside of bonding components or curing epoxy. In one exemplary embodiment of the present invention, the system 2900 can trigger release of pharmaceutical agents in an organism or biological media.

Figure 30A:
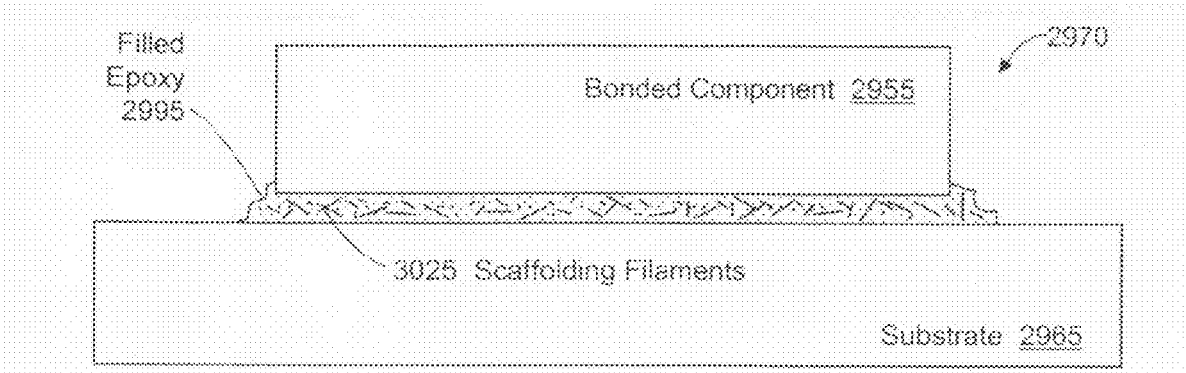
FIG. 30A illustrates two components arranged for bonding using an epoxy filled with elongated particles that are responsive to a magnetic field in accordance with an exemplary embodiment of the present invention.
Figure 30B:
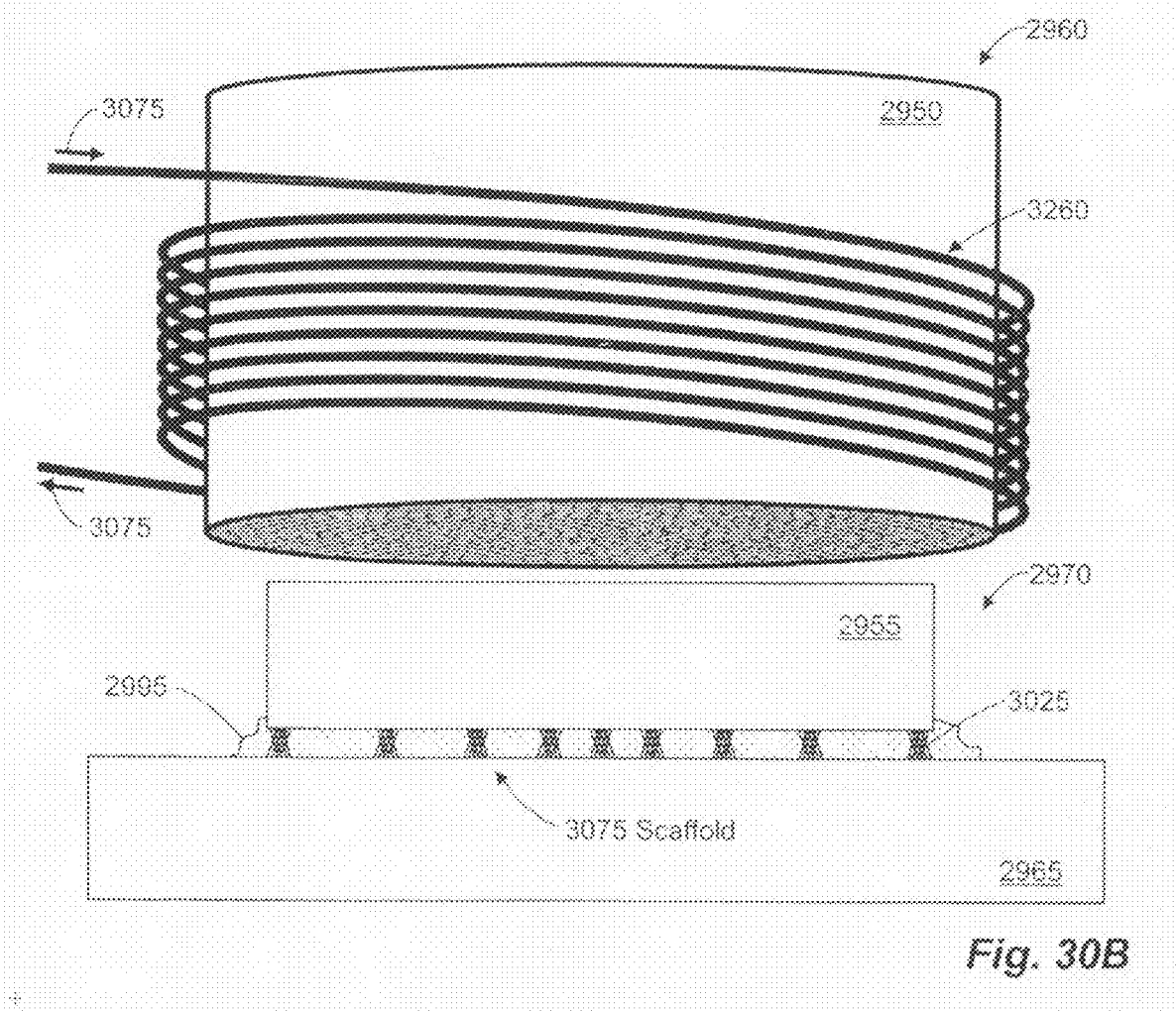
FIG. 30B illustrates two components bonded together with epoxy and having a scaffold in the bond line that can be formed by applying a magnetic field to magnetically-responsive elongated particles disposed in the bond line in accordance with an exemplary embodiment of the present invention.

Turning now to FIGS. 30A and 30B, FIG. 30A illustrates two components 2955, 2965 arranged for bonding using an epoxy 2995 filled with elongated particles 3025 that are responsive to a magnetic field 2980 in accordance with an exemplary embodiment of the present invention. FIG. 30B illustrates two components 2955, 2965 bonded together with epoxy 2995 and a scaffold 3075 in the bond line that is formed by applying a magnetic field 2980 to magnetically-responsive elongated particles 3025 disposed in the bond line in accordance with an exemplary embodiment of the present invention. A robustly stabilized laser 950 can comprise the components 2955, 2965

The elongated particles 3025 can comprise negative thermal expansion ceramic, glass, or other material. Negative thermal expansion compositions are available from various sources such as: Nippon Electric Glass Co., Ltd of Shiga-ken, Japan; Ohara GmbH, of Hofeim, Germany, Ohara Corporation of Branchburg, N.J.; Schott North America Inc. of Elmsford, N.Y. under the registered trade name ZERODUR; and Almaz Optics, Inc. of Marlton, N.J. under the trade name Astrosital.

Bulk material can be mechanically processed, for example by filing, to produce elongated particles 3025. The particles 3025 can be formed by laser processing, grinding, ablation, ion-based etching, or chemical processing of a bulk material for example. In one exemplary embodiment of the present invention, the particles 3025 are formed by a sputtering process.

The particles 3025 can have a length in a range of 50 nm to approximately fifty microns. In one exemplary embodiment of the present invention, the particles 3025 have a length less than approximately 75 nm. In one exemplary embodiment of the present invention, the particles 3025 have a length less than approximately 100 nm. In one exemplary embodiment of the present invention, the particles 3025 have a length less than approximately 200 nm. In one exemplary embodiment of the present invention, the particles 3025 have a length less than approximately 300 nm. In one exemplary embodiment of the present invention, the particles 3025 have a length less than approximately 500 nm. In one exemplary embodiment of the present invention, the particles 3025 have a length less than approximately 750 nm. In one exemplary embodiment of the present invention, the particles 3025 have a length less than approximately 1000 nm. In one exemplary embodiment of the present invention, the particles 3025 have a length less than approximately 1500 nm.

The elongated particles 3025 can have a length-to-width ratio of: 1.1 to 1; 1.25 to 1; 1.5 to 1; 2 to 1; 2.5 to 1; 3.0 to 1; 3.5 to 1; 4.0 to 1; 4.5 to 1; 5 to 1; 7 to 1; 10 to 1; 15 to 1; 20 to 1; 50 to 1; 100 to 1; 200 to 1; or 500 to 1, for example.

The elongated particles 3025 can comprise a material such as iron that is sensitive to a magnetic field. The particles 3025 can be strongly, mildly, or inherently ferromagnetic, paramagnetic, or magnetic and can comprise a rare earth oxide or rare earth element such as an element in the lanthanide series. In one exemplary embodiment of the present invention, the particles 3025 comprise cobalt and/or samarium.

The particles 3025 can be formed by sputtering or other vacuum deposition process whereby magnetically active material is applied to a material having desirable thermal expansion properties. Such properties may include decreasing in size in response to increased temperature, or negative thermal expansion. In one exemplary embodiment of the present invention, the elongated particles 3025 are produced by heating and liquidating or condensing a material having a desired mechanical property with another material having a desirable magnetic property. The resulting composition can be responsive to a magnetic field 2980 while providing desirable mechanical and thermal expansion properties.

With the filled epoxy 2995 in the gap between the substrate 2965 and the bonded component 2955, the elongated particles 3025 are essentially randomly dispersed in an unordered manner. The elongated particles 3025 can have a length that is approximately equal to the gap or bond line between the substrate 2965 and the bonded component 2955. These particles 3025 can also have a length within 5, 10, 15, 25, or 50 percent of this gap.

The epoxy base that comprises the filled epoxy 2995 can be a low-expansion epoxy such as an epoxy available from Dymax Corporation of Torrington, Conn. or from Epoxy Technologies of Billerica, Mass. That is, the particles 3025 can be added to a low-shrink or dimensional stable epoxy base that has a UV-initiated cure.

Figure 29B:
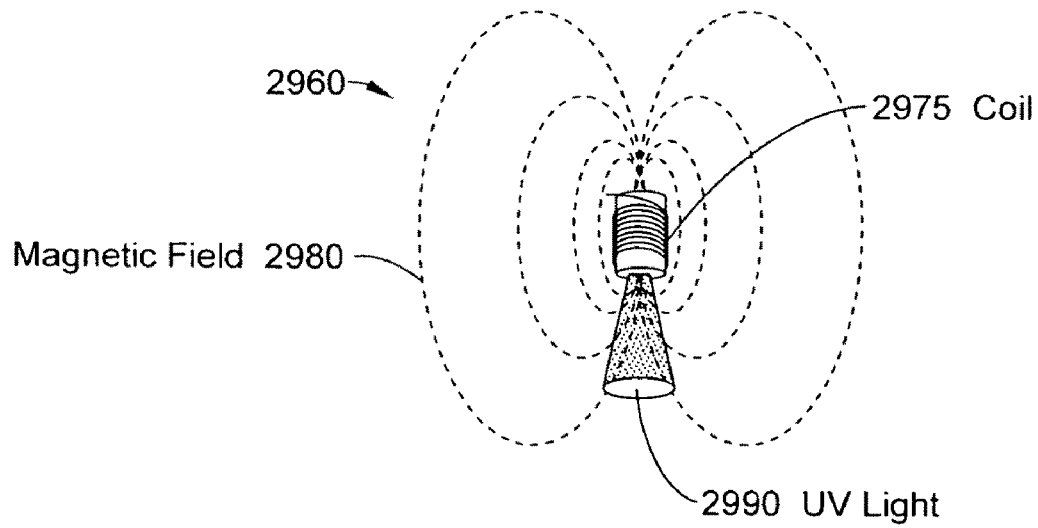

The system 2900 illustrated in FIGS. 29A and 29B can deliver UV light 2990 and magnetic field 2980 to the filled epoxy 2995. The magnetic field 2980 can exert a force on the elongated particles 3025 causing the elongate particles 3025 to align into to the magnetic field lines 2980, with the particles essentially filling the gap in a scaffold or framework arrangement 3075. The magnetic field 2990 can be controlled by the current 3075 flowing through the coil 3260 at the distal tip 2960. In one exemplary embodiment of the present invention, the distal tip 2960 comprises multiple coils or other magnetic field delivery elements that can each deliver interacting magnetic fields. The combination of these magnetic fields can provide a high level of control over the framework 3075, for example defining the spacing between each pillar or supporting column of elongate or slender particles 3025.

The polymerization or curing process of an epoxy can exert a shrinkage force drawing, pulling, or urging two bonded components 2955, 2965 together in an undesirable manner that the scaffold 3075 can counteract. That is, the scaffold 3075 can provide support between two components 2955, 2965 undergoing a bonding process, so that the bonding process does not significantly disrupt or displace the relative positions of each of the components 2955, 2965. After the bonding process is complete, the scaffold 3075 can provide enhanced long-term dimensional stability, for example minimizing dimensional change associated with temperature variations or changes.

In one exemplary embodiment of the present invention, the ordered structure 3075 of elongate particles 3025 comprises a biologically active chemical, such as a pharmaceutical agent that affects an organism. That is, rather than being disposed in between two inanimate objects surrounded with epoxy, the scaffold 3075 can be disposed in a living organism and can deliver a chemical to the organism that desirably alters some aspect of the organism's biology or function. Such a scaffold 3075 can also provide a support structure for tissue or cell growth, such as stem cell growth or growth of tissue cultured, originating, or stemming from stem cells.

Figure 31:
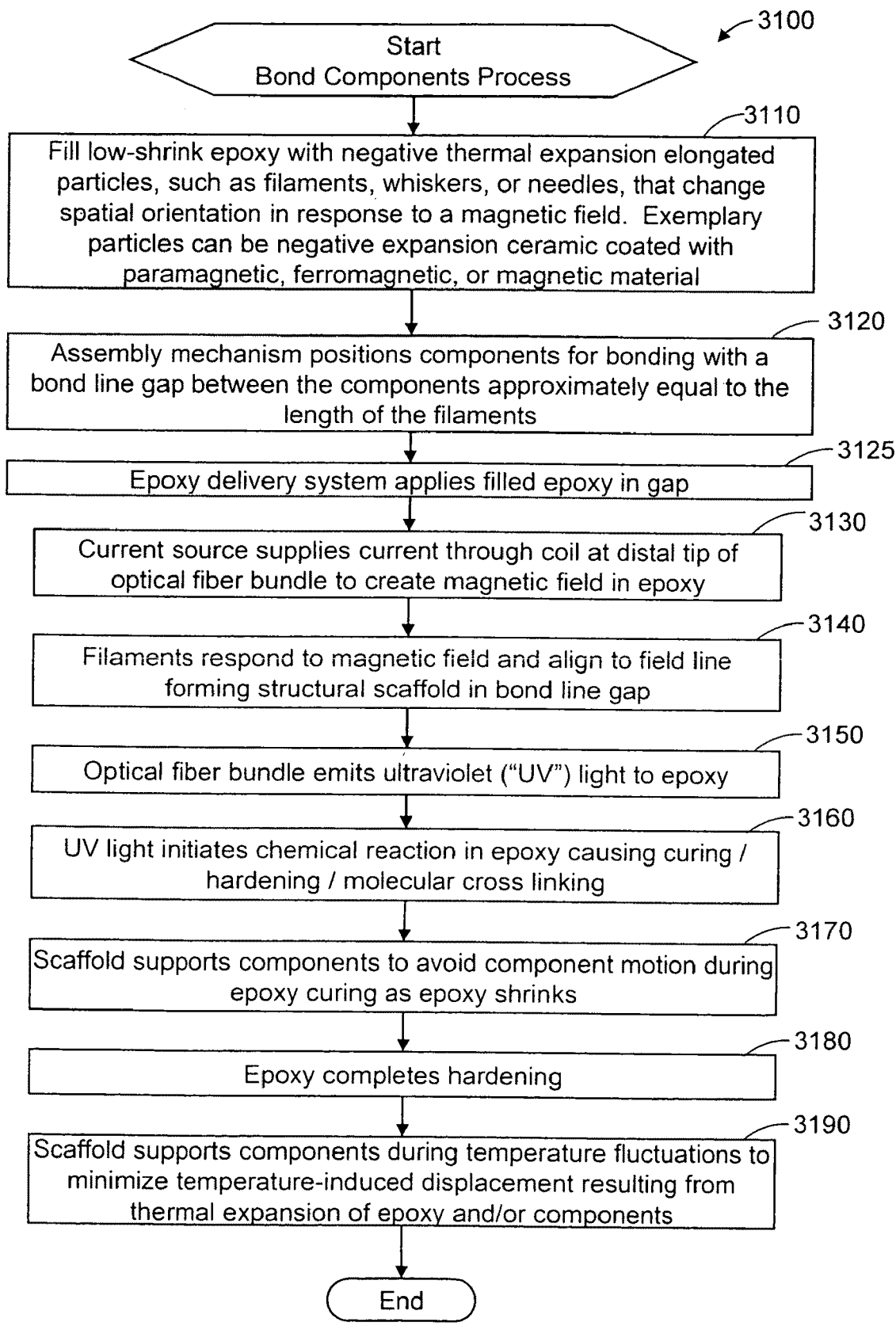
FIG. 31 is a flow chart illustrating a process for bonding components and providing a scaffold in the bond line in accordance with an exemplary embodiment of the present invention.

Turning now to FIG. 31, this figure is a flow chart illustrating a process 3100, entitled Bond Components, for bonding components 2955, 2965 with a scaffold 3075 in the bond line in accordance with an exemplary embodiment of the present invention. At Step 3110, elongate particles 3025, such as filaments, whiskers, or needles, are mixed with low-shrink epoxy. These particles 3025 are responsive to a magnetic field 2980, changing geometric orientation, for example moving into alignment with the field lines of a magnetic field 2980. The particles 3025 can comprise a negative expansion ceramic coated with a paramagnetic, ferromagnetic, or magnetic material. Such material can comprise iron, for example. The particles 3025 can be nanoparticles, for example having at least one dimension less than approximately 100 nm.

At Step 3120, an assembly mechanism positions the components 2955, 2965 in a desirable orientation with respect to one another. A bond line between the components 2955, 2965 provides a gap that dimensionally approximates the particle length. The bonded components can be components in a robustly stabilized multimode laser 950, for example a beam steering optical element 2245 and a substrate 2325 as illustrated in FIG. 23A.

At Step 3125, an epoxy deliver system applies the filled epoxy 2995 into the bond gap, for example though a via or through hole in the substrate as illustrated in FIG. 23A and discussed above.

At Step 3130, a current source 2930 supplies electrical current 3075 through a coil 3260 at the distal tip 2960 of an optical fiber bundle 2950. The current 3075 flowing through the coil 3260 generates a magnetic field 2980 in the filled epoxy 2995.

At Step 3140, the elongate particles 3025, which can also be characterized as scaffolding filaments or structural members, respond to the applied magnetic field 2980 and organize into a structural scaffold 3075 in the bond line gap.

At Step 3150, the optical fiber bundle 2950 emits a pattern of UV light 2990 into the filled epoxy 2995. At Step 3160, the UV light 2990 initiates a chemical reaction in the epoxy 2995 causing curing, hardening, or molecular cross linking.

At Step 3170, the scaffold 3075 supports the components 2955, 2965 to avoid component motion during epoxy curing as the epoxy may exhibit a tendency to shrink or otherwise undergo a dimensional change during cure.

At Step 3180, the epoxy completes hardening or polymerization. That is, the cure is essentially complete. At Step 3190, the scaffold 3025 supports the bonded components 2955, 2965 to minimize temperature-induced displacement resulting from thermal expansion or contraction of the epoxy 2955 or of the components 2955, 2965. The scaffold 3025 can also provide support to overcome stresses associated with other effects such as moisture or applied forces. Following Step 3190, Process 3100 ends.

Figure 32:
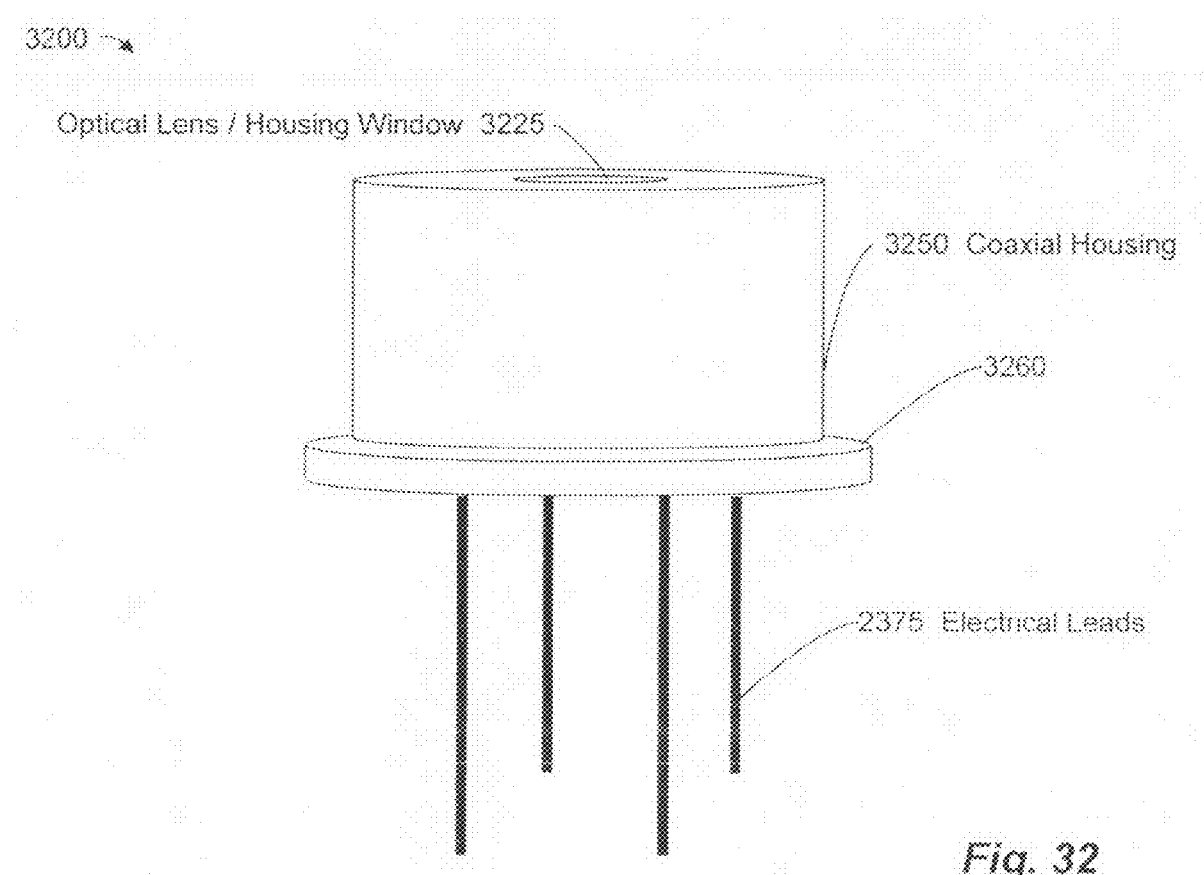
FIG. 32 illustrates a robustly stabilized multimode laser mounted in a coaxial package that allows exchange of gaseous material between the outside of the package and the enclosed volume of the package and that supports laser operation at a temperature higher than the coaxial package's case temperature in accordance with an exemplary embodiment of the present invention.

Turning now to FIG. 32, this figure illustrates a robustly stabilized multimode laser 3200 mounted in a coaxial package 3250 that allows exchange of gaseous material between the outside of the package 3250 and the enclosed volume of the package 3250 and that provides laser operation at a temperature higher than the coaxial package's case temperature in accordance with an exemplary embodiment of the present invention.

The coaxial housing 3250 typically does not have internal active cooling, such as from a thermoelectric device. If the coaxial housing 3250 had an internal active cooling element and the coaxial housing 3250 allowed water vapor to enter the housing 3250, the water vapor could condense and from liquid water, which could cause problems for electrical, optical, and optoelectronic components associated with typical lasers. However, with the robustly stabilized multimode laser 3200 providing DWDM performance without need of active cooling and operating at a temperature at or above the temperature of the coaxial housing 3250, the coaxial housing 3250 can allow a degree of water vapor, contaminants, or extraneous material to enter the coaxial housing 3250 without significant risk of condensation. In other words, operating the robustly stabilized multimode lasing element (not shown in FIG. 32) inside the coaxial housing 3250 without thermoelectric cooling facilitates using a housing package 3250 that allows a level of exchange between the gases in the housing 3250 and the gases outside of the housing 3250. That is, the housing can be permeable to diffusion or exchange of gaseous matter.

The robustly stabilized multimode laser system 3200 illustrated in FIG. 32 comprises an optical lens or housing window 3225 through which laser light exits the housing 3250 and is coupled to a single mode optical fiber or another optical medium. A shoulder 3260 facilitates mounting the laser system 3200 in a receptacle (not shown) that can mate with an optical fiber connector. Electrical leads 2375 convey bias current and modulated current to the gain medium inside the housing 3250 and convey a power monitoring signal from the inside to the housing 3250 to external electronic components (not shown in FIG. 32).

Figure 33:
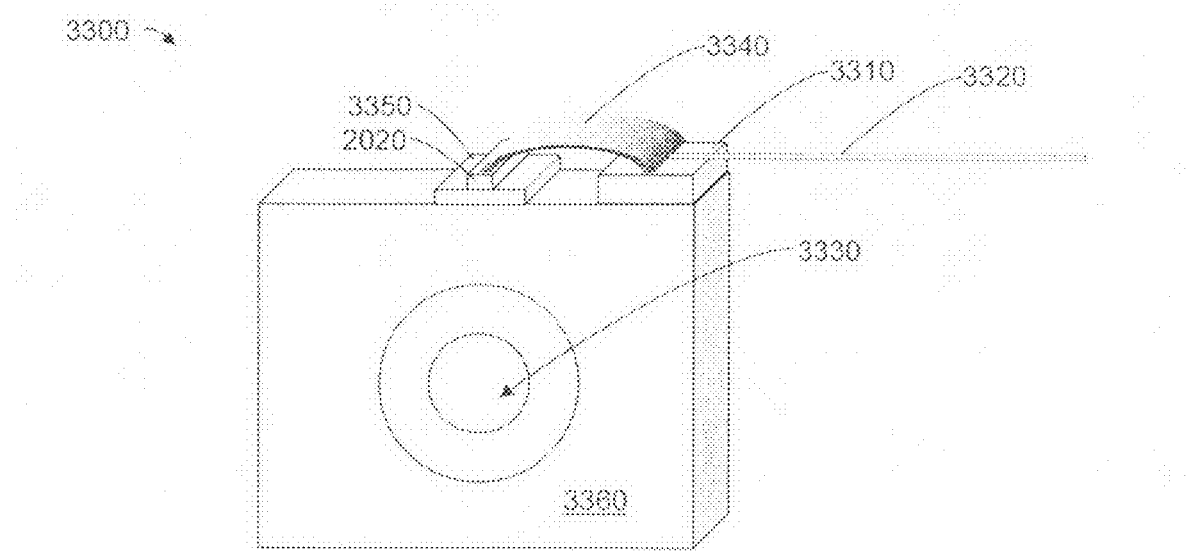
FIG. 33 illustrates a robustly stabilized multimode laser attached to a mount for assembly in a coaxial package in accordance with an exemplary embodiment of the present invention.

Turning now to FIG. 33, this figure illustrates a robustly stabilized multimode laser 2020 attached to a mount 3360 for assembly in a coaxial package 3250 in accordance with an exemplary embodiment of the present invention. The mounting system 3300 comprises a mounting member 3360 with a mounting hole 3330. The mounting member 3360 provides a heat sinking capability and a path to conduct heat generated at the lasing element 2020 away from the lasing element, typically towards the base of the coaxial housing 3250.

The lasing element 2020, which can comprise a lasing cavity 1535 and associated components of a robustly stabilized multimode laser 950, is mounted on a submount 3340 or substrate. An electrical lead 3320 carries current to the lasing element 2020, which typically comprises a semiconductor, via a pad and a conductive strip 3340.

The mounting system 3300 is typically mounted in the coaxial package 3250 so that light emitted from the lasing element 2020 transmits through the housing window 3225. A screw or similar fastener, placed through the mounting hole 3330, can attach to a plate (not shown) inside of the coaxial housing that is aligned to the shoulder 3260.

Figure 34:
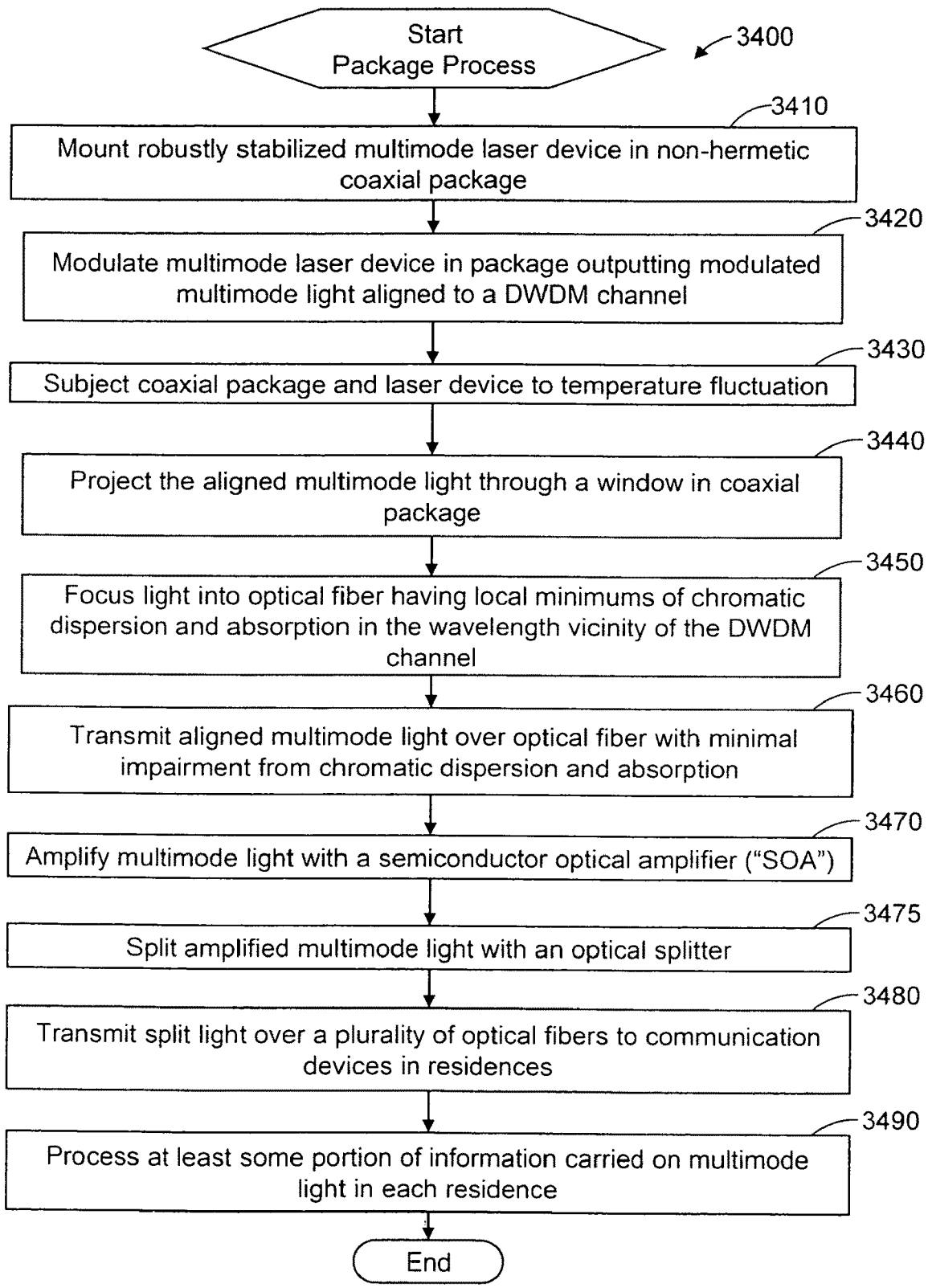
FIG. 34 is a flow chart illustrating a process for packaging a robustly stabilized laser in accordance with an exemplary embodiment of the present invention.

Turning now to FIG. 34, this figure is a flow chart illustrating a process 3400, entitled Package, for packaging a robustly stabilized laser 2020 in accordance with an exemplary embodiment of the present invention. Process 3400 will be discussed with exemplary reference to FIGS. 32 and 33, which are discussed above.

At Step 3410, the first step in Process 3400, an assembly system mounts a robustly stabilized multimode laser device 2020 in a non-hermetic coaxial package 3250. At Step 3420, electrical circuitry modulates the multimode laser device 2020 in the package 3250. While referenced to the coaxial housing 3250 illustrated in FIG. 33, the package of Process 3400 can be another type of package, such as a dual-inline-pin ("DIL") package or a mini-DIL package. The multimode laser device 2020 outputs modulated multimode light with spectral characteristics that are aligned to a DWDM channel 151.

At Step 3430, the coaxial package 3250 and the robustly stabilized multimode laser device 2020 housed therein are subject to a temperature fluctuation or a random event that triggers or results in a lasing cavity response. At Step 3440, stable multimode light output from the lasing device 2020 projects through the window 3225 in the coaxial package 3250. The window 3225 can comprise a ball lens or other optical element.

At Step 3450, a lens or other light manipulation element focuses light into the core of an optical fiber. The optical fiber can have a local minimum of chromatic dispersion and light absorption in the wavelength vicinity of the DWDM channel.

At Step 3460, the optical fiber transmits the aligned multimode light 101 with minimal impairment from the chromatic dispersion and absorption properties of the optical fiber. At Step 3470, a semiconductor optical amplifier ("SOA"), Raman amplifier, SiOA, or silicon photonic device amplifies the multimode optical signal propagating over the optical fiber. The SOA can be placed a distance along the optical fiber to facilitate maintaining an acceptable power level in an optical network, such as an access network or fiber-to-the-home network.

At Step 3475, an optical splitter splits the amplified multimode light output from the SOA, dividing the optical signal between or among two or more optical fiber segments. At Step 3480, the split light signals transmit over the plurality of optical fiber segments for reception at communication devices associated with residences. The receiving communication devices can be on the residential premises or in a hub or distribution node associated with a group of houses, a neighborhood, or community.

In one exemplary embodiment of the present invention, variations on the supply or feed to the SOA, Raman amplifier, SiOA, or other optical amplifier are sensed to determine or deduce information. The load on the optical amplifier can change as a result of variations in the signal that feeds into the optical amplifier. As the load changes, operational parameters, such as current, pump light, or unabsorbed pump light supplied to the SOA, can change. Sensing the change in load can provide a tap for information flowing through the SOA.

One type of optical amplifier has two optical inputs, one that carries the data payload and that is optically transmitted for site-to-site communication, the other that balances the load on the optical amplifier. When the payload optical signal is attenuated (or in the 'zero' state), the amplifier applies gain to that optical signal. When the payload optical signal has high strength (or in the 'one' state), the amplifier applies gain to the balancing optical signal. In this manner, the optical amplifier's load is relatively stable or uniform.

In one exemplary embodiment of the present invention, detecting the amplified strength of a balancing optical signal in an SOA, Raman amplifier, SiOA, or other optical amplifier provides a determination of the payload data or other data carried on a primary optical transmission line. That is, sensing the modulation of the balancing optical signal provides a capability to tap information from an optical transmission without interrupting or breaking the optical path. A computing system can comprise a network of amplifiers so outfitted to tap optical information without interrupting transmission. The network can support optically disseminating information among computing elements in a computing system, such as a microprocessor-based system.

In one exemplary embodiment of the present invention, an SiOA comprises a silicon-based waveguide that provides a controlled level of amplification based on the amount of free or excess electronics in that waveguide. Thus, removing or adding electrons changes the amplifier's gain. Monitoring the amount of electrons removed from the waveguide's medium in connection with amplification can provide an indication of the information that the amplified optical signals carry. That is, analyzing the current that results from draining electrons from the SiOA's traveling wave gain region can deduce information encoded on the amplified signals that are traveling through that gain region.

At Step 3490, the communication devices or an information processing device coupled thereto processes at least some portion of the information carried on the robustly stabilized multimode light. For example, a television or personal computer can receive digital or analog data or other information. Following Step 3490, Process 3400 ends.

Figure 35A:
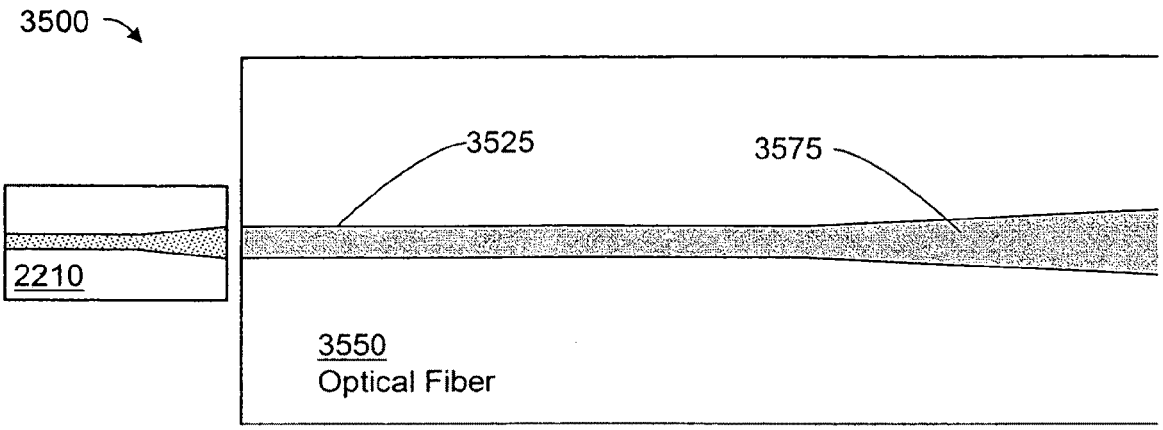
FIGS. 35A-35C illustrate an efficient coupling of a laser to an optical fiber wherein the mode fields of the mated ends of the laser and the optical fiber match one another in accordance with an exemplary embodiment of the present invention.
Figure 35B:
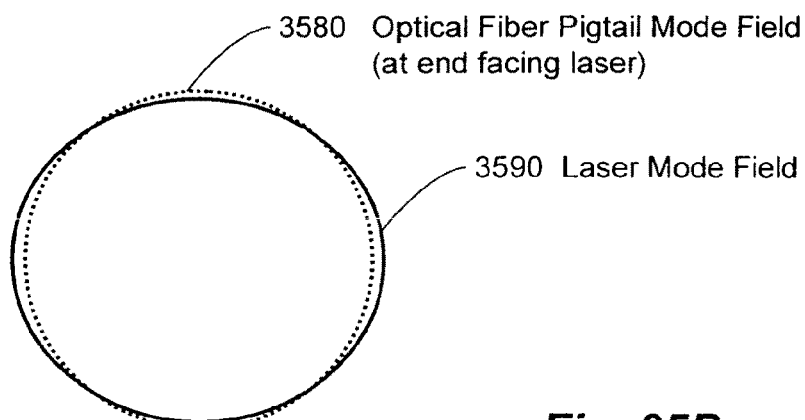
Figure 35C:
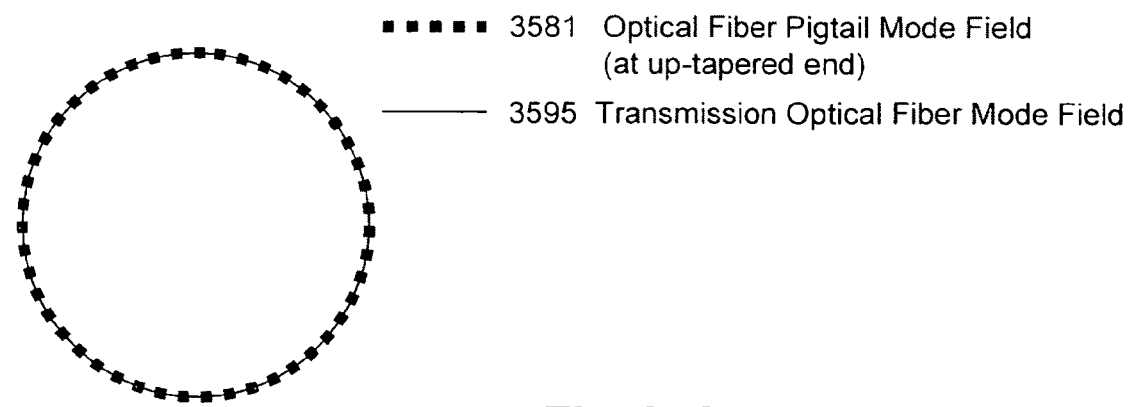

Turning now to FIGS. 35A-35C, these figures illustrate an efficient coupling of a laser 2210 to an optical fiber 3550 wherein the mode fields 3580, 3590 of the mated end of the laser 2210 and the mated end of the optical fiber 3550 match one another in accordance with an exemplary embodiment of the present invention. The laser 2210 of FIG. 35A can be a robustly stabilized multimode laser 950, a VCSEL, a DFB laser, or another laser and can have an up-taper (as illustrated) or another integral structure that provides an expanded mode, such as the laser device 2710 that FIG. 27 illustrates. The illustrated laser 2210 of FIG. 35 can more generally represent an active optical component, including a Raman amplifier, an SiOA, an SOA, or a light emitting diode ("LED") or a passive optical component, such as many types of planar lightguide circuits ("PLCs") or other passive waveguide devices, to name a few examples.

In comparison to industry-standard glass optical fiber that often carries infrared signals one kilometer or further, such as Corning SMF-28 fiber, the optical fiber 3550 has a reduced mode profile 3580 at the end that faces the laser 2210. The optical fiber 3550 can be a jumper or a pigtail that is connected on one end to the laser 2210 and on the other end to such an industry-standard glass fiber (not shown in FIG. 35A) with a mode field diameter 3595 of approximately 10 microns. The laser 2210 and the facing end of the fiber 3550 can each have a mode field 3580, 3590 with a diameter in a range of 2.5 to 6.0 microns, for example.

The optical fiber 3550 can be based on or build from commercially available optical fibers that are manufactured by Nufern of East Granbury, Conn. and that are distributed by Thorlabs, Inc. of Newton, N.J. Nufern Planar Waveguide Fiber, Part Number PWG1-HP has a mode field diameter of 4.8 microns +/−0.5 microns. Nufern Ultra-High NA (numerical aperture) Silica Fiber, Part Number UHNA1 has a mode field diameter of 4.0 microns at 1300 nm. Nufern Ultra-High NA Silica Fiber, Part Number UHNA3 has a mode field diameter of 3.2 microns at 1300 nm. Nufern Ultra-High NA Silica Fiber, Part Number UHNA4 has a mode field diameter of 3.2 microns at 1310 nm. Each of those flexible glass Nufern fibers has an outer or cladding diameter of approximately 125 microns, which matches Corning SMF-28 fiber and many other glass fibers that transmit light over an extended geographic distance. Fibercore Limited of Southhampton, Hampshire, United Kingdom also supplies single mode optical fiber with reduced mode profile that can be suited for mating with the expanded-mode laser 2210.

From the above listed sources or another commercial source, fiber can be selected to use as stock for the optical fiber 3550 and to have a mode size 3580 that is similar to, matches with, or approximates the mode size 3590 of the mode-expanded laser 2210 or another type of semiconductor laser, an edge emitting laser, or a VCSEL. Thus, light couples or transfers efficiency between the laser 2210 and the optical fiber 3550. The optical fiber 3550 connects to a transmission optical fiber 201 (not shown in FIG. 35A) that is typically part of a DWDM or OADM network, such as the system 300 illustrated in FIG. 3 and discussed above, or another optical communication system. The transmission optical fiber 201 typically has a mode field 3595 that is approximately or nominally 10 microns in diameter. The optical fiber 3550 has a taper 3575, with the taper's large side facing the transmission optical fiber 201, that provides a mode field 3581 matched to the transmission fiber 201.

Thus, the laser 2210 couples light efficiently to the single mode optical fiber 3550, and the laser's mode field 3590 matches the pigtail fiber's mode field 3580. The taper 3575 in the core of that pigtail fiber 3550 adiabatically, efficiently, or with minimal loss expands the mode field of the light propagating therein. The output or expanded side of the taper 3575 efficiently couples light to the transmission optical fiber 201, and the taper's mode field 3581 matches the transmission fiber's mode field 3595. Further, the outside diameter of the pigtail optical fiber 3550 matches the outside diameter of the transmission optical fiber 201 to facilitate connectorization, mechanical coupling, and physical alignment. Via this system 3550, light from the laser 2210 efficiently couples into the transmission fiber 201 via waveguide components that maintain or confine that light in a single mode, waveguided state.

The taper 3575 is formed by heating the tapered section 3575 of the pigtail fiber 3550 to provide a thermal gradient along the longitudinal length of the taper 3575. The heat diffuses or disperses the core's dopant(s) into the surrounding cladding, with a correlation between the amount of heat applied and the extent of the dopant diffusion. The core doping material is typically present in the fiber stock from the commercial vendor. At the end of the taper 3575 facing the laser 2210, the core of the fiber 3550 tightly confines the mode of the light propagating therein. The level of confinement gradually decreases along the length of the taper 3575 in correlation to the amount of diffusion of the core material into the surrounding cladding. Thus, the fiber's numerical aperture gradually changes along the length of the taper 3575.

An electric arc placed in the vicinity of the fiber 3550 can create sufficient heat and a sufficient temperature gradient to produce the taper 3575 by diffusion, migration, or mixing of the core into the cladding. Other heat sources, electric or non-electric, can also be used to create a longitudinal diffusion profile that comprises the taper 3575. Flowing current through a resistive coil of wire placed adjacent or around the fiber 3550 can provide a thermal gradient that produces the taper.

In exemplary embodiments, the temperature difference between the small end of the taper 3575 and the large end during the tapering process can be 250° C., 300° C., 350° C., 400° C., 450° C., or 500° C., which is a not an exhaustive list. Higher temperatures can also be applied. Generally, higher temperature applications need less time to yield sufficient diffusion than do lower temperatures. The amount of heat and time can vary according to the composition of the fiber 3550. An annealing step applied after creating the primary features of the taper 3757 can stabilize the taper 3575 to reduce taper change or material migration over time, for example during years of deployment in a network application.

In one exemplary embodiment, the taper 3575 can result from intense laser light projected onto the fiber 3550 from the side, wherein the delivered laser light has an intensity gradient correlated to the taper gradient. Thus, an application or controlled dose of photonic radiation can create the taper 3575.

In one exemplary embodiment, the laser die 2210 is mounted on a substrate (not shown in FIG. 35A), such as a silicon optical bench. The optical fiber 3550 is disposed in a v-groove of the substrate. A plate or member having a hole or aperture is disposed between the laser die 2210 and the fiber 3550 so that light passes through the hole. The plate is positioned so that the aperture is in or adjacent the near field of the laser die 2210. The aperture creates its own near field, and the face of the fiber 3550 is placed within the aperture's near field, on the opposite side of the plate from the laser die 2210. A gaseous medium can be present in the aperture, between the aperture and the laser die 2210, and/or between the aperture and the fiber 3550. The aperture can be viewed as extending the near field of the laser die 2210. Thus, the aperture of the plate can function as a beam relay or a near field extender between the laser die 2210 and the optical fiber 3550 to facilitate expanding the separation or gap between the laser die 2210 and the optical fiber 3350. Expanding that gap can provide working room and viewing area to support cost effective assembly or manufacturing operations. A device that manipulates light, such as a thin film, can be disposed in the expanded gap. The resulting assembly can be contained in a sealed enclosure or a circuit-board-mountable housing. Thus, an optical communication module, a transmitter 907, a laser system, or some other optical system can comprise the resulting assembly, for example. Further, an enclosed or encased module can comprise: a housing; an electrical component; an optoelectronic component receiving electrical signals from the electrical component; a passive optical component in optical communication with the optoelectronic component; and a series or network of aperture relaying devices coupled to light flowing between the optoelectronic component and the passive optical component. The module's housing or case can comprise an electrical port for feeding electricity to the electrical component and an optical port for transmitting light between the optical component and another device external to the module's housing or case.

Figure 36A:
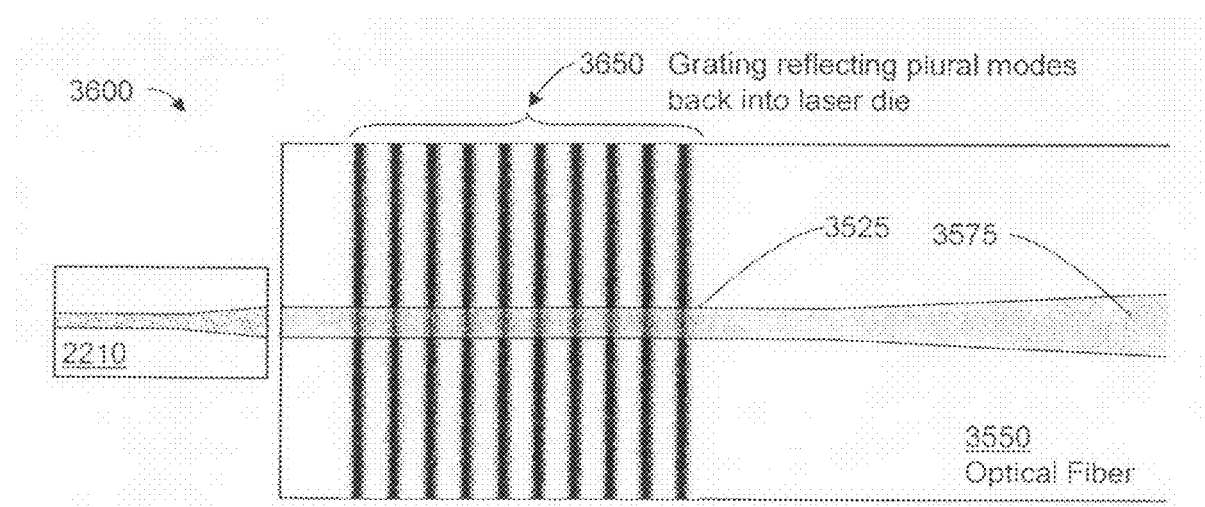
FIG. 36A illustrates a mode expanded laser die coupled to a mode matched optical fiber that has a laser stabilization grating in accordance with an exemplary embodiment of the present invention.

Turning now to FIG. 36A, this figure illustrates a lasing system 3600 comprising a mode expanded laser die 2210 coupled to a mode matched optical fiber 3559 that comprises a laser stabilization grating 3650 in accordance with an exemplary embodiment of the present invention. The grating 3650 can be written into the fiber 3550 with UV laser light interacted with a phase mask. The grating 3650 has spectral characteristics for reflecting multiple modes of light into the die or gain chip 2210. The lasing cavity spans from the rear of the laser die 2210 to the grating 3650 with that cavity supporting resonation of multiple longitudinal modes.

As an alternative to multimode resonation, the system 3600 can comprise a single-longitudinal-mode lasing device that provides high performance with direct modulation. Placing the grating in a section of the fiber 3550 having a mode match to the laser die 2210, as illustrated in FIGS. 35A-C and discussed above, facilitates controlling or selecting the length of the lasing cavity and the extent of cavity losses to support high-speed modulation, for example 10 gigabits per second, and a high extinction ratio, such as 10 dB or more. In other words, the grating 3650 can be written into the fiber segment 3550 illustrated in FIG. 35A to produce a lasing device 3600 having a short cavity and low cavity loss. The resulting short cavity can be sufficiently responsive to a modulating signal to provide a fast rise time that supports data rates exceeding 10 gigabits, for example.

Figure 36B:
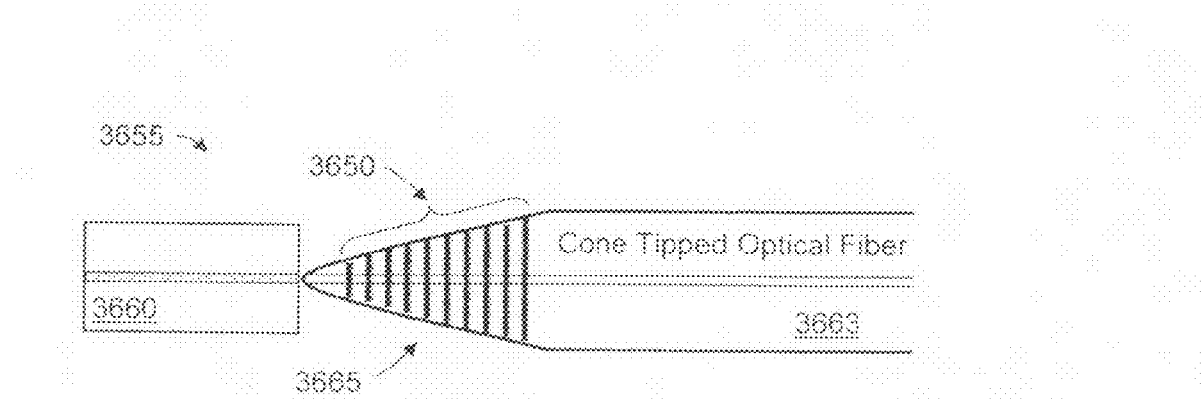
FIG. 36B illustrates a laser die coupled to a cone tipped optical fiber that has a grating in its tapered region in accordance with an exemplary embodiment of the present invention.

Turning now to FIG. 36B, this figure illustrates a lasing system 3655 comprising a laser die 3660 coupled to a cone tipped optical fiber 3663 that has a grating 3650 in its tapered region 3665 in accordance with an exemplary embodiment of the present invention. Writing the feedback grating 3650 in the conical or tapered region 3665 of the fiber 3663 supports placing the grating close to the die 3660 to yield a shorter lasing cavity than would result from placing the grating in an un-tapered or cylindrical section of the fiber 3663.

The fiber 3663 can have an inherent or internal mode field diameter of approximately 10 microns that is ill-matched to the laser chip's mode field of approximately 3 microns. The conical or contoured endface 3665 provides efficient coupling of light between the laser die gain medium 3660 and the fiber 3663, compensating for the mode mismatch. The grating 3650 provides a wavelength selective reflector functioning as a cavity mirror. The short or controlled length of the lasing cavity of the lasing system 3655 can facilitate high performance communication signals, for example modulation at 2.5 or 10 gigabits per second. That is, placing the grating 3650 adjacent the laser die 3660, specifically in the region with conical sidewalls, can enhance the laser's dynamic response characteristics relative to placing a grating in the region of the fiber 3663 that has parallel sidewalls.

Figure 36C:
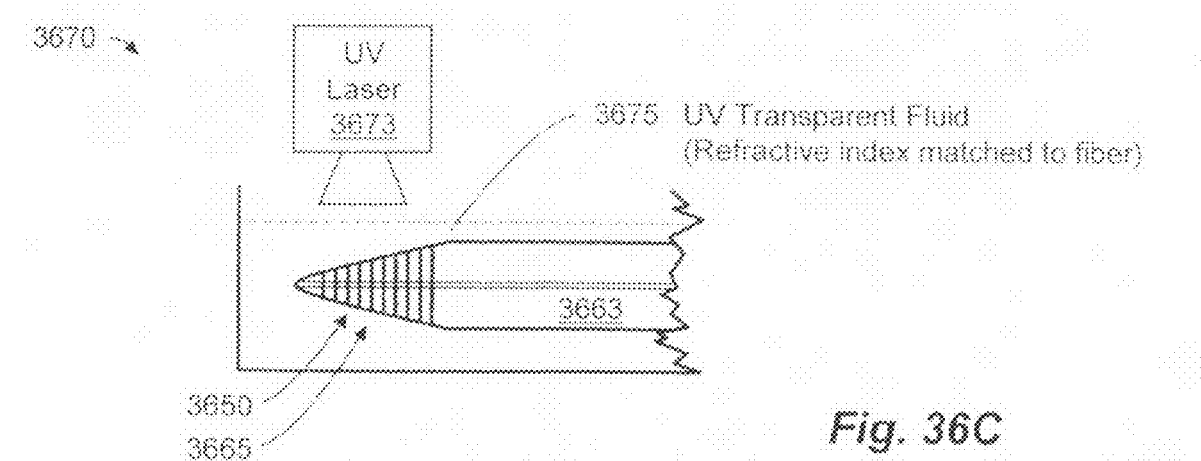
FIG. 36C illustrates a system for writing gratings in contoured optical components by projecting light through a liquid medium surrounding the component in accordance with an exemplary embodiment of the present invention.

Turning now to FIG. 36C, this figure illustrates a system 3670 for writing gratings 3650 in a contoured optical component 3663 by projecting light through a liquid medium 3675 surrounding or contacting the component 3663 in accordance with an exemplary embodiment of the present invention. The medium 3675 comprises a UV transparent liquid with a refractive index that matches the refractive index of the fiber's conical tip 3665 or shaped endface. The liquid can comprise a fluorocarbon, a fluoropolymer, or an aqueous material, for example. The medium 3675 can comprise commercially available UV-grade index-matching or index-controlled gels or fluids. In one exemplary embodiment, the liquid 3675 comprises water with an additive that adjusts or increases the water's refractive index. The additive can comprise a salt, such as sodium chloride or potassium chloride, for example. That is, sufficient salt can be added to or dissolved in water to boost the water's refractive index to approximately the same value as the refractive index of the fiber 3663.

Various commercial instruments are available to measure the refractive index of the liquid 3675. A refractometer can measure that refractive index as the additive is mixed with a base liquid until the resulting composition has a refractive index that matches the refractive index of the fiber 3663 or the fiber's cladding. Optical component suppliers typically provide or publish refractive index data for supplied components, and that data can be used for index matching.

The flat uniform surface of the index-matching fluid receives grating-writing light without distortion for transfer to the cone 3665. That is, the fluid bath 3675 provides a flat or uniform surface that facilitates projecting light emanating from a phase mask, or other light-patterning element, to a contoured optical component 3663. Further, the index match and wetted contact between the fluid medium 3675 and the medium of the component 3663 provides an interface or coupling that supports sending light into the component 3663 with minimal or no refraction or detriment to the profile, structure, or phase front of that light. The light can more generally be viewed as photonic energy or actinic radiation.

Figure 36D:
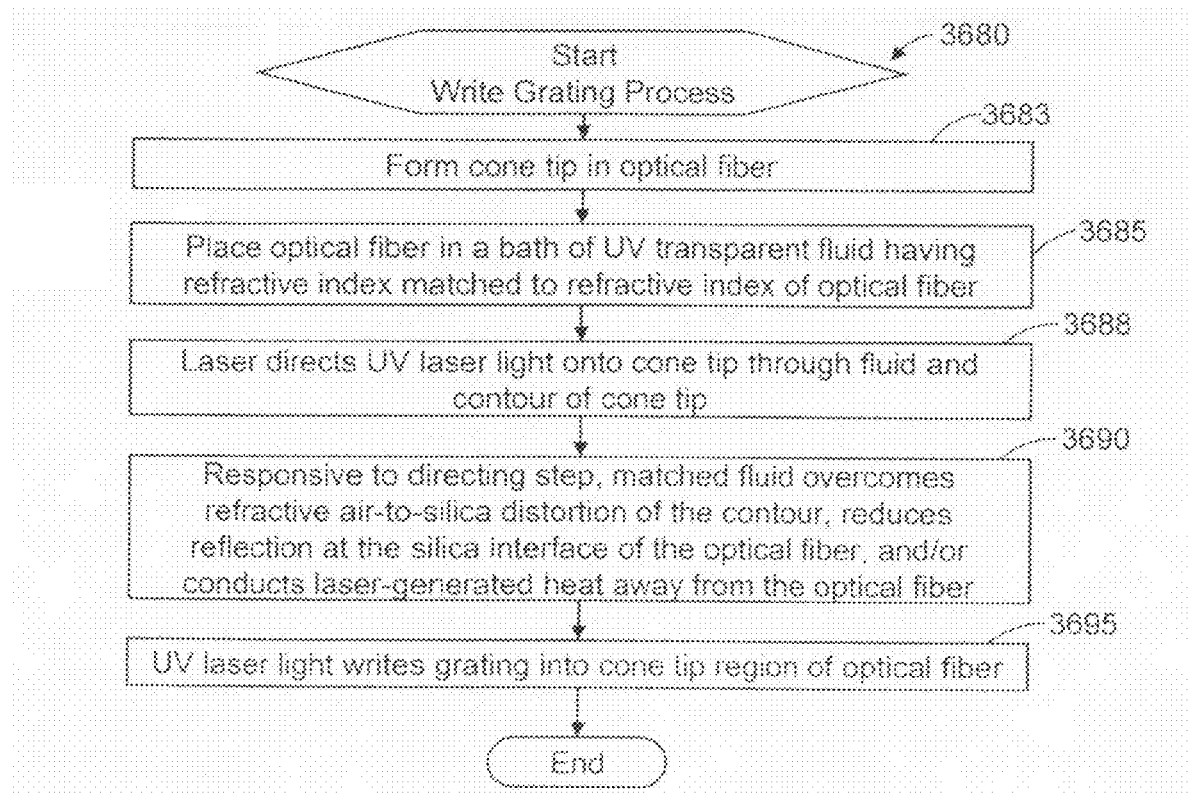
FIG. 36D is a flow chart illustrating a process for writing a grating in a contoured optical component in accordance with an exemplary embodiment of the present invention.

Turning now to FIG. 36D, this figure is a flow chart illustrating a process 3680 for writing a grating 3650 in a contoured optical component 3663 in accordance with an exemplary embodiment of the present invention. The Process 3680, which is entitled Write Grating, exemplifies a process for using light to create high resolution features on an object or item that has a contoured surface with the potential to distort the light and for overcoming that distortion potential. More generally, the projected light can effect a change in refractive index of a selected area of a contoured component.

At Step 3683, the first step in Process 3680, a contour is created in an optical component. For example, a cone tip 3665 is formed in an optical fiber 3663 that may ultimately become a component of a communication system 300 comprising a robustly stabilized multimode lasing device 950.

At Step 3685, the fiber 3663 is immersed or placed in fluid 3675 with a refractive index selected according to or for compatibility with the refractive index of the fiber 3663. The fluid 3675 is typically a liquid but may alternatively be a multiphase composition, which in certain embodiments may comprise dispersed nano-particles, or a high-pressure gas. The fluid 3675 may have an open surface or be in a fully enclosed container with a transparent wall, made of UV-grade quartz, for example. The window may be wetted on one side with the fluid 3675 and contacting air or a UV-transparent gas on the opposite side that faces the laser 3673. A temperature controller (not shown in the system 3670 of FIG. 36C) can maintain the fluid bath 3675 at a defined temperature set point.

At Step 3688, UV laser light transmits through the fluid 3675 and onto or into the contoured region 3665 fiber 3663. If a sealed or windowed container holds the fluid 3675, the laser light transmits from the laser 3673 through air, through the window, through the fluid 3675, and into the fiber 3663.

At Step 3690, the fluid 3675 provides an interface to a surface of the fiber 3663 that is essential free from refractive distortion. Wetting with an index matching material the surface of the fiber 3663 through which actinic radiation passes can overcome, defeat, or suppress that surface's propensity to reflect or distort that radiation. The fluid 3675 can also conduct heat away from the fiber 3663 during a grating-writing step.

At Step 3695, UV laser light writes or creates the grating 3650 in the fiber 3663. Following Step 3695, Process 3680 ends.

Figure 37:
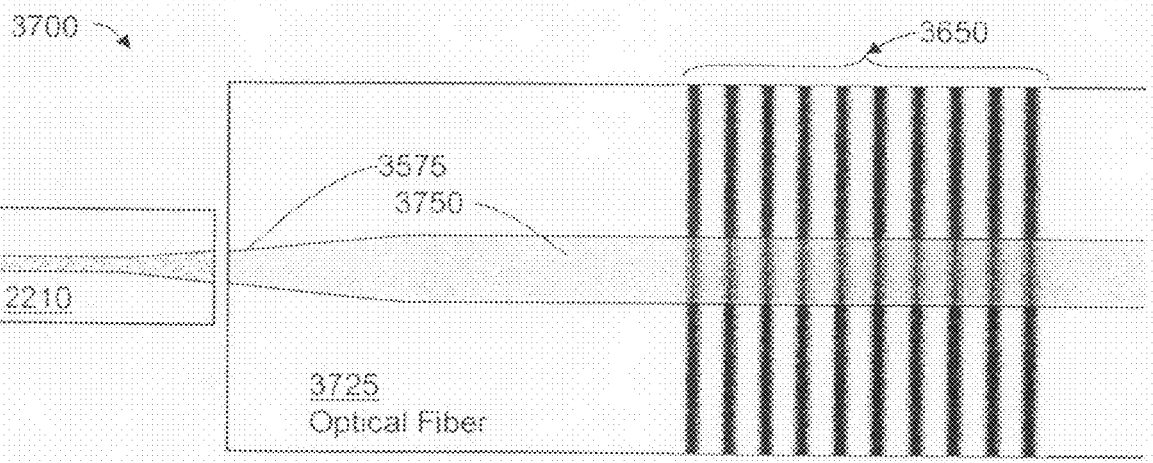
FIG. 37 illustrates a mode expanded laser die coupled to a mode matched optical fiber that has a laser stabilization grating and a tapered core between the grating and its coupled end face in accordance with an exemplary embodiment of the present invention.

Turning now to FIG. 37, this figure illustrates a mode expanded laser die 2210 or gain element coupled to a mode matched optical fiber 3725 that has a laser stabilization grating 3650 and a tapered core 3575 between the grating 3650 and its coupled end face in accordance with an exemplary embodiment of the present invention. The grating 3650 can provide a cavity mirror that reflects multiple longitudinal modes for lasing via resonant reflection. The grating 3650 of the system 3700 can be formed in accordance with the methodology or steps of Process 3680 as discussed above. The fiber's taper 3575 can be formed as discussed above in reference to FIGS. 35A-C. The down-tapered side of the core 3750 can have a modal size that matches the laser's output beam, while the expanded core 3750 can be mated, fused, or connected to a transmission fiber 201 with a 10-micron core, for example. The fiber's endface can be in the near field of the laser die's output face.

Figure 38:
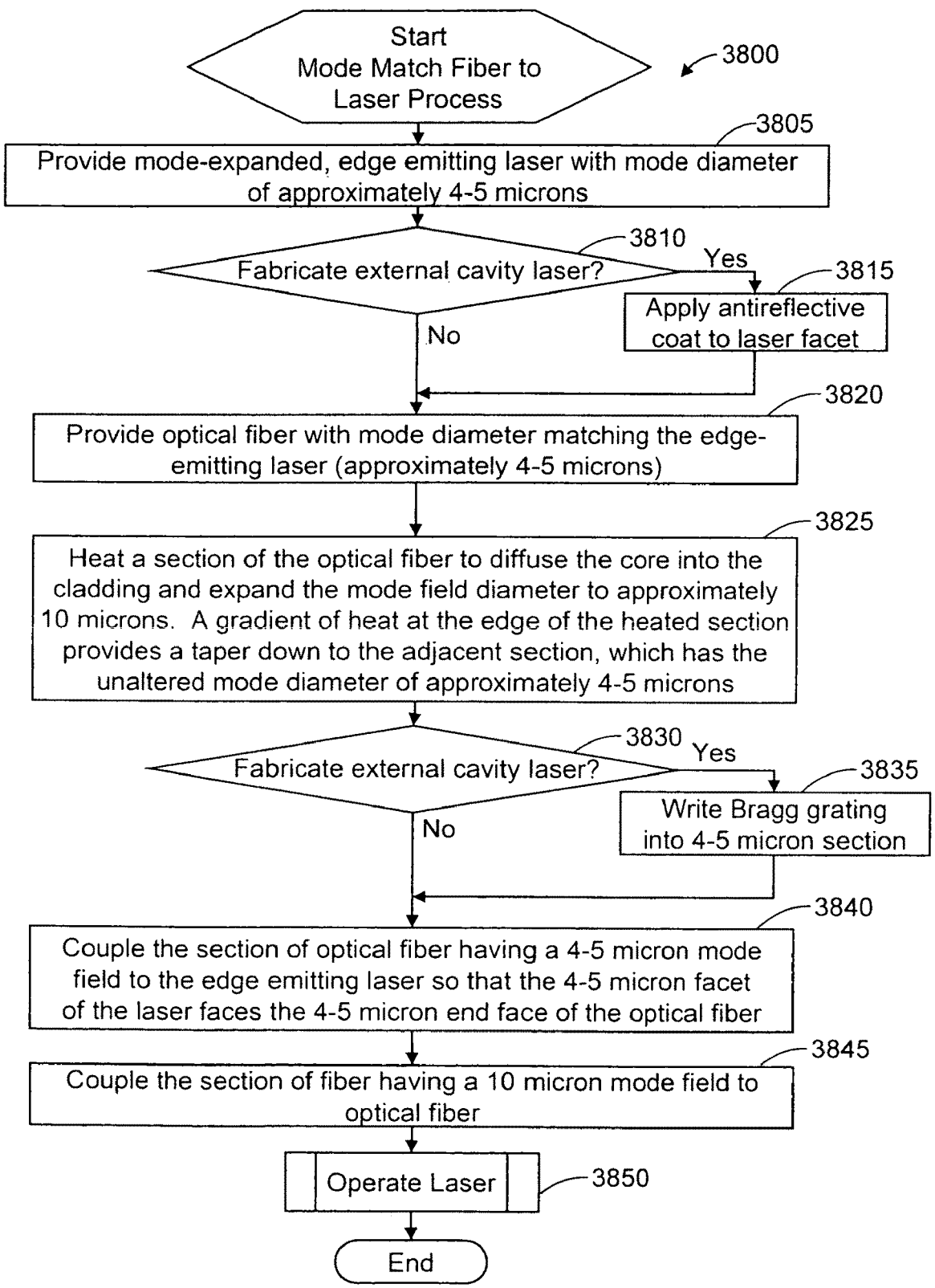
FIG. 38 is a flow chart illustrating a process for efficiently coupling a laser to an optical fiber in accordance with an exemplary embodiment of the present invention.

Turning now to FIG. 38, this figure is a flow chart illustrating a process 3800 for efficiently coupling a laser or gain element to an optical fiber 3550 in accordance with an exemplary embodiment of the present invention. The Process 3800, which is entitled Mode Match Fiber to Laser, can be used to fabricate the system 3500 illustrated in FIGS. 35A-C as discussed above, as well as other optical system.

At Step 3805, an active optical element, such as the element 2210, is provided or procured. At Step 3810, a decision is made regarding whether to construct an external cavity laser 3810. A deposition process applies a thin-film antireflective coating to the laser's facet if the Process 3800 is to provide an external cavity laser.

At Step 3820, a supplier provides an optical fiber segment or pigtail 3550 that has a mode size 3580 that matches the gain element's mode size 3590. At Step 3825, heat diffuses, disperses, migrates, or mixes some of the core material into the surrounding cladding material. The diffused material may be a material that the manufacturer of the fiber segment 3550 added to the fiber's core to increase the core's refractive index relative to the fiber's cladding. The heat is selectively applied to a section of the fiber 3550 into which the taper 3575 of the core is to be formed. Areas with high heat diffuse more rapidly than areas with lower heat, thereby providing a varied diffusion profile along the longitudinal length of the fiber 3550. The applied heat can provide a temperature in the range of 350° C. to 750° C., depending on the composition of the fiber 3550 and the time of heat application. The heat can be applied in a range between a few seconds and a few hours, for example.

If an external cavity laser is a desired product of the Process 3800, at Step 3835, a Bragg grating 3650 is written into a portion of the fiber 3550 that has a reduced core dimension (at the small side of the taper 3575). If the Process 3800 is to yield another type of optical assembly that provides efficient coupling between waveguide devices with differing mode field sizes, Step 3835 may be skipped.

At Step 3840, the fiber segment 3550 is coupled to the active device so that the respective mode fields 3580, 3590 match or are similar in geometry and/or size. At Step 3845, the up-tapered or expanded-core side of the pigtail fiber 3550, which may be a fiber optic jumper, an extender, or a mode adapter, is mated to another fiber or waveguide having a core diameter that is suited for or optimized for propagation over an extended distance relative to the length of the pigtail 3550. At that end of the fiber segment 3550, opposite the laser element 2210, the mode fields 3581, 3595 of the segment 3550 transmission fiber 201 match.

Figure 39:
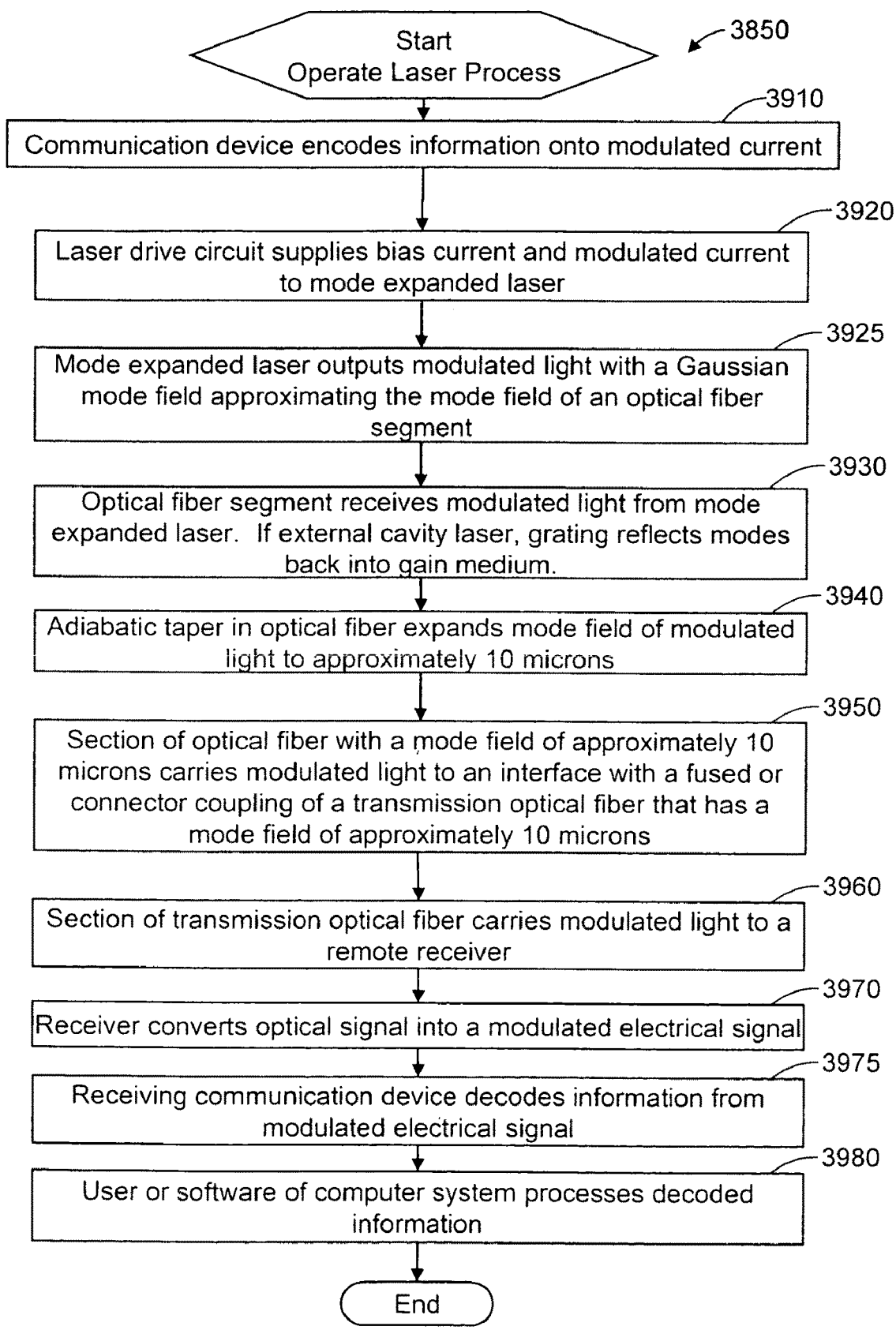
FIG. 39 is a flow chart illustrating a process for operating a laser that is coupled to a mode matched optical fiber in accordance with an exemplary embodiment of the present invention.

At Step 3580, for which FIG. 39 illustrates an exemplary embodiment, the resulting system is operated to provide photonic signal that communication digital or analog information between two sites or devices. Following Step 3850, Process 3800 ends.

Turning now to FIG. 39, this figure is a flow chart illustrating a process 3850 for operating a laser 2210 that is coupled to a mode matched optical fiber 3725 in accordance with an exemplary embodiment of the present invention. While described below with reference to 35A and 36A, the methodology of Process 3850, which is entitled Operate Laser, can be applied to a variety of optical systems.

At Step 3910, a communication device, such as a telephone system, modulates an electrical signal 905 to encode information on that signal. At Step 3920, a laser drive circuit 910 supplies modulated current to the laser 2210 to provide direct modulation.

At Step 3925, the laser 2210 emits light having a transverse mode field 3590 that matches the transverse mode field 3580 of the fiber 3550. At Step 3930, the fiber 3550 efficiently receives the emitted light. At Step 3940, the taper 3575 in the fiber 3550 expands the light's transverse mode field without breaking up that mode.

At Step 3950, the fiber 3550 couples the expanded light, to another optical fiber 201 with a relatively large mode field 3595. That is, at the taper output, the mode field 3581 of the fiber 3550 matches the mode field 3595 of the transmission fiber 201. At Step 3960, the fiber 201 carries the modulated light and the information encoded thereon to a remote receiver 321.

At Step 3970, the receiver 321 produces an electric signal modulated in accordance with the transmitted information. At Step 3975, the receiver 321, or a device connected thereto, processes that electric signal to extract the encoded information for usage at a computing or communication device such as a telephone system, a server, or a personal computer (not an exhaustive list). Process 3850 ends following Step 3980.

Figure 40A:
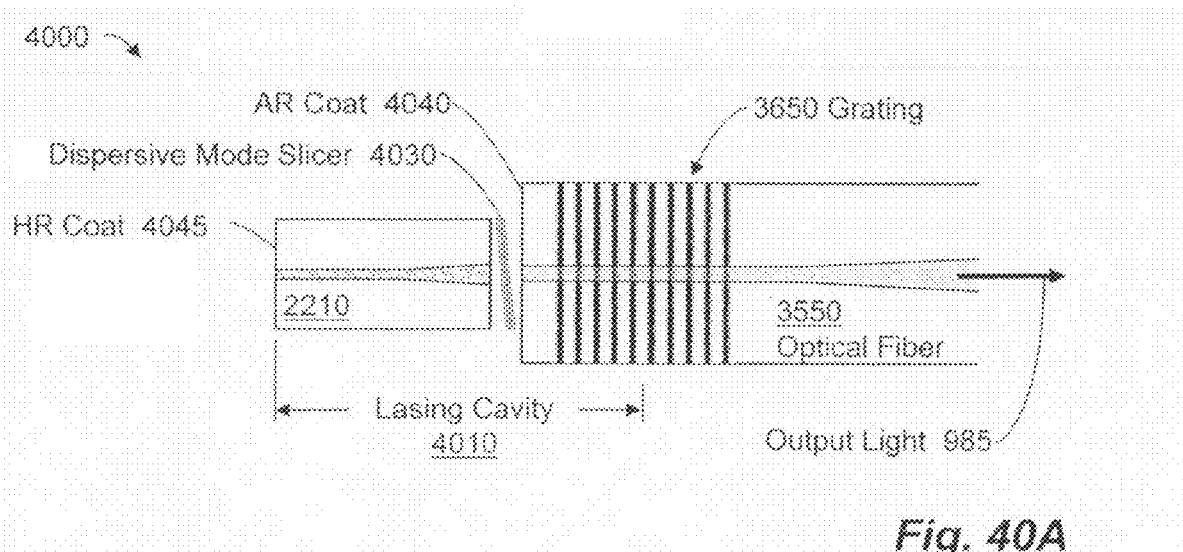
FIG. 40A illustrates a laser comprising a mode slicer in the lasing cavity in accordance with an exemplary embodiment of the present invention.
Figure 40B:
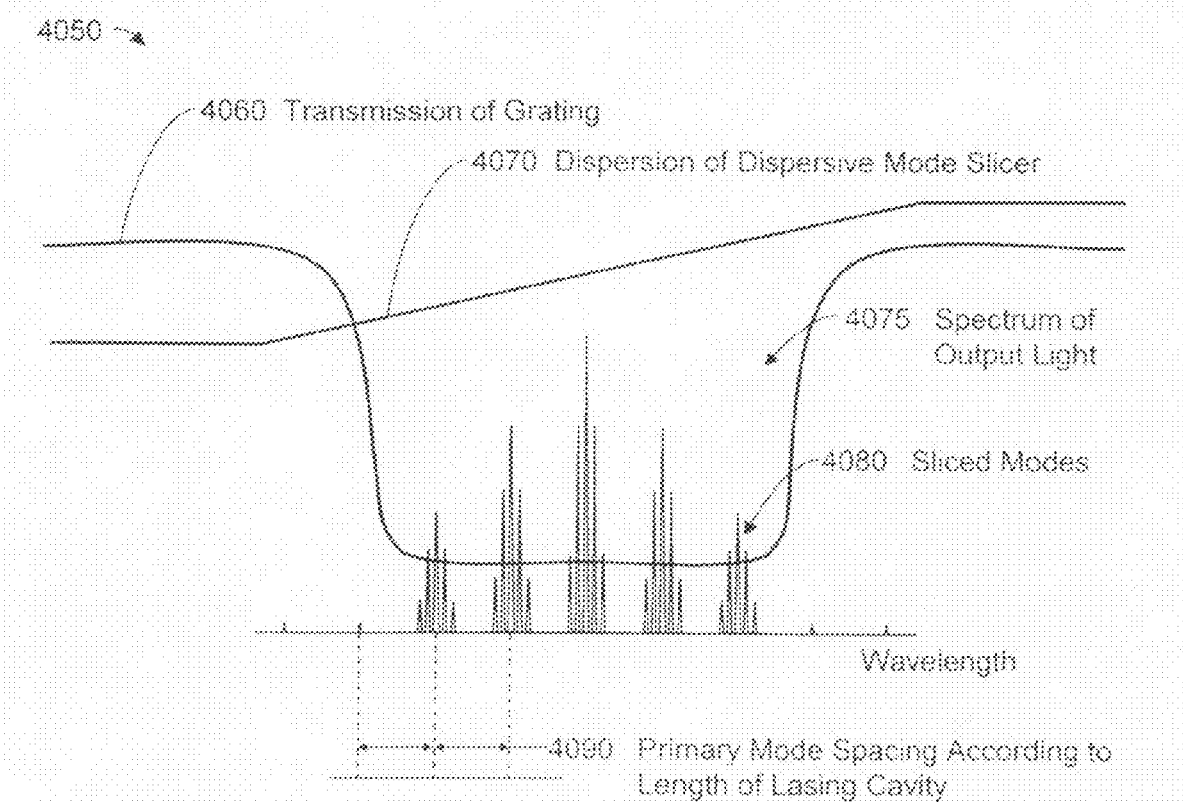
FIG. 40B illustrates a spectral plot of the optical output of a laser comprising a dispersive mode slicer in the lasing cavity overlaid with a plot of a grating's transmission and a plot of a dispersive mode slicer's dispersion in accordance with an exemplary embodiment of the present invention.

Turning now to FIGS. 40A and 40B, this FIG. 40A illustrates a laser system 4000 comprising a mode slicer 4030 in the lasing cavity 4010 in accordance with an exemplary embodiment of the present invention. FIG. 40B illustrates spectral plots 4075, 4080 of the optical output of the laser system 4000 overlaid with a transmission plot 4060 of a grating 3650 and a dispersion plot 4070 of the mode slicer 4030 in accordance with an exemplary embodiment of the present invention. In one exemplary embodiment of the present invention, the plot 4070 can represent or describe group delay of the mode slicer 4030.

The lasing cavity 4010 has a length that produces a plurality of primary modes 4075. The spectral distance or wavelength span 4090 between the primary modes 4075 correlates to the optical length of the lasing cavity 4010. That is, the roundtrip distance that light travels in each pass across the cavity 4010, as that light resonates in the cavity 4010, specifies or correlates with the frequency or wavelength spacing 4090 of the cavity's primary modes 4075.

Light resonates between the high reflective ("HR") coat 4045 that functions as the cavity's rear mirror and the grating 3650 that functions as the cavity's front mirror. The HR coat 4045 provides broadband reflectivity. The gain element 2210, which can be a semiconductor laser chip, provides light amplification. The grating 3650 has a spectral region of reflectivity that is broader than the spacing 4090 between the primary modes 4075. The abrupt dip in the transmission grating's transmission plot 4060, which may be referred to as a notch, represents the wavelengths or colors that the grating 3650 reflects. The grating 3650 exhibits high transmission outside of that spectral region and low transmission or high reflectivity within that region. Thus, the cavity 4010 supports resonance of a plurality of primary modes 4075 that appear in the output light 985 from the optical fiber 3550.

The mode slicer 4030 exhibits a controlled, defined, or specified dispersion profile 4070. In an exemplary embodiment, the mode slicer 4030 can comprise an optical device that provides controlled dispersion or group delay. Thus, the presence of the mode slicer can introduce into the cavity 4010 a wavelength dependent variation in the cavity length and/or a wavelength dependent variation in the speed of light resonating in the cavity.

The AR coating 4040 suppresses reflections from the fiber's facet that could interfere with the cavity's dynamical response. The dispersive mode slicer 4030 comprises a stack of thin film layers on a substrate. The stack can comprise a plurality of cavity mirrors. The stack can also comprise a multi-cavity interference device. The stack provides dispersion and group delay in response to optical interference of light passing through those layers. The stack is oriented at an angle with respect to the cavity's optical axis to avoid resonance of light that is inadvertently reflected from the outer surfaces of the stack and its substrate. In one exemplary embodiment, the dispersive mode slicer 4030 comprises a pass band filter, such as a three-, four-, or five-cavity interference filter, that has a wider pass band than the spectral width of the grating's reflective notch.

The mode slicer 4030 can produce controlled broadening of the cavity's primary modes 4075. The broadening can result from creating, splitting, or slicing each primary mode 4075 into finer modes 4080. Thus, the mode slicer 4030 can generate a plurality of sliced modes 4080 associated with each of the primary modes 4075. Splitting a primary mode 4075 into a plurality of finer modes 4080 can enhance the stability of the laser cavity 4010, for example refining the cavity's response to a randomly fluctuating condition, such as an unexpected temperature incursion or an introduction of stray light.

Figure 41A:
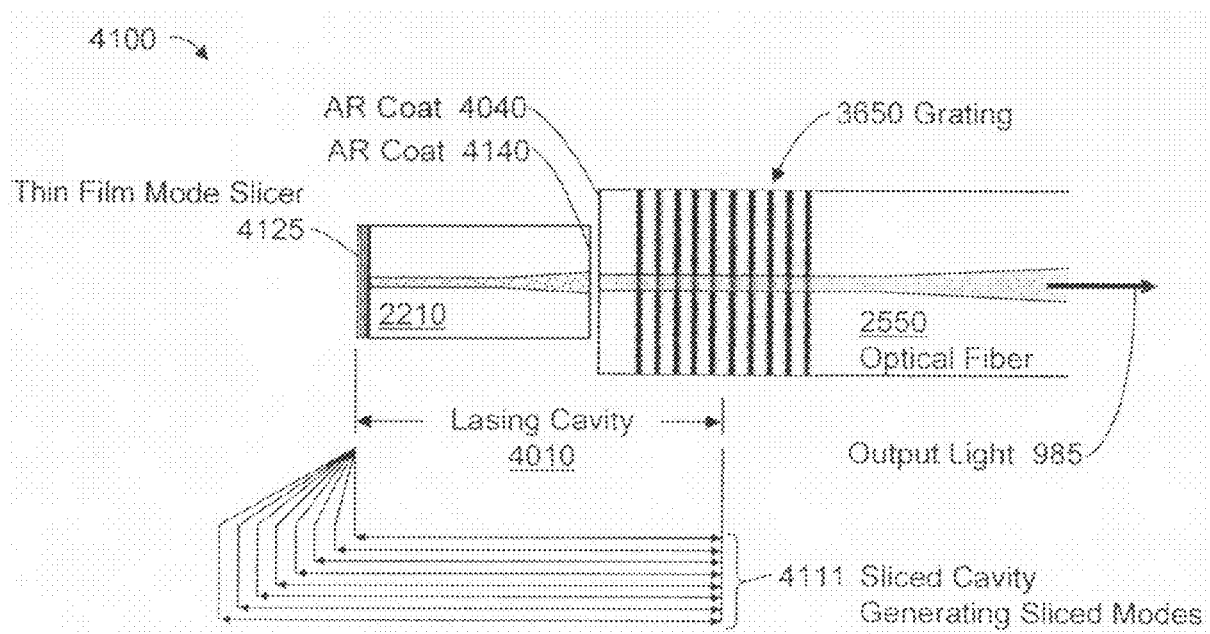
FIGS. 41A and 41B each illustrates a laser that comprises a mode slicer, based on thin film coatings, associated with the laser's lasing cavity in accordance with an exemplary embodiment of the present invention.
Figure 41B:
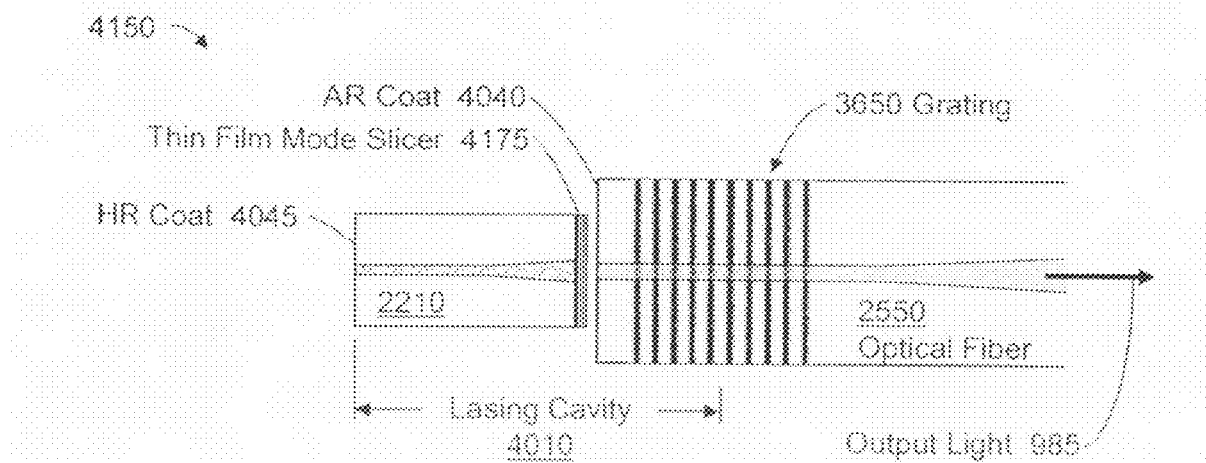

Turning now to FIGS. 41A and 41B, these figures each illustrates a laser system 4100, 4150 that comprises a mode slicer 4125, 4175, comprising thin film coatings, associated with the laser's lasing cavity 4010 in accordance with an exemplary embodiment of the present invention. In the laser system 4100, the cavity's rear reflector mirror 4125 comprises the mode slicer 4125. That mirror/mode slicer combination 4125 is based on thin film layers and provides an effective change in the optical length of the cavity 4010 as a function of wavelength.

As illustrated in FIG. 41A, over a small wavelength span in the vicinity of a primary cavity mode 4075 the cavity 4010 can exhibit optical length variations 4111 that are associated with and correspond to each of the fine modes 4080. Those length variations 4111 can be wavelength or frequency dependent. That is, each of the horizontal lines, designated with the identifier '4111,' can illustrate a length of the cavity 4010 for a specific wavelength associated with the fine modes 4080. Collectively, those lines 4111 can intuitively illustrate a subtle change in cavity length over a wavelength span associated with a primary cavity mode 4075.

The lasing cavity 4010 can have a primary length associated with the primary modes 4075 and a plurality of secondary lengths, intuitively represented by the eight horizontal lines illustrated in FIG. 41A, that give rise to the secondary or minor modes 4080. In this intuitive model, the lasing cavity 4010 comprises eight lasing cavities 4111, each having a slightly different length. Thus, the slicer 4125 can slice a primary cavity 4010 into a plurality of secondary cavities 4111.

The optical length differences among the secondary lasing cavities 4111 can correlate to the spacing between each peak in each of the sliced modes 4080. Each of the secondary lasing cavities 4111 has a length that is slightly offset from the primary cavity length. Thus, light resonating within the cavity 4010 can resonant between the grating 3650 and a plurality of reflective artifacts or features generated by or in a stack of thin films. Those artifacts can be displaced or separated from one another along the cavity's axis to provide a plurality of interacting lasing cavities. In other words, the slicer 4125 can comprise a stack of thin films that are cooperatively operative to reflect light from a plurality of locations offset from one another a minute distance, wherein reflection at each of the offset locations slices a primary mode 4075 into a plurality of modes 4080. That minute offset distance can be less than 100 nm, less than 25 nm, or less than 10 nm, or in a range in between, for example. The minute offset can also be less than the wavelength of the light 985 that the lasing device 4100 outputs or less than one-fourth of that wavelength, for example.

The AR coat 4040 and the AR coat 4140 help suppress facet reflections that, if left unsuppressed, could adversely impact the stability or dynamic response of the laser system 4100.

Referring to FIG. 41B, the mode slicer 4175 of the system 4150 comprises a stack of thin films disposed on the front facet of the lasing element 2210, which comprises a mode expander that increases optical coupling efficiency to the optical fiber 2550. The mode slicer 4175 provides a wavelength-dependent delay in the optical signals passing there through, and the fine modes 4080 result from that varied delay.

As discussed above with reference to other thin film devices, a variety of commercial software programs are available to support specifying thin film stack parameters that yield defined group delay and dispersion characteristics.

As an alternative to supporting stimulation of a plurality of primary longitudinal modes 4075, the lasing cavity 4010 can be relatively short so that a single primary longitudinal mode 4075 lases. In this exemplary situation, the gain profile of the gain element 2210 may have a spectral width that overlaps a single primary longitudinal mode 4075. The cavity's other primary longitudinal modes 4075 lie outside of the spectral region that provides sufficient light amplification to sustain lasing. The mode slicer 2210 can slice that primary longitudinal mode 4075 into a plurality of sliced modes 4080. Thus, a slicer 4125 can a divide a VCSEL's single-mode output into a plurality of modes as well as slicing an edge-emitting laser's modes.

In one exemplary embodiment, the grating 3650 can have a reflective notch width that spans less wavelength than the spacing between each of the primary cavity modes 4075. That is, the grating 3650 can provide a reflective profile that supports resonance and lasing of a single primary mode. Thus, the signal 6550 shown in FIG. 65 (discussed below) can illustrate the main feature of an exemplary embodiment of that unitary primary mode. The mode slicer 4125 can slice or divide that single mode into a plurality of fine modes. Thus, the output light 985 of the system 4100 can resemble a selected one of the sliced primary modes 4080 shown in FIG. 40B.

Figure 42:
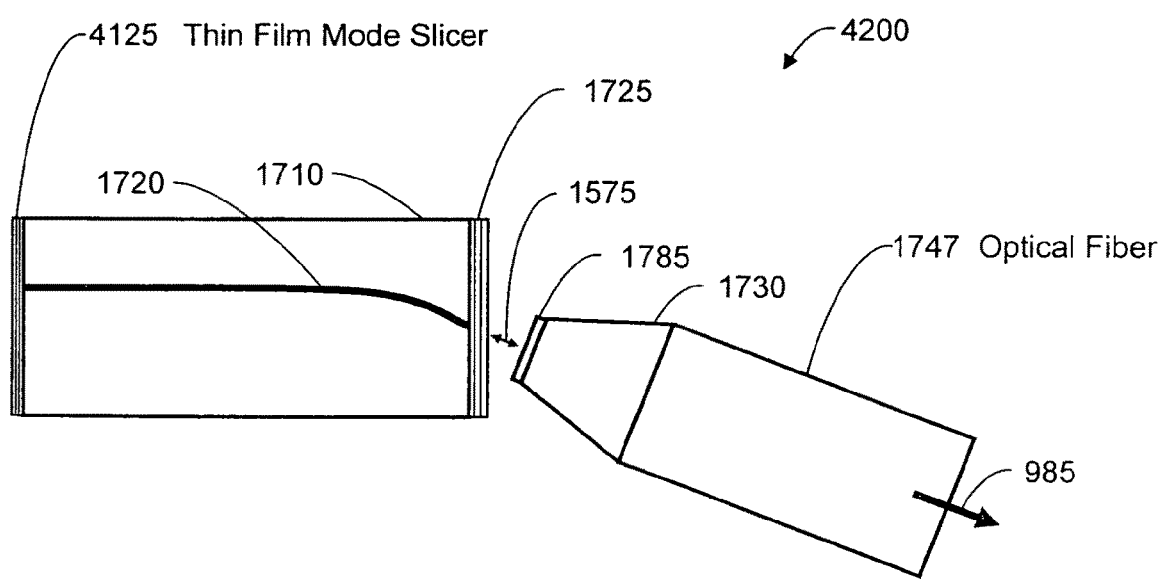
FIG. 42 illustrates a laser comprising a mode slicer coupled to its lasing cavity in accordance with an exemplary embodiment of the present invention.

Turning now to FIG. 42, this figure illustrates a laser system 4200 comprising a mode slicer 1725 coupled to its lasing cavity in accordance with an exemplary embodiment of the present invention. The mode slicer 4125, which can be an exemplary embodiment of a cavity stabilizer, is disposed on the rear facet of a curved cavity semiconductor gain chip 1710. The mode slicer 4125 can be fabricated by placing the gain chip 1710 in a deposition chamber that sputters the layers thereon.

The laser system 4200 comprises the laser system 1700 that FIG. 17B illustrates as discussed above. Adding the cavity stabilizer 4125 to that laser system 1700 can provide an enhanced level of stabilization. The lasing cavity of the laser system 4200 can respond to a random event, having a potential to perturb that cavity, by redistributing photonic energy among the fine or sliced modes 4080. That is, each of the fine modes 4080 may increase or decrease in intensity in response to a random event while the intensities of the primary modes 4075 remain relatively uniform.

The response of the fine modes 4080 to random events can also comprise shifts in wavelengths. That is, the comb of fine peaks that makes up each of the primary modes 4075 may shift in wavelength or color. In response to a random event, an individual fine mode can move from a position on the blue side of a primary mode 4075 where its intensity is suppressed, to a position of prominence within that primary mode, and on to a wavelength position on the red side of the same primary mode 4075 where its intensity is suppressed. During such a shift, the spectral position of a primary mode 4075 can remain relatively fixed.

Figure 43:
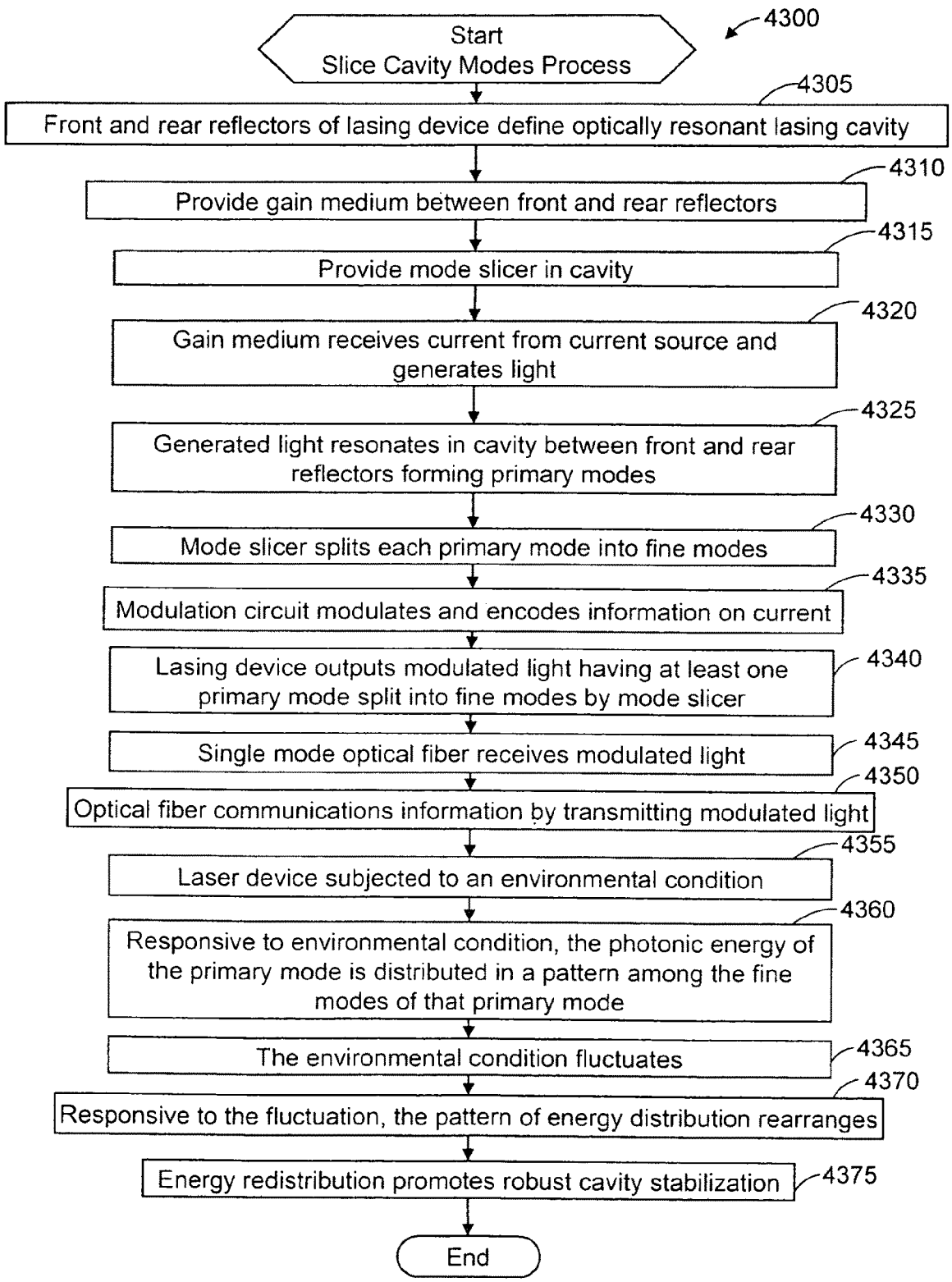
FIG. 43 is a flow chart illustrating a process for slicing cavity modes of a laser in accordance with an exemplary embodiment of the present invention.

Turning now to FIG. 43, this figure is a flow chart illustrating a process 4300 for slicing cavity modes 4075 of a laser 4000 in accordance with an exemplary embodiment of the present invention. Process 4300, which is entitled Slice Cavity Modes, will be discussed below with exemplary reference to FIGS. 40A and 40B. Breaking a large mode 4075 into a plurality of finer modes 4080 can support robust stabilization in certain situations.

At Step 4305, the first step of Process 4300, the front and rear reflectors 4045, 3650 of a laser device 4000 define the device's lasing cavity 4010. At Step 4310, a gain medium 2210 is provided between the mirrors 4045, 3650. The gain medium 2210 may be an optoelectronic semiconductor, an element derived from a Fabry Perot laser chip, an SOA, an optically pumped medium, a Raman amplifier, an SiOA, or a silicon-based device with a facility to control free or excess electrons in the gain region, to name a few examples.

At Step 4315, a dispersive element or a mode slicer 4030 is disposed within the cavity 4010. At Step 4320, the gain medium 2210 receives electrical or photonic energy that stimulates light emissions in that medium 2210. At Step 4325, those light emissions resonate between the mirrors 4045, 3650, setting up a standing light wave. The standing wave provides at least one energized primary mode 4075 with a wavelength separation between other primary modes 4075 that can be correlated to the length of the cavity 4010.

At Step 4330, which typically occurs essentially contemporaneously with Step 4325, the mode slicer 4030 disperses the primary mode 4075 into a cluster or organized group of finer modes 4080. At Step 4335, modulation circuitry 910 supplies the gain medium 2210 with modulated energy, typically electrical or optical pump power.

At Step 4340, the laser device 4000 outputs modulated light 985 comprising primary energy peaks 4075 spaced from one another in wavelength, wherein each primary peak 4075 comprises a cluster of secondary peaks 4080, typically exhibiting a comb pattern. At Step 4345, a single mode fiber 201 receives the modulated light 985 for transmission. At Step 4350, the modulated light 985 conveys information between two sites. The spectral structure of that light 985 is typically aligned to a DWDM grid 100 to provide DWDM optical communication.

At Step 4355, the laser device 4000 is subjected to an environmental condition, such as a level of stray light or a temperature. In association with or in response to that environmental condition, at Step 4360, the modulated light 985 exhibits an organized pattern 4075 of spectral intensities or peaks. The photonic energy of at least one of the primary energy peaks 4075 is distributed among its secondary peaks 4080.

At Step 4365, the environmental condition changes in an unforeseen manner. That is, the laser 4000 is subjected to a random perturbation or a fluctuating environmental condition, such as the stray light 925 or the externally generated heat 960. At Step 4370, the laser device 4000 responds to the changed environmental condition. The photonic energy of at least one of the primary energy peaks 4075 redistributes among its secondary peaks 4080 in response to the fluctuation event.

At Step 4375, the spectral redistribution of photonic energy enhances the laser's stability. The modulated light 985 remains aligned to the DWDM grid and DWDM optical communication continues. Process 4300 ends following Step 4375.

Figure 44:
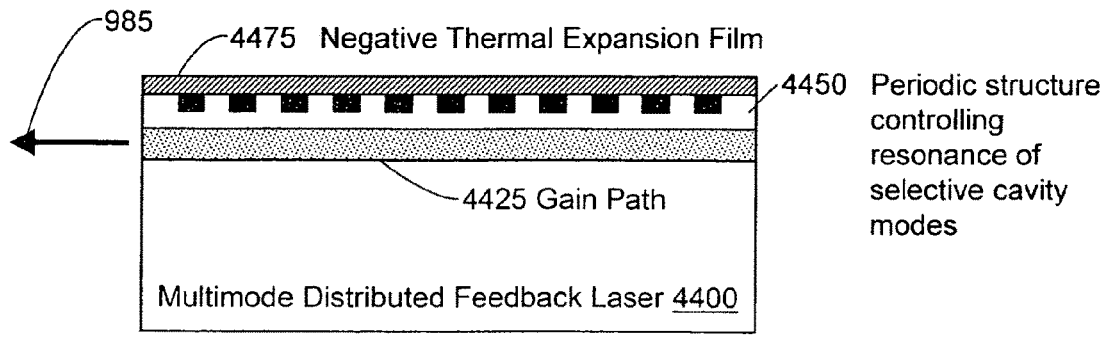
FIG. 44 illustrates a multimode distributed feed back laser in accordance with an exemplary embodiment of the present invention.

Turning now to FIG. 44, this figure illustrates a multimode DFB laser 4400 in accordance with an exemplary embodiment of the present invention. The laser 4400 comprises a gain path 4425 that emits light in response to electrical excitation.

A periodic structure 4450, that can comprise a Bragg grating, produces wavelength selective reflection and transmission. The periodic structure 4450 can comprise grooves or a corrugated pattern etched in material nearby the gain path 4435. In that configuration, the field or wave of the light propagating in the gain path 4425 interacts with the periodic structure 4450 and is reflected or attenuated. Alternatively, the periodic structure 4450 can comprise undulations of material or refractive index in the gain path 4425.

The periodic structure 4425 provides a laser cavity that supports resonance and lasing of a plurality of modes. That is, in contrast to conventional DFB lasers that usually operate in a single mode regime, the laser 4400 has a periodic structure 4425 that provides a sufficiently broad band or spectral reflectivity to cause lasing of a plurality of longitudinal modes. Thus, the output 985 of the laser 4400 can comprise a group of modes similar to the signal 101 illustrated in FIG. 1A and discussed above.

The negative thermal expansion film 4475 applies a compressive force to the periodic structure 4450 in response to an increase in temperature, associated, for example, with a random temperature event. That film 4475 tends to control the level of thermal expansion of the periodic structure 4450. Controlling the periodic structure's thermal expansion can help the laser's multimode output 985 remain aligned to a DWDM grid coordinate 151 while the laser 4400 is subjected to temperature fluctuations. Thus, in one exemplary embodiment, the robustly stabilized multimode laser 950, shown in FIG. 9, can comprise the laser 4400. That is, the laser 4400 can be an exemplary embodiment of a robustly stabilized multimode laser.

Figure 45:
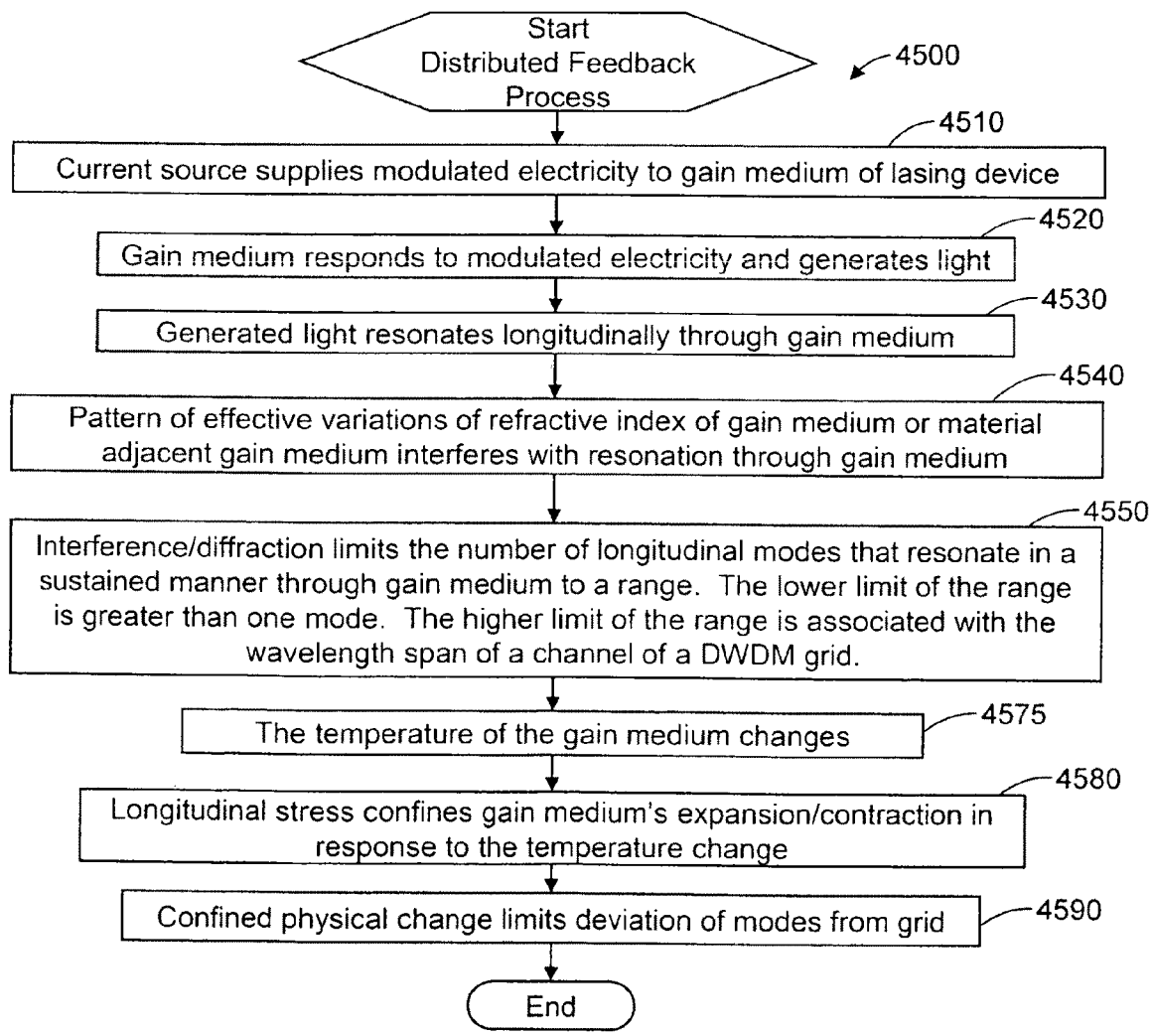
FIG. 45 is a flow chart illustrating a process for generating multimode light with a laser using distributed feedback in accordance with an exemplary embodiment of the present invention.

Turning now to FIG. 45, this figure is a flow chart illustrating a process 4500, entitled Distributed Feedback, for generating multimode light 101 with a laser 4400 using distributed feedback in accordance with an exemplary embodiment of the present invention. Process 4500 will be discussed with exemplary reference to FIG. 44.

At Step 4510, the first step in Process 4500, a current source 910 supplies modulated electricity to the gain path 4425 of the multimode DFB laser 4400. At Step 4520, the gain path 4425 produces light in response to the electricity. That light resonates longitudinally in the gain path 4425 at Step 4530, as a lasing cavity.

At Step 4540, a pattern 4450 of variations in the effective refractive index of the gain path 4425 interferes with the resonation. Via this effect, which can be associated with optical interference or optical diffraction, a standing wave comprising a plurality of modes forms in the gain path 4425. That is, the periodic structure 4425 limits the number of resonant modes in the lasing cavity of the DFB laser 4400 to a number associated with a spectral range 181 and that number can be greater than one. Thus, the output 985 is spectrally aligned to a DWDM channel 151 or grid coordinate 151 and comprises a plurality of longitudinal modes.

At Step 4575, the temperature of the gain path 4425 changes in association with a random event. At Step 4580, the film 4475 exerts longitudinal stress on the periodic structure 4450 in response to the temperate change. That longitudinal stress counters the periodic structure's inherent propensity to expand or contract in the opposite direction. Thus, the film's temperature response opposes the periodic structure's temperature response and the periodic structure's longitudinal physical dimensions remain relatively stable or invariant to changes in temperature. That is, the length of the periodic structure 4450 changes minimally or in a controlled manner in response to a change in temperature.

At Step 4590, the physical confinement or opposing stresses that the film 4475 applies to the periodic structure 4450 limits the signal 985 from shifting off of a DWDM coordinate 151 or out of a DWDM channel 151. Process 4500 ends following Step 4590.

Figure 46:
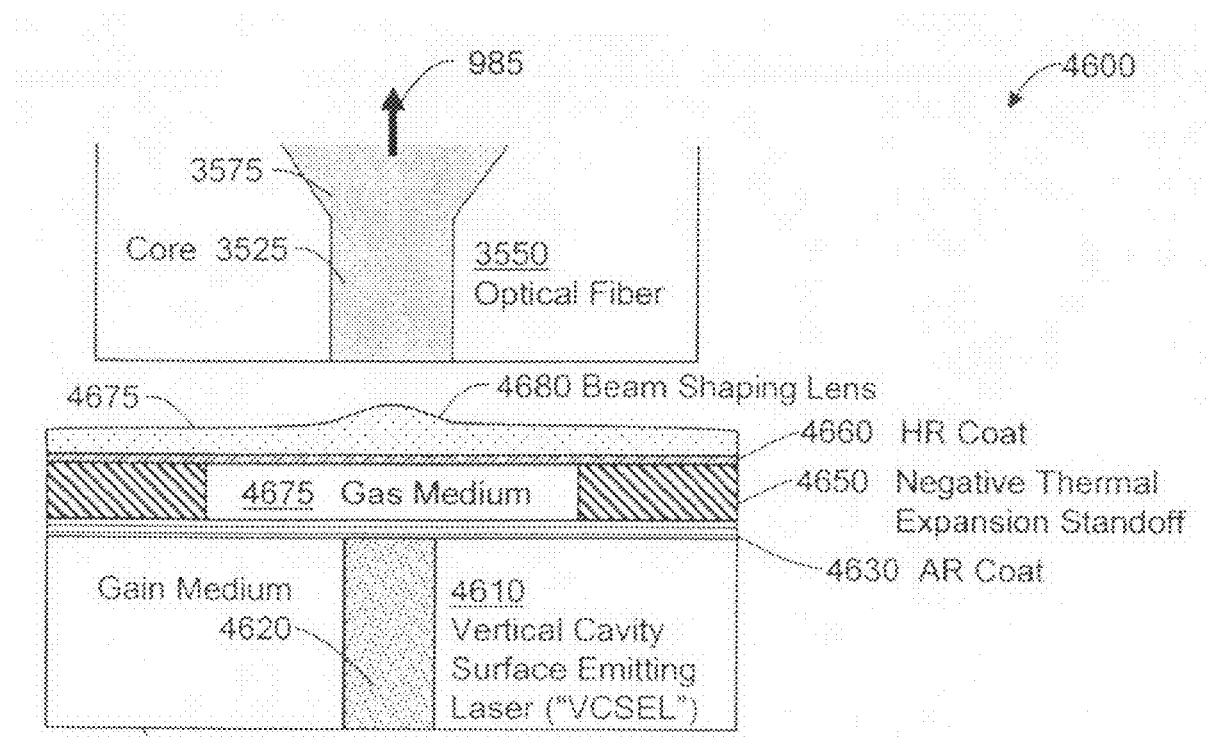
FIG. 46 illustrates a vertical cavity surface emitting laser ("VCSEL") stabilized to generate an output aligned to a channel of a wavelength division multiplexing grid during temperature fluctuation in accordance with an exemplary embodiment of the present invention.

Turning now to FIG. 46, this figure illustrates a VCSEL system 4600 comprising a VCSEL element 4610 stabilized to generate an output 985 aligned to a channel 151 of a wavelength division multiplexing grid 100 during temperature fluctuation in accordance with an exemplary embodiment of the present invention.

The VCSEL 4610 comprises a gain medium 4620 that generates light. The front face of the VCSEL 4610 comprises an AR coat 4630 that suppresses that face from reflecting light, thereby preventing the face from functioning as a cavity mirror. Negative thermal expansion material 4650 that may comprise a glass composition or a ceramic is disposed on and attached to the AR coat 4630. The negative thermal expansion material 4650 has a geometry or shape that resembles a washer, a doughnut, or a short tube. A gaseous medium 4675 typically exists in the internal area of the washer-shaped standoff 4650.

A beam shaping lens 4680 has a planar surface that faces the VCSEL element 4610 and an opposing contoured surface 4675. A HR coat 4660 has been applied to that planar surface. The rear face 4691 of the VCSEL element 4610 provides a rear cavity mirror. The HR coat 4660 provides a front cavity mirror. Thus, the back face 4691 and the HR-coated surface provide a lasing cavity.

The gain medium 4620 expands in response to an increase in temperature. The standoff 4650 contracts in response to the temperature increase. That expansion and contraction offset or cancel one another. Thus, the optical distance between the HR coat 4660 and the back face 4691 changes little in response to temperature fluctuations. A small change in physical distance can be used to offset or cancel temperature-based changes in the refractive index of the gas 4675 and the gain medium 4620.

The VCSEL system 4600 can provide a single mode output that remains aligned to a DWDM grid coordinate 191 while temperature of the system 4600 fluctuates. The optical fiber 3550 comprises a core 3525 that is mode matched to the output of the beam shaping lens 4680. The fiber's integral taper 3575 adapts the mode field of the output 985 for compatibility with another fiber (not shown in FIG. 46) joined thereto.

Accordingly, a temperature insensitive laser system 4600 can comprise a gain medium 4620, providing a spectral region of light gain or amplification, and a cavity of appropriate length to provide exactly one resonant longitudinal mode in that spectral gain region. In one exemplary embodiment, the laser system 4600 comprises a slicing device 4125, 4030, 4175 (not shown in FIG. 46) which splits that one mode into a plurality of sliced modes within the spectral gain region.

Figure 47:
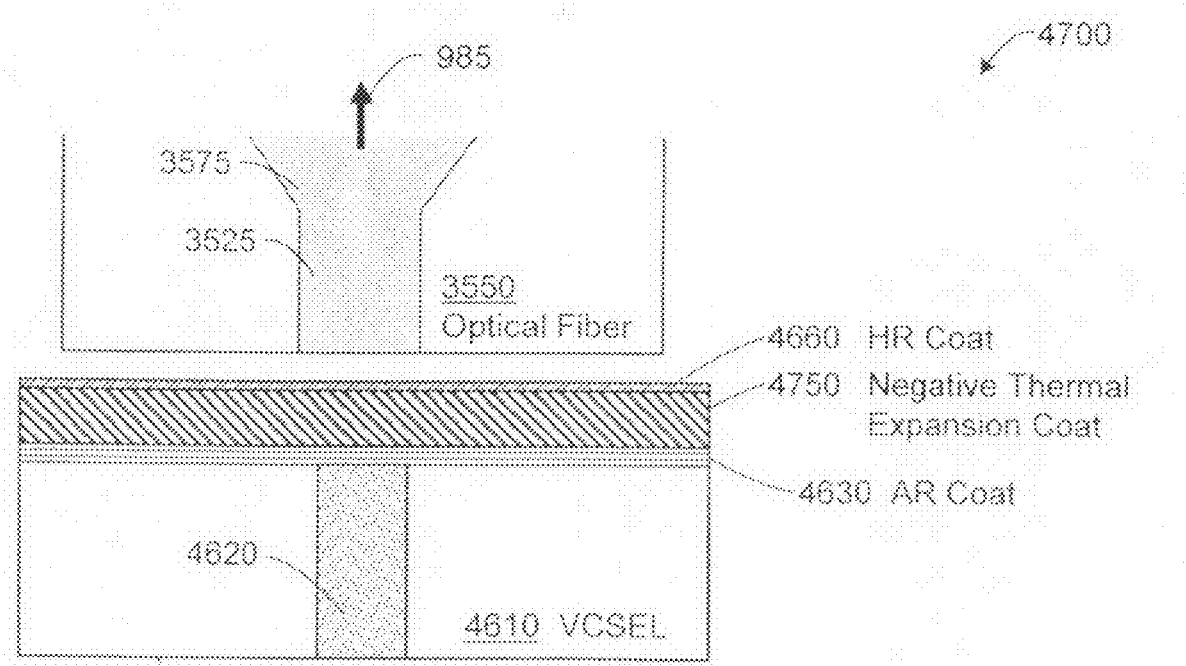
FIG. 47 illustrates a VCSEL for generating a wavelength stabilized output in accordance with an exemplary embodiment of the present invention.

Turning now to FIG. 47, this figure illustrates a VCSEL system 4600 for generating a wavelength stabilized output 985 in accordance with an exemplary embodiment of the present invention. The VCSEL laser system 4700 can function in a manner that is similar the VCSEL laser system 4600 illustrated in FIG. 46 and discussed above.

The surface 4691 comprises the rear mirror of the system's lasing cavity. The gain medium 4620 is disposed in the lasing cavity, which extends through the negative thermal expansion coating 4750 to the HR coat 4660. The FIR coat 4600, which can be a thin film applied in a deposition chamber, comprises the front mirror of the lasing cavity. In one exemplary embodiment, the coat 4650 comprises a waveguide core (not shown in FIG. 47) that is situated to guide light between the gain medium 4620 and the HR coat 4660.

The dimensional and optical response of the negative thermal expansion coat 4750 to temperature fluctuations offsets, cancels, or compensates for the dimensional and optical response of the gain medium 4620 to those fluctuations. Thus, the system 4700 can output a single mode signal that remains aligned to a DWDM grid channel 151 despite a random temperature event or a fluctuating temperature condition.

Figure 48:
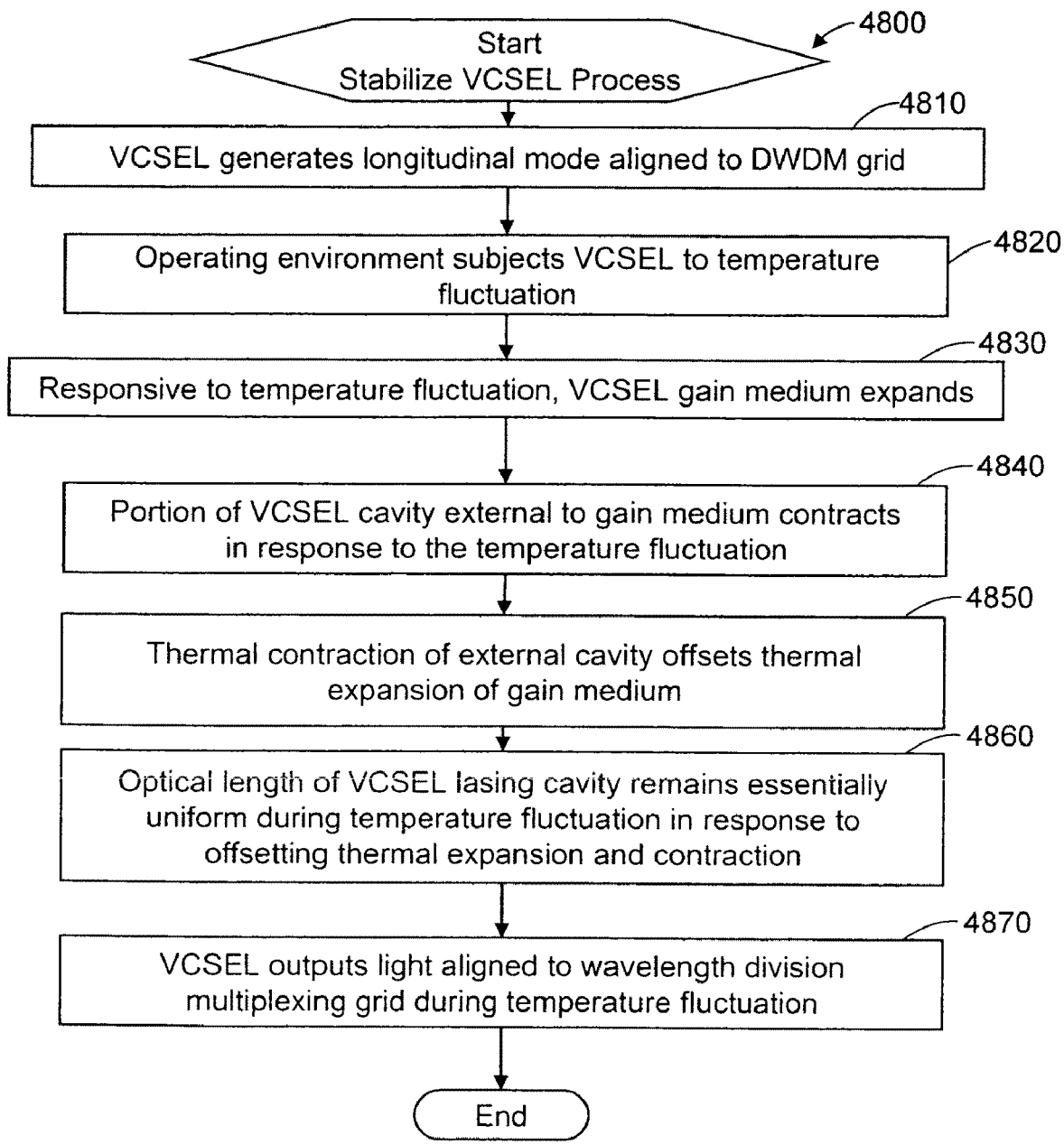
FIG. 48 is a flow chart illustrating a process for stabilizing a VCSEL in accordance with an exemplary embodiment of the present invention.

Turning now to FIG. 48, this figure is a flow chart illustrating a process 4800, entitled Stabilize VCSEL, for stabilizing a VCSEL 4610 in accordance with an exemplary embodiment of the present invention. Process 4800 will be discussed with exemplary reference to FIG. 46, which is discussed above.

At Step 4810, the VCSEL system 4600 generates an optical signal comprising a unitary longitudinal mode aligned to a DWDM grid coordinate 191. The signal 6550 shown in FIG. 65 (discussed below) can illustrate the prominent feature of an exemplary embodiment of that unitary mode.

At Step 4820, a change in the VCSEL system's operating environment subjects the system 4600 to a temperature fluctuation. At Step 4830, the VCSEL gain medium 4620 expands in response to the temperature fluctuation. At Step 4840, a portion of the VCSEL system's lasing cavity that is external to the gain medium 4620 contracts in response to the temperature fluctuation. At Step 4850, the contraction offsets the expansion. In response to the contraction offsetting the expansion, at Step 4860, the optical length of the lasing cavity undergoes little, no, or insignificant net change due to the temperature fluctuation.

At Step 4870, the VCSEL system 4600 outputs light suited for DWDM-based optical communication during and following the temperature fluctuation. Process 4800 ends following Step 4870.

Figure 49:
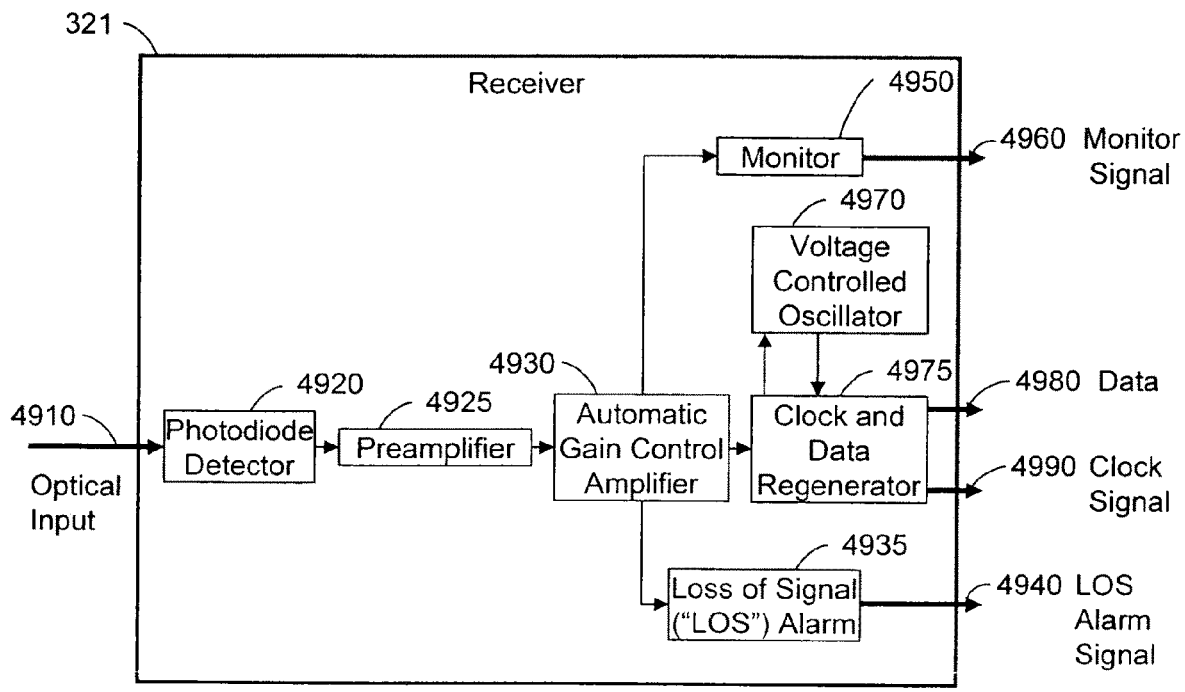
FIG. 49 is a functional block diagram illustrating an optical receiver in accordance with an exemplary embodiment of the present invention.

Turning now to FIG. 49, this figure is a functional block diagram illustrating an optical receiver 321 in accordance with an exemplary embodiment of the present invention. The receiver 321 receives an optical signal 4910, which may or may not be a DWDM signal.

The photodetector or photodiode detector 4829 receives the light signal 4910 and outputs a corresponding electrical signal. The preamplifier 4925 applies a first stage of gain to the electrical signal from the detector 4920 or processes that signal in preparation for amplification by the automatic gain control amplifier 4930.

The amplifier 4930 provides an adjustable level of gain to the electrical signal from the preamplifier 4925. The amplifier 4930 communicates with the monitor 4950 to provide a monitor signal 4960 that can provide an indication of the intensity of the optical input 4910. Loss of signal circuitry 4935 outputs an alarm 4940 upon a failure condition such as a cut in fiber that feeds the detector 4920.

A voltage controlled oscillator 4970 works with clock and data regenerator circuitry 4975 to provide a data signal 4980 and a clock signal 4990. An exemplary embodiment of the receiver system 321 can provide reshaping and/or retiming in preparation for signal regeneration by modulating a robustly stabilized multimode laser 950 based on the data signal 4980.

The receiver 321 shown in FIG. 49 can be an exemplary embodiment of the receiver 321 of the system 300 illustrated in FIG. 3 and discussed above.

Figure 50:
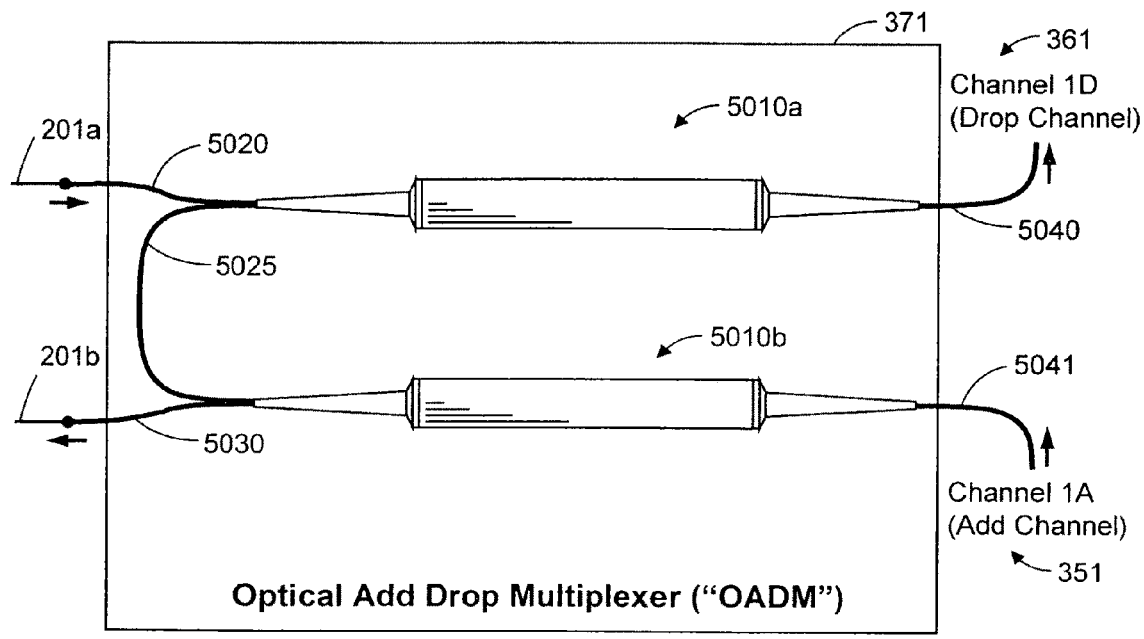
FIG. 50 illustrates an optical add drop multiplexer ("OADM") in accordance with an exemplary embodiment of the present invention.

Turning now to FIG. 50, this figure illustrates an OADM 371 in accordance with an exemplary embodiment of the present invention. The OADM 371 of FIG. 50 can be an exemplary embodiment of the OADM 371 of the system 300 illustrated in FIG. 3 and discussed above. The OADM 371 can be a commercially available component that drops signals aligned to a drop channel 361 and inserts signals aligned to an add channel 351, wherein the add channel 351 and the drop channel 361 are typically aligned to a common DWDM coordinate 191.

The OADM 371 couples to a first transmission fiber 201a that delivers DWDM optical signals to the OADM 371 via an ingress fiber 5020. The OADM 371 processes those incoming DWDM signals and launches distinct DWDM optical signals onto another transmission optical fiber 201b via an egress fiber 5030.

The ingress fiber 5020 transmits the incoming DWDM signals to a first filter assembly 5010a that transmits or passes the drop channel signals. The drop fiber 5040 transmits the drop channel signals to a receiving device (not shown in FIG. 50) such as the receiver 321. The first filter assembly 5010a rejects or reflects the incoming DWDM signals that are outside of the drop channel 361. The fiber 5025 carries those reflected DWDM signals to the second filter assembly 5010b.

The second filter assembly 5010b reflects the signals that the fiber 5025 carries, thereby diverting those signals to the egress fiber 5030. The second filter assembly 5010b also transmits or passes optical signals from a source (not shown on FIG. 50) that is coupled to the add fiber 5041. Those add signals are aligned to the add channel 351 and pass through to the egress fiber 5030 where they propagate alongside the out-of-band signals that the filter assembly 5010a reflected. The fiber 5030 carries the add-channel signals and the signals that were not dropped to the transmission fiber 201b.

Figure 51:
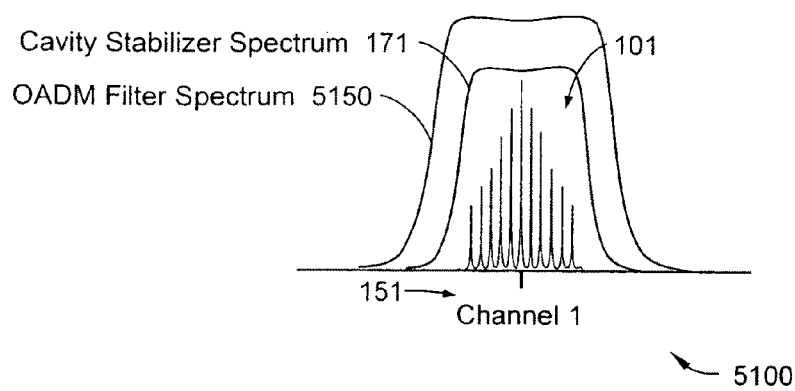
FIG. 51 illustrates overlaid spectral plots of a robustly stabilized laser's output, an OADM filter, and a cavity stabilizer in accordance with an exemplary embodiment of the present invention.
Figure 52A:
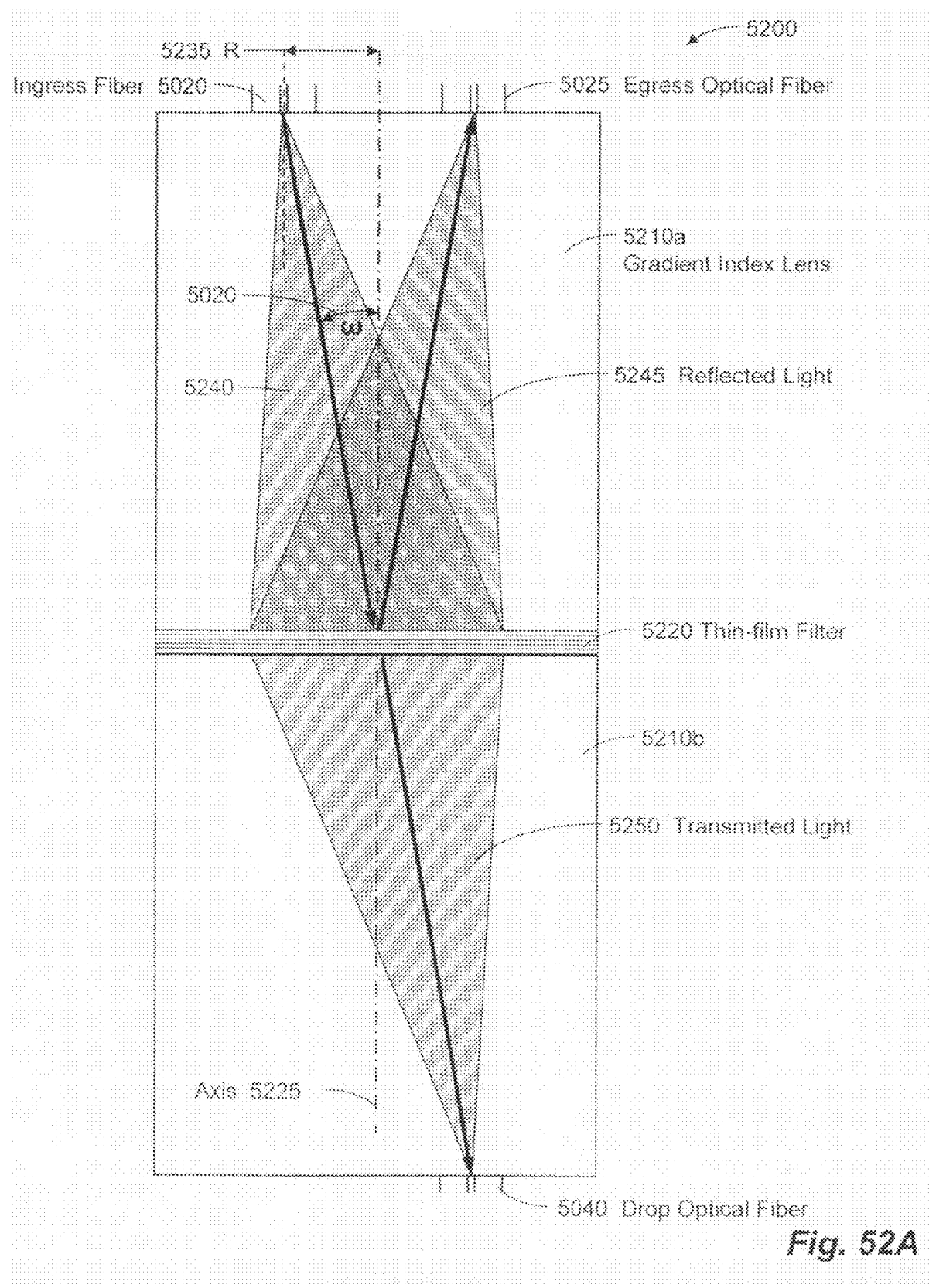
FIG. 52A illustrates an OADM filter assembly that comprises three optical fibers and an optical thin film filter disposed between two gradient index lenses in accordance with an exemplary embodiment of the present invention.

Turning now to FIG. 51, this figure illustrates, in an overlaid arrangement, a spectral plot 101 of a robustly stabilized laser's output 985, a spectral plot 5150 of an OADM filter 5010a, and a spectral plot 171 of a cavity stabilizer 1525 in accordance with an exemplary embodiment of the present invention. The cavity stabilizer 1525 confines the modes 101 to a spectral region 181, shown in FIG. 1B, that is narrower than the pass band of the OADM filter 5010a. This arrangement provides an error margin or tolerance that helps keep adjacent channels 151, 152, 153 from interfering with one another. Thus, the OADM 371 of FIG. 50 transmits multimode channel signals that are added and dropped and reflects the other multimode DWDM signals.

Turning now to FIGS. 52A, 52B, 52C, and 52D, FIG. 52A illustrates an OADM filter assembly 5200 that comprises three optical fibers 5020, 5025, 5040 and an optical thin film filter 5220 disposed between two gradient index lenses 5210 in accordance with an exemplary embodiment of the present invention. The assembly 5200 exemplifies internal components of the OADM filter assembly 5010a, 5010b and will be discussed as such.

The lens 5210a collimates incoming light on the ingress fiber 5020 and projects the light 5240 onto the filter 5220. The filter 5220 transmits the drop channel 361 and reflects the channels that are not dropped. The lens 5210b concentrates the transmitted light 5250 (aligned to the drop channel 361) into the drop fiber 5040. The lens 5210a concentrates the reflected light 5245 (outside the drop channel 361) into the egress optical fiber 5025.

The ingress fiber 5020 and the egress optical fiber 5025 are disposed an equidistance R 5235 from the assembly's optical axis 5225. That is, the fibers 5020, 5025 are situated in diametrically opposed positions about the optical axis 5225. The optical axis of the incoming beam 5240 forms an angle ω (omega) 5020 with the optical axis 5225 of the assembly 5200. The angle omega 5020 correlates with the distance R 5235. Thus, increasing R 5235, by moving the fibers 5020, 5025 radially outward away from the axis 5225, increases the angle omega 5020.

The pass band of the OADM filter's spectrum 5150 shifts in wavelength in response to changes in angle of incidence or the angle omega 5020. That is, changing the separation between the fibers 5020, 5025, while maintaining their relative alignment to the axis 5225, changes the angle of incidence of the light 5240 on the filter 5220 thereby producing a corresponding shift in the spectral characteristics 5150 of the OADM filter system 5200.

Thus, the distance R 5235 can be adjusted to move the pass band of an out-of-specification filter 5220 into compliance with a performance specification. In other words, a filter 5200 that would otherwise be misaligned to a DWDM grid channel 151 can be incorporated in the system 5200, and the distance (2R) between the ingress fiber 5020 and the egress fiber 5025 can be set or defined to compensate for the filter's spectral misalignment.

FIG. 52B illustrates a pair of optical fibers 5020, 5025 situated for establishing a defined separation 5235 between each of the optical fibers 5020, 5025 in accordance with an exemplary embodiment of the present invention. The system 5255 can be used in connection with making the OADM optical assembly 5200.

The fibers 5020, 5025 are held together at one end with a dab 5270 of epoxy 5270. That epoxy 5270 does not necessarily hold the fibers 5020, 5025 to any other structure, rather it constrains the fiber 5020, 5025 to one another during fabrication.

The fibers 5020, 5025 are twisted 5265 at the end of the assembly 5255 that is opposite the epoxy constraint 5270. Twisting the fibers 5020, 5025 urges them together, in a manner similar to the strands a sisal rope. Each of the fibers 5020, 5025 is twisted 5265 about its longitudinal axis at that opposite end. In one exemplary embodiment, the twist 5265 can be implemented manually, for example by rolling each fiber 5020, 5025 between an operator's thumb and index finger. Alternatively, a machine can turn each fiber end (separately) about that fiber's longitudinal axis.

The twisting force that causes the fibers 5020 to embrace one another can be maintained with a clip (not shown) or another restraint. After providing and maintaining the twist 5265, a second epoxy dab 5261 is applied. A member or spacer 5260 is inserted between the fibers 5020 in the area of the second epoxy dap 5261. The spacer 5260 can have a bevel or point that provides a lead-in to facilitate the insertion. The spacer 5260 typically comprises glass or ceramic that exhibits stable thermal properties. The compression force associated with the twist 5265 holds or constrains the spacer 5260 in position between the fibers 5020, 5025. The spacer provides a defined separation (two times R 5235) that can be used to establish the angle of incidence (e.g. omega 5020) of light onto the filter 5220, thereby shifting the filter's pass band.

A batch of filters 5220 can be tested to determine the spectral position (wavelength) of each filter's pass band. The value of the dimension R 5235 can be determined empirically, via well-known optical equations, or with commercially available optical design or modeling software. A spacer 5250 that provides the appropriate separation based on its thickness can be selected from a bin. That is, a fabricator can maintain bins of spacers 5250 organized according to size, and a specific size can be selected that will provide the separation needed to achieve a pass band shift that will align the OADM's pass band to a coordinate 191 of the DWDM grid 100.

After inserting the spacer 5260 between the fibers 5020, 5025, an application of heat or UV light and/or a passage of time cures the epoxy 5260. The assembly 5255 is cut through the spacer 5260, typically with a saw, and polished on the resulting end face. That is, a saw cuts through the matrix that comprises the fibers 5020, 5025, the epoxy 5261, and the spacer 5260.

The fibers 5020, 5025 are cleaved or cut between the epoxy constraint 5270 and the epoxy 5261. That cleave relieves the twisting stress of the fibers 5020, 5025 in the section that is not epoxied and provides pigtail ends for connectorization.

Referring now to FIG. 52C, this figure illustrates an end-on view of the pair of optical fibers 5020, 5035 having a defined separation (2R) between each of the optical fibers 5020, 5035 in accordance with an exemplary embodiment of the present invention. The assembly 5257 results from the cut-and-polish operation discussed above with reference to FIG. 52B. Thus, the assembly 5257 comprises two fibers 5020, 5025 having a precise separation.

If the spacer 5260 is eliminated or not used, the fibers 5020, 5025 are essentially in contact with one another or have essentially no separation.

The end of the assembly 5257 illustrated in the view of FIG. 52C is butted to the gradient index lens 5210a in alignment with the optical axis 5225. That alignment can be a passive alignment or an active alignment, i.e. with or without using optical signals transmitted there through as feedback for positioning.

Referring now to FIG. 52D, this figure is a flow chart illustrating a process 5275, entitled Position Fibers, for fabricating an assembly 5257 that comprises two optical fibers 5020, 5025 with a defined separation (2 times R 5235) or with essentially no separation in accordance with an exemplary embodiment of the present invention.

At Step 5277, the first step in Process 5275, a machine or a human places the two fibers 5020, 5025 in a side-by-side arrangement. A dispensing system applies the epoxy 5270 to one end of the pair 5020, 5025. The epoxy 5270 cures. At Step 5280, the epoxy 5270 binds the ends of the fibers 5020, 5025 together, but allows the pair of fibers 5020, 5025 to move as a unit.

At Step 5282, an operator or a machine twists 5025 the unconstrained end of each of the fibers 5020, 5025 in the same rotational direction, for example clockwise. In response to the twisting action 5265, at Step 5285, the epoxied end 5270 of the fiber pair 5020, 5025 rotates or spins, and the twisting 5265 causes the fibers 5020, 5025 to form a tightly compact bundle. That is, the twisting 5265 produces force between the fibers 5020, 5025 that brings them into tight contact with one another.

At Step 5287, an operator or machine applies the epoxy 5261 to a section of the fiber pair 5020, 5025 and inserts the spacer 5260, which can be viewed as a shim, insert, or a member, between the fibers 5020, 5025 at that section. At Step 5290, a fixture or machine holds the assembly 5255 taunt while the epoxy 5261 cures.

At Step 5292, an operator or a machine cuts the assembly at the inserted spacer 5260 and polishes the resulting end face. Thus, the cut produces two fiber-pair assemblies that each has a controlled spacing at one end. At Step 5292, either or both resulting fiber-pair assemblies are incorporated into an optical device, such as the OADM 5010a, 5010b. Process 5275 ends following Step 5295.

Figure 53:
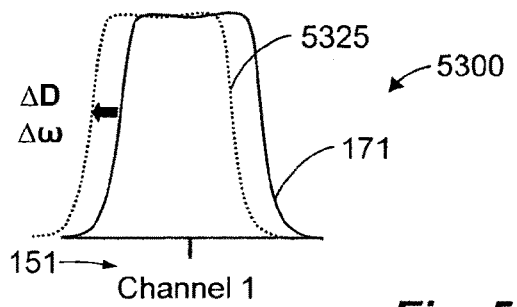
FIG. 53 illustrates a spectral plot of an OADM filter system with a spectral characteristic that shifts in wavelength based on adjusting the positions of optical fibers in the system in accordance with an exemplary embodiment of the present invention.

Turning now to FIG. 53, this figure illustrates a spectral plot 5300 of an OADM filter system 5200 with a spectral characteristic 5235 that shifts in wavelength based on adjusting the positions of optical fibers 5020, 5025 in the system 5200 in accordance with an exemplary embodiment of the present invention. The spectral plot 5300 illustrates how the separated fibers 5020, 5025 of the assembly 5257, when butted to the gradient index lens 5210a, provide a filter pass band 5235 that is shifted relative to butting the pair of fibers 5020, 5025 to that lens 5210a without the spacer 5260 (and the fibers 5020, 5025 are in contact with one another).

Figure 54:
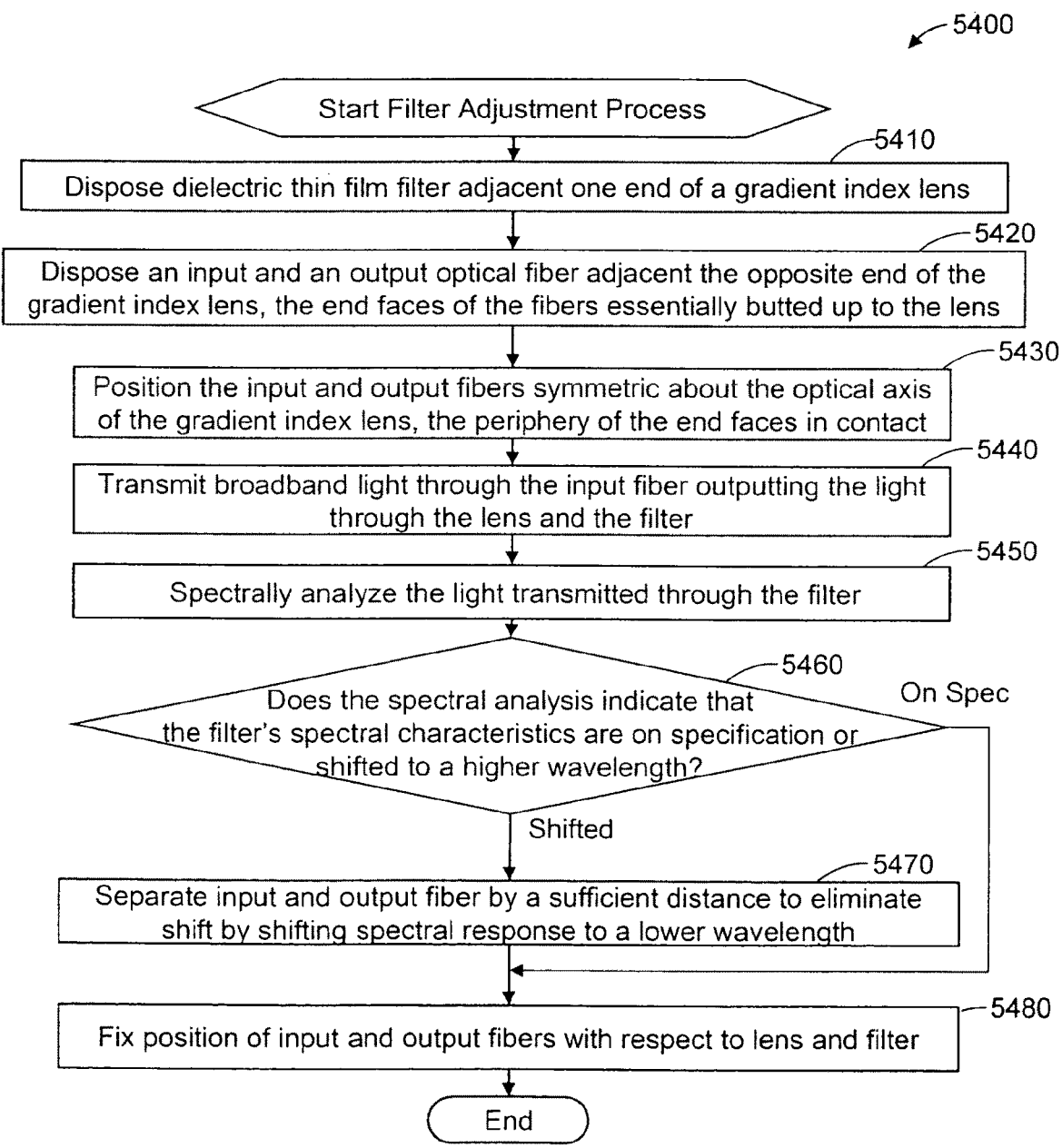
FIG. 54 is a flow chart illustrating a process for adjusting a spectral characteristic of an assembly that comprises a thin film filter, a lens, and an optical fiber in accordance with an exemplary embodiment of the present invention.

Turning now to FIG. 54, this figure is a flow chart illustrating a process 5400 for adjusting a spectral characteristic of an assembly 5200 that comprises a thin film filter 5220, a lens 5210a, 5210b, and an optical fiber 5020, 5025, 5040 in accordance with an exemplary embodiment of the present invention. The Process 5400, which is entitled Filter Adjustment, will be described with exemplary reference to FIGS. 50-53.

At Step 5410, which is the first Step in Process 5400, an automated assembly system places the filter 5220 against one end of the gradient index lens 5210a. At Step 5420, the fibers 5020, 5025 are butted up to the end of the lens 5210a that is opposite the filter 5220.

At Step 5430, the assembly system adjusts the positions of the fibers 5020, 5025 so they are situated symmetrically about the lens's optical axis 5225. The fibers 5020, 5025 are parallel to and in contact with one another. The optical axis 5225 is at the peripheral or contacting interface between those fibers 5020, 5025.

At Step 5440, a light source transmits broadband; multicolored, or 'white' light through the fiber 5020. The lens 5210a delivers the resulting beam 5240 to the filter 5220. At Step 5450, a spectrometer or other instrument analyzes the spectral content of the light that transmits through the filter 5220, thereby characterizing the pass band of the filter.

At Step 5460 software logic or a human determines whether the analysis indicates that the pass band 5325 is within specification or is shifted in wavelength. If the pass band 5325 is properly aligned to the OADM add/drop channel 351, 361, Step 5480 follows Step 5460.

At Step 5480, the assembly system attaches the fibers 5020, 5025 to the lens 5210a in their current positions. Process 5400 ends following Step 5480.

If at Step 5460 a determination is made that the pass band 5325 is shifted with respect to the OADM add/drop channel 351, 361, then Step 5470 follows Step 5460. At Step 5470, the fibers 5020, 5025 are separated from one another a sufficient distance to move the pass band 5325 into alignment with the OADM add/drop channel 351, 361. Process 5275, illustrated in FIG. 52D and discussed above, can be executed to provide the desired separation. That is, Process 5275 can provide an exemplary embodiment of Step 5470 of Process 5400. Step 5480 follows Step 5470.

Figure 55:
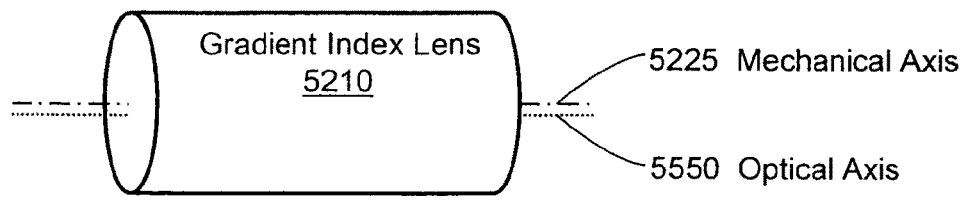
FIG. 55 illustrates a gradient index lens having a mechanical axis displaced from its optical axis.

Turning now to FIG. 55, this figure illustrates a gradient index lens 5210 having a mechanical axis 5225 displaced from its optical axis 5550. The axis displacement can result from process variation or tolerance associated with a diffusion process that provides the index gradient within the lens 5210, for example. To facilitate aligning the lens 5210 to another optical or mechanical or opto-mechanical device, it is often preferable to have the optical axis 5550 aligned to the mechanical axis 5225. For example, such alignment can support passive alignment or assembly of an optical subsystem 5200 of an OADM device 5010a, 5010b. Adapting the lens

5210 to provide a corrected mechanical axis aligned to its optical axis 5550 will be discussed below with reference to FIGS. 56-59.

Figure 56:
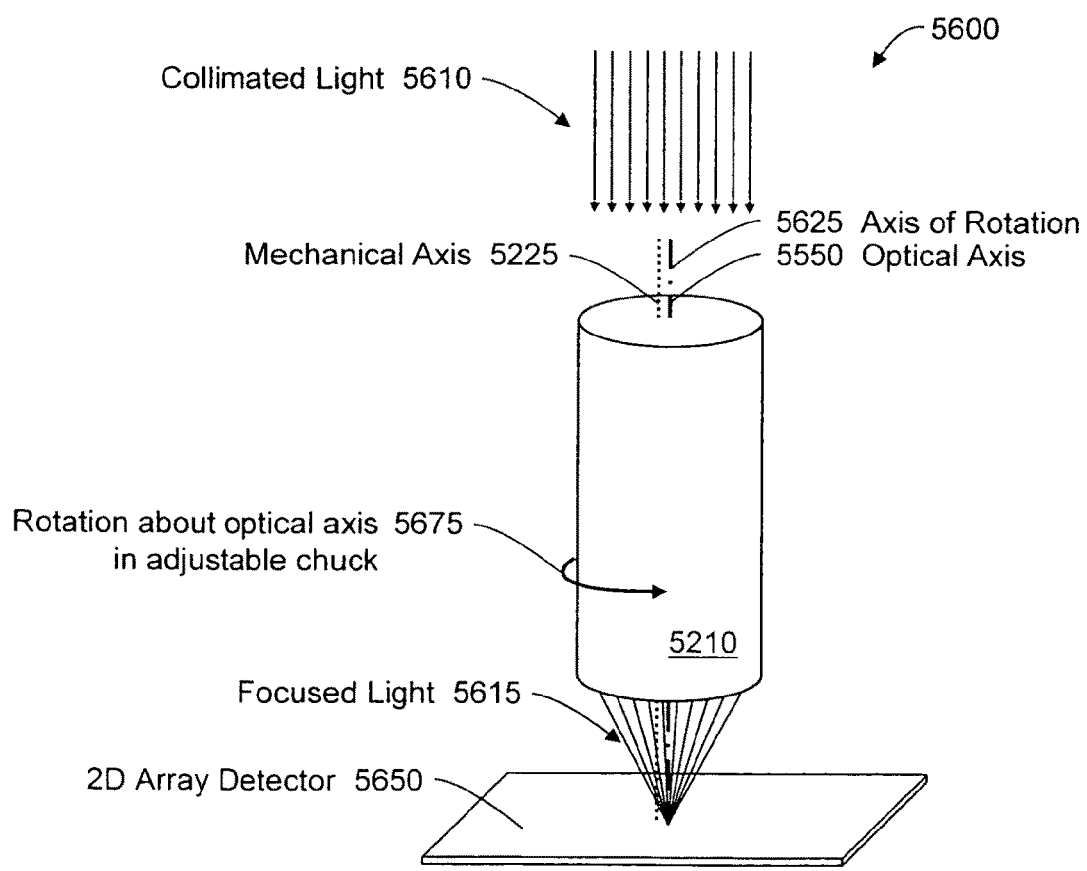
FIG. 56 illustrates a system that aligns an optical axis of a gradient index lens with an axis of rotation, about which the lens can rotate, in accordance with an exemplary embodiment of the present invention.

Referring now to FIG. 56, this figure illustrates a system 5600 that aligns an optical axis 5550 of a gradient index lens 5210 with an axis of rotation, about which the lens 5210 can rotate, in accordance with an exemplary embodiment of the present invention. The lens 5210 is situated in front of a charge coupled device ("CCD") detector 5650, for example in a rotatable chuck.

Collimated light 5610, for example from a laser, projects into the end of the lens 5210 opposite the detector 5650. The lens 5210 focused the light 5615 onto the CCD detector array 5650. The CCD 5650 determines or senses the focal point of the focused light 5615 based on the CCD pixels that are illuminated. Thus, the system 5600 determines the optical axis 5550 of the lens 5210.

When the chuck spins the lens about its mechanical axis 5225, as a collet would, the focused light 5675 traces a circular pattern on the CCD detector surface. That circular pattern, which the CCD captures, is associated with offset between the mechanical axis 5225 and the optical axis 5550. That is, the chuck can provide an axis of rotation 5625 that is aligned to the lens's mechanical axis 5225. That pattern can be acquired and used to ascertain the deviation between the optical axis 5550 and the mechanical axis 5225.

Unlike most collets, an adjustable chuck can provide an axis of rotation 5625 offset a specified distance from the mechanical axis 5225. Thus, the adjustable chuck can be set to spin 5675 the lens 5210 about the lens's optical axis 5550. That is, the system 5600 can provide a rotation 5675 about the optical axis 5550 of the lens 5210.

Figure 57:
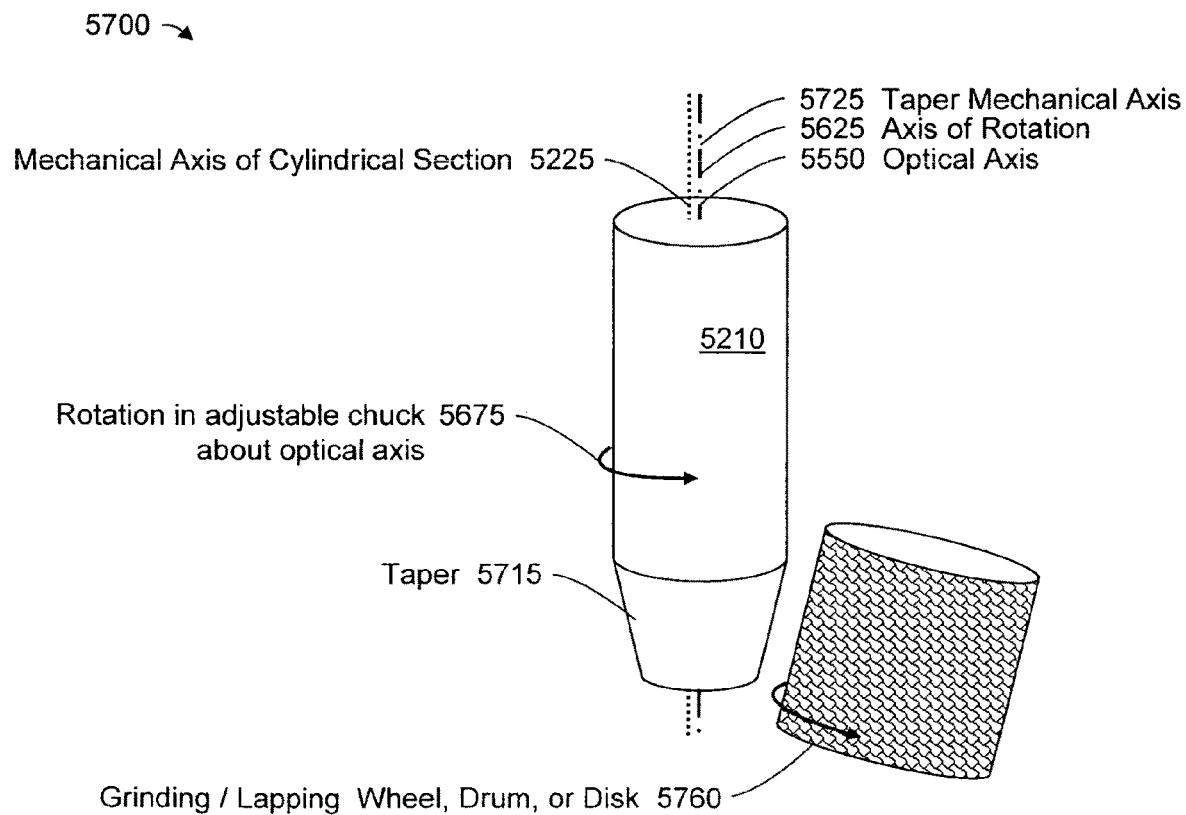
FIG. 57 illustrates a system that forms a mechanical feature, such as a taper, on a gradient index lens, wherein the feature is aligned with the lens's optical axis in accordance with an exemplary embodiment of the present invention.

Referring now to FIG. 57, this figure illustrates a system 5700 that forms a mechanical feature, such as a taper 5715, on a gradient index lens 5210, wherein the feature 5715 is aligned with the lens's optical axis 5550 in accordance with an exemplary embodiment of the present invention. The system 5700 can comprise the system 5600 discussed above with the addition of the abrading, grinding, or lapping drum 5760.

After the system 5600 is set to rotate the lens 5210 about its optical axis 5550, the CCD detector 5650 can be moved aside, and the grinding tool or wheel 5760 moved into grinding position. The grinding tool 5760 spins an abrasive surface and brings that spinning surface into contact with the rotating lens 5210, typically near one end. The ground end can be the end at which light is most concentrated.

The grinding tool 5760 removes material from the lens 5210 to form the taper 5715 around the axis of rotation 5625. That is, the resulting taper 5715 has a mechanical axis 5725 that overlays or is collinear with the axis of rotation 5625. As discussed above, the axis of rotation 5625 overlays or is collinear with the optical axis 5550. Thus, the taper 5715 or the mechanical axis 5725 of the taper 5715 overlays, is collinear with, or is aligned to the lens's optical axis 5550.

In addition to forming a smooth surface on an optical component, the system 5700 can be adapted to impose on an optical component a periodic pattern of features, such as a grating, that is operative to diffract light. The abrasive surface of the drum 5760 can be dressed or groomed to grind a diffractive surface-relief pattern on an optical surface of the optical component. An exemplary process for grinding or cutting diffractive patterns will now be described. The cylindrical abrasive surface of the drum 5760 is coated with photoresist, for example via spin coating or spray coating. A positioning mechanism, such as an adapted commercial mask aligner, positions a non-contact phase mask adjacent the photoresist coating. A UV light source illuminates the phase mask. In response to the UV illumination, the phase mask projects a pattern of that UV light onto the photoresist. Slowly spinning the drum 5760 while the patterned UV light is incident on the photoresist uniformly subjects the circumferential surface area of the photoresist coating to the patterned UV light. That is, the phase mask projects a periodic pattern of UV light onto the revolving photoresist surface, thereby exposing the photoresist coating on the drum's cylindrical surface to a circumferentially symmetrical application of patterned UV light. The photoresist polymerizes or cures in response to the incident UV light. Thus, the UV light pattern, which the phase mask creates, transfers to or writes into the photoresist. Processing the exposed photoresist in accordance with the instructions of the photoresist manufacturer or using recipes known in the photolithography arts completes the transfer or writing process. An automated arm or an operator places the drum in a chamber of an ICP system. The ICP process etches the abrasive surface of the drum 5760 according to the patterned photoresist. That is, the ICP system removes material from the exposed areas of the drum's abrasive surface and avoids substantially etching the areas that lie under photoresist. To promote etching uniformity, the drum 5760 can be rotated about its axis during ICP etching in the ICP chamber. Thus, the ICP system creates circumferentially symmetrical grooves in the drum's cylindrical abrasive surface. That is, a cylindrical pattern of grooves are formed around the periphery of the drum 5760. After removing the etched drum from the ICP chamber, a solvent wash removes the remaining photoresist from the drum's abrasive surface. The drum 5760 is mounted on a spindle that spins it. A positioning system moves the spinning drum 5760 to bring the drum's patterned abrasive surface into contact with the optical surface of the optical component. The spinning drum 5760 transfers its pattern of grooves, which correspond to the optical characteristics of the phase mask, to the optical surface by selectively abrading areas of that surface. In addition to forming periodic patterns on a gradient index lens 5210, this process can create diffractive features on a wide variety of optical devices or optical surfaces. For example, this process can be used to create a corrugated grating on a planar lightguide circuit that can provide a wavelength selective mirror for robustly stabilizing a multimode laser. Such as planar lightguide circuit can be used as the optical fiber 3550 in the system 4000 of FIG. 40A, which is discussed above.

Figure 58:
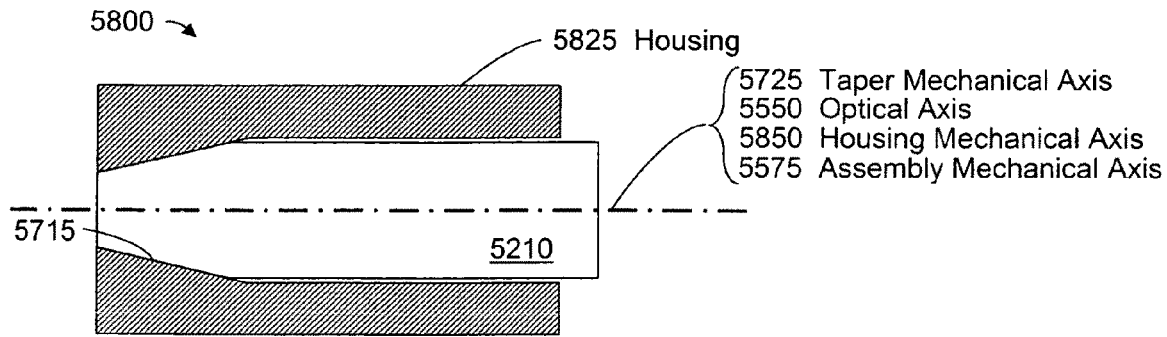
FIG. 58 illustrates a gradient index lens mounted in a housing, wherein the optical axis of the lens is essentially collinear with the mechanical axis of the housing in accordance with an exemplary embodiment of the present invention.

Referring now to FIG. 58, this figure illustrates a gradient index lens 5210 mounted in a housing 5825, wherein the optical axis 5550 of the lens 5210 is essentially collinear with the mechanical axis 5850 of the housing 5825 in accordance with an exemplary embodiment of the present invention. The assembly 5800 provides a cylindrical housing 5825 having at least one of its outer surfaces essentially parallel to or essentially perpendicular to the assembly's optical axis 5550.

Having alignment between a device's mechanical axis 5725 and its optical axis 5550 supports efficient, cost-effective, automated, or passive assembly of that device 5800 in an optical or optomechanical system. Thus, the assembly 5800 can be efficiently integrated into an optical system such as an exemplary embodiment of the OADM filter 5010$a$, the robustly stabilized multimode laser 950, or another device that could benefit from precise optical and mechanical alignment and low-cost manufacturing.

The housing 5800, which could be a mount, support, enclosure, or fixture, can be comprised of metal, ceramic, glass, or another material, such as plastic. A fabricator can make the housing 5825 by turning a rod of stock in a precision lathe. A grinding tool or a bit can bore, grind, or cut the inner surfaces of the housing 5825 including the taper 5715 and the straight sidewalls. The inner diameter of the sidewalls can be slightly larger than the outer diameter of the lens's straight sidewalls, thus avoiding interference of or contact between the un-tapered sections of the lens 5210 and the housing 5825. The tapers 5715 of the lens 5210 and the housing 5825 have approximately the same angle, thus facilitating contact and some interference at the tapered interface 5715.

The lens 5210 is inserted into the housing typically without need of active alignment. That is, an operator or a machine can achieve alignment between the housing's mechanical axis 5575 and the optical axis 5550 by simply inserting the lens 5210 into the housing 5825, thereby mating the tapers 5715. The resulting optomechanical system 5800 has a taper mechanical axis 5725, an optical axis 5550, a housing mechanical axis 5820, and an assembly mechanical axis 5575 that are essentially collinear with one another or are precisely aligned with one another.

Figure 59:
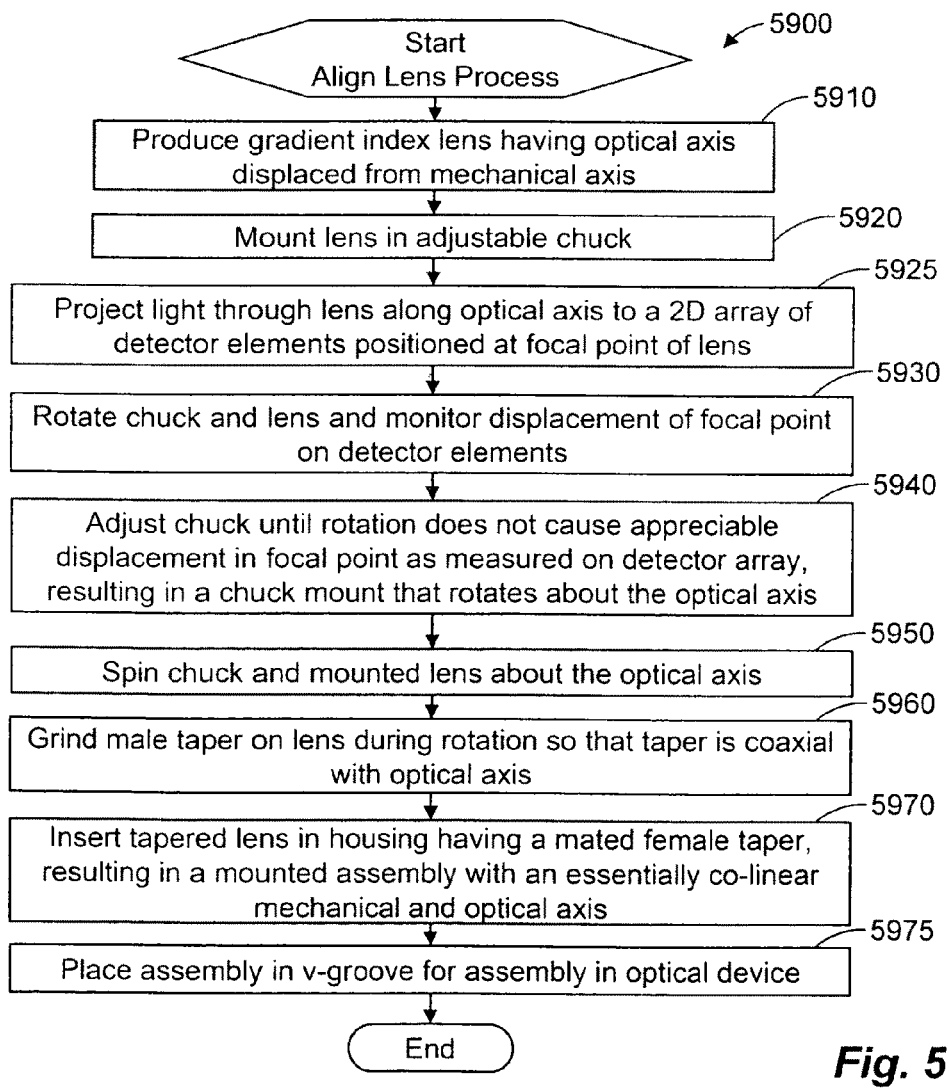
FIG. 59 is a flow chart illustrating a process for aligning the optical axis of a gradient index lens with a mechanical axis in accordance with an exemplary embodiment of the present invention.

Referring now to FIG. 59, this figure is a flow chart illustrating a process 5900 for aligning the optical axis 5550 of a gradient index lens 5210 with a mechanical axis 5575, 5850 in accordance with an exemplary embodiment of the present invention. That is, Process 5900, which is entitled Align Lens, can provide the system 5800, as one example.

At Step 5910, the first Step in Process 5900, a gradient index lens 5210 is fabricated or acquired that has an undesirable level of misalignment between its mechanical axis 5225 and its optical axis 5550. Gradient index lenses are available from Nippon Sheet Glass of Osaka Japan or its subsidiary NSG America, Inc. of Somerset, N.J., among sources. Gradient index lenses 5210 from such commercial sources may have unwanted misalignment between their optical and mechanical features.

At Step 5920, an automated positioning system, such as a robotic arm, places the lens 5210 in a chuck that has an "x-y" adjustment or a capability to position the lens at least in two dimensions perpendicular to its axis of rotation 5675.

At Step 5925, a light source delivers collimated light 5610 or other light of known orientation to the lens 5210. The lens 5210 projects or delivers a resulting focused light beam 5615 onto the two dimensional detector array 5650, which comprises an array of detector elements or pixels and can be a CCD-based imaging system. That is, the detector 5650 can capture images or image patterns of the beam 5615 or an object associated with that beam.

At Step 5930, a motor or other drive rotates 5675 the chuck and the lens 5210 mounted therein. The detector array 5650 monitors displacement of the light beam 5615 as the chuck and lens 5210 turn slowly about their axis of rotation 5625.

At Step 5940, the chuck is manually or automatically adjusted or is shimmed until the rotation 5675 produces little or no appreciably displacement of the beam 5615. The chuck adjustments move the lens 5210 until the chuck rotates the lens 5210 about the lens's optical axis 5550. In that state, the position of the beam 5615 remains essentially fixed or uniform as the lens 5210 rotates 5675, and the detector senses little or minimal signal change as the lens 5210 rotates 5675. In one exemplary embodiment, a control program automatically adjusts the lens's position in the chuck until the detector 5650 observes a reduced change in the image pattern captured from the beam 5615 as the lens 5210 rotates. That is, an automatic control system can move the lens 5210 until feedback from an imaging detector 5650 indicates that the lens 5210 is properly positioned.

The chuck adjustments can be in two orthogonal dimensions that are each perpendicular to the chuck's axis of rotation 5625, thereby correcting linear displacement between the mechanical axis 5225 and the optical axis 5550. The adjustments can also comprise tilting the lens 5210 in two angular dimensions, wherein a third angular dimension is the spinning rotation 5675. Thus, the lens 5210 can be moved in every dimension needed to bring the mechanical axis 5725 of the taper 5715 into a collinear position with respect to the optical axis 5550. That is, chuck adjustments can address the situation of the mechanical axis 5225 of the untapered lens 5210 being angled, tilted, or skewed with respect to the lens's optical axis 5550 in addition to addressing parallel or linear offset.

At Step 5950, a motor or drive unit spins the chuck and the lens 5210 mounted therein at a speed sufficient for processing. At Step 5960, a male taper 5715 is ground or otherwise formed on the lens 5210 during rotation about the lens's optical axis 5550. The resulting taper 5715 has a mechanical axis 5725 or a mechanical axis of centricity that is aligned to, is coaxial with, or overlays the lens's optical axis 5550.

At Step 5970, the automated assembly system inserts or places the tapered lens 5210 in a mount, or piece of material, or housing 5825 having a mated female taper 5715. The resulting assembly 5800 has a mechanical axis 5575 that is collinear with, its optical axis 5550 or otherwise has less misalignment than the misalignment between the mechanical axis 5225 and the optical axis 5550 of the commercially available lens obtained at Step 5910, discussed above.

In one exemplary embodiment of the present invention, the tapered end 5715 of the lens is mounted in an internally tapered chuck, collet, or other receiving holder of a material processing system. Using the taper 5715 for holding and spinning, a new cylindrical, un-tapered outside diameter is ground on the lens 5210. That is, the taper 5715 is used to hold the lens 5210 and "true it up." Thus, the taper 5715 can provide alignment for subsequent holding and processing of the lens 5217 to grind side walls or cylindrical surfaces that are true with the optical axis 5550. In other words, subsequent processing using a tool that embraces or grasps the taper 5715 can provide an optical axis 5550 positioned at the diametric center or longitudinal axis of the resulting cylinder. That is, a resulting gradient index lens can have sidewalls that are coaxial with its optical axis.

At Step 5975, the assembly 5800 is placed in a v-groove for assembly in an optical device that may comprise part of an optical system that provides robustly stabilized DWDM optical communication, for example.

Figure 60:
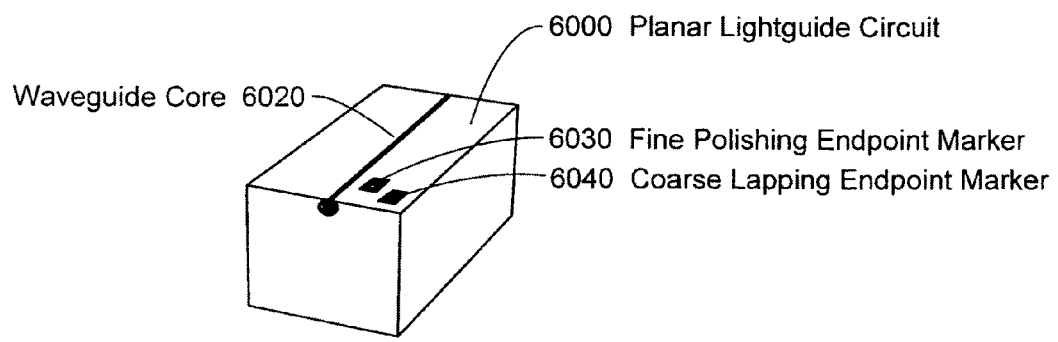
FIG. 60 illustrates an optical component having a marking that is aligned with a specified or desired length for the optical component in accordance with an exemplary embodiment of the present invention.
Figure 61:
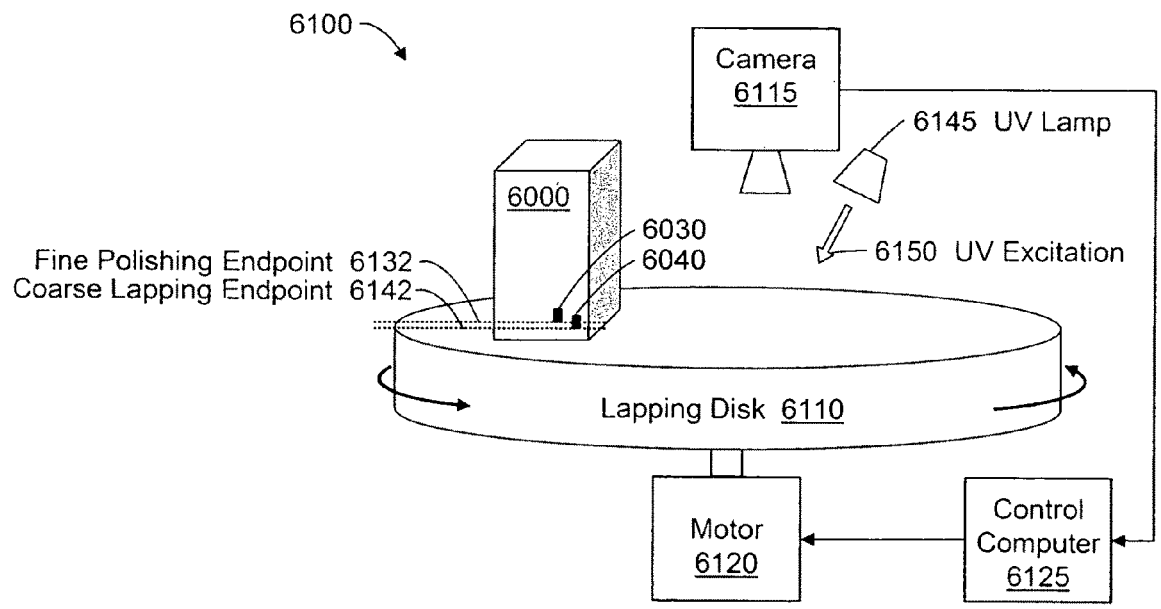
FIG. 61 illustrates a system that removes material from an optical component until a sensor detects removed material indicative of a processing endpoint in accordance with an exemplary embodiment of the present invention.

Turning now to FIGS. 60 and 61, FIG. 60 illustrates an optical component 6000 having a mark 6030, 6040 that is aligned with a specified or desired length for the optical component 6000 in accordance with an exemplary embodiment of the present invention. FIG. 61 illustrates a system 6100 that removes material from an optical component 6000 until a sensor 6115 detects removed material indicative of a processing endpoint 6132 in accordance with an exemplary embodiment of the present invention.

The component 6000 can be a planar lightguide circuit, a waveguide device, an active component, an optoelectronic element, an electro-optic system, or a silicon-based laser, to name a few examples. The component's length is desired to be shortened. A photolithographic process applies two patches or marks 6030, 6040 to a side or surface of the component 6000, for example near the core 6020. The marks 6030, 6040 typically comprise a fluorescent material, for example an ink that comprises quantum dots or nanoparticles that emit light under UV excitation 6150.

Each of the marks 6030, 6040 emits a distinct color of light. For example, the mark 6040 may emit green light under UV excitation 6150 while the mark 6030 emits yellow light under the same excitation. The mark 6030 indicates the desired length 6132 of the component 6000. The mark 6040 is offset slightly from the mark 6030 to indicate a slightly longer length 6142 than the desired length 6132.

The system 6100 comprises a rotating lapping disk 6110 that can be an abrading device, a polishing disk, a grinding disk, or another type of material removal system. A motor 6120 drives the rotation of the lapping disk 6110. A fixture or arm (not shown in FIG. 61) holds the component 6000 in contact with the lapping disk 6110.

Rotation of the lapping disk 6100 removes material from the component 6000, thereby shortening it. The mark 6040 provides a coarse lapping endpoint 6142. When the lapping disk 6110 removes sufficient material from the component 6000, the fluorescent material of the mark 6040 transfers to the abrasive surface of the lapping disk 6110. The UV lamp 6145 emits UV light 6150 onto the disk's abrasive surface to excite any mark material that may be present as a result of abrasive removal. The camera 6115 has an operability for spectral discrimination, provided by a color-sensitivity CCD or a spectrophotometer, for example.

When the camera 6115 detects the presence of material from the mark 6040 on the lapping disk 6110, the control computer 6125 determines that the length of the component 6000 corresponds to the coarse lapping endpoint 6142 and stops the motor 6120. An operator or an automated tool replaces the lapping disk 6110 with a polishing disk (not shown in FIG. 61) or another lapping disk having a finer grit or slower material removal.

The control computer 6125, which can be a programmable logic controller, engages the motor 6120 to rotate the fine-grit or polishing disk. That disk removes material from the component 6000 at a slower rate than the lapping disk 6110 until the material of the mark 6030 transfers to the disk's face, indicating that the fine polishing endpoint 6132 has been reached. At that point, the component 6000 has been shortened to its desired length. The UV light 6150 excites the material from the mark 6030 on the disk face for detection by the camera 6115. When the camera 6115 detects the fluorescent response of the mark 6030 on the disk face, the control computer 6125 stops the motor 6120. An operator or an automated arm removes the component 6000 from the system 6100, thereby providing a length that has been shortened to coincide with the endpoint 6132 and the mark 6030.

The optical component 6000 can be integrated into an optical system, such as a robustly stabilized laser 950 for example. In many circumstances, a laser system can benefit from a laser cavity with a precisely controlled physical length as may be provided by the refined length of the optical component 6000.

Figure 62:
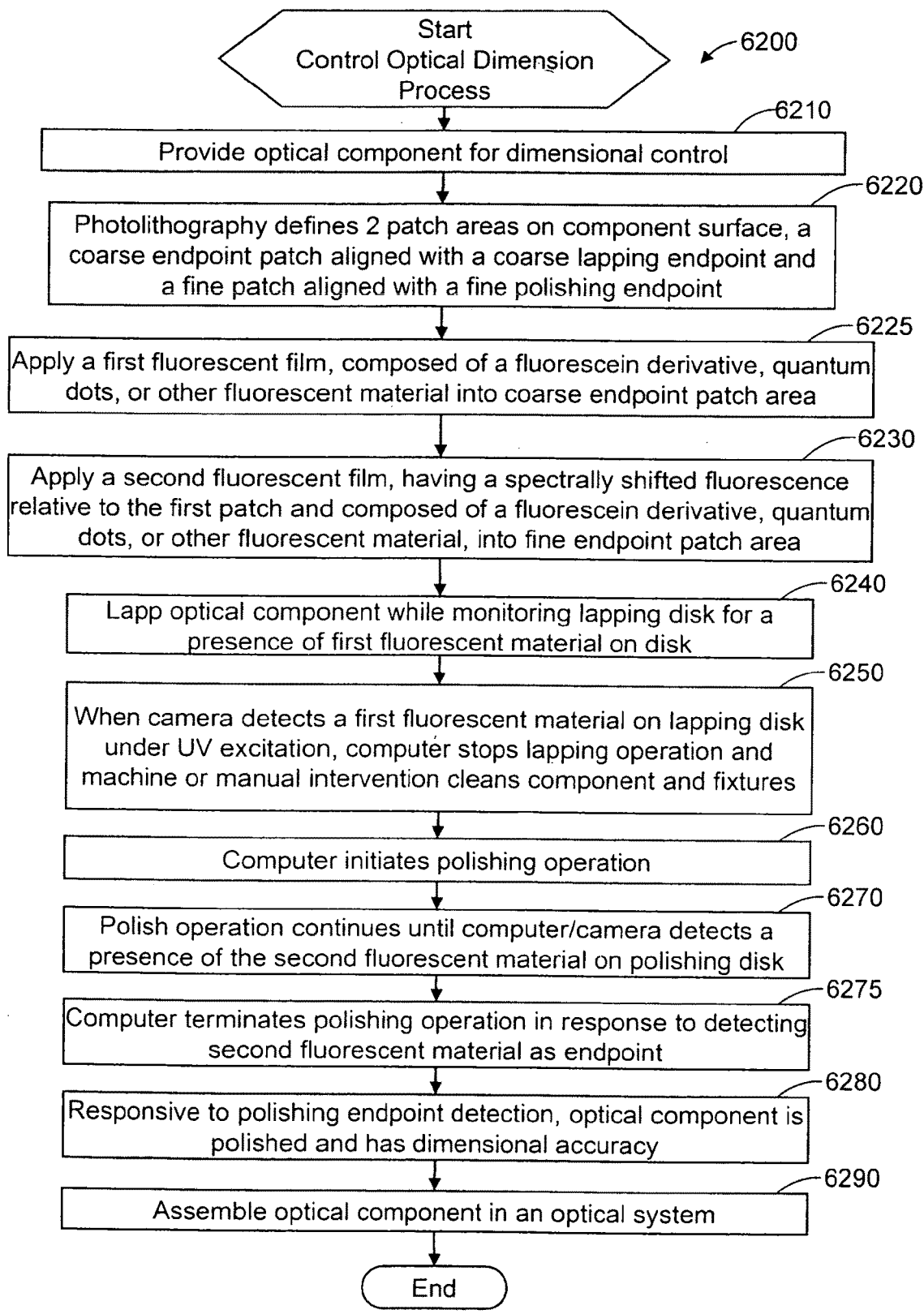
FIG. 62 is a flow chart illustrating a process for controlling a dimension of an optical component in accordance with an exemplary embodiment of the present invention.

Turning now to FIG. 62, this figure is a flow chart illustrating a process 6200 for controlling a dimension of an optical component 6000 in accordance with an exemplary embodiment of the present invention. The Process 6200, which is entitled Control Optical Dimension, will be discussed below with exemplary reference to FIGS. 60 and 61.

At Step 6210, the first step in Process 6200, a manufacturer provides an optical component 6000 for which precise control over a physical dimension is desired. At Step 6220, a photolithographic system defines two patch areas 6030, 6040 on the component 6000. One patch area 6040 is located at a position on the component 6000 that is slightly beyond the desired physical dimension 6132. The other patch area 6030 is disposed on the component 6000 at the desired physical dimension 6142. The patch areas 6030, 6040 can be windows in a positive or negative photoresist, for example.

At Step 6225, the photolithographic system applies a fluorescent film, ink, or paste at the patch area 6040 to create the mark 6040. The fluorescent material of the mark 6040 has first spectral response to UV light 6150. At Step 6230, the photolithographic system applies a fluorescent film, ink, or paste at the patch area 6030 to create the mark 6030. The fluorescent material of the mark 6030 has second spectral response to UV light 6150. The first spectral response can be distinct or differentiable from the second spectral response.

As an alternative to creating the marks 6040, 6030 via photolithography, in certain embodiments, they can be applied manually, for example with permanent fluorescent "highlighting" marking pens. Manual application can be used in circumstances where a relatively coarse level of length control is acceptable, for example.

At Step 6240, a lapping, abrading, or material removal system 6100 removes material from the optical component 6000, thereby approaching the desired physical dimension 6142. An optical detector or camera 6115 monitors the disk 6110 for appearance of the mark 6040 in the material that the system 6100 removes from the component 6000. Detection of the first spectral response by the camera 6115 indicates that the system 6100 has removed sufficient material to reach the coarse lapping endpoint 6142

At Step 6250, an automatic control program executing on the computer 6125 stops the material removal. Manual or automatic intervention cleans the component 6000 and any fixtures contaminated with lapping grit. At Step 6260, the system 6100 transitions, under computer control, to a polishing operation that removes material from the component 6000 at a slower or more finely controlled rate that coarse lapping.

At Step 6270, the polishing operation continues until the camera 6115 detects the second spectral response. At Step 6275, the computer 6125 halts the polishing operation in response to detecting the second spectral response, which indicates that material removal has reached the fine polishing endpoint 6132. At Step 6280, the component 6100 has achieved the desired dimension 6132 in response to reaching the fine polishing endpoint 6132. The fine polishing operation can provide not only a fine level of dimensional control but also a polished surface finish.

At Step 6290, the component 6000 is cleaned and assembled into an optical system, such as an OADM filter 5010*a*, 5010*b* or a robustly stabilized laser 950. Following Step 6290, Process 6200 ends.

Figure 63:
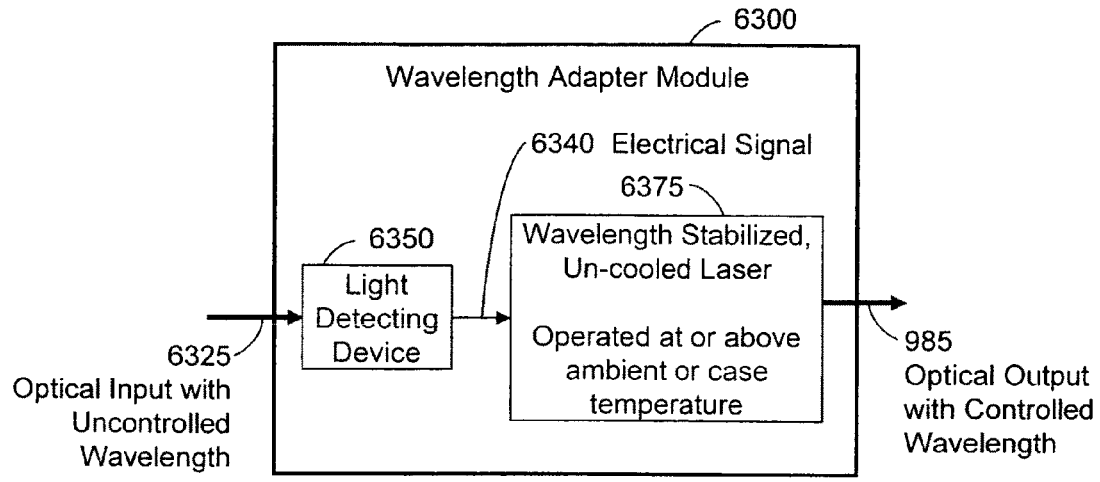
FIG. 63 is a functional block diagram illustrating a wavelength adapter module that receives an optical input having an uncontrolled wavelength and outputs a robustly stabilized multimode optical signal in accordance with an exemplary embodiment of the present invention.

Turning now to FIG. 63, this figure is a functional block diagram illustrating a wavelength adapter module 6300 that receives an optical input 6325 having an uncontrolled wavelength and outputs a robustly stabilized multimode optical signal 985 in accordance with an exemplary embodiment of the present invention. A LED, a Fabry Perot laser, or an un-cooled DFB laser can provide the uncontrolled signal. The system 6300 comprises an optoelectronic or electro-optic detector 6350 that converts the uncontrolled signal 6350 into a modulated electrical signal 6340. That is, the light detecting device 6350 converts incoming information from the optical domain to the electrical domain.

The electrical signal 6340 drives the lasing device 6375 which operates at an elevated temperature or a temperature that fluctuates or changes with a degree of randomness or variation. The lasing device typically comprises a robustly stabilized multimode laser 950 that outputs a plurality of modes that are aligned or oriented to a single coordinate 191 or channel 151 of a DWDM grid 100.

In one exemplary embodiment of the present invention, the transmitter 907 illustrated in FIG. 9 and discussed above is the lasing device 6375. That is, the wavelength adapter module 6300 can comprise the transmitter 907 of FIG. 9.

In one exemplary embodiment of the present invention, the system 300 that FIG. 3 illustrates comprises the wavelength adapter module 630. Specifically, the transmitters 311, 312, 313, 31N of the system 300 can each be the wavelength adapter module 6300. In one exemplary embodiment, the wavelength adapter module 6300 can be a transponder or a transponder card subject to random temperature events. Such a transponder can support DWDM without active cooling elements mounted directly on the associated circuitry.

Figure 64:
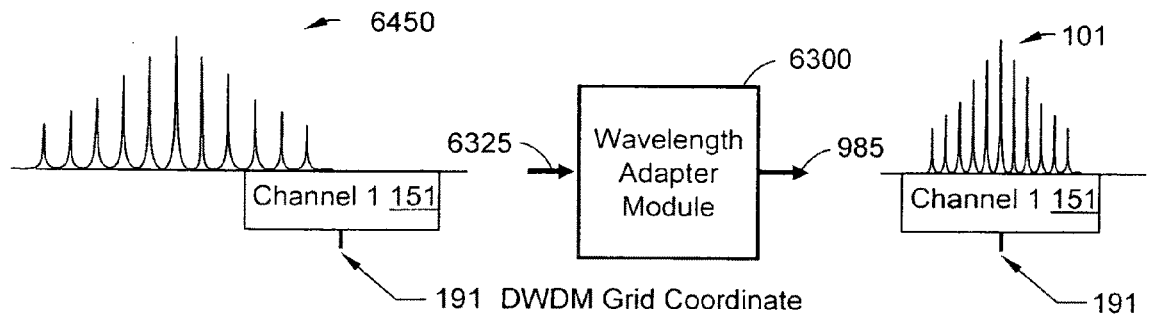
FIG. 64 is a functional block diagram illustrating spectral characteristics of input and output optical signals of a wavelength adapter module in accordance with an exemplary embodiment of the present invention.

Turning now to FIG. 64, this figure is a functional block diagram illustrating spectral characteristics of input and output optical signals of the wavelength adapter module 6300 in accordance with an exemplary embodiment of the present invention. The incoming optical signal 6450, 6325 comprises multiple longitudinal modes that are generally free to move in wavelength. That is, the incoming signal 6325 exhibits spectral characteristics 6450 that are misaligned to the DWDM grid coordinate 191 and the channel one 151. During normal operation, the illustrated comb pattern 6450 may move in wavelength a greater distance than the spacing between two coordinates 191, 192 on the grid 100. A free running Fabry Perot laser can output the signal 6450, for example.

The output 985 of the wavelength adapter module 6300 is aligned to the channel one 151 and comprises spectral characteristics 101 representative of a robustly stabilized multimode laser 950.

Figure 65:
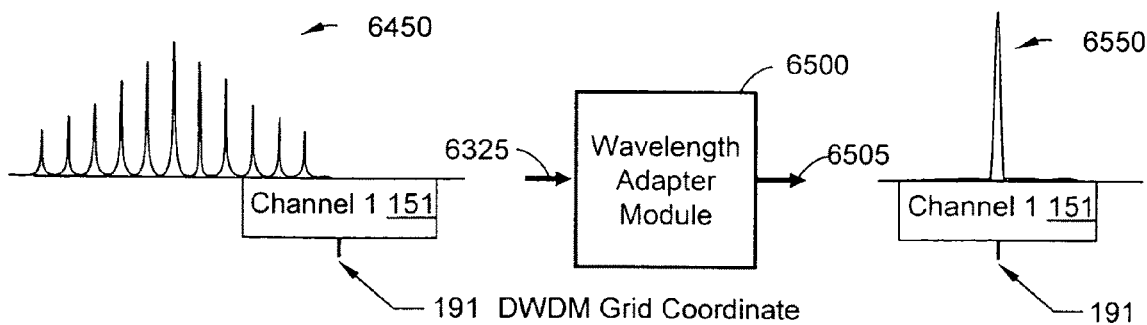
FIG. 65 is a functional block diagram illustrating spectral characteristics of input and output optical signals of a wavelength adapter module that provides a stabilized single mode optical signal in accordance with an exemplary embodiment of the present invention.

Turning now to FIG. 65, this figure is a functional block diagram illustrating spectral characteristics of input and output optical signals of a wavelength adapter module 6500 that provides a stabilized single mode optical signal 6505 in accordance with an exemplary embodiment of the present invention. The wavelength adapter module 6500 can comprise a single mode laser that operates without active cooling or that outputs a single mode DWDM signal 6505 while receiving perturbation from random temperature events. The signal 6505 can exhibit a unitary or single peak 6505 aligned to the channel one 191.

Figure 66:
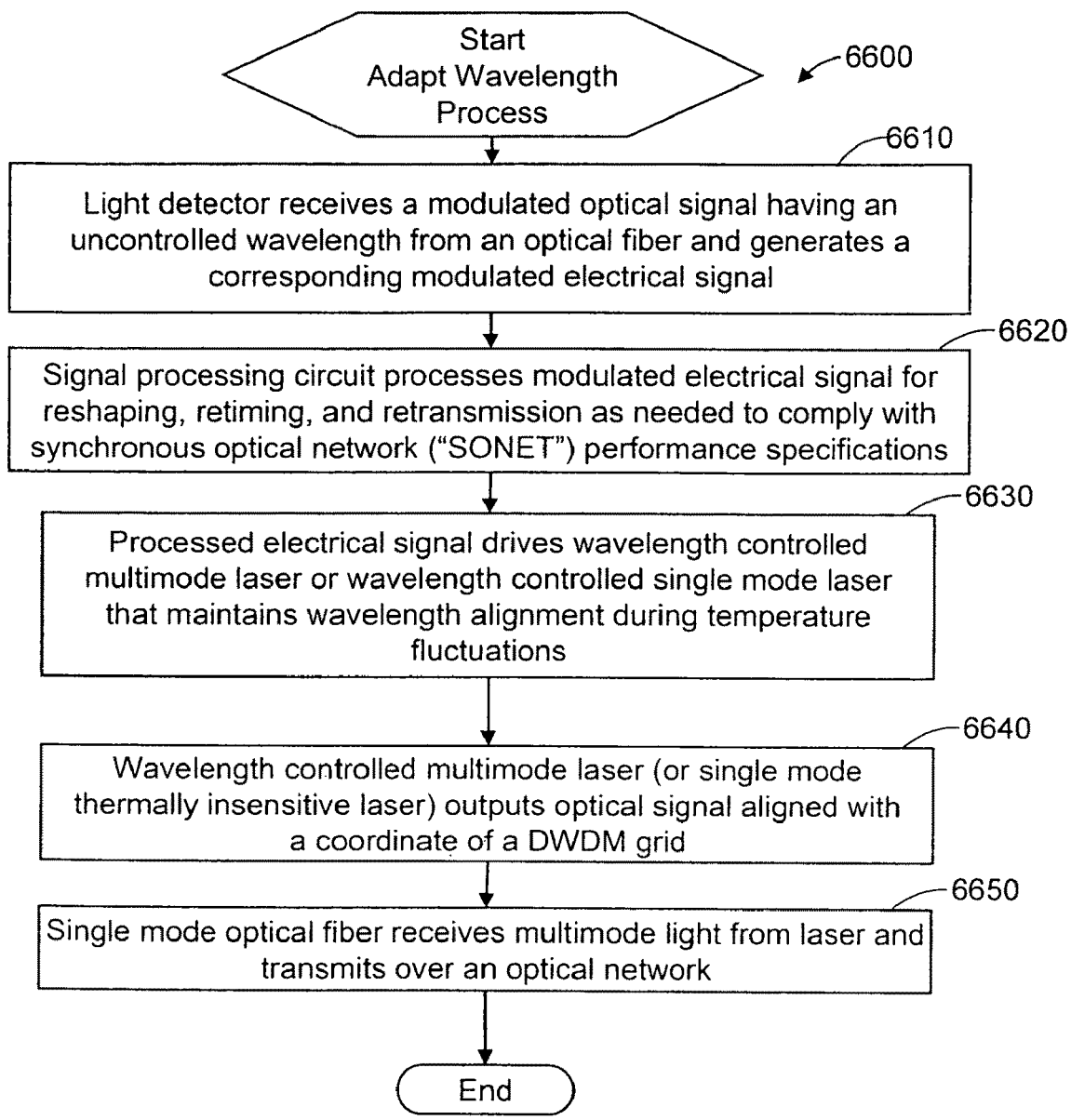
FIG. 66 is a flow chart illustrating a process for generating a stable optical signal based on an unstable optical signal in accordance with an exemplary embodiment of the present invention.

Turning now to FIG. 66, this figure is a flow chart illustrating a process 6600 for generating a stable optical signal 985 based on an unstable optical signal 6325 in accordance with an exemplary embodiment of the present invention.

At Step 6610, a light detector 6350 receives an uncontrolled optical signal 6325 modulated with information. The uncontrolled optical signal 6325 may exhibit spectral features 6450 that drift, wander, or vary in wavelength over time. The detector 6350 outputs an electrical signal 6350 that carries the information that was encoded on the uncontrolled optical signal 6325.

At Step 6620, receiver circuitry processes the electrical signal 6350, for example changing some aspect of its waveform to facilitate transmission over a backplane, through a circuit on a board, or in a module. At Step 6630, the processed electrical signal 6350 drives a robustly stabilized multimode laser 950.

At Step 6640, the robustly stabilized multimode laser 950 outputs an optical signal 985 that is aligned to a DWDM grid coordinate 191 or channel 151 and that is encoded with at least some of the information that the incoming optical signal 6325 carried. The optical signal 985 is launched into an optical fiber 201 for transmission over an optical network 300 at Step 6650. Following Step 6650, Process 6600 ends.

Figure 67A:
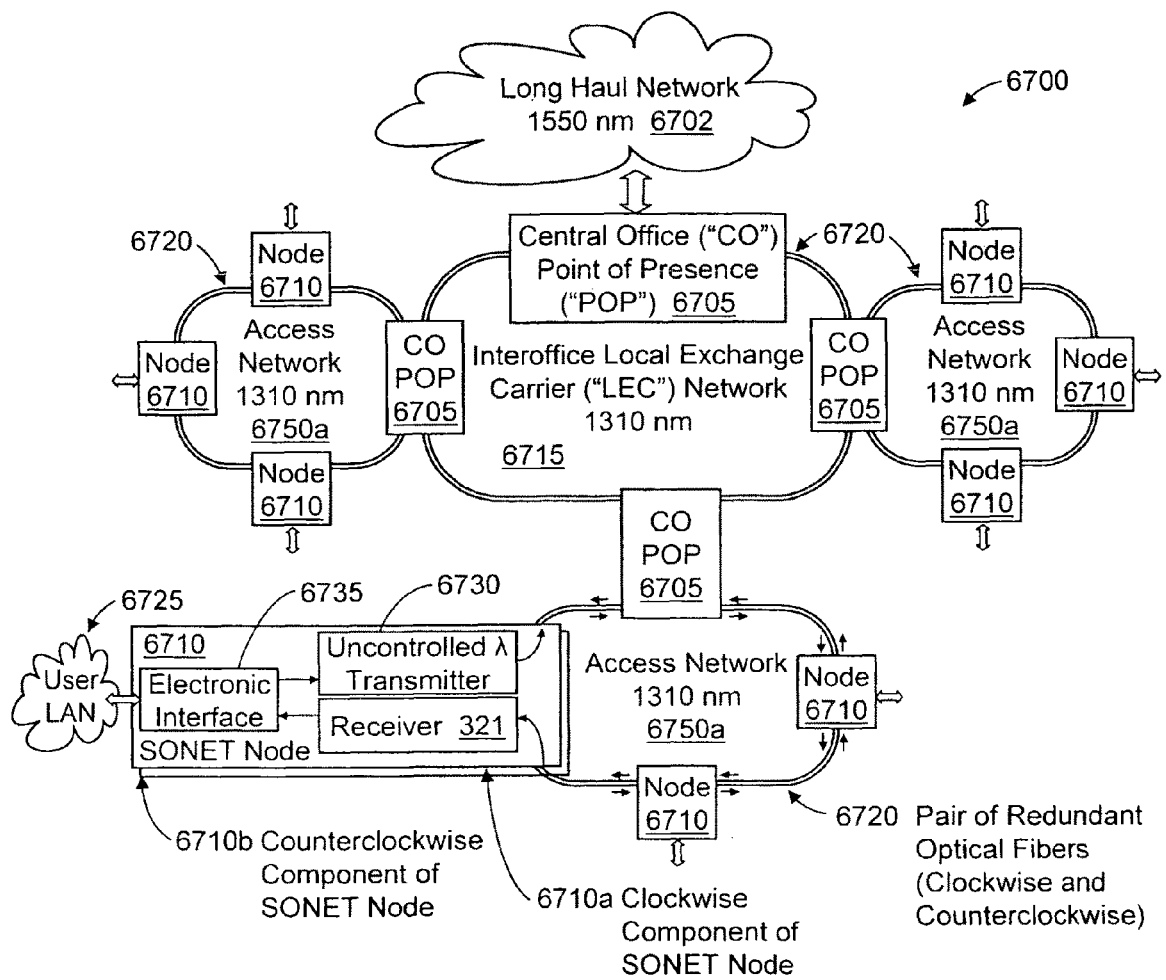
FIG. 67A is a functional block diagram illustrating an optical communication system that comprises an exemplary access network.

Turning now to FIG. 67A, this figure is a functional block diagram illustrating an exemplary optical communication system 6700 that comprises an access network 6750a. The access network 6750a provides access for a user local area network ("LAN") 6725 to a long haul network 6702.

The long haul network 6702 communicates information long distances, for example among regions of the United States, using light signals having a nominal wavelength of 1550 nm. An interoffice local exchange carrier ("LEC") network 6715 that may be referred to as a ring links together a plurality of central office ("CO") Point of Present ("POP") sites 6705. One of the POPs 6705 provides an interface to the long haul network 6702, while three of the POPs each interfaces to an access network 6750a. Having four POPs 6705 on the LEC network 6715, as illustrated in FIG. 67A is exemplary; the network 6715 can generally have an arbitrary number of POPs 6705.

The LEC network 6715 supports exchanging data among the access networks 6750a or between any of the access networks 6750a and the long haul network 6702. Data transmits on the LEC network 6715 in the form of multimode optical signals with a nominal wavelength of 1310 nm but with insufficient wavelength precision or control to provide DWDM on that network 6715. That is, signals on the LEC network 6715 are free to undergo a wavelength shift that can exceed the spacing between two adjacent channels on a DWDM grid 100. Signals flow on the LEC network 6715 in a pair of optical fibers 6720, with one of the fibers 6720 transmitting light in a counterclockwise direction and the other transmitting light in the opposite or clockwise direction. Together, the pair of fibers 6720 can provide redundancy or fault tolerant operation.

The LEC network 6715 or generally most any part of the system 6700 or that whole system 6700 can comprise a SONET or a SDH network. In an exemplary embodiment, the system 6700 can support Gigabit Ethernet.

Each of the access networks 6750a comprises a plurality of nodes 6710, exemplarily illustrated in FIG. 67A as three nodes 6710 per access network 6750. The nodes may comply with SONET, SDH, Gigabit Ethernet, or another optical networking specification or standard. Each node 6710 can provide network access to a home, a group of residences, a community, a city, a campus, an office building, a business, a private network, or an LAN to name a few examples. Voice, data, Internet Protocol traffic, or other forms of information or signaling can flow to or from the system 6700 or its various elements via the nodes 6710.

Each access network 6750 comprises a pair of optical fibers 6720 that are operable to transmit light in opposing directions, such as clockwise and counterclockwise, to provide fault tolerance and redundancy. Each node 6710 comprises two node elements, represented in FIG. 67A as SONET node component 6710a and SONET node component 6710b. The component 6710a couples to one of the fibers 6720 and handles clockwise traffic, while the component 6710b couples to the other fiber in the pair 6720 and handles counterclockwise traffic.

Each of the SONET node components 6710a, 6710b comprises a receiver 321 that converts incoming or ingress optical signals on the access network 6750 to corresponding electrical signals. The electronic interface 6735 of each SONET node component 6710a, 6710b processes the electrical signals from the receiver 321 and passes them or the information that they carry to the user LAN 6725. Telephonic or computing devices on the user LAN 6725 receive the information/signals and output new data, signals, or information.

information generated on the user LAN 6725 passes through the electronic interface 6735 to the uncontrolled wavelength transmitter 6730, which converts that information into the optical domain. The transmitter 6730 launches the resulting optical signals, which lack sufficient wavelength precision for alignment to the DWDM grid 100, on the access network 6750*a*.

Thus, information passes from the user LAN 6725 onto the access network 6750 through the node 6710. That information can flow though the CO POP 6705 to the LEC network 6715 and to the long haul network 6702 through another CO POP 6705 on the LEC network 6715. And, information flows in the opposite direction from the long haul network 6702 though those network elements to the user LAN 6725.

Figure 67B:
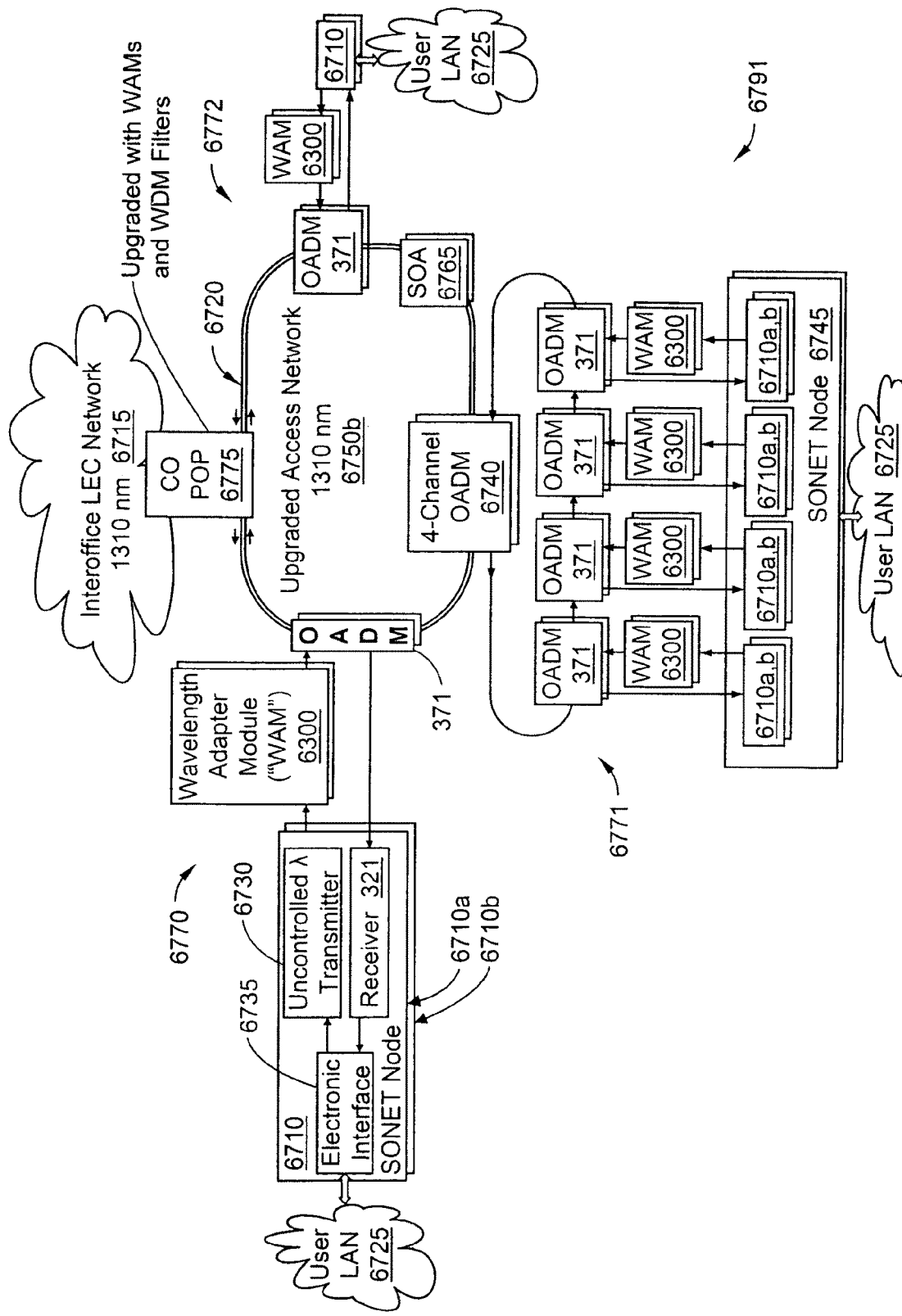
FIG. 67B is a functional block diagram illustrating an optical communication system that comprises an access network upgraded with wavelength division multiplexing using robustly stabilized multimode lasers in accordance with an exemplary embodiment of the present invention.

Turning now to FIG. 67B, this figure is a functional block diagram illustrating an optical communication system 6791 that comprises an access network 6750 upgraded with wavelength division multiplexing using robustly stabilized multimode lasers 950 in accordance with an exemplary embodiment of the present invention. FIG. 67B illustrates how one of the access networks of the system 6700 of FIG. 67A can be upgraded for increased bandwidth or carrying capacity using robustly stabilized multimode laser signals 101, 102, 103, 10N aligned to a DWDM grid 100.

At site 6770 and site 6772, a wavelength adapter module 6300 is coupled to each of the SONET node components 6710*a*, 6710*b* to receive the un-stabilized light that it outputs. The wavelength adapter module 6300 outputs a robustly stabilized DWDM signal 101 aligned to a channel 151, 152, 153, 15N of the DWDM grid 100. The OADM 371 provides the interface on the upgraded access network 6750*b* for dropping and adding the multimode DWDM optical signal 101 on that network 6750*b*.

The SOA 6765 amplifies signals on the access network fibers 6720 as need to provide sufficient optical signal strength for reception at various points on the access network 6750*b*. The SOA 6765 can comprise an SiOA that uses a waveguide medium comprising silicon and the Raman effect for amplification. Controlling the amount or level of electrons in the silicon medium can provide variable gain or attenuation. Detecting the amount of electrons drained or removed from the silicon medium can extract some or all of the information on the amplified optical signals without directly interrupting the optical signals passing through the amplifier.

Network location or site 6771 on the access network 6750 is upgraded to add and drop four multimode DWDM channels 151, 152, 153, 15N and the corresponding signals 101, 102, 103, 10N. Thus, the site 6771 provides approximately four times the bandwidth access that the site 6770 provides. The OADM 6740 drops four adjacent channels 151, 152, 153, 15N collectively via a filter. Each of the four OADMs 371 at the site 6771 handles one of the four adjacent channels 151, 152, 153, 15N in serial fashion.

For each of the four channels 151, 152, 153, 15N that are added and dropped, the SONET node 6745 comprises a pair of SONET node components 6710*a*, 6710*b*, one for each fiber in the access network's pair of fibers 6720. Four wavelength adapter modules 6300 are coupled between the OADMs 371 and the SONET node 6745.

Figure 68A:
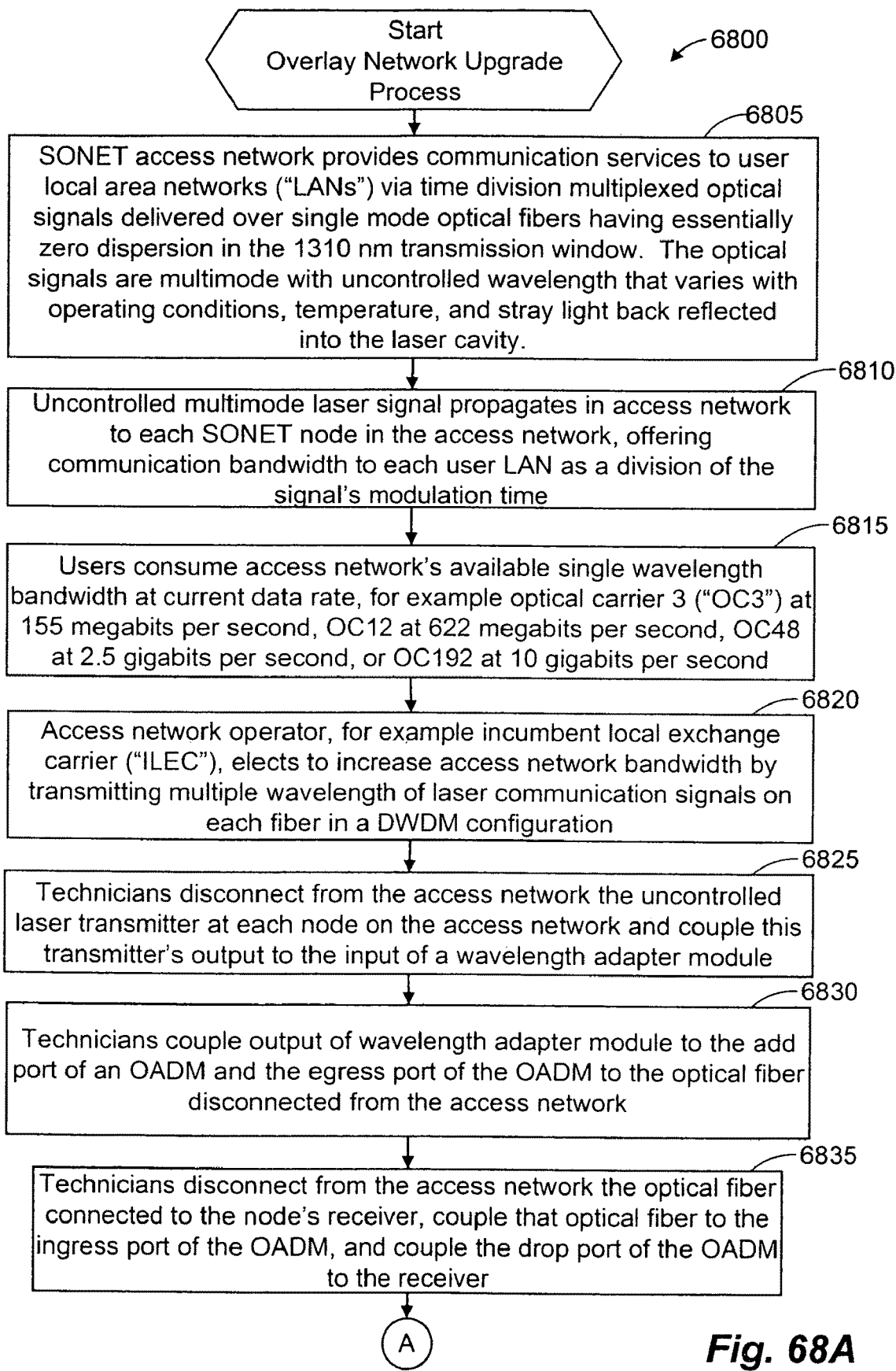
FIGS. 68A, 68B, and 68C are a flow chart illustrating a process for upgrading a network with robustly stabilized multimode optical signals aligned to a wavelength division multiplexing grid in accordance with an exemplary embodiment of the present invention.
Figure 68B:
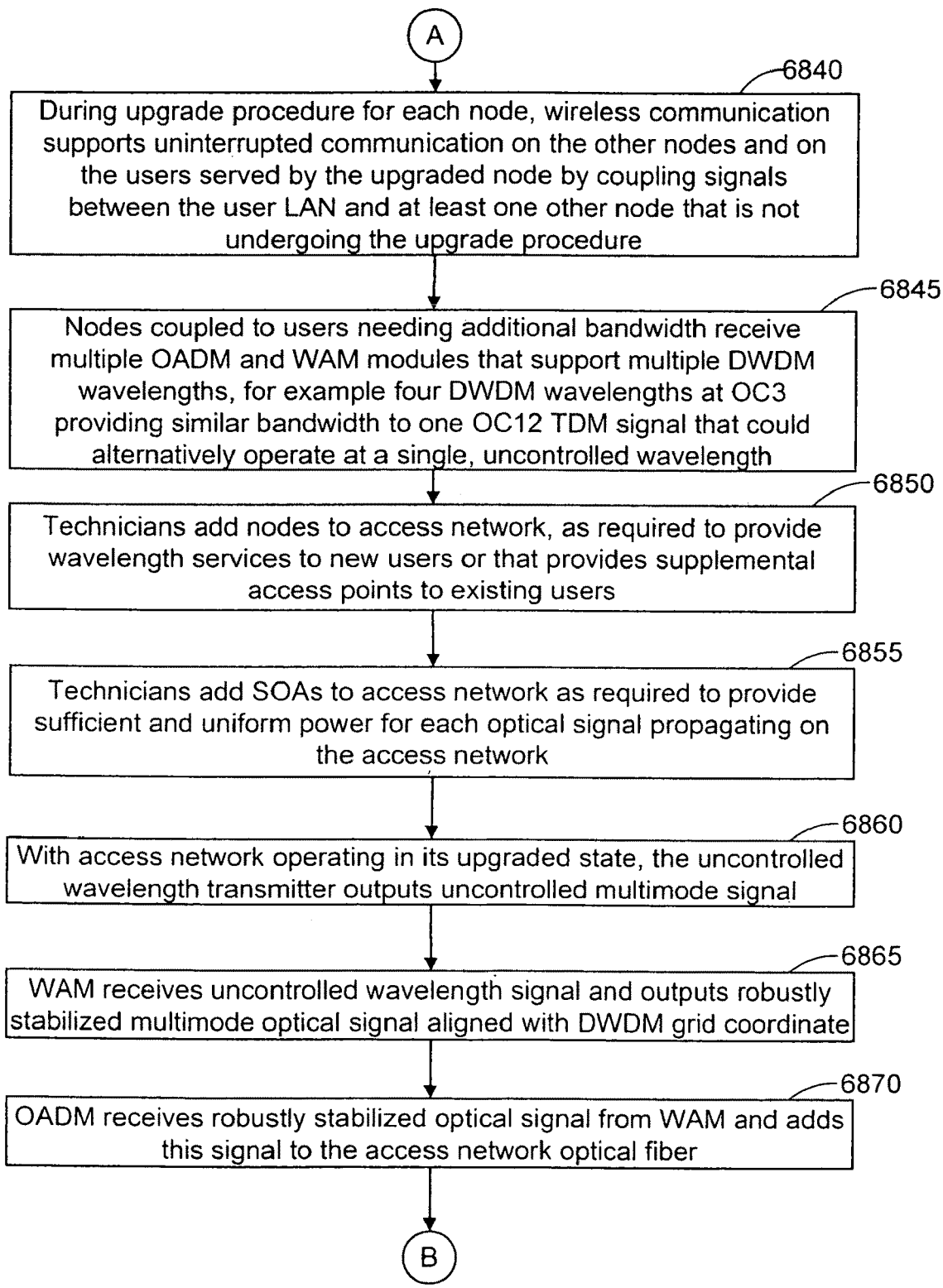
Figure 68C:
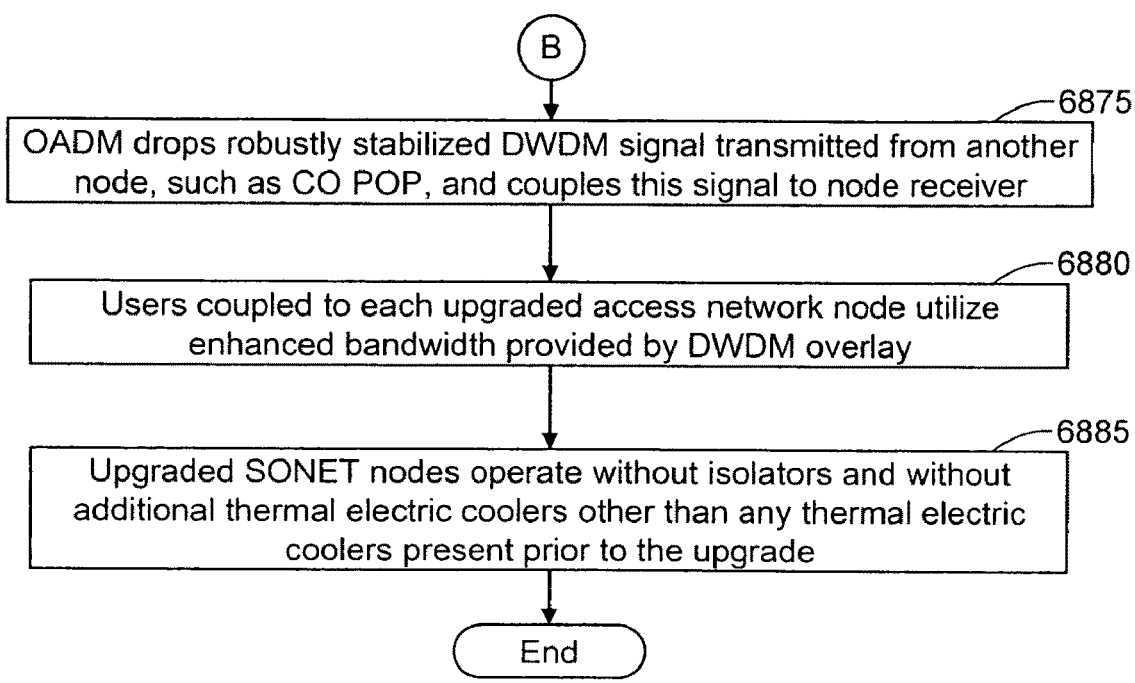

Turning now to FIGS. 68A, 68B, and 68C, these figures are a flow chart illustrating a process 6800 for upgrading a network 6700 with robustly stabilized multimode optical signals 101, 102, 103, 10N aligned to a wavelength division multiplexing grid 100 in accordance with an exemplary embodiment of the present invention. The Process 6800, which is entitled Overlay Network Upgrade, can convert the network 6700 or its access network 6750*a* into the network 6791 and/or its access network 6750*a*. Process 6800 will be discussed with exemplary reference to FIGS. 67A and 67B, At Step 6805 the SONET/SDH-based access network 6750*a* provides LAN users with access to a broader network via non-DWDM optical signals. At Step 6810, bandwidth is allocated on the access network 6750*a* via time division multiplexing of those non-DWDM optical signals, which may vary in color over time too much for DWDM.

At Step 6815, users or equipment on the LAN 6725 need more bandwidth or access capability than the data carrying capability of the access network 6750*a* supports. Users may desire heavy usage of voice-over-IP services, for example.

At Step 6820, the operator of the access network 6750*a*, for example an ILEC, decides to increase the access bandwidth using DWDM via a DWDM overlay on existing fibers 6720. At Step 6825, technicians or engineers begin the upgrade and disconnect the optical output fiber from the uncontrolled laser transmitter 6730. They couple this output fiber to the input of the wavelength adapter module 6300.

At Step 6830, the technicians connect the output of the wavelength adapter module 6300 to the add port of the OADM 371. They connect the egress or output port of the OADM 371 to the optical fiber that was disconnected from the access network 6750*a* at Step 6825. That is, they couple the OADM's output port to the access network 6750*a* so that port launches light onto the access network 6750*a* (which will be access network 6750*b* after the upgrade is complete).

At Step 6835, the technicians disconnect the optical fiber from the receiver 321 and connect that fiber to the input or ingress port of the OADM 371. They couple the OADM's drop port to the receiver 310. Thus, the technicians have inserted the wavelength adapter module 6300 and the OADM 371 into the network 6750*a* (FIG. 67A) to create the OADM site 6770 of the access network 6750*b* (FIG. 67B).

At Step 6840, technicians have used a wireless link to during the site upgrade to bypass the portion of the network that was disconnected during upgrading activities. That is, in one exemplary embodiment, a wireless data link is established around the upgraded node 6710 so that traffic and services continue without interruption while the fibers 6720 are disconnected during the upgrade.

At Step 6845, the access network 6750*b* has enhanced bandwidth. The individual site 6711 receives an increase in bandwidth by dropping and adding four signals at that site 6711, thereby effectively providing the site 6711 with four virtual fibers or a four-fold increase in access bandwidth. At Step 6850, technicians increase the number of access points to the network 6750*b*, to add new subscribers for example.

At Step 6855, technicians place SOAs 6775 on the access network 6750*b* to provide uniform and adequate optical signal power.

At Step 6860, the uncontrolled-wavelength laser transmitter 6730 outputs uncontrolled signals 6325 that are generally free to wander in wavelength. Those signals 6325 carry voice or data LAN traffic. At Step 6865, the wavelength adapter module 6300 receives the uncontrolled-wavelength signal 6325 from the transmitter 6730 and output the robustly stabilized multimode DWDM signal 101, encoded with corresponding or equivalent information.

At Step 6870, the OADM 371 receives the robustly stabilized multimode DWDM signal 101 (shown as signal 985 on FIG. 63) from the wavelength adapter module 6300 and inserts that signal 101/985 on one of the access network's fibers 6720, traveling clockwise away from the site 6770 for example.

At Step 6875, the OADM 371 drops the robustly stabilized DWDM signal 101 that is traveling towards the site 6770 and is carrying information distinct from the signal 101/985 that was launched at Step 6870. That is, the OADM 371 drops a signal aligned to a DWDM channel 151 having a first information content and adds another signal that is also aligned to that channel 151 but carries a second information content.

At Step 6880, users coupled to each upgraded access network collectively have increased bandwidth. At Step 6885, the upgraded SONET nodes 6710a, 6710b function without any isolators or thermal electric coolers that were not present prior to the upgrade. In other words, the upgrade can avoid adding new isolators or active cooling devices to the upgraded site 6770. Following Step 6885, Process 6800 ends.

It will be appreciated that exemplary embodiments of the present invention can comprise combinations of the disclosed methods, steps, components, elements, subsystems, devices, systems, etc., or equivalents thereof, selected and arranged in a manner that will be apparent to one of ordinary skill in the art upon review of this specification and the appended drawings. That is, this document is intended to include sufficient teaching to support integrations of various aspects of the disclosed exemplary embodiments.

From the foregoing, it will be appreciated that the present invention overcomes the limitations of the prior art. From the description of the exemplary embodiments, equivalents of the elements shown herein will suggest themselves to those skilled in the art, and ways of constructing other embodiments of the present invention will suggest themselves to practitioners of the art. Therefore, the scope of the present invention is to be limited only by the claims below.

That is, although specific embodiments of the present invention have been described above in detail, the description is merely for purposes of illustration. Various modifications of and equivalent steps corresponding to, the disclosed aspects of the exemplary embodiments, in addition to those described above, also can be made by those skilled in the art without departing from the spirit and scope of the present invention defined in the following claims, the scope of which is to be accorded the broadest interpretation so as to encompass such modifications and equivalent structures.

What is claimed is:

1. A method for optical communication, comprising the steps of:
    providing a lasing cavity dimensioned to form a plurality of longitudinal modes spread across a plurality of dense wavelength division multiplexing channels;
    energizing the longitudinal modes of the plurality of longitudinal modes that are substantially in a selected one of the dense wavelength division multiplexing channels;
    suppressing the longitudinal modes of the plurality of longitudinal modes that are substantially outside the selected one of the dense wavelength division multiplexing channels; and
    encoding information on the energized longitudinal modes in response to modulating a semiconductor gain medium disposed substantially in the lasing cavity,
    wherein, in response to a substantial fluctuation in temperature of the lasing cavity stemming from a random event:
        the lasing cavity substantially lengthens or shortens;
        the plurality of longitudinal modes shift substantially;
        suppressed longitudinal modes shift into the selected dense wavelength division multiplexing channel and become energized; and
        energized longitudinal modes shift out of the selected dense wavelength division multiplexing channel and become suppressed,
        with the number of energized modes in the dense wavelength division multiplexing channel remaining substantially uniform.

2. The method of claim 1, wherein substantially all energized modes remain substantially confined to a substantially uniform bandwidth for a time period leading up to the fluctuation in temperature, during the fluctuation in temperature, and for another time period following the fluctuation in temperature.

3. The method of claim 1, wherein in advance of the substantial fluctuation in temperature, the longitudinal modes that are energized define a first bandwidth,
    wherein during the substantial fluctuation in temperature, the longitudinal modes that are energized define a second bandwidth,
    wherein following the substantial fluctuation in temperature, the longitudinal modes that are energized define a third bandwidth, and
    wherein the first, second, and third bandwidths are substantially equal.

4. The method of claim 1, wherein before, during, and after the substantial fluctuation in temperature, the respective longitudinal modes that are energized are contained in a spectral region of constant bandwidth.

5. The method of claim 1, further comprising slicing each longitudinal mode in the selected dense wavelength division multiplexing channel into a plurality of finer modes.

6. The method of claim 1, wherein a gain medium substantially fills the lasing cavity,
    wherein the energizing step comprises the lasing cavity selecting a contiguous band of longitudinal modes for energizing, and
    wherein the suppressing step comprises the lasing cavity selecting other longitudinal modes on two sides of the contiguous band for suppression.

7. The method of claim 1, wherein a first reflector at a first facet of the semiconductor gain medium and a second reflector at a second facet of the semiconductor gain medium form the lasing cavity,
    wherein the energizing step comprises resonating light between the first and second reflector for a first spectral band,
    wherein the suppressing step comprises avoiding resonance between the first and second reflector outside the spectral band of light, and
    wherein at least one of the first reflector and the second reflector comprises a multicavity stack of thin films of alternating refractive index providing a substantially temperature invariant band of reflection.

8. A method for optical communication, comprising
    immediately before, during, and immediately following a lasing cavity undergoing a substantial change in length due to a temperature fluctuation, emitting a plurality of longitudinal modes from the lasing cavity, the longitudinal modes remaining confined to a substantially constant spectral band of a dense wavelength division multiplexing channel,
    wherein the lasing cavity comprises a die that comprises a light-amplifying waveguide extending between a pair of reflective surfaces, and
    wherein emitting the plurality of longitudinal modes comprises
        confining light emissions from the die to the channel via the pair of reflective surfaces resonating longitudinal modes in the spectral band and suppressing resonance of other longitudinal modes, at least one of the reflective surfaces comprising a multicavity thin film interference filter that provides a temperature stable spectral region of reflectivity.

9. The method of claim 8, wherein emitting the plurality of longitudinal modes from the laser cavity comprises maintaining a substantially constant number of emitted longitudinal modes, the number exceeding three.

10. The method of claim 8, further comprising slicing each longitudinal mode into a cluster of finer modes.

11. A method for optical communication, comprising
immediately before, during, and immediately following a lasing cavity undergoing a substantial change in length due to a temperature fluctuation, emitting a plurality of longitudinal modes from the lasing cavity, the longitudinal modes remaining confined to a substantially constant spectral band of a dense wavelength division multiplexing channel, wherein the lasing cavity comprises a die comprising a waveguide extending between two reflectors, and wherein emitting the plurality of longitudinal modes comprises confining light emissions from the die to the channel via resonating selected longitudinal modes between the two reflectors and suppressing resonance of other longitudinal modes, and wherein at least one of the reflectors comprises a system of thin films that provides a spectral band of heightened reflectivity between two spectral bands of heightened transmission and a group delay profile comprising a spectral region of substantially uniform group delay between two peaks in group delay.

12. A method for optical communication, comprising
simultaneously emitting a plurality of longitudinal modes of light imprinted with information and confined to a dense wavelength division multiplexing channel in response to resonating light between opposing ends of a semiconductor die with at least one stack of thin films of alternating refractive index adhering to at least one of the ends for confining the longitudinal modes; and providing the stack of thin films of alternating refractive index with a group delay profile selected to promote multimode lasing within a notch of reflectivity.

13. The method of claim 12, wherein resonating light comprises:

reflecting light back and forth between the opposing ends of the semiconductor die for a spectral region of the dense wavelength division multiplexing channel that is substantially temperature invariant; and suppressing resonance outside the spectral region.

14. The method of claim 12, wherein the at least one stack of thin films of alternating refractive index comprises a plurality of cavities and provides temperature stable regions of reflection and transmission.

15. The method of claim 12, wherein the plurality of longitudinal modes of light comprises a substantially temperature invariant number of modes.

16. The method of claim 12, wherein the plurality of longitudinal modes comprises at least three clusters of modes with the clusters spectrally separated from one another according to laser cavity length.

17. The method of claim 12, further comprising transmitting light through the stack of thin films while the light is waveguided.

18. The method of claim 12, wherein the stack of thin films comprises a waveguide extending across multiple layers of the stack.

* * * * *